US011594690B2

(12) United States Patent
Shi et al.

(10) Patent No.: US 11,594,690 B2
(45) Date of Patent: Feb. 28, 2023

(54) ORGANOMETALLIC COMPLEX, AND POLYMER, MIXTURE AND FORMULATION COMPRISING SAME, AND USE THEREOF IN ELECTRONIC DEVICE

(71) Applicant: GUANGZHOU CHINARAY OPTOELECTRONIC MATERIALS LTD., Guangdong (CN)

(72) Inventors: Chao Shi, Guangdong (CN); Hong Huang, Guangdong (CN); Junyou Pan, Guangdong (CN)

(73) Assignee: GUANGZHOU CHINARAY OPTOELECTRONIC MATERIALS LTD., Guangdong (CN)

( * ) Notice: Subject to any disclaimer, the term of this patent is extended or adjusted under 35 U.S.C. 154(b) by 188 days.

(21) Appl. No.: 16/772,661

(22) PCT Filed: Dec. 12, 2018

(86) PCT No.: PCT/CN2018/120700
§ 371 (c)(1),
(2) Date: Jun. 12, 2020

(87) PCT Pub. No.: WO2019/114764
PCT Pub. Date: Jun. 20, 2019

(65) Prior Publication Data

US 2021/0083204 A1 Mar. 18, 2021

(30) Foreign Application Priority Data

Dec. 14, 2017 (CN) ......................... 201711341877.7

(51) Int. Cl.
*H01L 51/00* (2006.01)
*C07F 15/00* (2006.01)
*C09K 11/06* (2006.01)
*H01L 51/50* (2006.01)

(52) U.S. Cl.
CPC ...... *H01L 51/0085* (2013.01); *C07F 15/0033* (2013.01); *C09K 11/06* (2013.01); *C09K 2211/1029* (2013.01); *C09K 2211/1033* (2013.01); *C09K 2211/1044* (2013.01); *C09K 2211/185* (2013.01); *H01L 51/5016* (2013.01)

(58) Field of Classification Search
CPC .................................................. H01L 51/0085
See application file for complete search history.

(56) References Cited

U.S. PATENT DOCUMENTS

| | | | |
|---|---|---|---|
| 6,824,895 | B1 | 11/2004 | Sowinski et al. |
| 6,830,828 | B2 | 12/2004 | Thompson et al. |
| 6,835,469 | B2 | 12/2004 | Kwong et al. |
| 7,029,766 | B2 | 4/2006 | Huo et al. |
| 9,660,198 | B2 | 5/2017 | Nakagawa et al. |
| 9,660,199 | B2 | 5/2017 | Shizu et al. |
| 10,454,038 | B2 | 10/2019 | Nakagawa et al. |
| 2001/0053462 | A1 | 12/2001 | Mishima |
| 2005/0258742 | A1 | 11/2005 | Tsai et al. |
| 2007/0087219 | A1 | 4/2007 | Ren et al. |
| 2009/0061681 | A1 | 3/2009 | McMunigal et al. |
| 2009/0134784 | A1 | 5/2009 | Lin et al. |
| 2011/0284799 | A1 | 11/2011 | Stoessel et al. |
| 2012/0004407 | A1 | 1/2012 | Stoessel et al. |
| 2012/0217869 | A1 | 8/2012 | Adachi et al. |
| 2015/0141642 | A1 | 5/2015 | Adachi et al. |
| 2016/0233443 | A1* | 8/2016 | Stoessel ............... C07D 491/14 |

FOREIGN PATENT DOCUMENTS

| | | | |
|---|---|---|---|
| CN | 103483332 | A | 1/2014 |
| CN | 102282150 | B | 7/2015 |
| CN | 105555792 | | 5/2016 |
| EP | 1191612 | A2 | 3/2002 |
| EP | 1191613 | A2 | 3/2002 |
| EP | 1191614 | A2 | 3/2002 |
| TW | 201309696 | A | 3/2013 |
| TW | 201309778 | A | 3/2013 |
| TW | 201343874 | A | 11/2013 |
| TW | 201350558 | A | 12/2013 |
| WO | 2001041512 | A1 | 6/2001 |
| WO | 2002002714 | A2 | 1/2002 |
| WO | 2002015645 | A1 | 2/2002 |

(Continued)

OTHER PUBLICATIONS

Endo et al., "Thermally Activated Delayed Fluorescence from $Sn^{4+}$-Porphyrin Complexes and Their Application to Organic Light-Emitting Diodes—A Novel Mechanism for Electroluminescence", Advanced Materials, vol. 21, 2009, pp. 4802-4806.
Li et al., Highly Efficient Organic Light-Emitting Diode Based on a Hidden Thermally Activated Delayed Fluorescence Channel in a Heptazine Derivative, Advanced Materials, vol. 25, 2013, pp. 1-5.
Dias et al., "Triplet Harvesting with 100% Efficiency by Way of Thermally Activated Delayed Fluorescence in Charge Transfer OLEO Emitters", Advanced Materials, vol. 25, 2013, pp. 3707-3714.
Mehes et al., "Enhanced Electroluminescence Efficiency in a Spiro-Acridine Derivative through Thermally Activated Delayed Fluorescence", Angew. Chem. Int. Ed, vol. 51, 2012, pp. 11311-11315.
Endo et al., "Efficient up-conversion of triplet excitons into a singlet state and its application for organic light emitting diodes", Applied Physics Letters, vol. 98, 2011, pp. 083302-1-083302-3.

(Continued)

*Primary Examiner* — William D Young
(74) *Attorney, Agent, or Firm* — PV IP PC; Wei Te Chung; Lu Ude

(57) ABSTRACT

The present invention relates to an organometallic complex as shown in general formula (I), and to a polymer, mixture and formulation comprising same, and to use thereof in an electronic device, in particular the use in an organic luminous diode. By providing a new high performance phosphorescent luminous material, in the present the device structure is optimized such that the device achieves the best performance, realizing a high efficiency, high luminance and high stability OLED device, thereby providing a better material option for full-color display and lighting.

16 Claims, No Drawings

(56) References Cited

FOREIGN PATENT DOCUMENTS

| | | |
|---|---|---|
| WO | 2000070655 A3 | 5/2004 |
| WO | 2005019373 A2 | 3/2005 |
| WO | 2005033244 A1 | 4/2005 |
| WO | 2007095118 A2 | 8/2007 |
| WO | 2008027220 A3 | 3/2008 |
| WO | 2009118087 A1 | 10/2009 |
| WO | 2009146770 A2 | 12/2009 |
| WO | 2010015307 A1 | 2/2010 |
| WO | 2010031485 A1 | 3/2010 |
| WO | 2010054728 A1 | 5/2010 |
| WO | 2010054731 A1 | 5/2010 |
| WO | 2010086089 A1 | 8/2010 |
| WO | 2010099852 A1 | 9/2010 |
| WO | 2010102709 A1 | 9/2010 |
| WO | 2010135519 A1 | 11/2010 |
| WO | 2011110277 A1 | 9/2011 |
| WO | 2011141110 A2 | 11/2011 |
| WO | 2011157339 A1 | 12/2011 |
| WO | 2012007086 A1 | 1/2012 |
| WO | 2012007087 A1 | 1/2012 |
| WO | 2012007088 A1 | 1/2012 |
| WO | 2013094620 A1 | 6/2013 |
| WO | 2013107487 A1 | 7/2013 |
| WO | 2013133359 A1 | 9/2013 |
| WO | 2013154064 A1 | 10/2013 |
| WO | 2013174471 A1 | 11/2013 |
| WO | 2014007565 A1 | 1/2014 |
| WO | 2014008982 A1 | 1/2014 |
| WO | 2014023377 A2 | 2/2014 |
| WO | 2014024131 A1 | 2/2014 |
| WO | 2014031977 A1 | 2/2014 |
| WO | 2014038456 A1 | 3/2014 |
| WO | 2014112450 A1 | 7/2014 |
| WO | 2016091217 | 6/2016 |
| WO | 2017092545 | 6/2017 |

OTHER PUBLICATIONS

Lee et al., "High-efficiency organic light-emitting diodes utilizing thermally activated delayed fluorescence from triazinebased donor-acceptor hybrid molecules", Applied Physics Letters, vol. 101, 2012, pp. 093306-1-093306-4.

Nakagawa et al., "Electroluminescence based on thermally activated delayed fluorescence generated by a spirobifluorene donor-acceptor structure" Chem Commun, vol. 48, 2012, pp. 9580-9582.

Tanaka et al., "Efficient green thermally activated delayed fluorescence (TADF) from a phenoxazine-triphenyltriazine (PXZ-TRZ) derivative", Chem Commun, vol. 48, No. 93, 2012, pp. 11392-11394.

Nasu et al., "A highly luminescent spiro-anthracenone-based organic light-emitting diode exhibiting thermally activated delayed fluorescence", ChemCommun, vol. 48, 2013, pp. 1-3.

Komino et al., "Suppression of Efficiency Roll-Off Characteristics in Thermally Activated Delayed Fluorescence Based Organic Light-Emitting Diodes Using Randomly Oriented Host Molecules", Chemistry Materials, vol. 25, 2013, pp. 3038-3047.

Tanaka et al., "Twisted Intramolecular Charge Transfer State for Long-Wavelength Thermally Activated Delayed Fluorescence", Chemistry Materials, vol. 25, 2013, pp. 3766-3771.

Zhang et al., "Design of Efficient Thermally Activated Delayed Fluorescence Materials for Pure Blue Organic Light Emitting Diodes", Journal of the American Chemical Society, vol. 134, 2012, pp. 14706-14709.

Lee et al., "Oxadiazole- and triazole-based highly-efficient thermally activated delayed fluorescence emitters for organic light-emitting diodes", Journal of Materials Chemistry C, vol. 1, 2013, pp. 1-6.

Ishimatsu et al., "Solvent Effect on Thermally Activated Delayed Fluorescence by 1,2,3,5-Tetrakis(carbazol-9-yl)-4,6-dicyanobenzene", The Journal of Physical Chemistry A, vol. 117, 2013, pp. 5607-5612.

Goushi et al., "Organic light-emitting diodes employing efficient reverse intersystem crossing for triplet-to-singlet state conversion", Nature Photonics, vol. 6, Apr. 2012, pp. 253-258.

Uoyama et al., "Highly efficient organic light-emitting diodes from delayed fluorescence", Nature, vol. 492, Dec. 2012, pp. 234-238.

Adachi et al., "High-efficiency red electrophosphorescence devices", Applied Physics Letters, vol. 78, 2001, pp. 1622-1624.

Baldo et al., "High-efficiency fluorescent organic light-emitting devices using a phosphorescent sensitizer", Nature, vol. 403, (2000), pp. 750-753.

Kido et al., "Bright red lightemitting organic electroluminescent devices having a europium complex as an emitter", Applied Physics Letter, vol. 65, 1994, pp. 2124-2126.

Johnson et al., "Luminescent Iridium(I), Rhodium(I), and Platinum(II) Dithiolate Complexes", JAGS, vol. 105, 1983, pp. 1795-1802.

Kido et al., "Electroluminescence in a Terbium Complex", Chem Lett, 1990, pp. 657-660.

Ma et al., "Electroluminescence from triplet metal-ligand charge-transfer excited state of transition metal complexes", Synth Metals, vol. 94, 1998, pp. 245-248.

Wrighton et al., "The Nature of the Lowest Excited State in Tricarbonylchloro-1,10-phenanthrolinerhenium(I) and Related Complexes", JAGS. vol. 96, 1974, pp. 998-1003.

Kipphan (Handbook of Print Media: Technologies and Production Methods), ISBN 3-540-67326-1, Chapter 1.3, pp. 40-67, Chapter 1.5, pp. 117-144, Chapter 5.5, pp. 711-730.

Bulovic et al., "Transparent light-emitting devices", Nature, vol. 380, 1996, p. 29.

Gu et al., "Transparent organic light emitting devices", Applied Physics Letters1996, vol. No. 19, 68, pp. 2606-2608.

Newkome, et al., Dendrimers and Dendrons, Wiley-VCH Verlag GmbH & Co. KGaA, (2002) pp. 1-21, 51-76, 76-102, 102-118, 191-234, 234-282, 282-309, 331-365, 366-393, 395-431, 431-455.

PCT/CN2018/120700, "International Search Report", dated Mar. 25, 2019, 2 pages.

* cited by examiner

ORGANOMETALLIC COMPLEX, AND POLYMER, MIXTURE AND FORMULATION COMPRISING SAME, AND USE THEREOF IN ELECTRONIC DEVICE

CROSS REFERENCE TO RELATED APPLICATIONS

The present disclosure claims priority to Chinese Patent Application No. 201711341877.7, filed on Dec. 14, 2017, entitled "organometallic complex, and polymer, mixture and formulation comprising the same, and application thereof in electronic devices", the entire contents of which are incorporated by reference herein in its entirety.

TECHNICAL FIELD

The present disclosure relates to the field of electroluminescent materials, and more particularly to an organometallic complex, and a polymer, a mixture and a formulation comprising the same, and an application thereof in organic electronic devices, especially in organic phosphorescent light-emitting diodes. The present disclosure also relates to an organic electronic device comprising the organometallic complex of the present disclosure and an application thereof.

BACKGROUND

Organic light-emitting diodes (OLEDs) show great potentials in the applications of optoelectronic devices (such as flat-panel displays and lighting) due to the synthetic diversities, relatively low manufacturing costs, and excellent optical and electrical properties of organic semiconductor materials.

In order to improve the luminescence efficiency of the organic light-emitting diodes, various light-emitting material systems based on fluorescent and phosphorescent materials have been developed. The organic light-emitting diodes based on fluorescent materials have high reliability, but their internal electroluminescence quantum efficiency is limited to 25% under electric field excitation, since the probability ratio of the exciton to generate a singlet excited state and a triplet excited state is 1:3. In 1999, Professor Thomson from the University of Southern California and Professor Forrest from the Princeton University successfully prepared green electrophosphorescence devices by incorporating tris(2-phenylpyridine) iridium ($Ir(ppy)_3$) into N,N-dicarbazole biphenyl (CBP), which aroused great interests in phosphorescent complex materials. The introduction of heavy metals improves the molecular spin orbit coupling, shortens the phosphorescence lifetime and enhances the intersystem crossing of molecules, so that phosphorescence can be successfully emitted. Moreover, since the reactions of this kind of complexes are mild, it is easy to alter the structure and the substituent groups of the complexes, to adjust the light-emitting wavelength, to obtain electrophosphorescent materials with excellent properties. So far, the internal quantum efficiency of the phosphorescent OLED is close to 100%. However, most of phosphorescent materials have too broad luminescence spectrum and poor color purity, which are not conducive to high-end display, and the stabilities of such phosphorescent OLEDs need to be further improved.

Therefore, novel high-performance phosphorescent metal complexes are urgently needed to be developed.

SUMMARY

A main object of the present disclosure is to provide an organometallic complex, and a polymer, a mixture, and a formulation containing the same, and an application thereof in organic electronic devices, which aims to provide a novel high-performance phosphorescent metal complex, to solve the problems such as broad luminescence spectrum and poor color purity of the existing phosphorescent materials, and to improve the device performance. Another object of the present disclosure is to provide an organic electronic device comprising the organometallic complex of the present disclosure, and an application thereof.

Technical solutions of the present disclosure are described below.

An organometallic complex of the general formula (I) is provided:

(I)

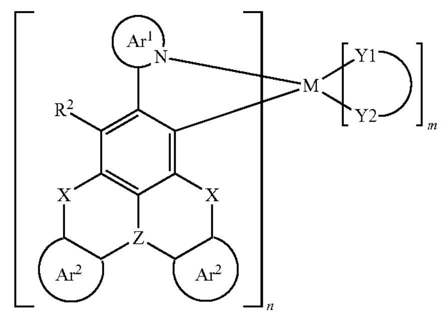

wherein, each occurrence of $Ar^1$ is the same or different and is a heteroaromatic group containing at least one N; each occurrence of $Ar^2$ is the same or different and is an aromatic group or a heteroaromatic group; $Ar^1$ and $Ar^2$ may be further substituted by one or more $R^1$;

X is selected from the group consisting of O, S, Se, $NR^1$, $C(R^1)_2$ or $Si(R^1)_2$;

Z is selected from the group consisting of B, N, P, P═O or P═S;

Each occurrence of $R^1$ and $R^2$ is the same or different and is selected from the group consisting of H, deuterium, a linear alkyl containing 1 to 20 carbon atoms, a linear alkoxy containing 1 to 20 carbon atoms, a linear thioalkoxy group containing 1 to 20 carbon atoms, a branched or cyclic alkyl containing 3 to 20 carbon atoms, a branched or cyclic alkoxy containing 3 to 20 carbon atoms, a branched or cyclic thioalkoxy group containing 3 to 20 carbon atoms, a branched or cyclic silyl group containing 3 to 20 carbon atoms, a substituted keto group containing 1 to 20 carbon atoms, an alkoxycarbonyl group containing 2 to 20 carbon atoms, an aryloxycarbonyl group containing 7 to 20 carbon atoms, a cyano group (—CN), a carbamoyl group (—C(═O)$NH_2$), a haloformyl group (—C(═O)—X, wherein X represents a halogen atom), a formyl group (—C(═O)—H), an isocyano group, an isocyanate group, a thiocyanate group or isothiocyanate group, a hydroxyl group, a nitro group, $CF_3$ group, Cl, Br, F, a crosslinkable group, a substituted or unsubstituted aromatic or heteroaromatic ring containing 5 to 40 ring atoms, an aryloxy or heteroaryloxy group containing 5 to 40 ring atoms, and the combination thereof, wherein $R^2$ may further form a ring with $Ar^1$;

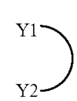

is a bidentate ligand;

M is a transition metal element;

m is an integer from 0 to 2, and n is an integer from 1 to 3.

A polymer comprising at least one repeating unit which comprises the structural unit represented by the general formula (1) is also provided.

A mixture comprising the organometallic complex or the polymer as described above and at least another organic functional material is further provided, wherein the another organic functional material may be selected from the group consisting of a hole injection material (HIM), a hole transport material (HTM), an electron transport material (ETM), an electron injection material (EIM), an electron blocking material (EBM), a hole blocking material (HBM), a light-emitting material (emitter), a host material, and an organic dye.

A formulation comprising the organometallic complex, the polymer or the mixture as described above and at least one organic solvent is further provided.

An application of the organometallic complex, the polymer, the mixture or the formulation as described above in an organic electronic device is further provided.

An organic electronic device comprising at least the organometallic complex, the polymer, the mixture or the formulation as described above is further provided.

The above organic electronic device which the characteristics are selected from the group consisting of an organic light-emitting diode (OLED), an organic photovoltaic cell (OPV), an organic light-emitting electrochemical cell (OLEEC), an organic field effect transistor (OFET), an organic light-emitting field effect transistor, an organic laser, an organic spintronic device, an organic sensor, and an organic plasmon emitting diode.

Beneficial effects: the present disclosure increases the degree of conjugation and rigidity of the complex by introducing fused ring units containing different main group elements into the phosphorescent metal complex, which is conducive to enhancing the luminescence efficiency of the complex, improving the color purity, and adjusting the light-emitting wavelength of the complex.

DETAILED DESCRIPTION

The present disclosure provides an organometallic complex and an application thereof in organic electroluminescent devices. In order to make the purposes, technical solutions and effects of the present disclosure clearer and more specific, the present disclosure will be further described in detail below. It should be understood that, the specific embodiments illustrated herein are merely for the purpose of explanation, and should not be deemed to limit the disclosure.

In the present disclosure, the host material and the matrix material have the same meaning and they are interchangeable.

In the present disclosure, the metal organic clathrate, the metal organic complex, and the organometallic complex have the same meaning and are interchangeable.

In the embodiment of the present disclosure, the singlet and the singlet state have the same meaning and are interchangeable.

In the embodiment of the present disclosure, the triplet and triplet state have the same meaning and are interchangeable.

Polymer includes homopolymer, copolymer, and block copolymer. In addition, in the present disclosure, the polymer also includes dendrimer. For the synthesis and application of dendrimers, please refer to [Dendrimers and Dendrons, Wiley-VCH Verlag GmbH & Co. KGaA, 2002, Ed. George R. Newkome, Charles N. Moorefield, Fritz Vogtle.].

The present disclosure provides an organometallic complex as shown in general formula (I)

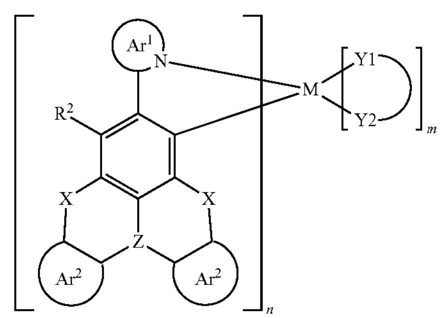

(I)

wherein each occurrence of $Ar^1$ is the same or different and is a heteroaromatic group containing at least one N; each occurrence of $Ar^2$ is the same or different and is an aromatic group or a heteroaromatic group; $Ar^1$ and $Ar^2$ may be further substituted by one or more $R^1$;

X is selected from the group consisting of O, S, Se, $NR^1$, $C(R^1)_2$ or $Si(R^1)_2$;

Z is selected from the group consisting of B, N, P, P═O or P═S;

Each occurrence of $R^1$ and $R^2$ is the same or different and is selected from the group consisting of H, deuterium, a linear alkyl containing 1 to 20 carbon atoms, a linear alkoxy containing 1 to 20 carbon atoms, a linear thioalkoxy group containing 1 to 20 carbon atoms, a branched or cyclic alkyl containing 3 to 20 carbon atoms, a branched or cyclic alkoxy containing 3 to 20 carbon atoms, a branched or cyclic thioalkoxy group containing 3 to 20 carbon atoms, a branched or cyclic silyl group containing 3 to 20 carbon atoms a substituted keto group containing 1 to 20 carbon atoms, an alkoxycarbonyl group containing 2 to 20 carbon atoms, an aryloxycarbonyl group containing 7 to 20 carbon atoms, a cyano group, a carbamoyl group, a haloformyl group, a formyl group, an isocyano group, an isocyanate group, a thiocyanate group, isothiocyanate group, a hydroxyl group, a nitro group, $CF_3$ group, Cl, Br, F, a crosslinkable group, a substituted or unsubstituted aromatic or heteroaromatic ring containing 5 to 40 ring atoms, an aryloxy or heteroaryloxy group containing 5 to 40 ring atoms, and the combination thereof, wherein $R^2$ may further form a ring with $Ar^1$;

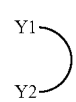

is a bidentate ligand;

M is a transition metal element;

m is an integer from 0 to 2, and n is an integer from 1 to 3.

In one embodiment, in the organometallic complex, X is O or S, and Z is B or N. In another embodiment, X is O or S and Z is N. In a specific embodiment, X is O and Z is N.

In one embodiment, each occurrence of $R^1$ and $R^2$ is the same or different and is selected from the group consisting of H, deuterium, a linear alkyl group containing 1 to 10 carbon atoms, a linear alkoxy group containing 1 to 10 carbon atoms, a linear thioalkoxy group containing 1 to 10 carbon atoms, a branched or cyclic alkyl containing 3 to 10 carbon atoms, a branched or cyclic alkoxy containing 3 to 10 carbon atoms, a branched or cyclic thioalkoxy group containing 3 to 10 carbon atoms, or a branched or cyclic silyl group containing 3 to 10 carbon atoms, a substituted keto group containing 1 to 10 carbon atoms, an alkoxycarbonyl group containing 2 to 10 carbon atoms, an aryloxycarbonyl group containing 7 to 10 carbon atoms, a cyano group, a carbamoyl group, a haloformyl group, a formyl group, an isocyano group, an isocyanate group, a thiocyanate group, a isothiocyanate group, a hydroxyl group, a nitro group, $CF_3$ group, Cl, Br, F, a crosslinkable group, a substituted or unsubstituted aromatic or heteroaromatic ring containing 5 to 20 ring atoms, an aryloxy or heteroaryloxy group containing 5 to 20 ring atoms, and the combination thereof, wherein $R^2$ may further form a ring with $Ar^1$.

In one embodiment, in the organometallic complex, the metal element M may be selected from any one of the transition metals consisting of chromium, molybdenum, tungsten, ruthenium, rhodium, nickel, silver, copper, zinc, palladium, gold, osmium, rhenium, iridium and platinum.

In another embodiment, in the organometallic complex, the metal element M is selected from the group consisting of ruthenium, copper, palladium, gold, osmium, rhenium, iridium and platinum.

In a particular embodiment, the organometallic complex is characterized in that the metal element M is iridium or platinum.

In one embodiment, each occurrence of $Ar^1$ is the same or different and is a heteroaromatic group containing at least one N. In another embodiment, each occurrence of $Ar^1$ is the same or different and is a heteroaromatic group containing at least one N with a ring atom number of 6 to 70. In another embodiment, each occurrence of $Ar^1$ is the same or different and is a heteroaromatic group containing at least one N with a ring atom number of 6 to 60. In another embodiment, each occurrence of $Ar^1$ is the same or different and is a heteroaromatic group containing at least one N with a ring atom number of 6 to 50. In another embodiment, each occurrence of $Ar^1$ is the same or different and is a heteroaromatic group containing at least one N with a ring atom number of 6 to 40. $Ar^1$ may be further substituted by one or more $R^1$.

In some embodiments, each occurrence of $Ar^1$ is the same or different and is a heteroaromatic group containing at least two or three N, wherein at least one N in $Ar^1$ is coordinated with the metal, and $Ar^1$ may be further substituted by one or more $R^1$.

In other embodiments, the organometallic complex is characterized in that each of $Ar^1$ on multiple occurrences may be independently selected from any one of the general formulas C1 to C3:

C1

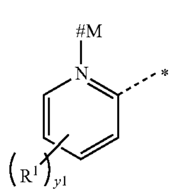

-continued

C2

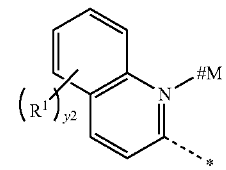

C3

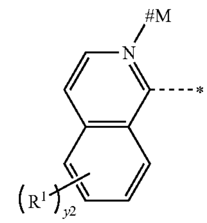

#M represents a site attached to the transition metal M;

* represents a site attached to the carbon atom of the benzene ring in the general formula (I);

wherein y1 represents an integer from 0 to 4, y2 represents an integer from 0 to 6, and the dotted line represents a connection in the form of a single bond, and $R^1$ is defined as above.

In one embodiment, $Ar^2$ is an aromatic group or a heteroaromatic group with a ring atom number of 6 to 70. In another embodiment, $Ar^2$ is an aromatic group or a heteroaromatic group with a ring atom number of 6 to 60. In another embodiment, $Ar^2$ is an aromatic group or a heteroaromatic group with a ring atom number of 6 to 50. In another embodiment, $Ar^2$ is an aromatic group or a heteroaromatic group with a ring atom number of 6 to 40. One or more groups may be further substituted by $R^1$.

The aromatic ring system or aromatic group refers to the hydrocarbyl comprising at least one aromatic ring, including monocyclic group and polycyclic ring system. The heteroaromatic ring system or heteroaromatic group refers to the hydrocarbyl group (containing heteroatoms) comprising at least one heteroaromatic ring, including monocyclic group and polycyclic ring system. The heteroatom is selected from Si, N, P, O, S and/or Ge, and particularly from Si, N, P, O and/or S. Such polycyclic rings may have two or more rings, wherein two carbon atoms are shared by two adjacent rings, i.e., fused ring. At least one ring of such polycyclic rings is aromatic or heteroaromatic. For the purpose of the present disclosure, the aromatic or heteroaromatic ring systems include aromatic or heteroaromatic systems, and further in the system a plurality of aryls or heteroaryls may be interrupted by short non-aromatic units (<10% of non-H atoms, specially less than 5% of non-H atoms, such as C, N or O atoms). Therefore, systems such as 9,9'-spirobifluorene, 9,9-diarylfluorene, triarylamine, diaryl ether and the like are also considered to be aromatic ring systems for the purpose of this disclosure.

Specifically, examples of the aromatic group include: benzene, naphthalene, anthracene, phenanthrene, perylene, tetracene, pyrene, benzopyrene, triphenylene, acenaphthene, fluorene, and derivatives thereof.

Specifically, examples of the heteroaromatic group include: furan, benzofuran, thiophene, benzothiophene, pyrrole, pyrazole, triazole, imidazole, oxazole, oxadiazole, thiazole, tetrazole, indole, carbazole, pyrroloimidazole, pyrrolopyrrole, thienopyrrole, thienothiophene, furopyrrole, furofuran, thienofuran, benzisoxazole, benzisothiazole, benzimidazole, pyridine, pyrazine, pyridazine, pyrimidine, triazine, quinoline, isoquinoline, o-diazonaphthalene, quinoxaline, phenanthridine, perimidine, quinazoline, quinazolinone, and derivatives thereof.

In one embodiment, $Ar^2$ of the organometallic complex is selected from the group consisting of benzene, biphenyl, naphthalene, anthracene, phenanthrene, benzophenanthrene, pyrene, pyridine, pyrimidine, triazine, fluorene, dibenzothiophene, silafluorene, carbazole, thiophene, furan, thiazole, triphenylamine, triphenylphosphine oxide, tetraphenyl silicane, spirofluorene, spirosilabifluorene and derivatives thereof, wherein one or more groups may be further substituted by $R^1$.

In another embodiment, $Ar^2$ of the organometallic complex is selected from the group consisting of benzene, biphenyl, naphthalene, anthracene, phenanthrene, benzophenanthrene, fluorene, spirofluorene and derivatives thereof, wherein one or more groups may be further substituted by $R^1$.

In another embodiment, in the organometallic complex, each of $Ar^2$ on multiple occurrences is the same and is further selected from substituted or unsubstituted benzene or naphthalene.

In one embodiment, in the organometallic complex,

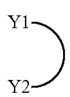

is a mono-anionic ligand, each of which on multiple occurrences may be independently selected from any one of the following general formulas L1 to L15:

L1

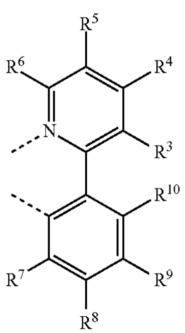

L2

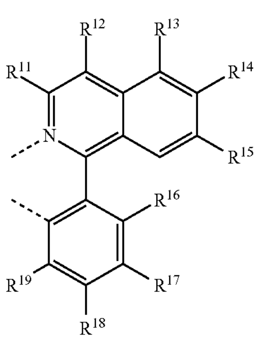

-continued

L3

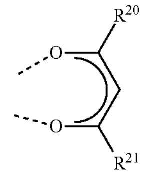

L4

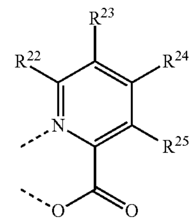

L5

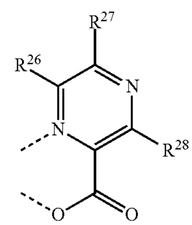

L6

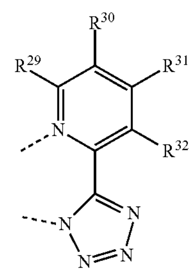

L7

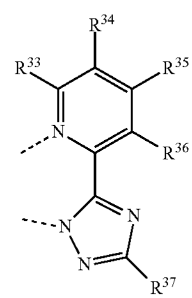

L8

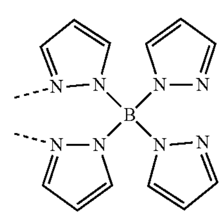

L9

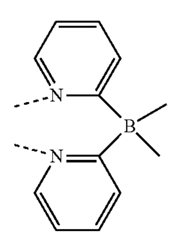

-continued

L10

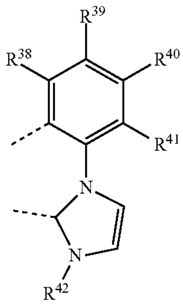

L11

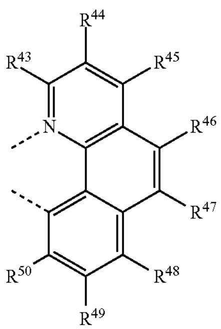

L12

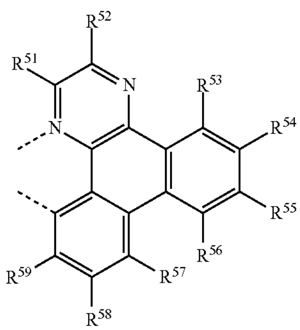

L13

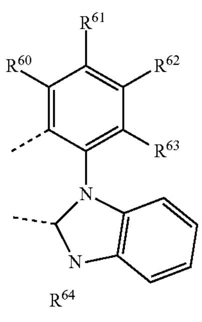

L14

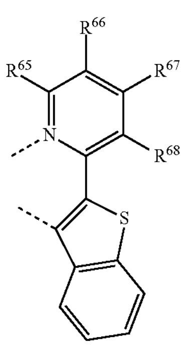

-continued

L15

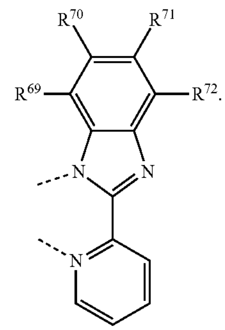

Wherein $R^3$ to $R^{72}$ are selected from one of the group consisting of —H, —F, —Cl, —Br, —I, -D, —CN, —$NO_2$, —$CF_3$, $B(OR^2)_2$, $Si(R^2)_3$, linear alkane, alkane ether, alkane sulfide containing 1 to 10 carbon atoms, or branched alkane, or cycloalkane, alkane ether or alkane sulfide group containing 3 to 10 carbon atoms, and aryl containing 6 to 10 carbon atoms, wherein the dotted line represents the bond directly connected to the metal element M.

In one embodiment, the organometallic complex is selected from, but not limited to, the following general formulas:

(I-1)

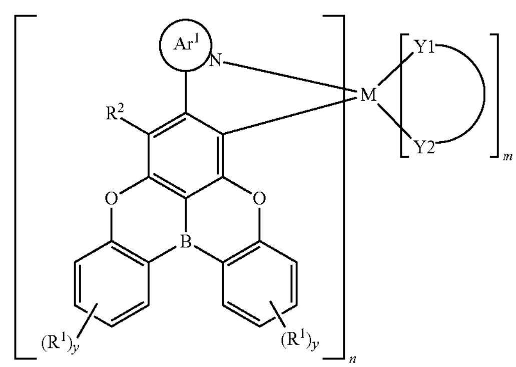

(I-2)

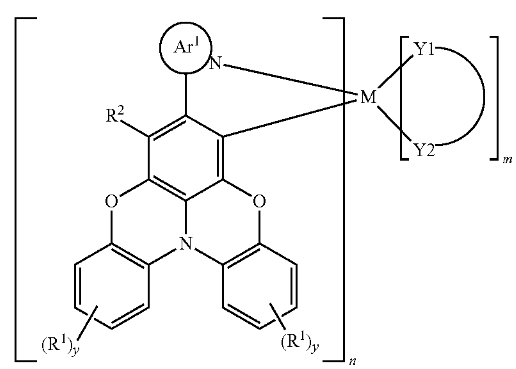

-continued
(I-3)
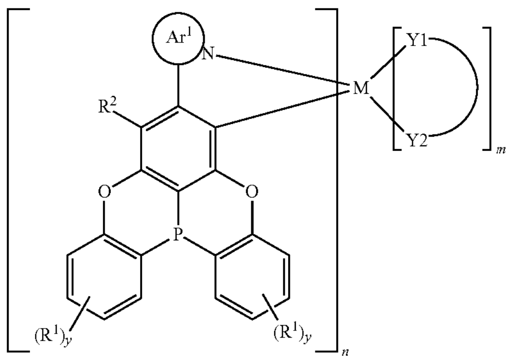
(I-4)
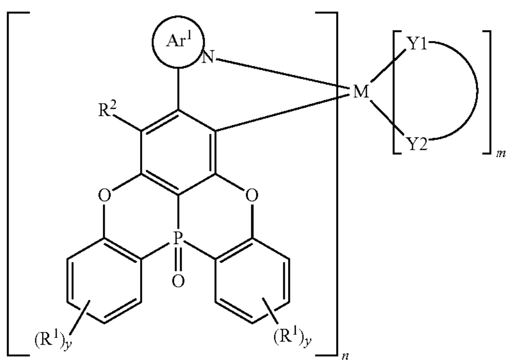
(I-5)
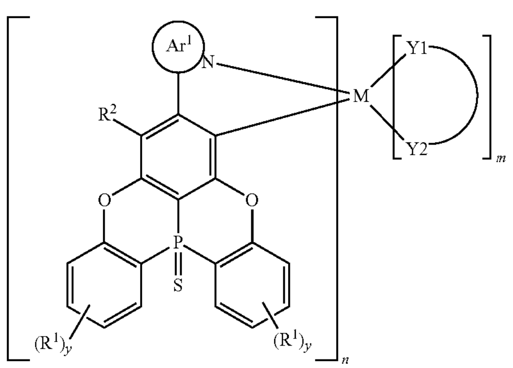
(I-6)
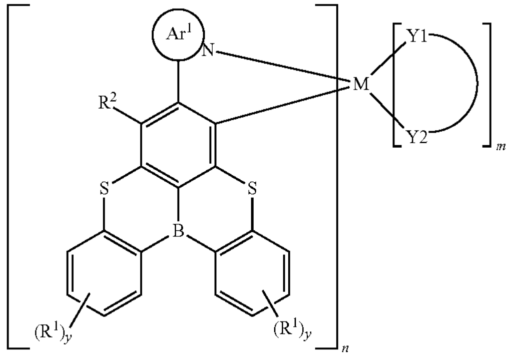
-continued
(I-7)
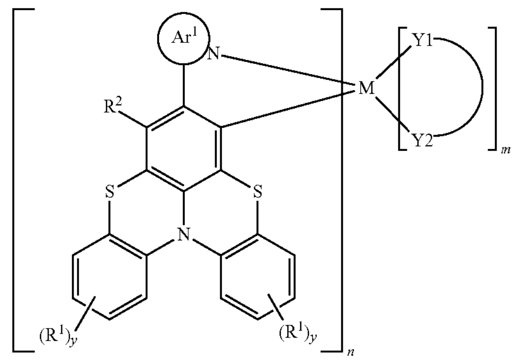
(I-8)
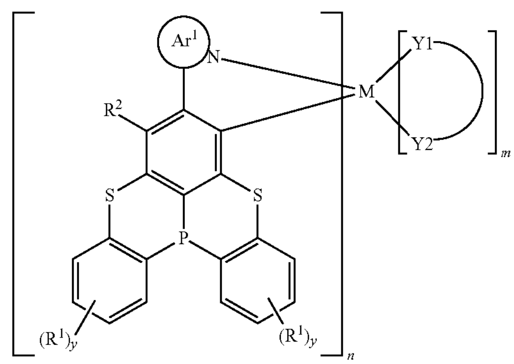
(I-9)
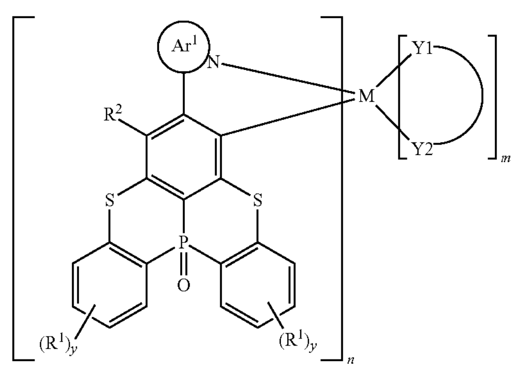
(I-10)
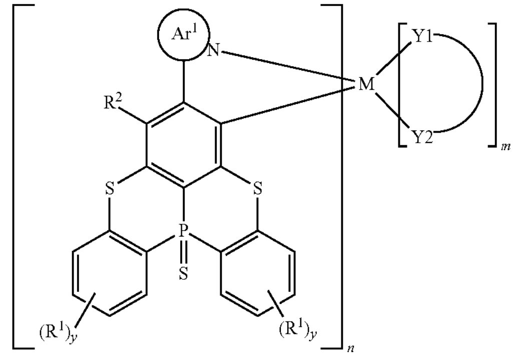

-continued
(I-11)
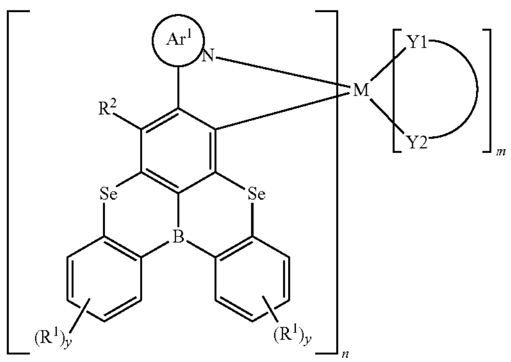
(I-12)
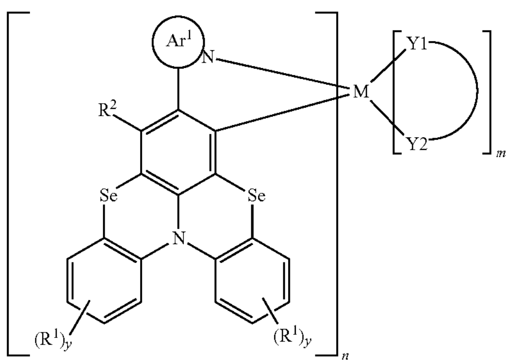
(I-13)
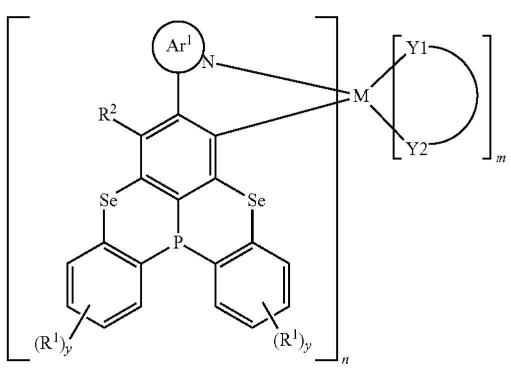
(I-14)
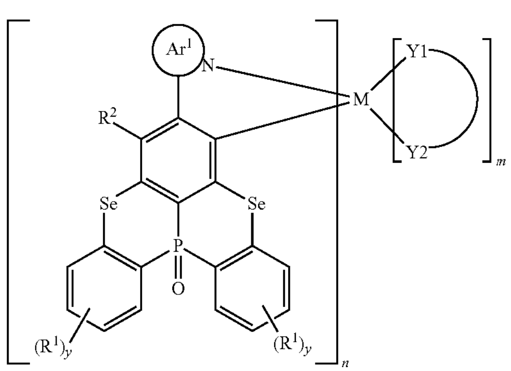
-continued
(I-15)
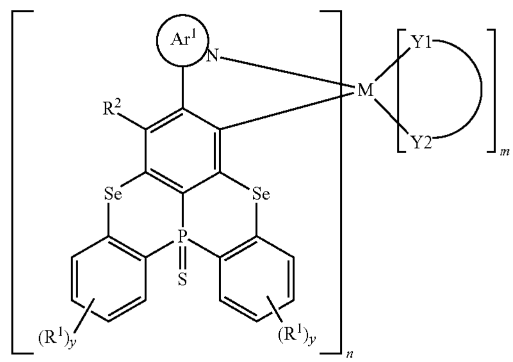
(I-16)
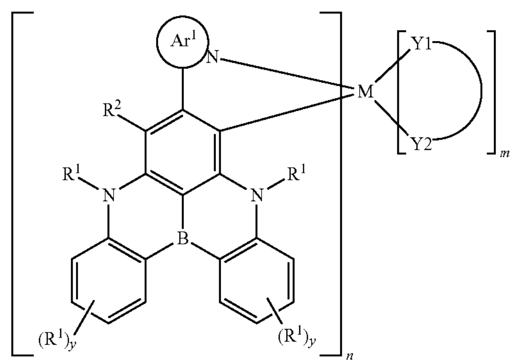
(I-17)
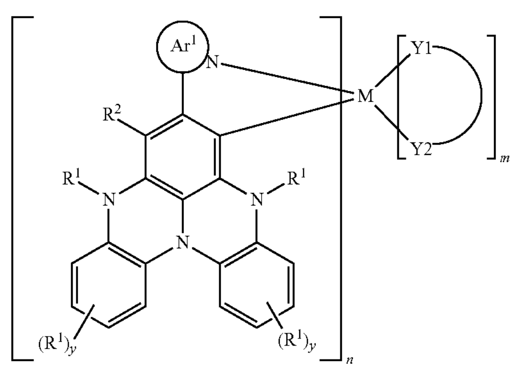
(I-18)
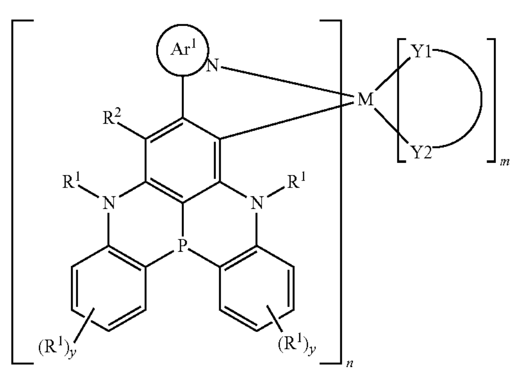

-continued
(I-19)
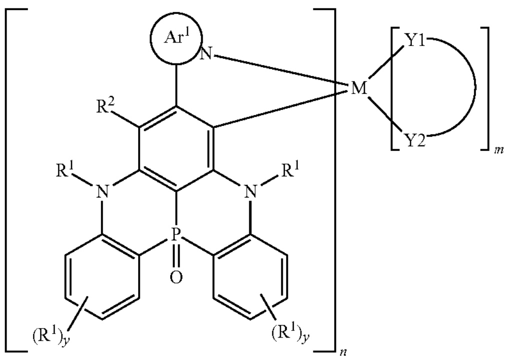
(I-20)
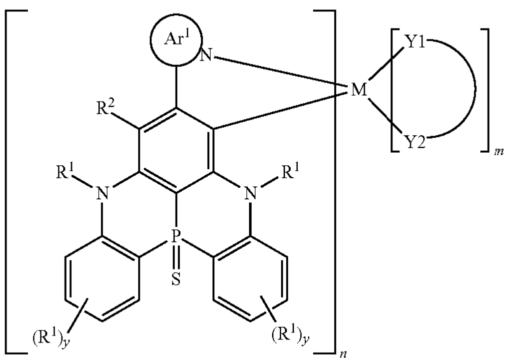
(I-21)
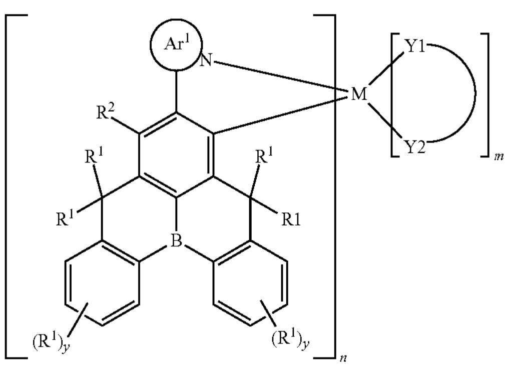
(I-22)
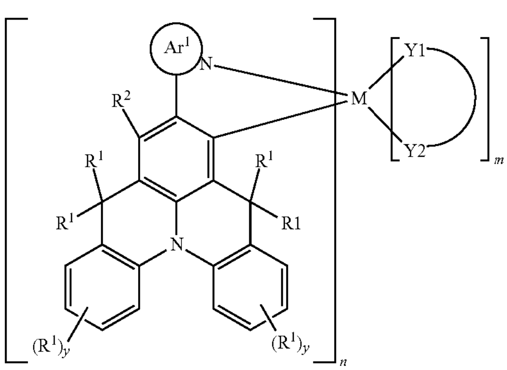
-continued
(I-23)
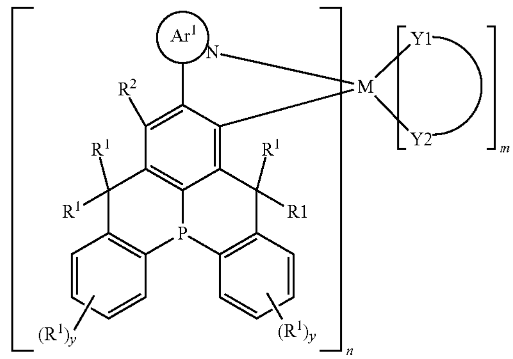
(I-24)
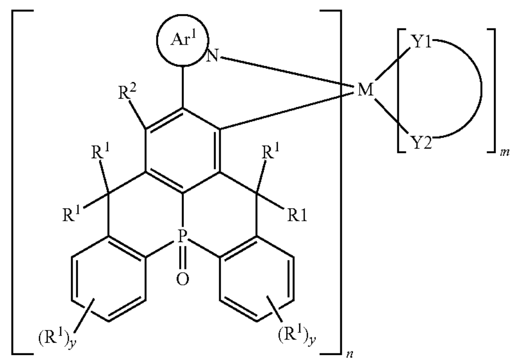
(I-25)
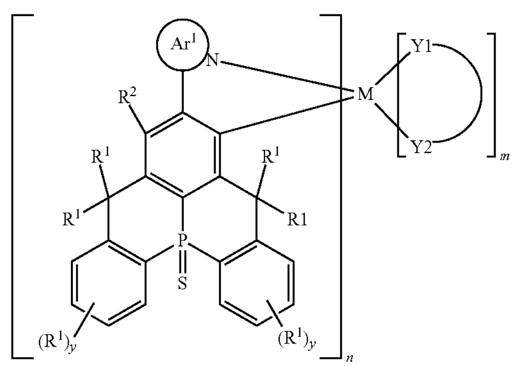
(I-26)
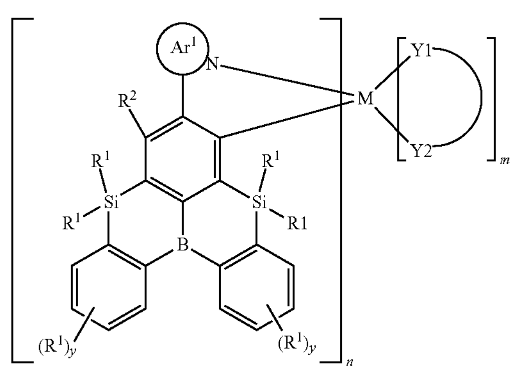

-continued
(I-27)
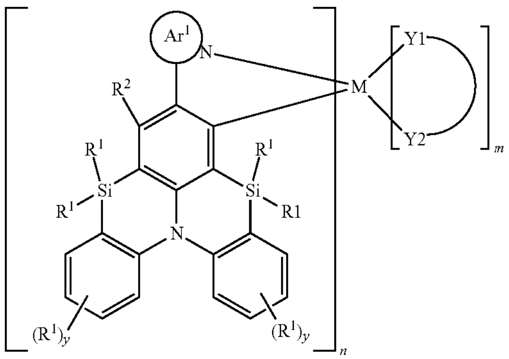
(I-28)
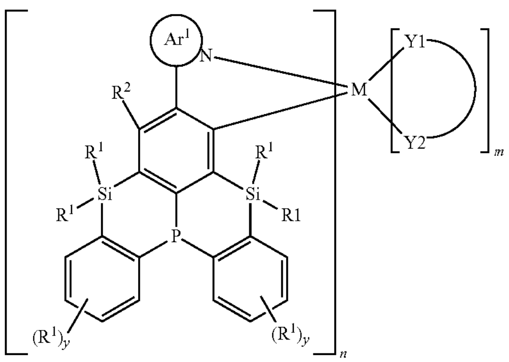
(I-29)
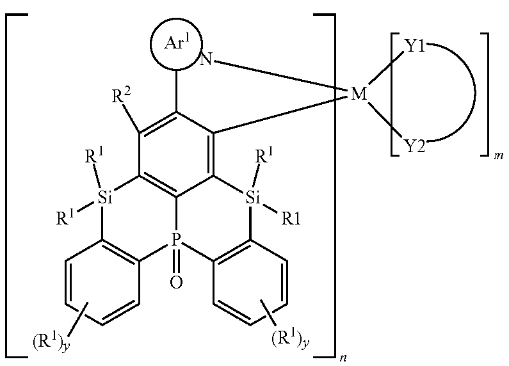
(I-30)
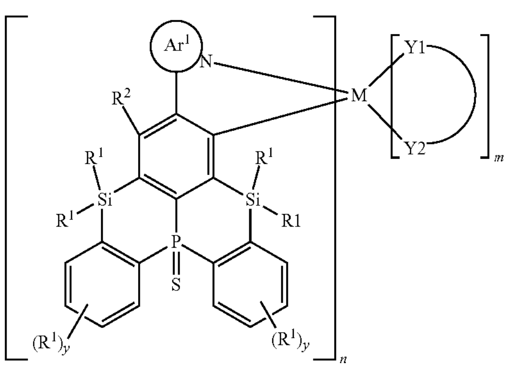
-continued
(I-31)
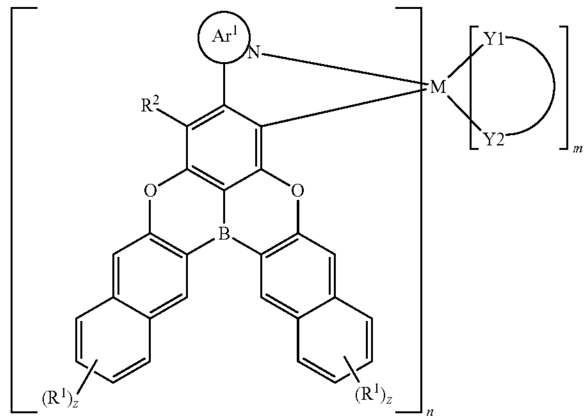
(I-32)
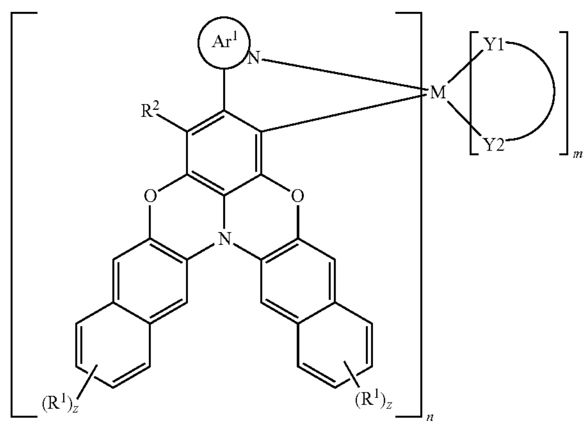
(I-33)
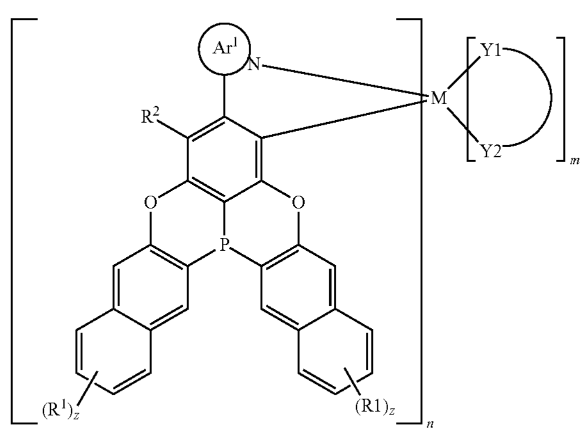

-continued
(I-34)
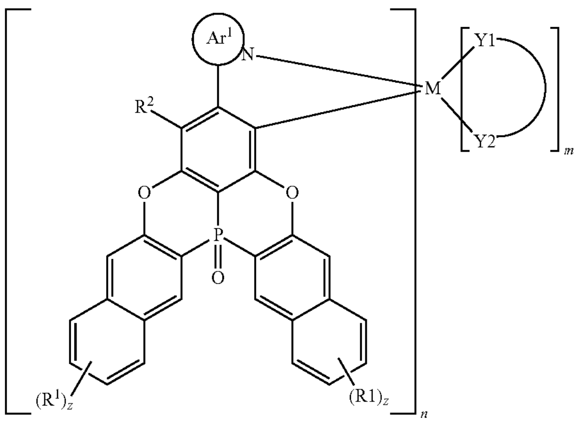
(I-35)
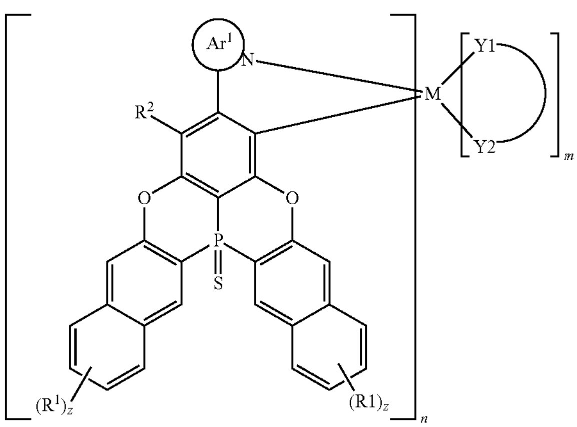
(I-36)
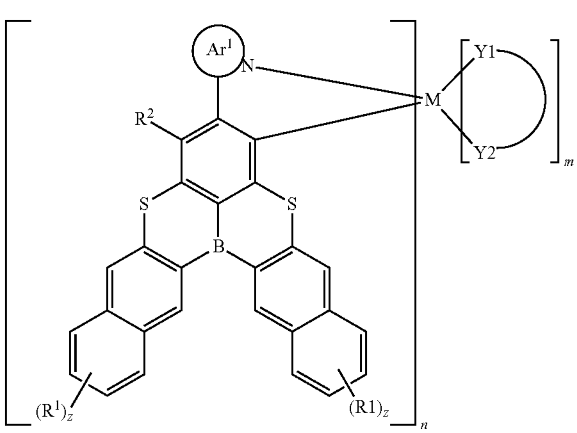
-continued
(I-37)
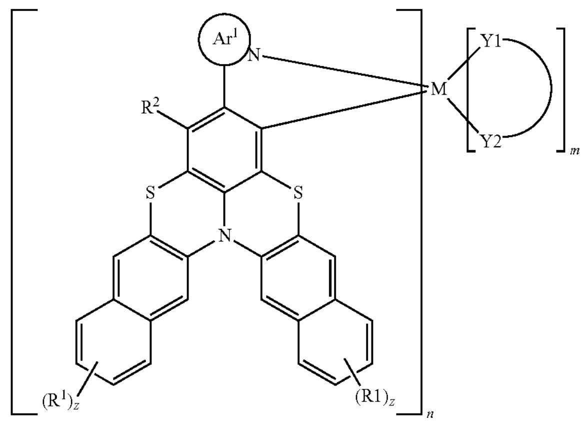
(I-38)
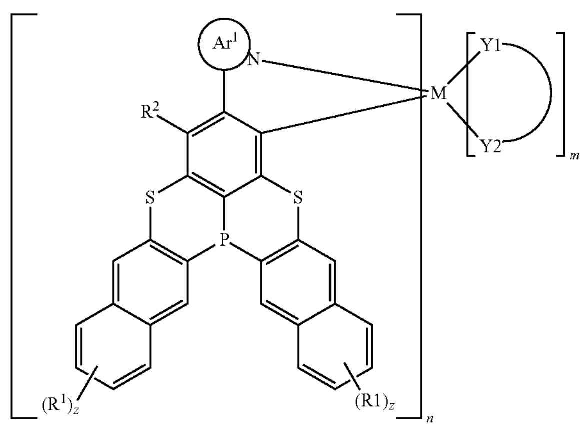
(I-39)
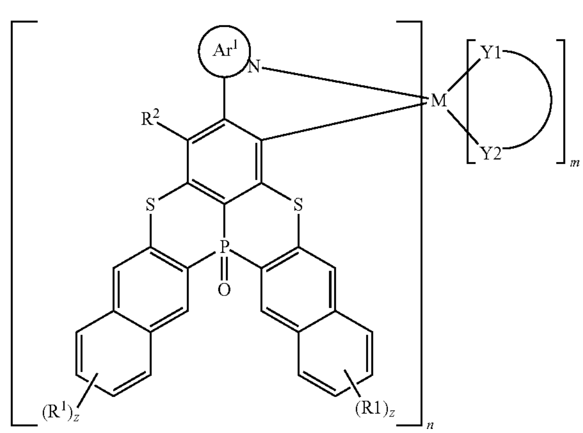

-continued
(I-40)
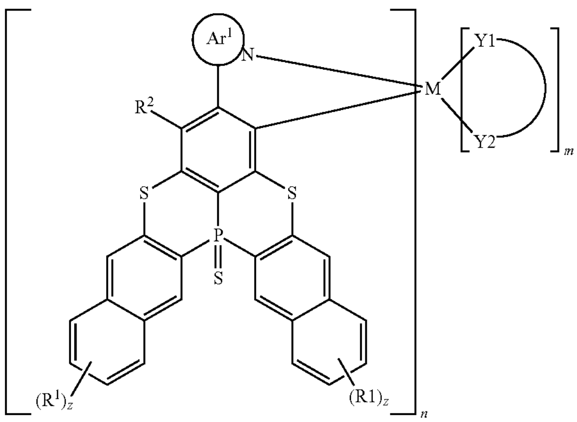
(I-41)
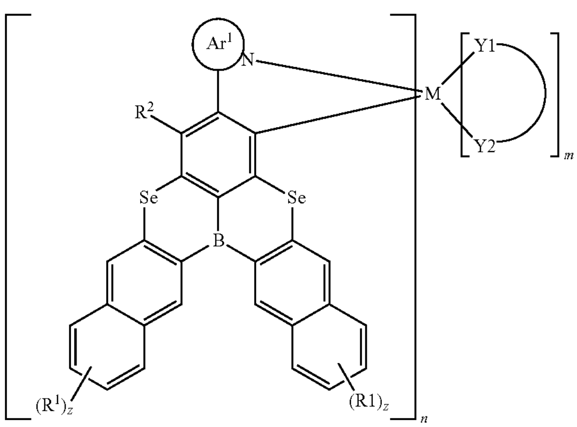
(I-42)
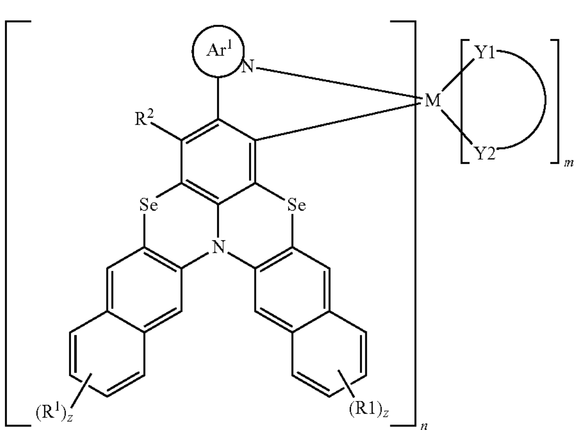
-continued
(I-43)
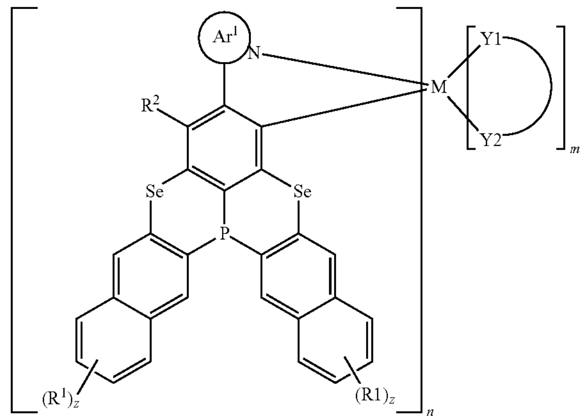
(I-44)
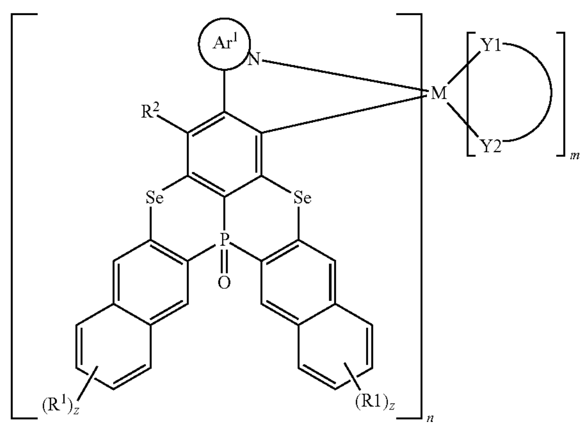
(I-45)
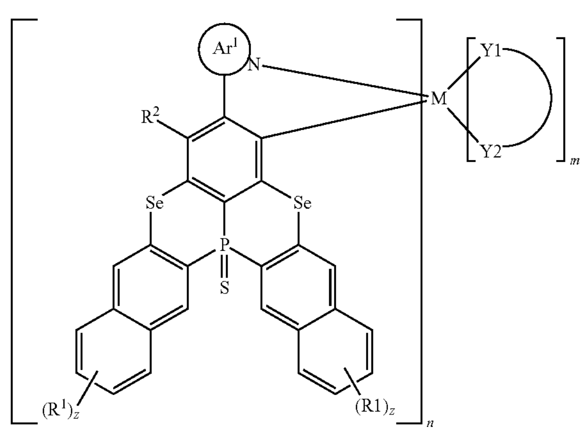

-continued
(I-46)
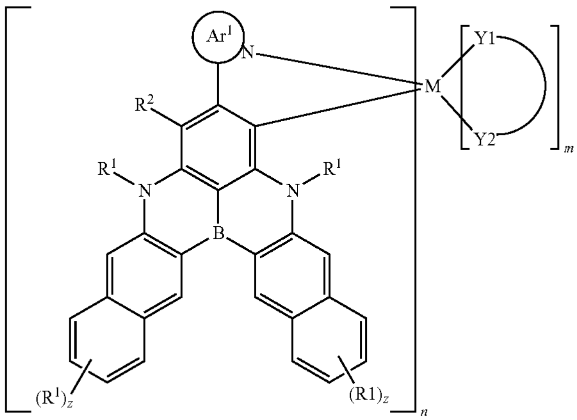
(I-47)
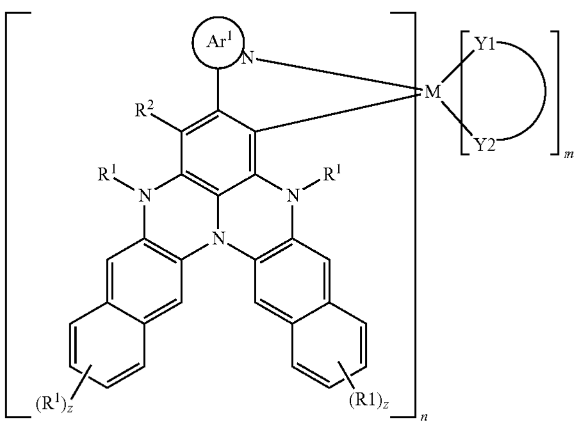
(I-48)
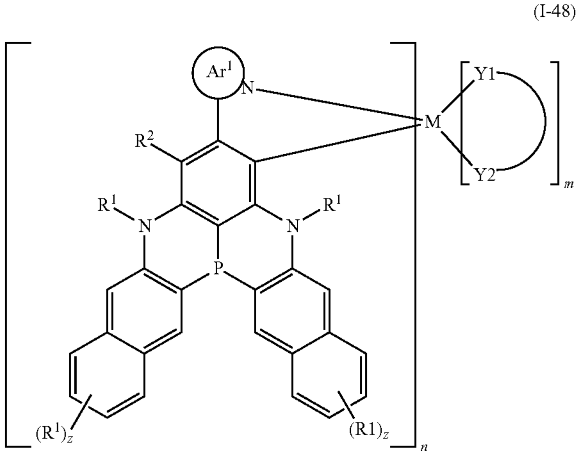
-continued
(I-49)
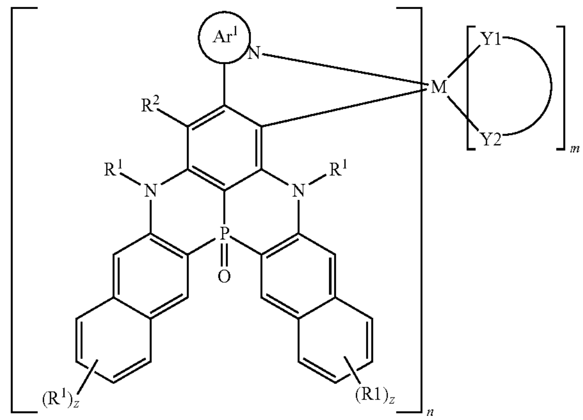
(I-50)
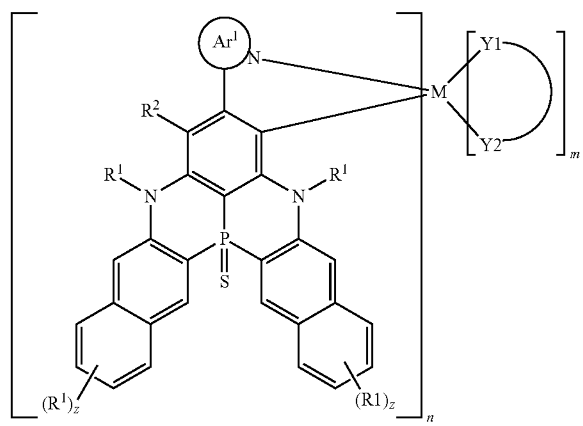
(I-51)
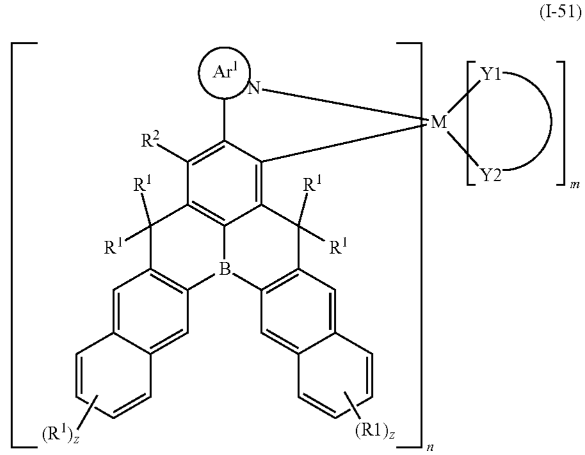

-continued
(I-52)
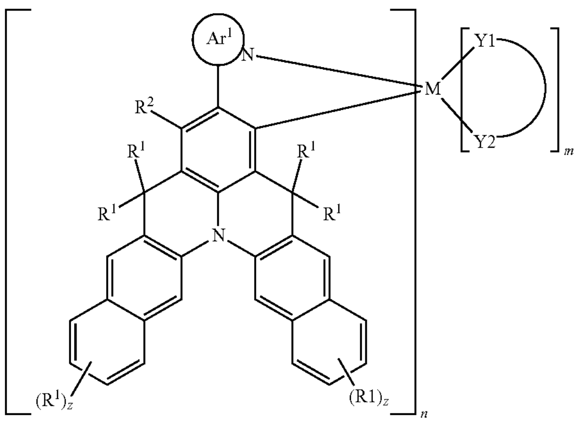
(I-53)
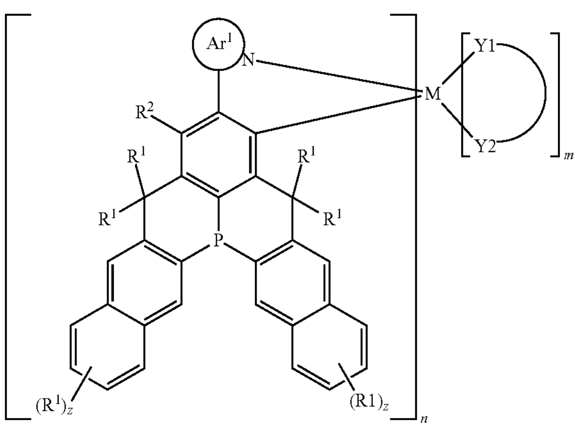
(I-54)
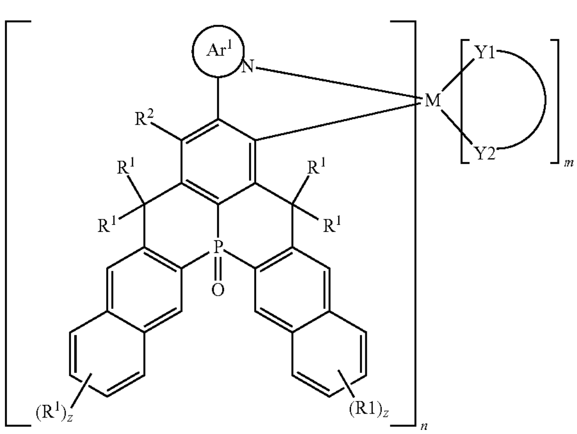
-continued
(I-55)
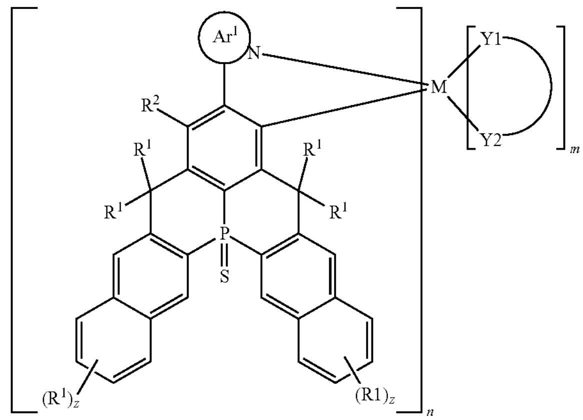
(I-56)
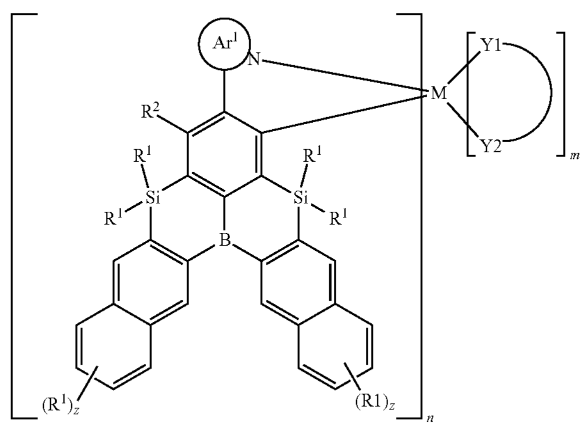
(I-57)
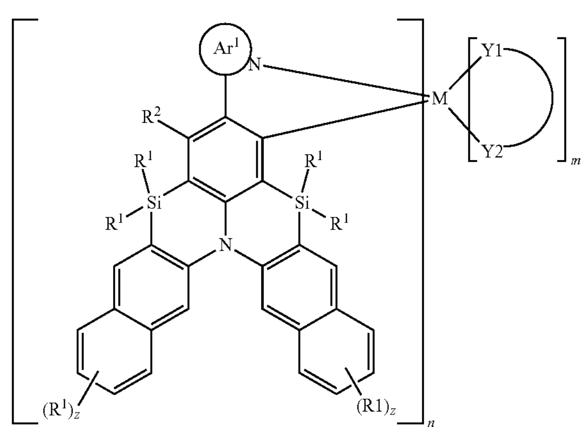

-continued
(I-58)
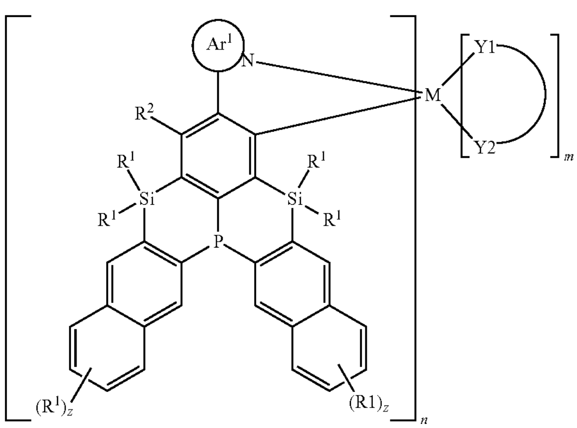
(I-59)
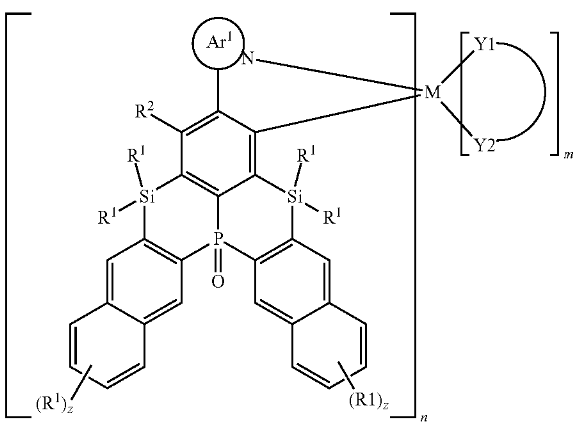
(I-60)
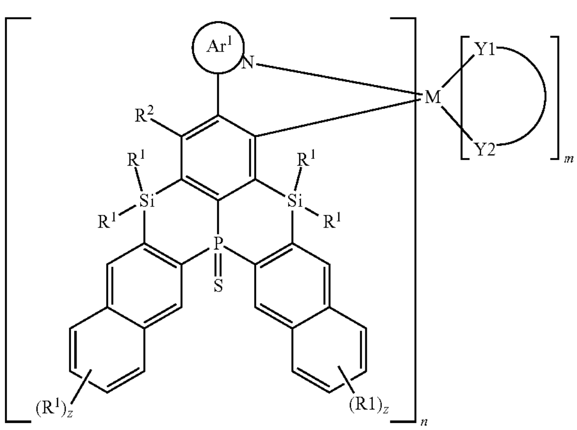
wherein $Ar^1$, $R^1$, $R^2$, M,
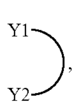
m and n are defined as above, y represents an integer from 0 to 4, and z represents an integer from 0 to 6.
In some embodiments, the organometallic complex is selected from the compounds represented by the following general formulas:
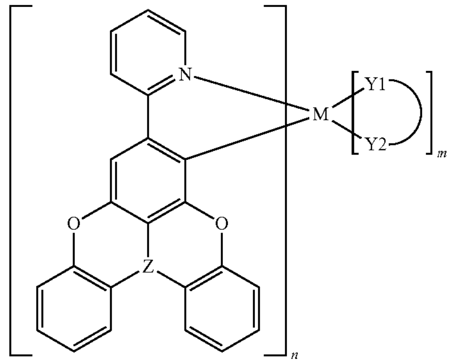
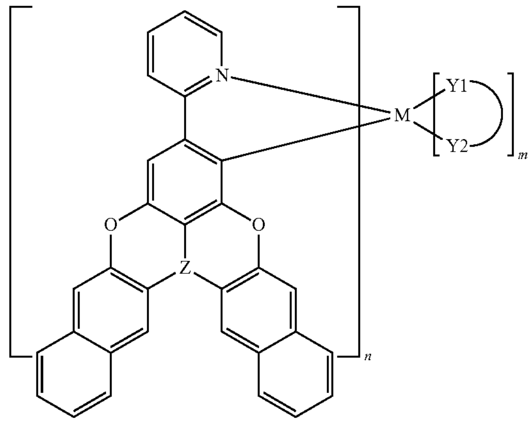
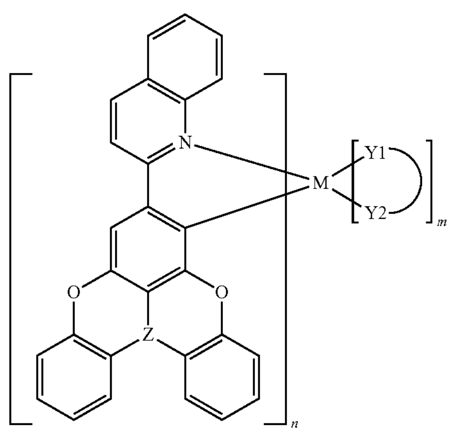
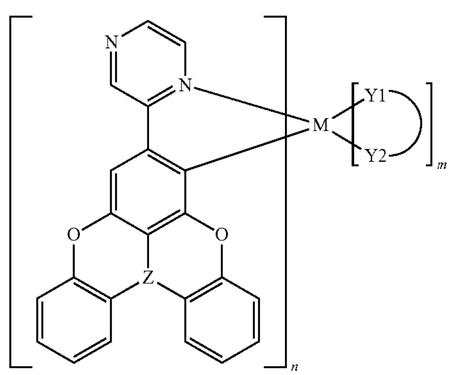
wherein, Z is B or N;

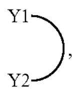
m and n are defined as above.
Examples of the organometallic complex according to the present disclosure are listed below, but are not limited to the following structures:
(101)
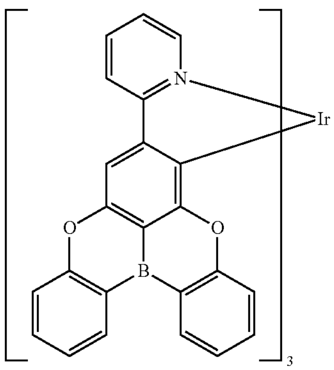
(102)
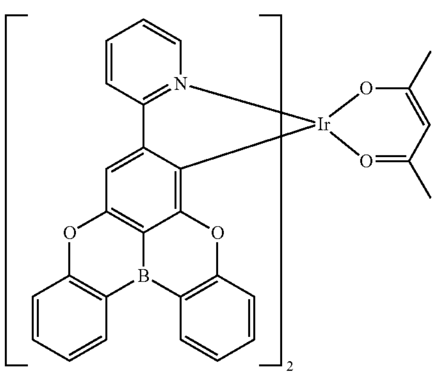
(103)
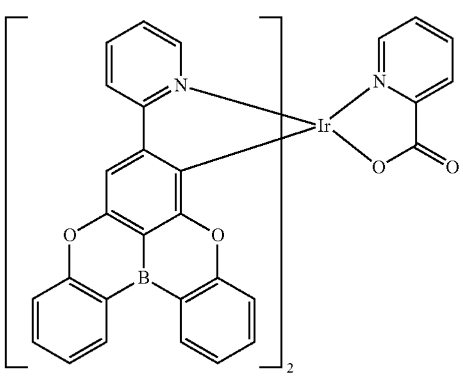
-continued
(104)
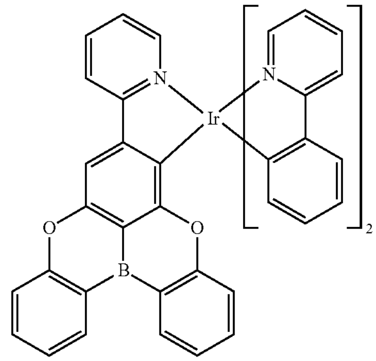
(105)
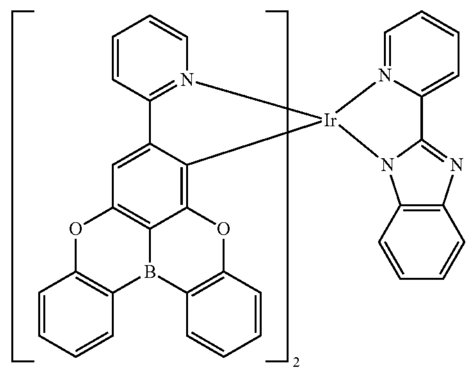
(106)
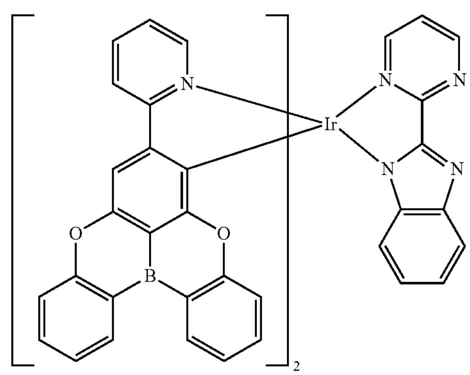
(107)
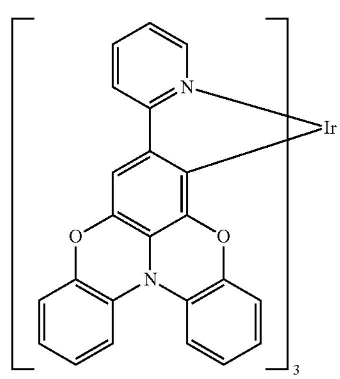

-continued
(108)
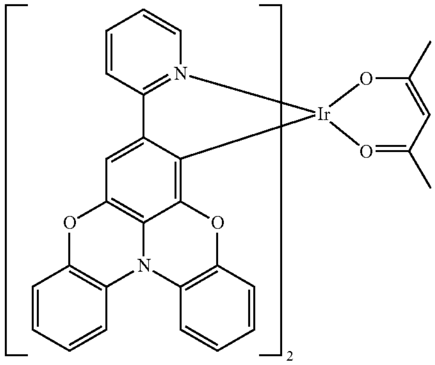
(109)
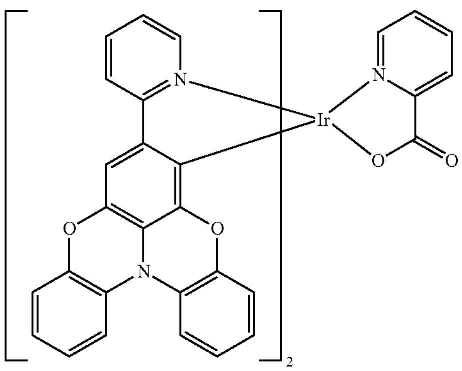
(110)
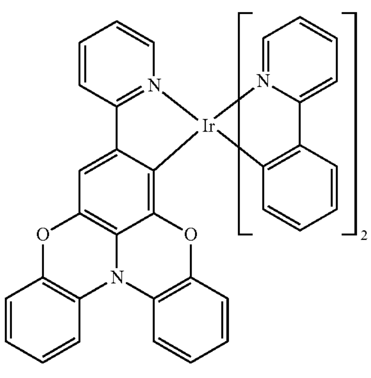
(111)
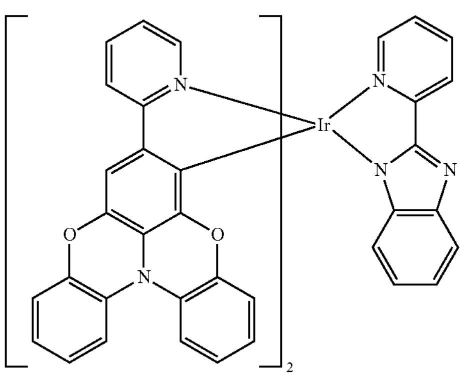
-continued
(112)
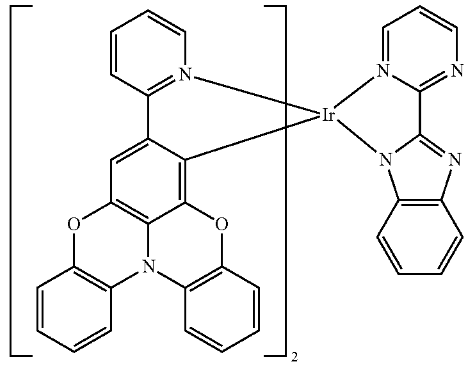
(113)
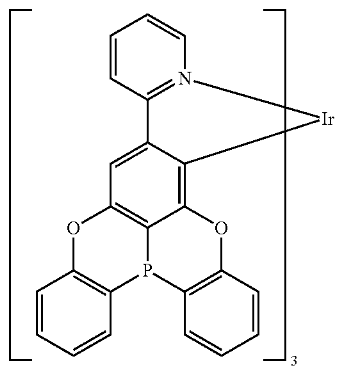
(114)
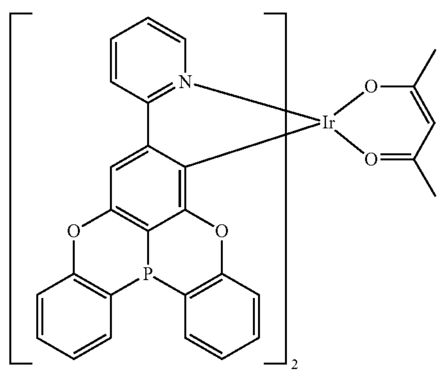
(115)
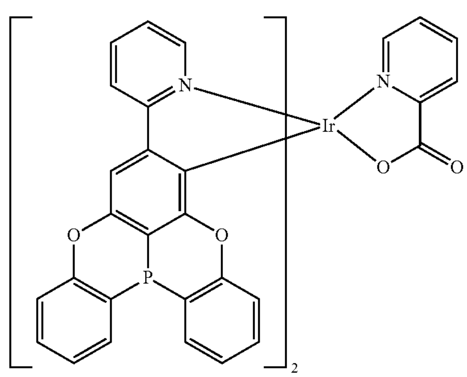

-continued
(116)
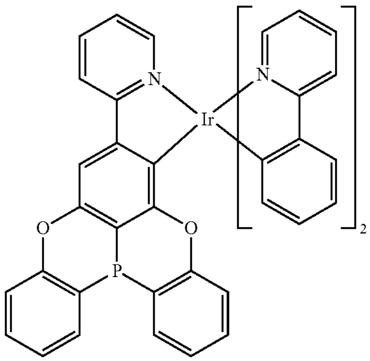
(117)
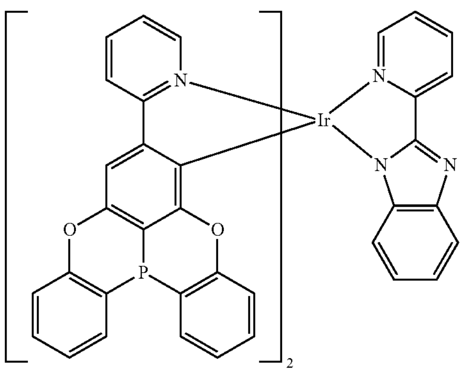
(118)
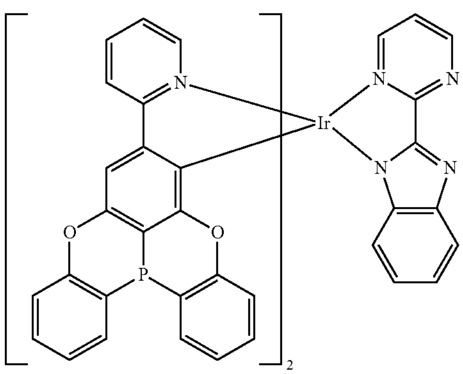
(119)
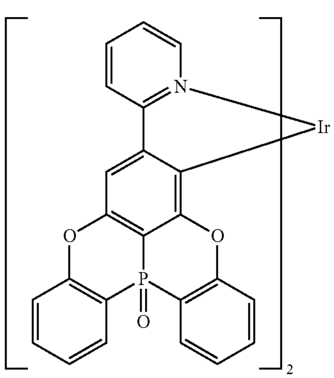
-continued
(120)
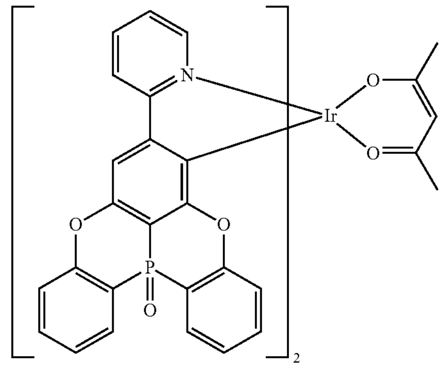
(121)
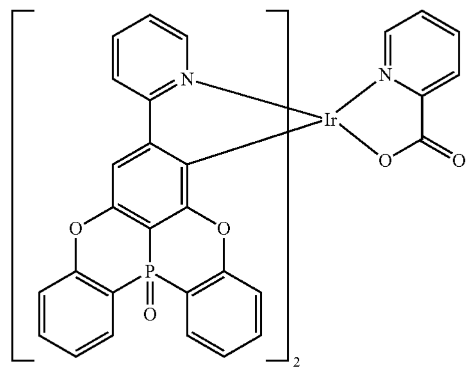
(122)
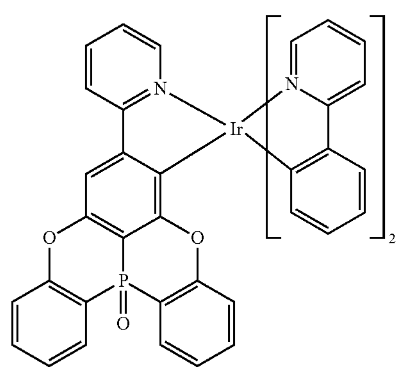
(123)
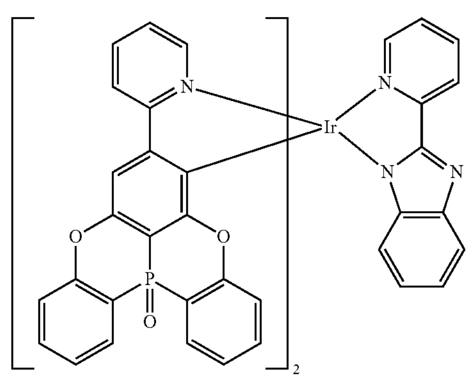

-continued
(124)
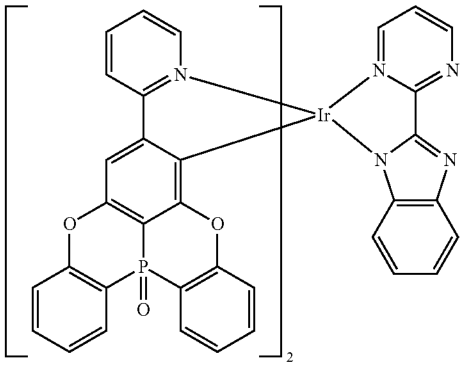
(125)
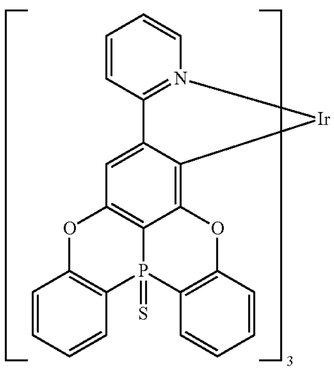
(126)
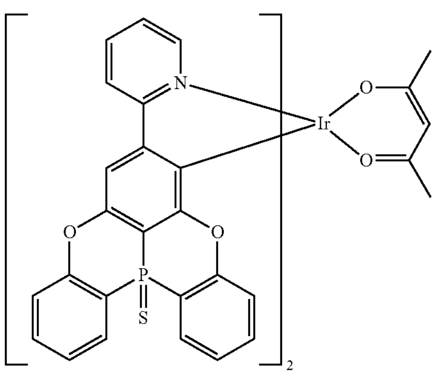
(127)
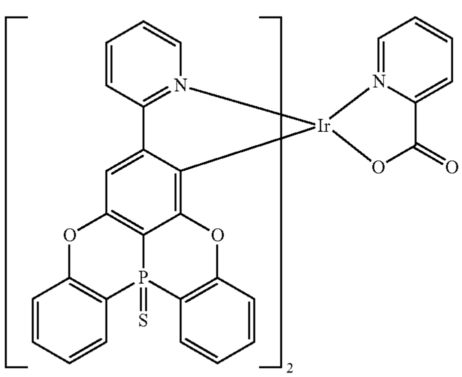
-continued
(128)
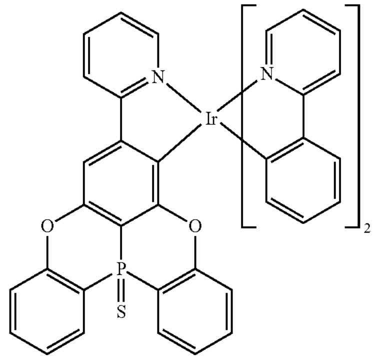
(129)
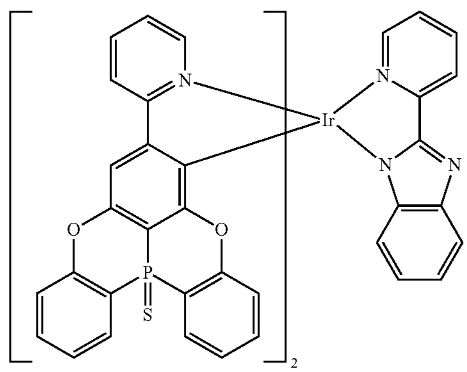
(130)
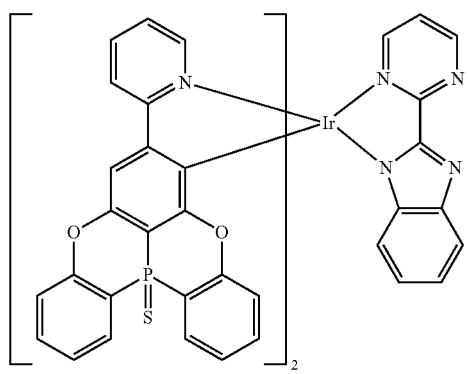
(131)
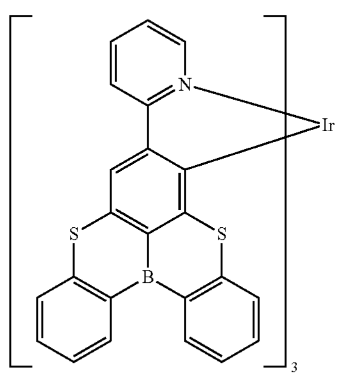

(132)
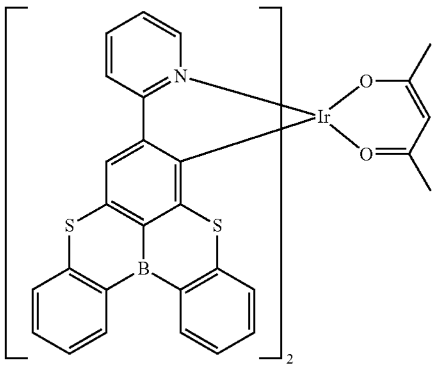
(133)
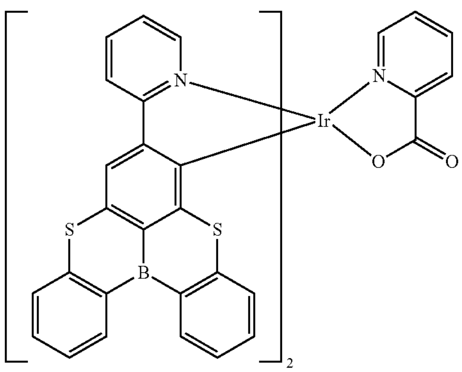
(134)
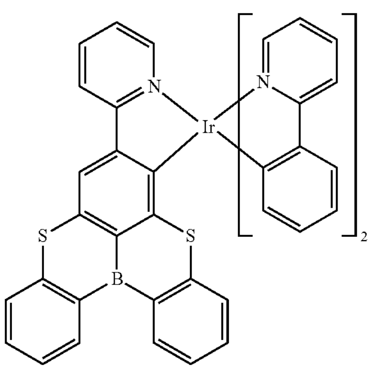
(135)
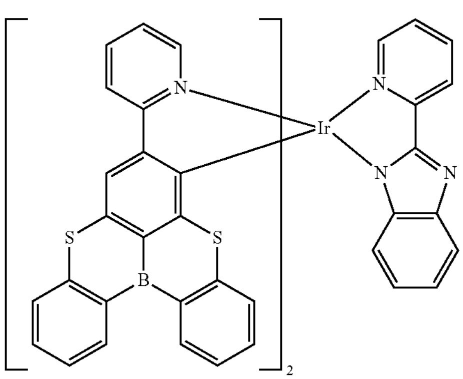
(136)
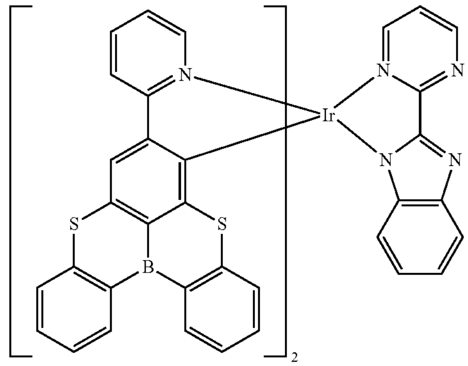
(137)
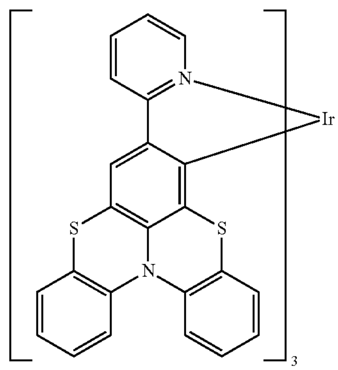
(138)
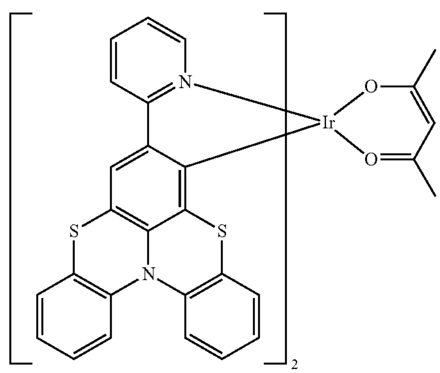
(139)
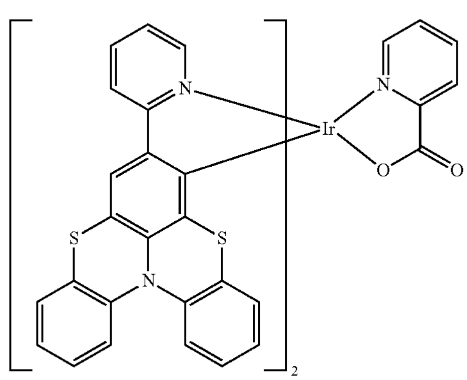

-continued
(140)
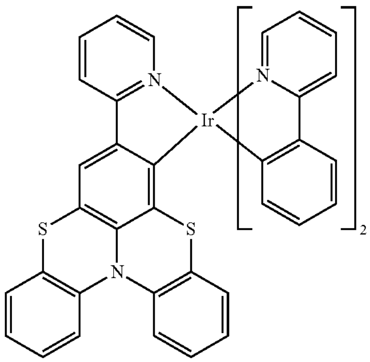
(141)
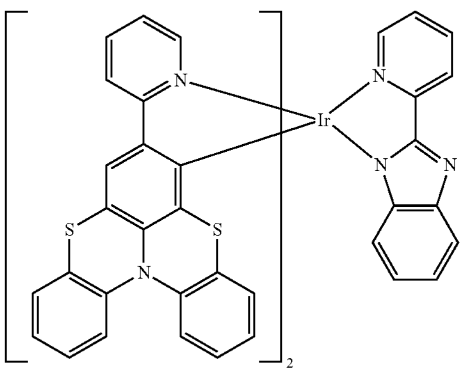
(142)
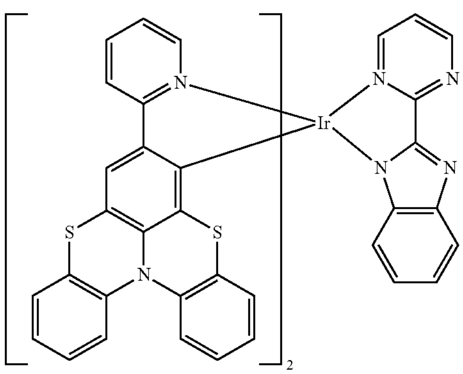
(143)
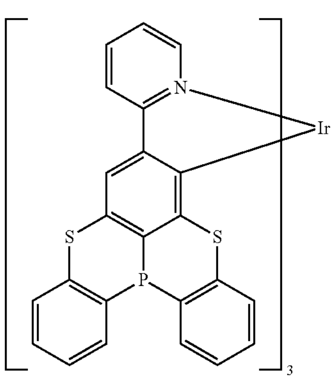
-continued
(144)
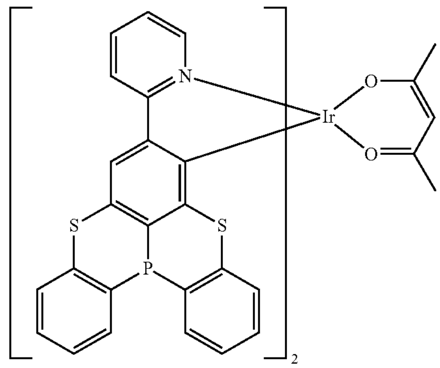
(145)
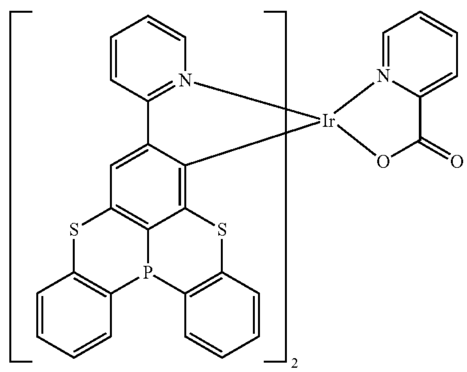
(146)
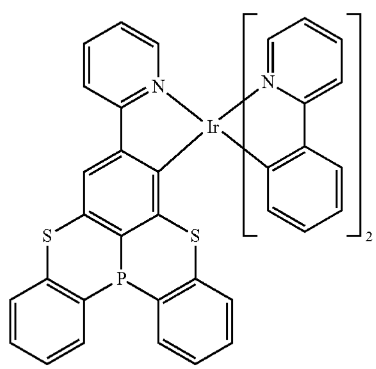
(147)
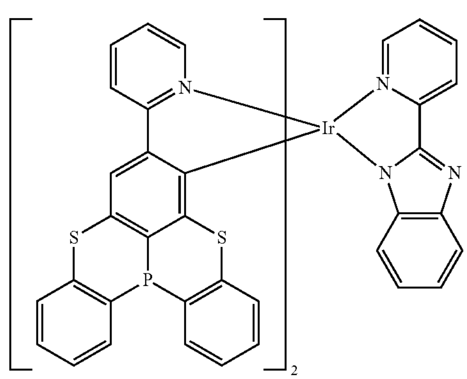

(148)
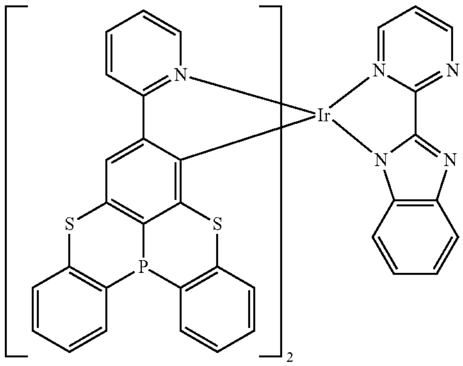
(149)
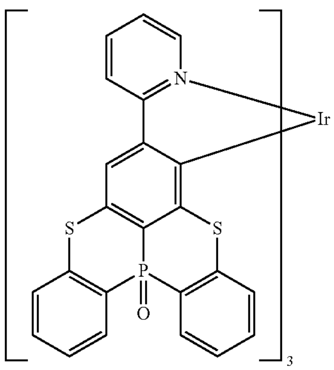
(150)
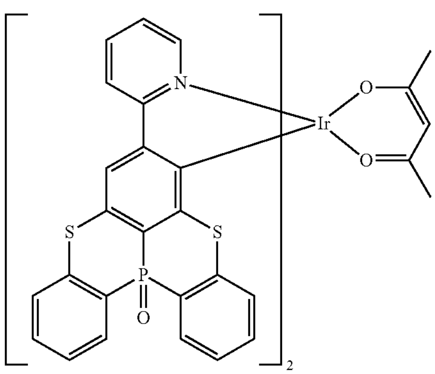
(151)
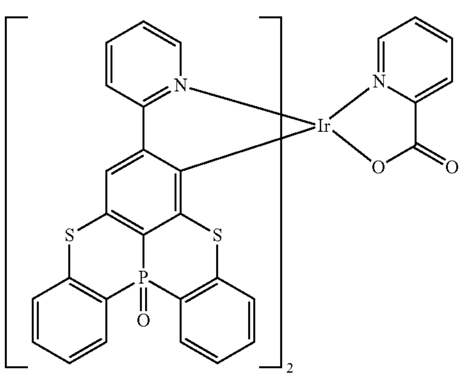
(152)
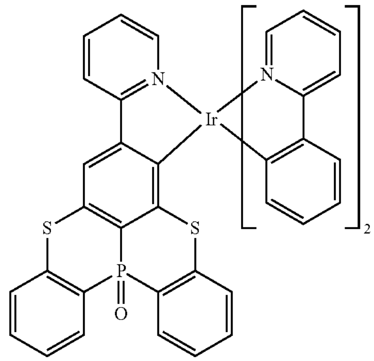
(153)
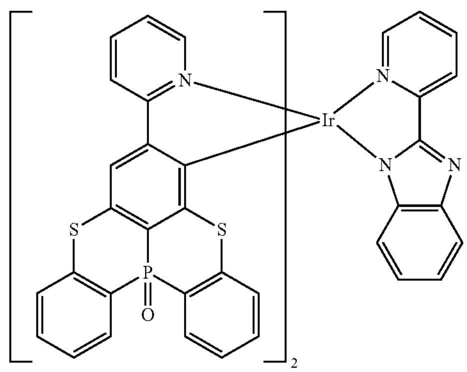
(154)
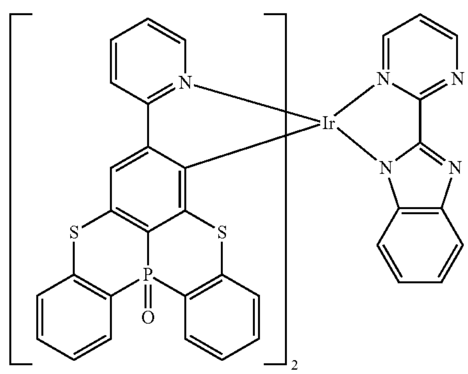
(155)
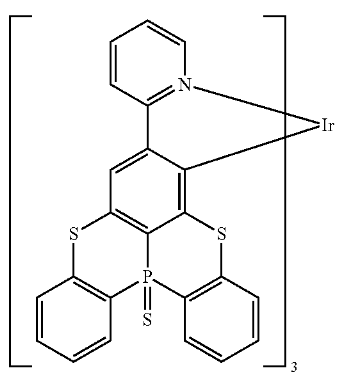

-continued
(156)
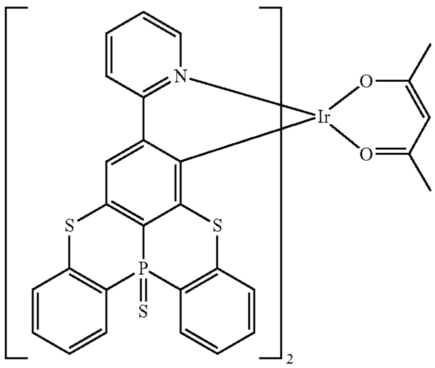
(157)
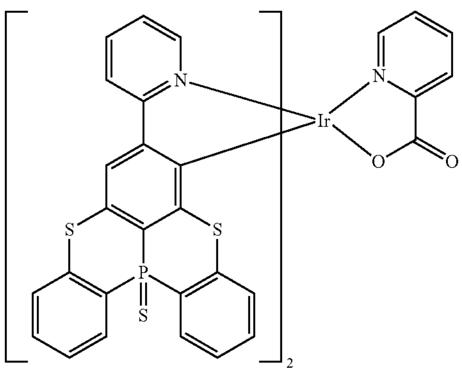
(158)
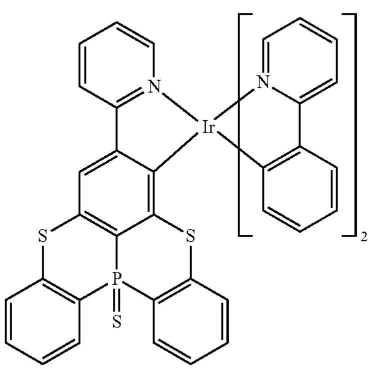
(159)
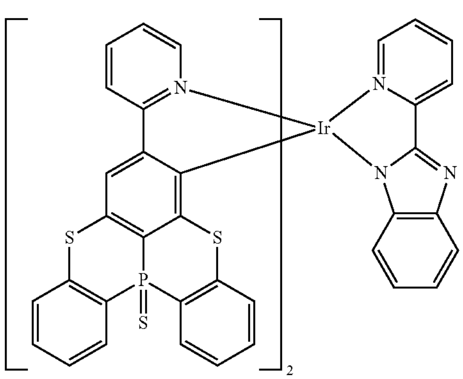
-continued
(160)
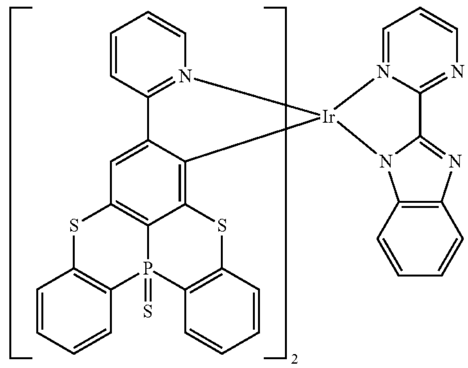
(161)
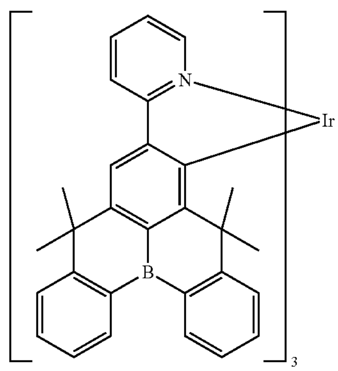
(162)
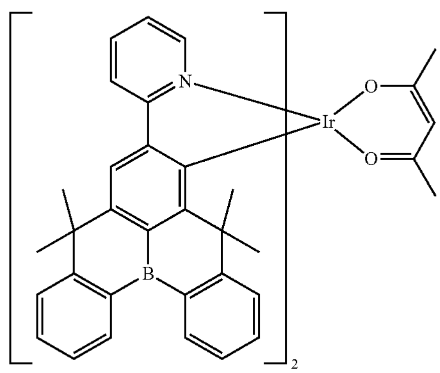
(163)
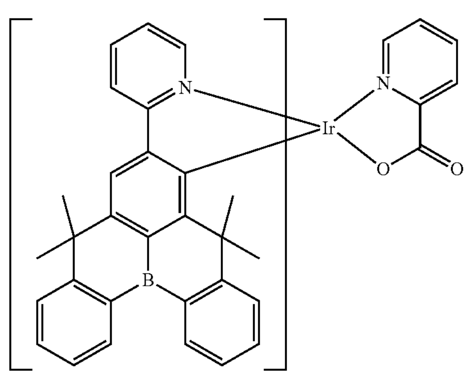

(164)
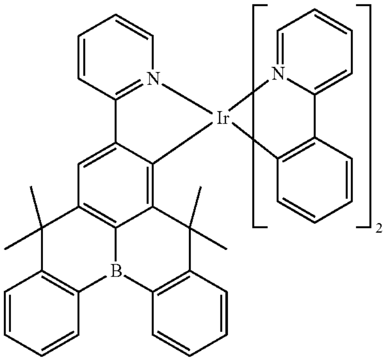
(165)
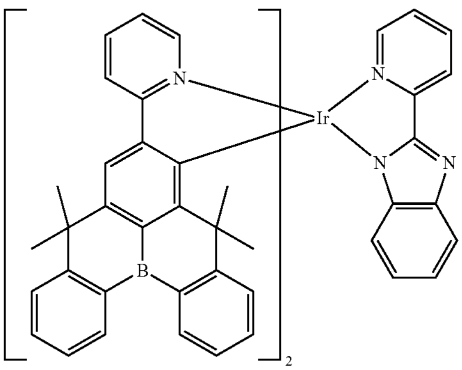
(166)
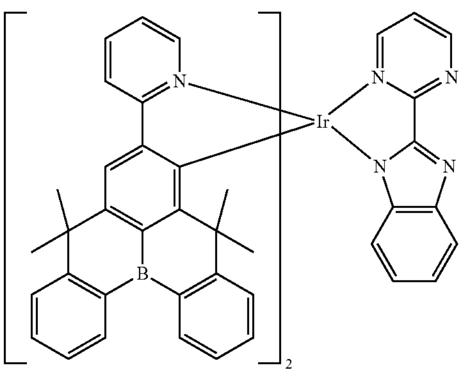
(167)
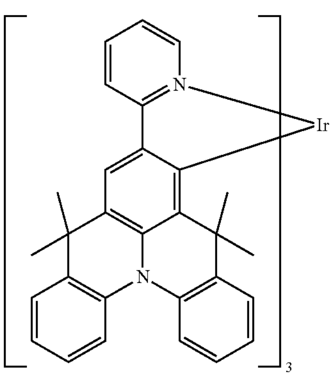
(168)
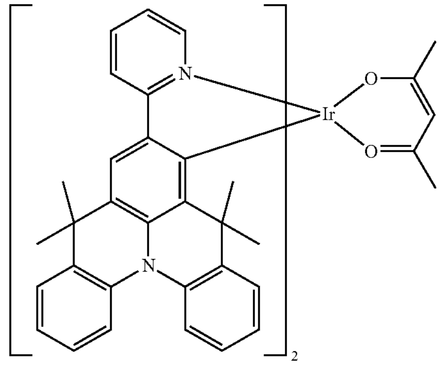
(169)
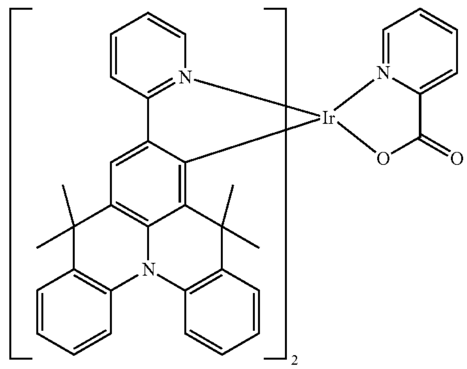
(170)
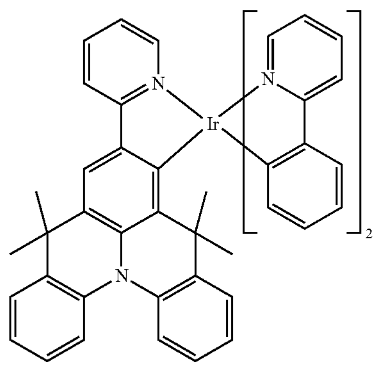
(171)
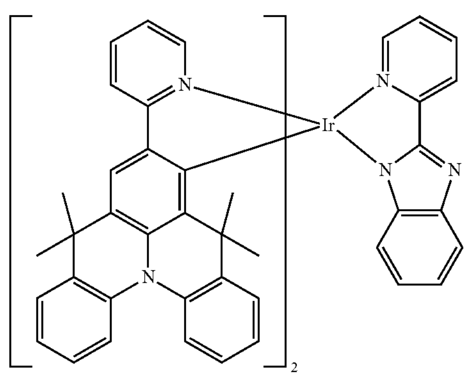

-continued
(172)
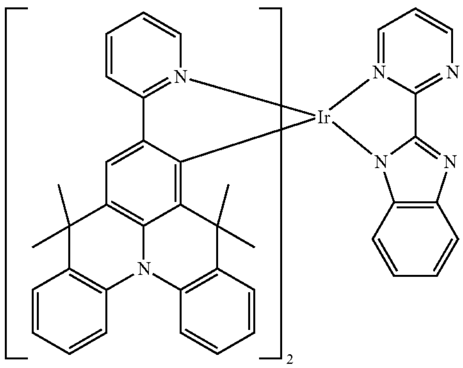
(173)
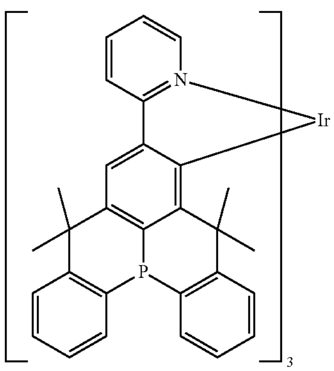
(174)
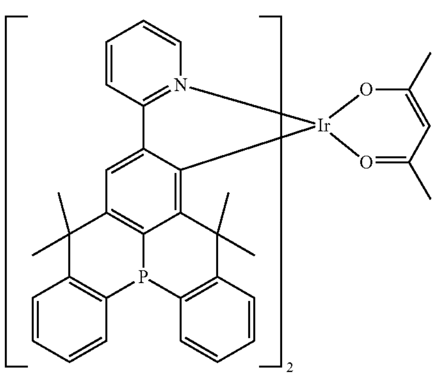
(175)
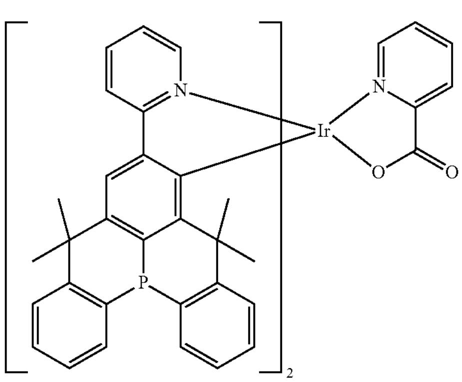
-continued
(176)
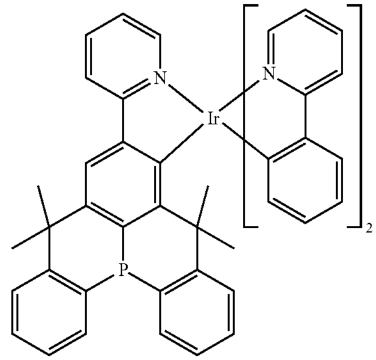
(177)
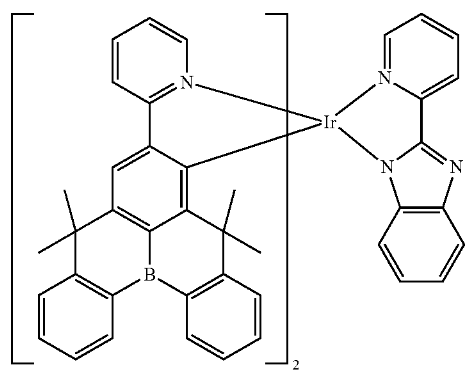
(178)
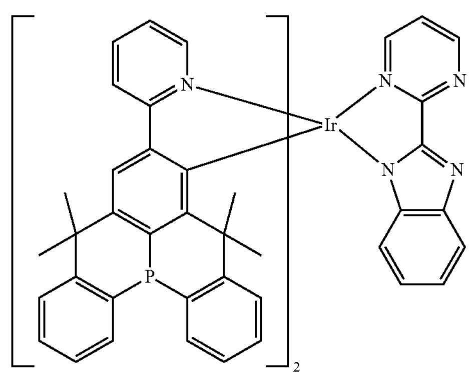
(179)
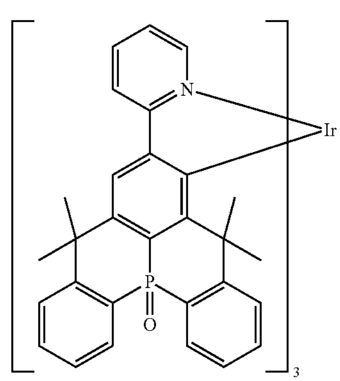

-continued
(180)
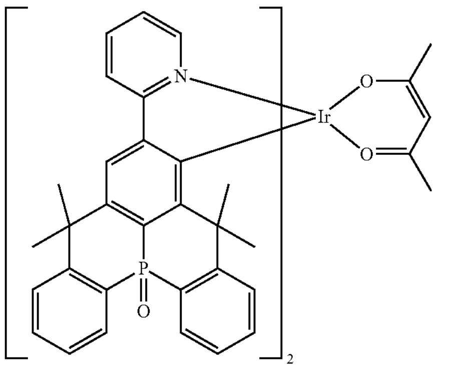
(181)
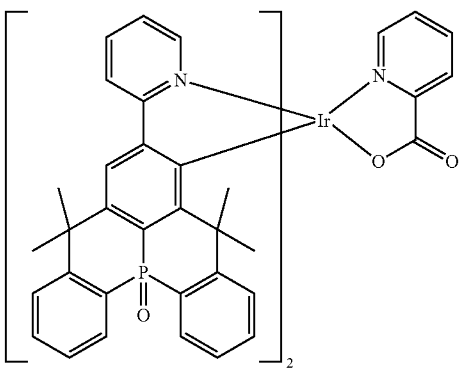
(182)
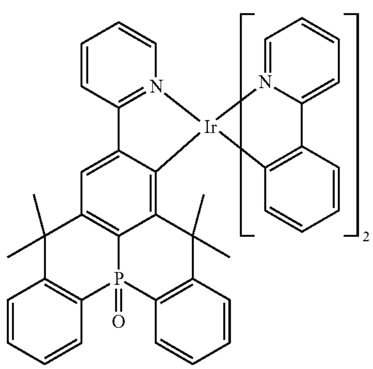
(183)
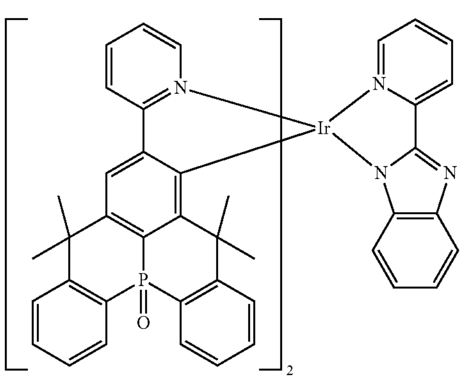
-continued
(184)
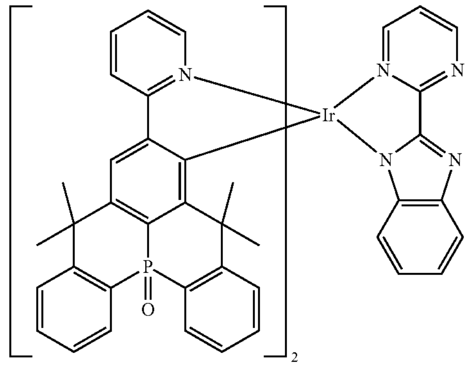
(185)
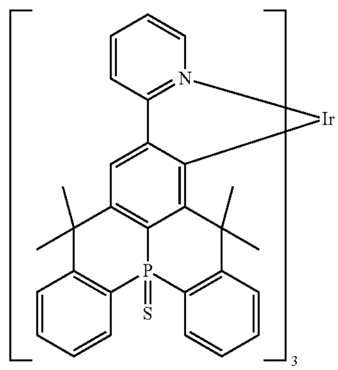
(186)
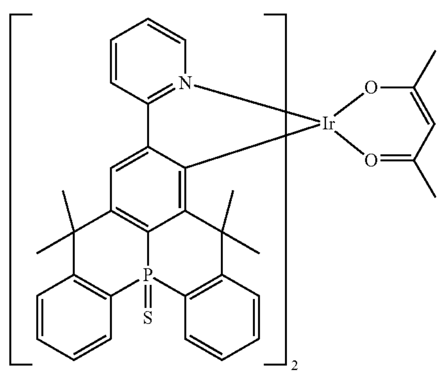
(187)
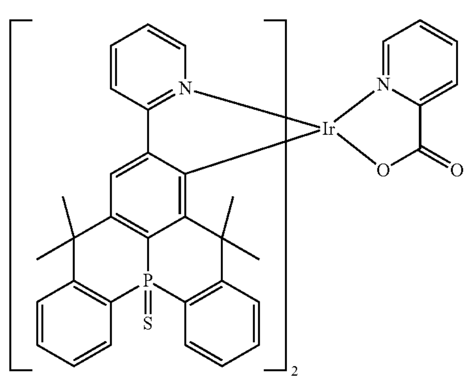

-continued
(188)
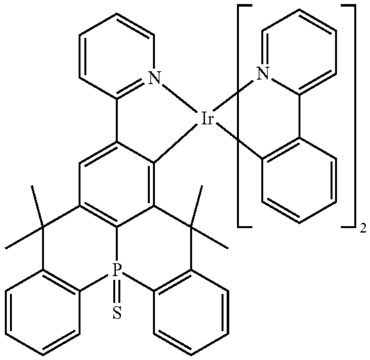
(189)
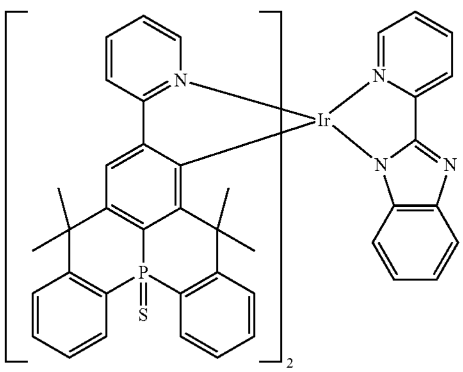
(190)
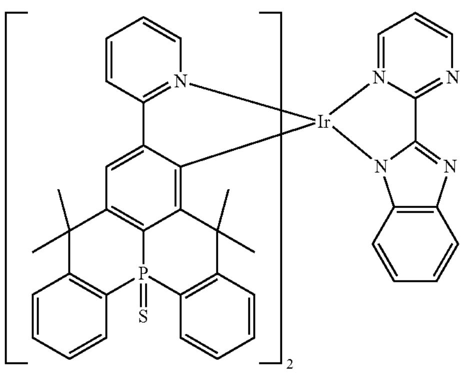
(191)
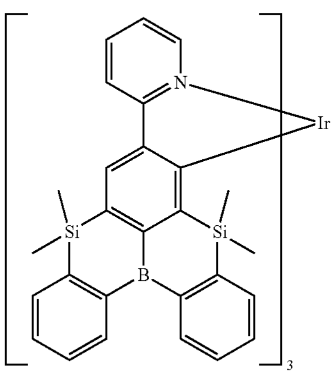
-continued
(192)
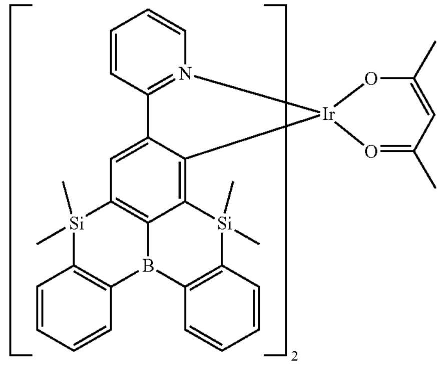
(193)
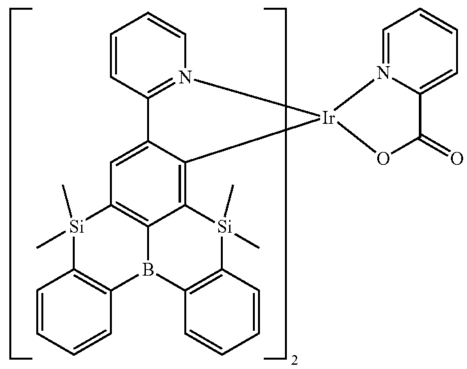
(194)
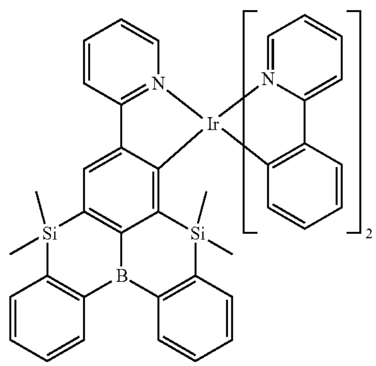
(195)
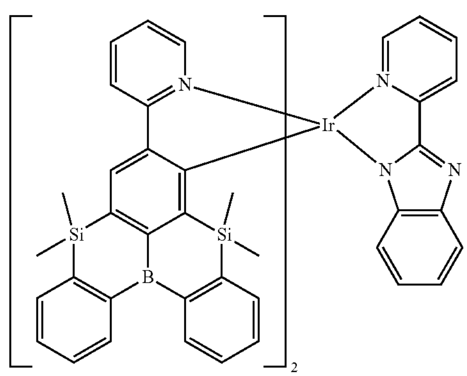

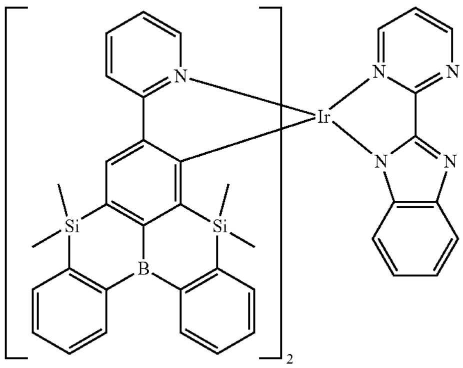
(196)
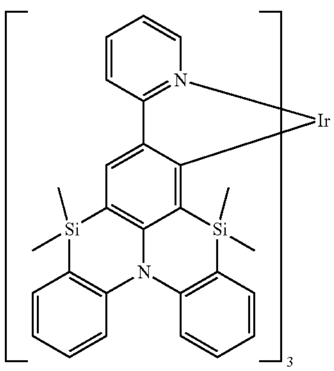
(197)
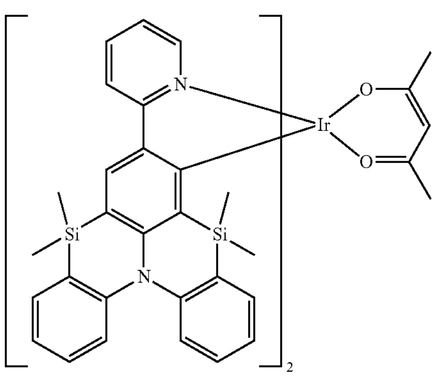
(198)
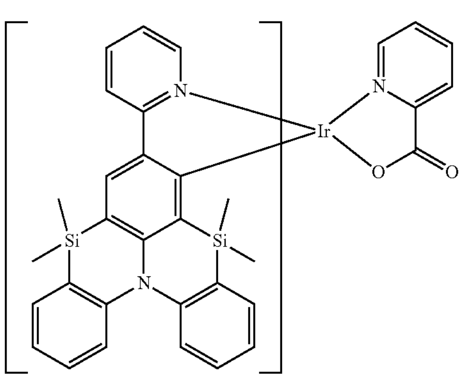
(199)
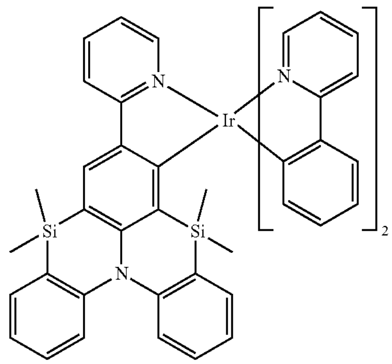
(200)
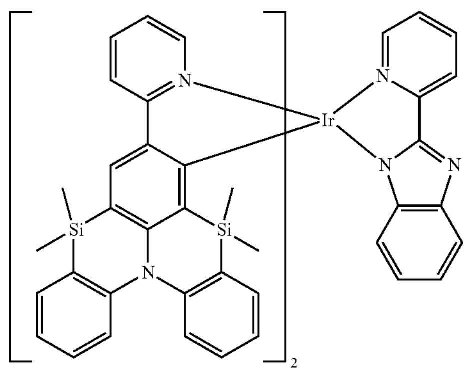
(201)
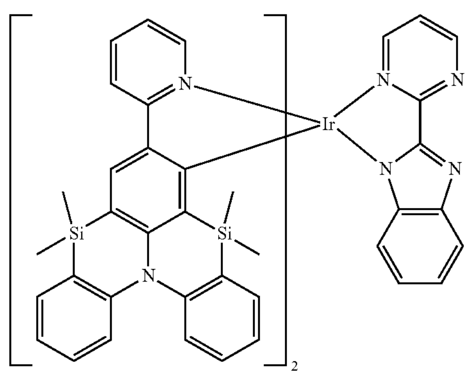
(202)
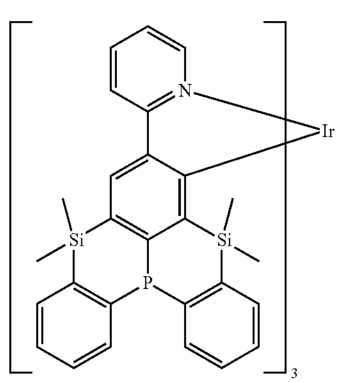
(203)

-continued
(204)
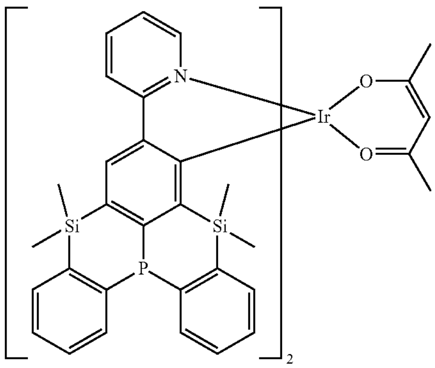
(205)
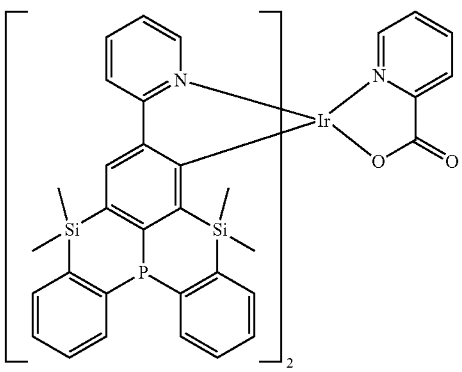
(206)
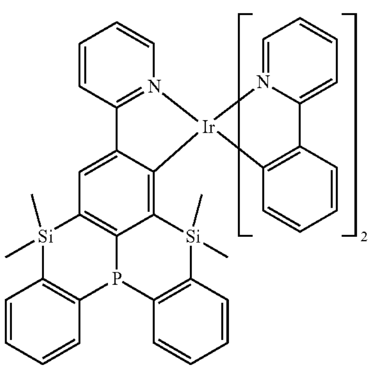
(207)
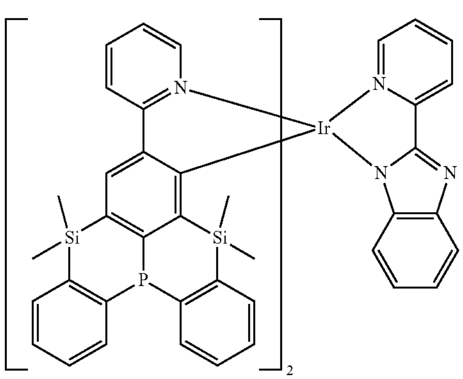
-continued
(208)
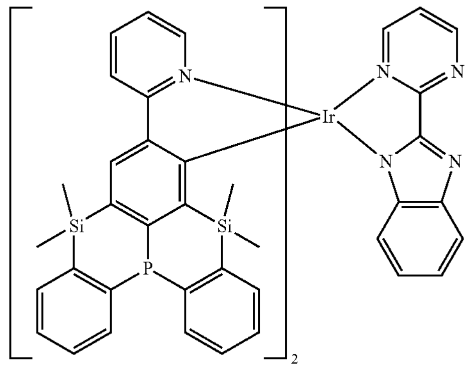
(209)
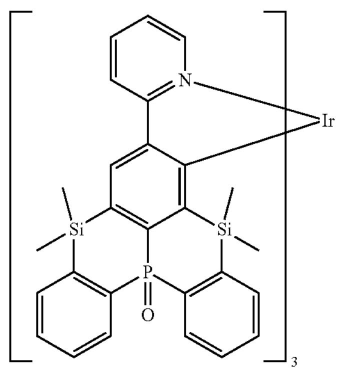
(210)
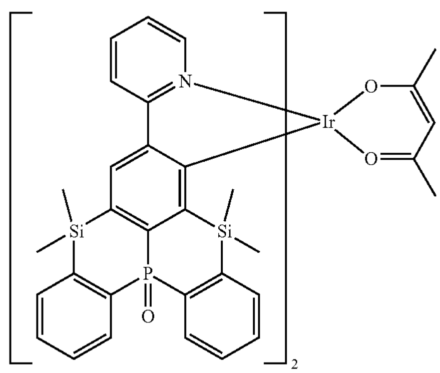
(211)
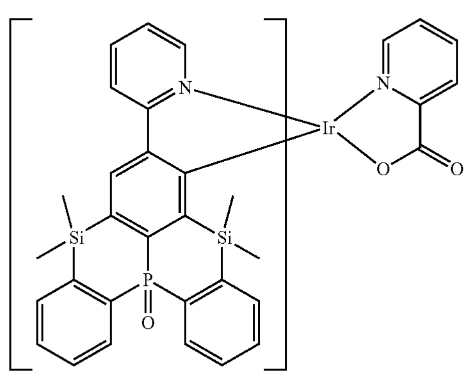

-continued
(212)
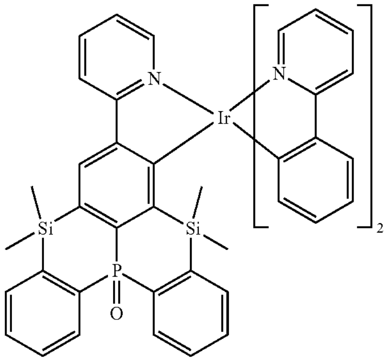
(213)
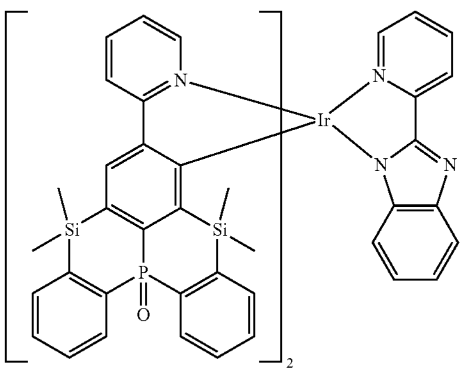
(214)
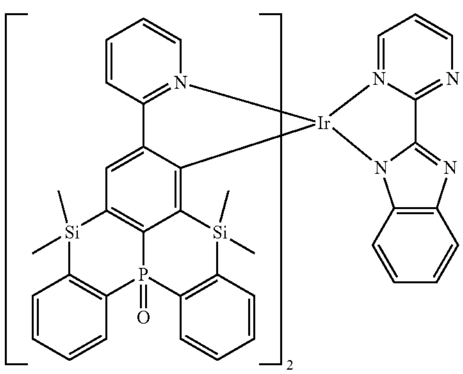
(215)
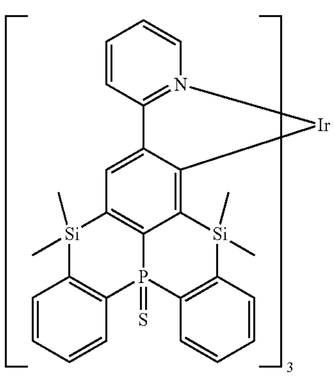
-continued
(216)
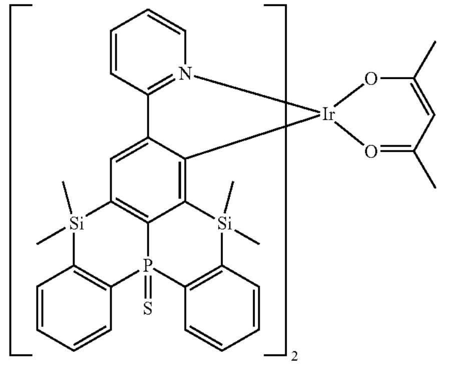
(217)
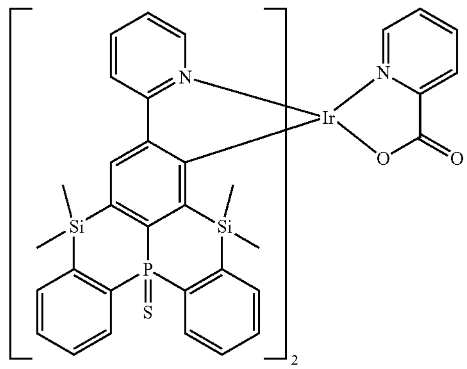
(218)
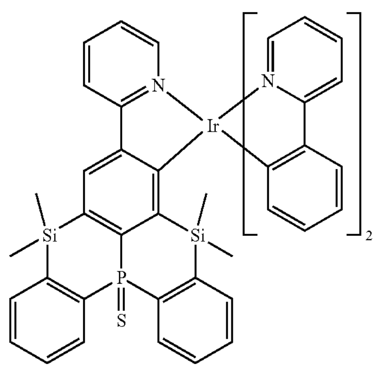
(219)
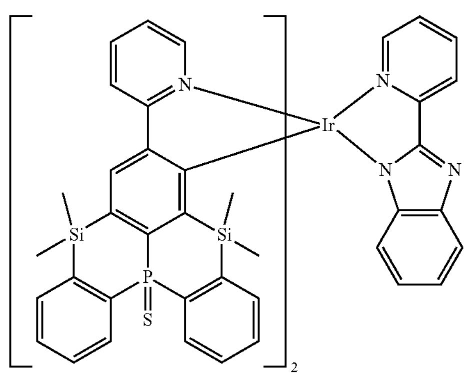

-continued
(220)
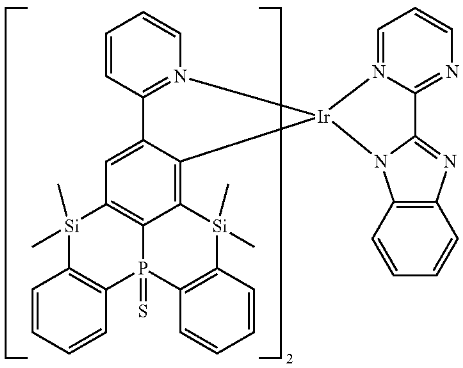
(221)
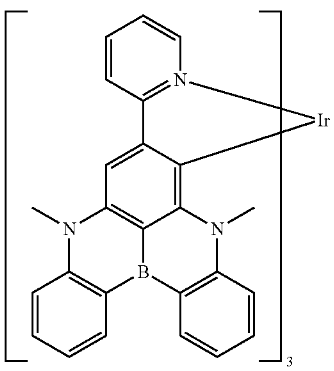
(222)
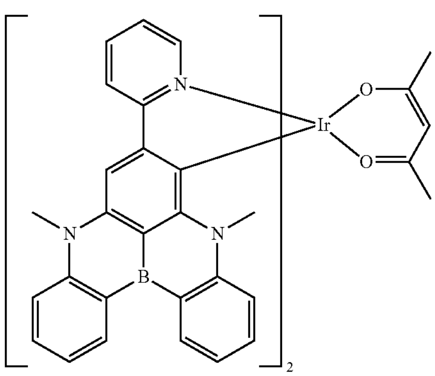
(223)
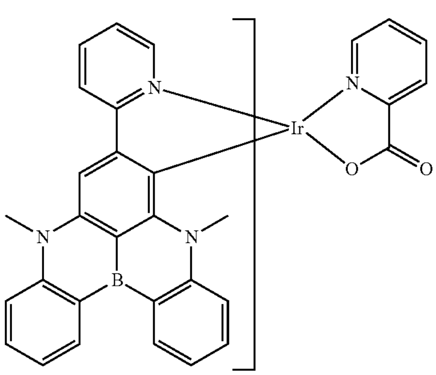
-continued
(224)
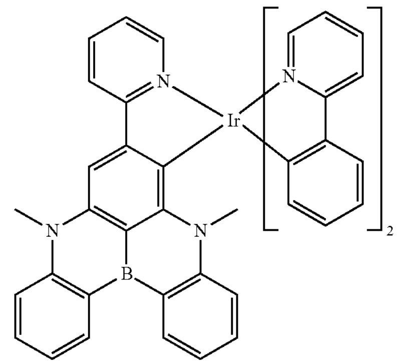
(225)
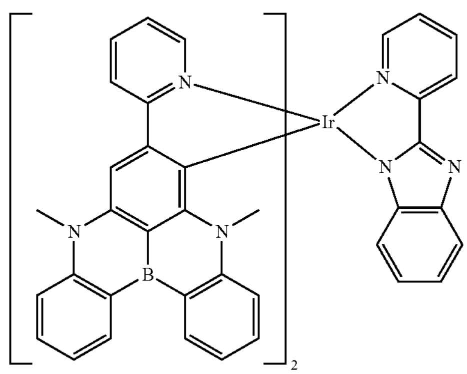
(226)
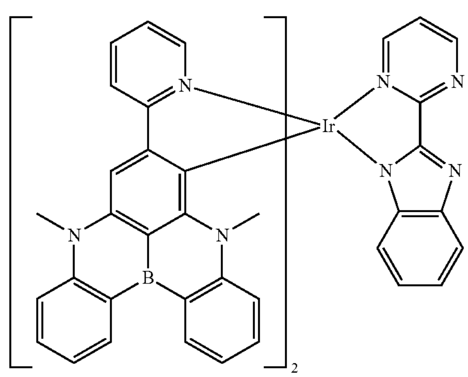
(227)
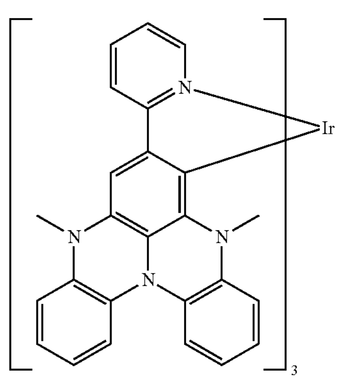

(228)
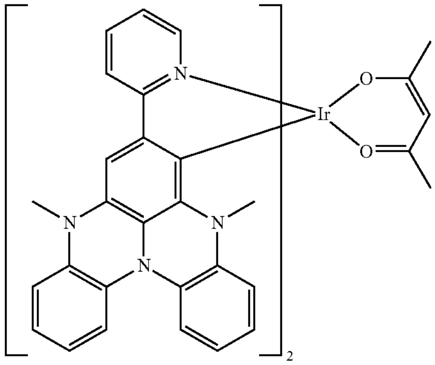
(229)
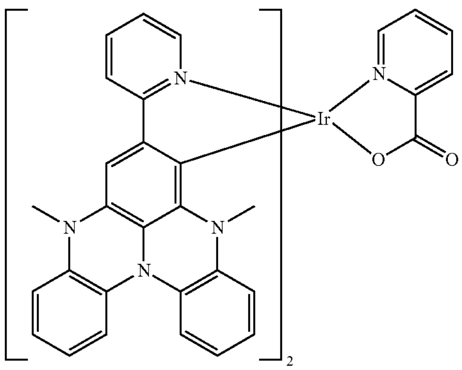
(230)
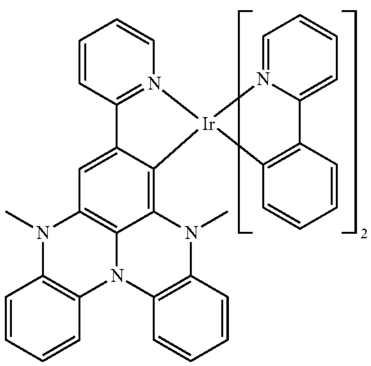
(231)
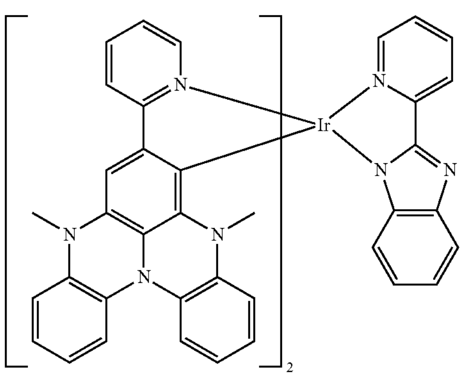
(232)
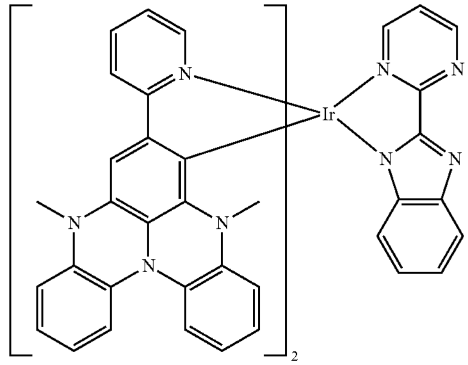
(233)
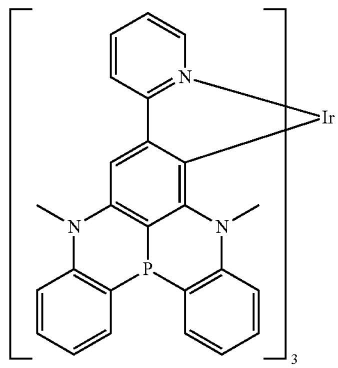
(234)
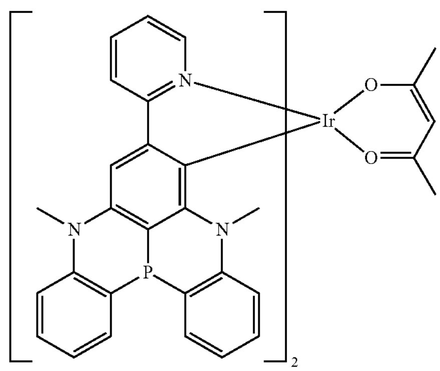
(235)
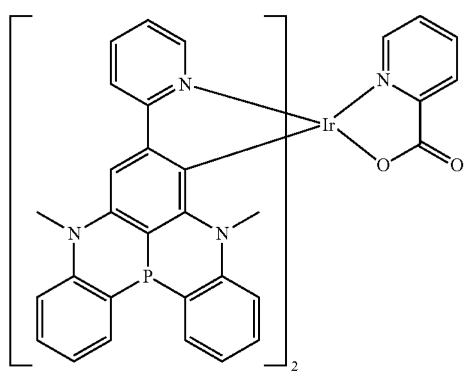

-continued
(236)
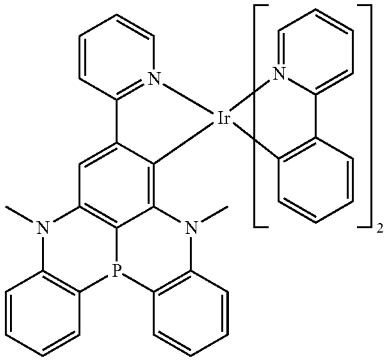
(237)
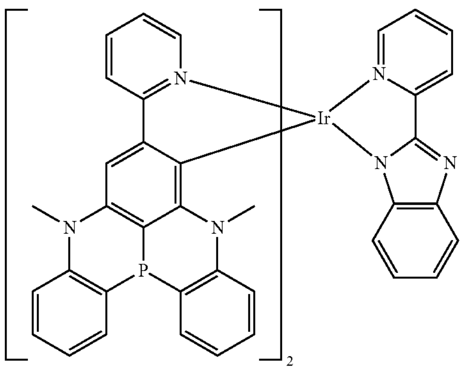
(238)
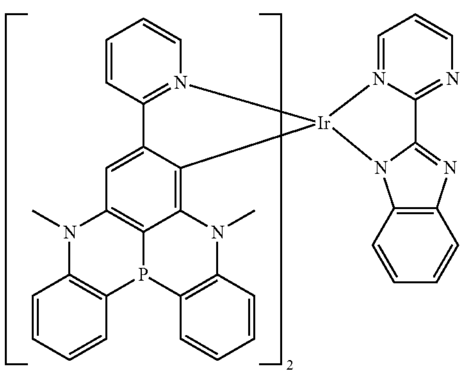
(239)
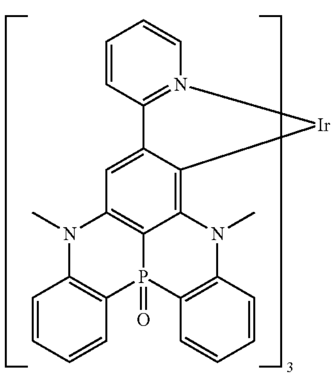
-continued
(240)
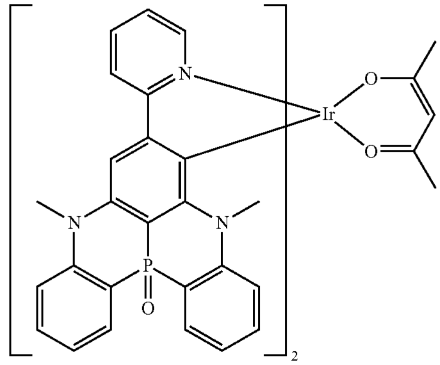
(241)
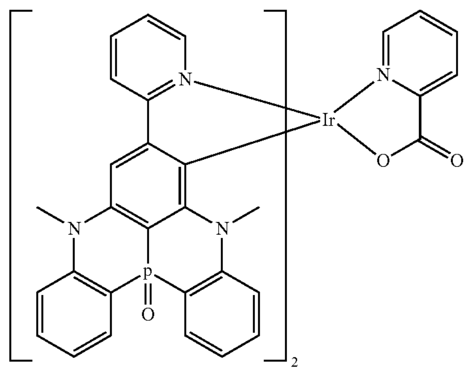
(242)
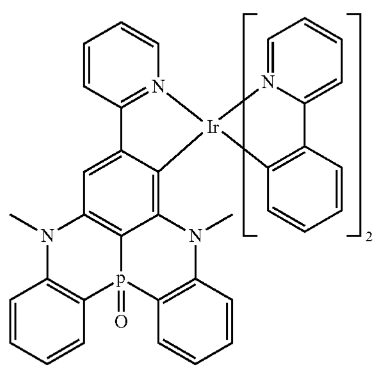
(243)
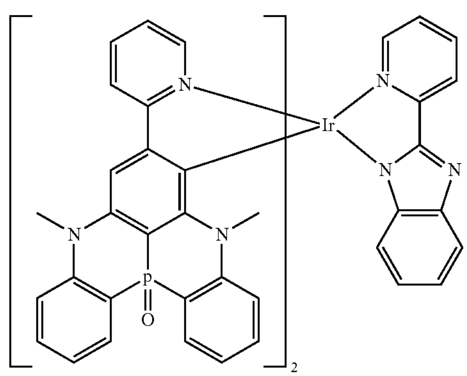

-continued
(244)
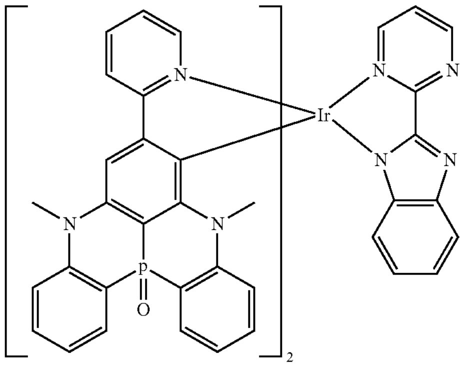
(245)
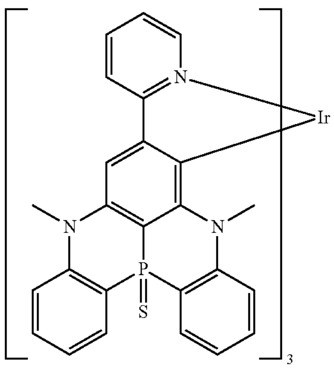
(246)
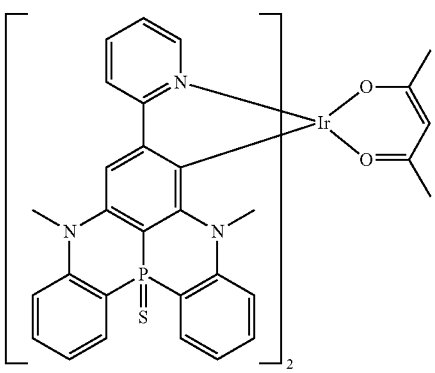
(247)
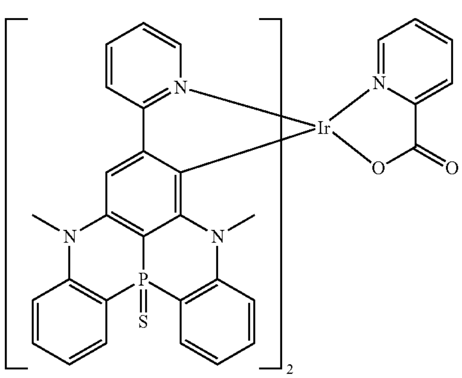
-continued
(248)
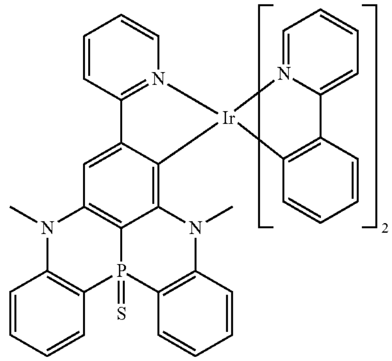
(249)
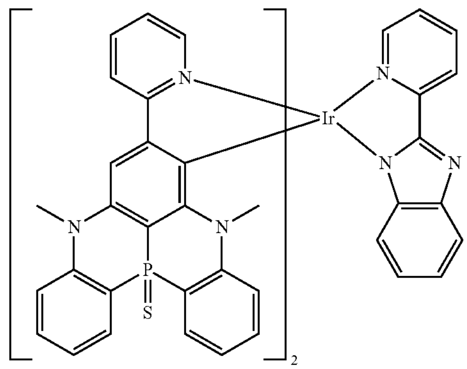
(250)
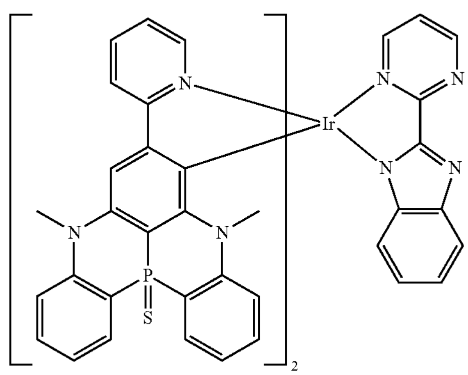
(251)
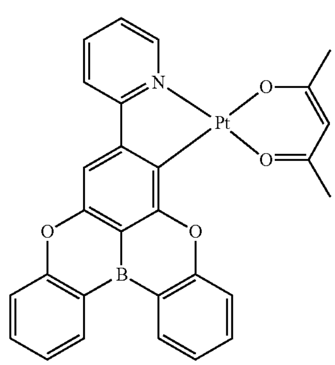

(252)
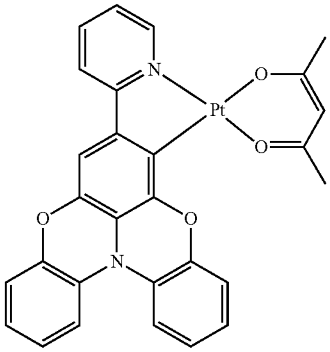
(253)
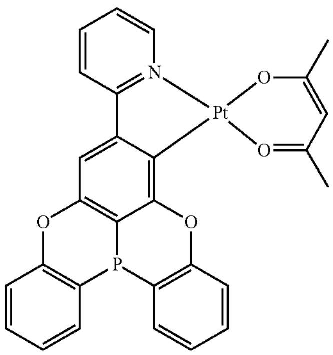
(254)
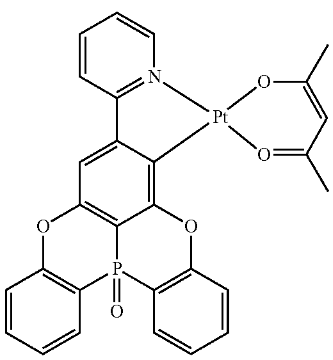
(255)
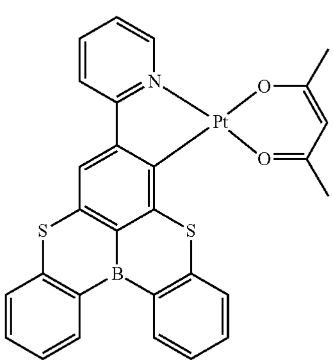
(256)
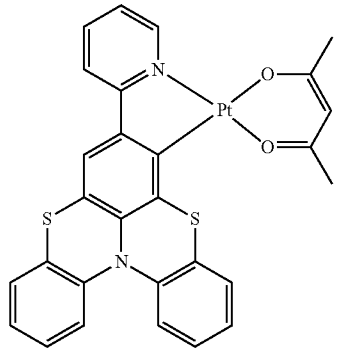
(257)
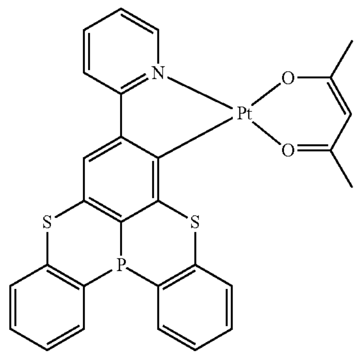
(258)
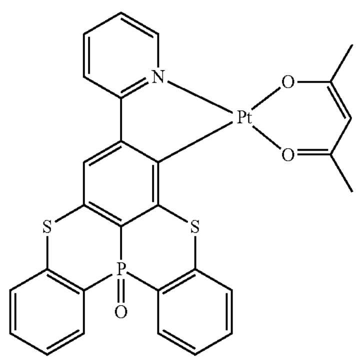
(259)
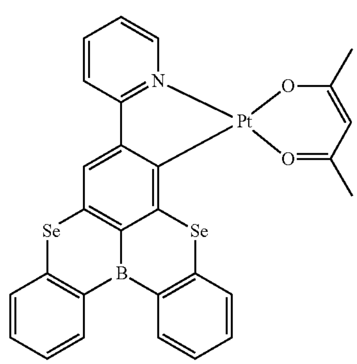

-continued
(260)
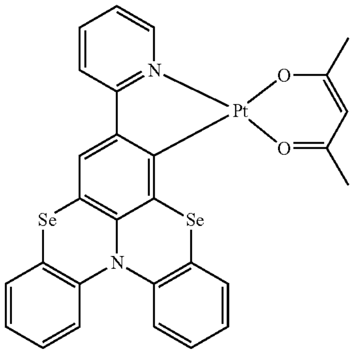
(261)
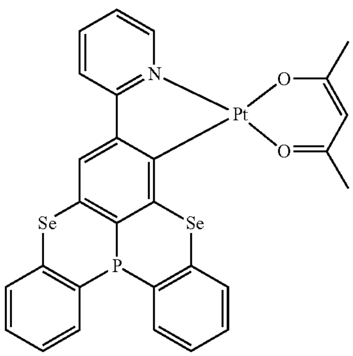
(262)
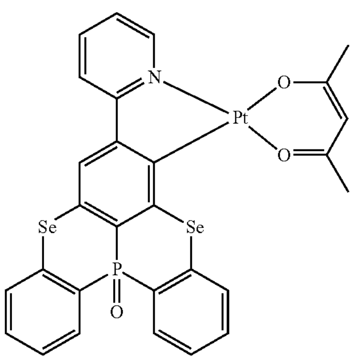
(263)
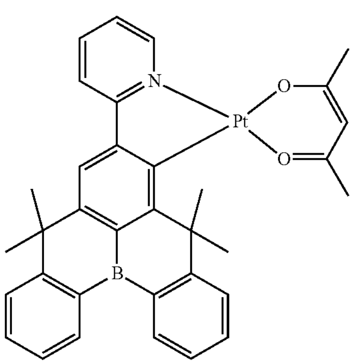
-continued
(264)
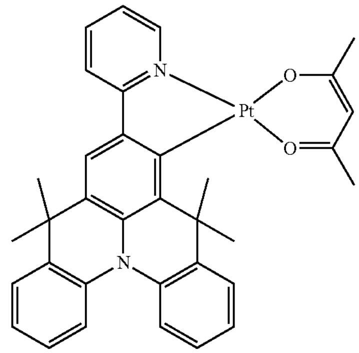
(265)
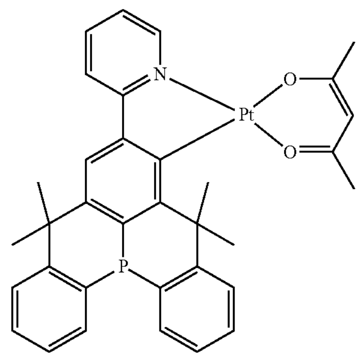
(266)
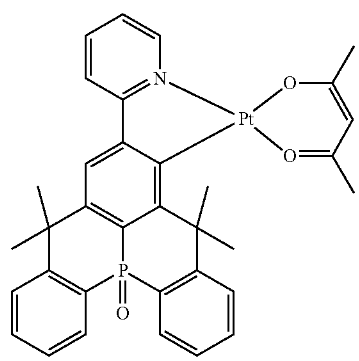
(267)
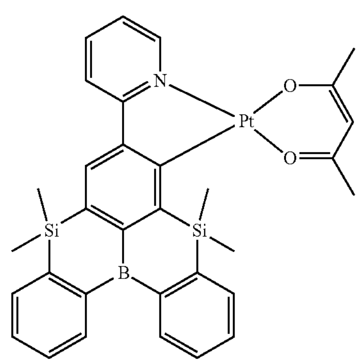

-continued
(268)
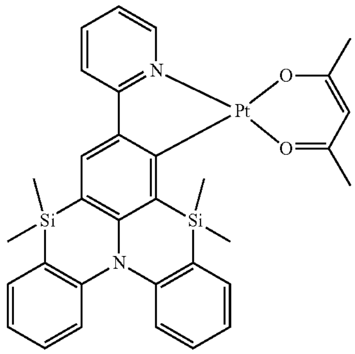
(269)
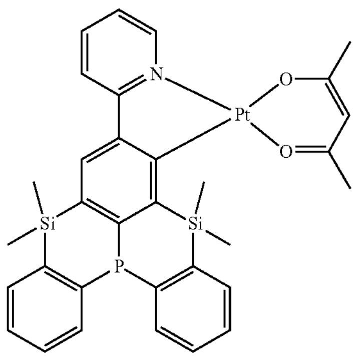
(270)
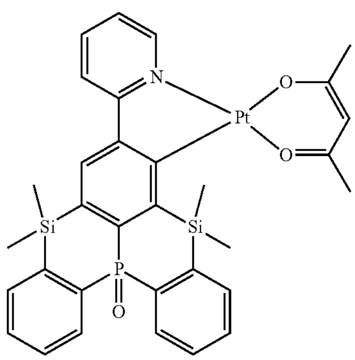
(271)
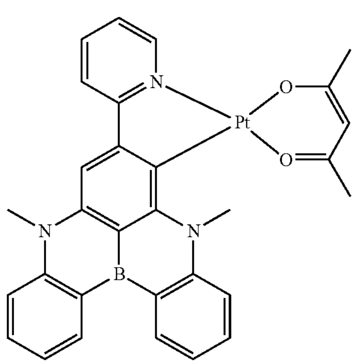
-continued
(272)
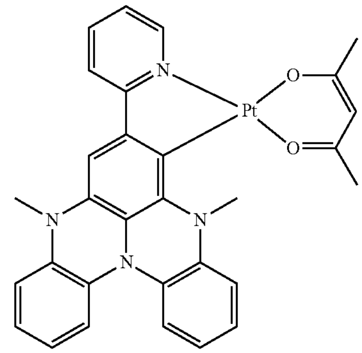
(273)
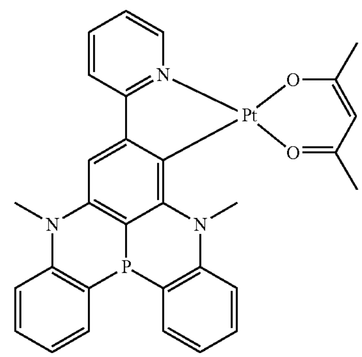
(274)
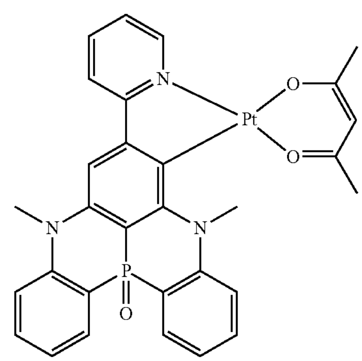
(275)
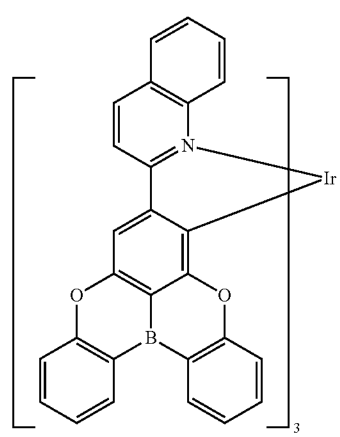

-continued
(276)
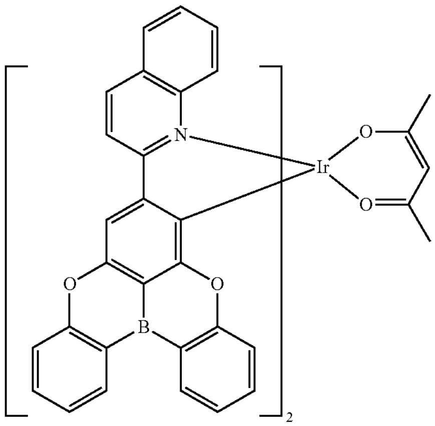
(277)
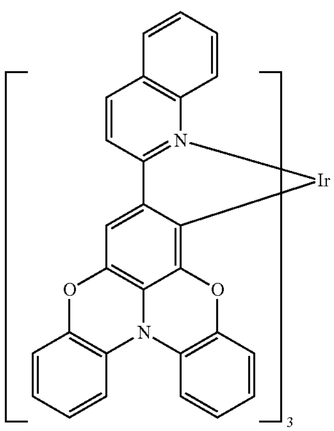
(278)
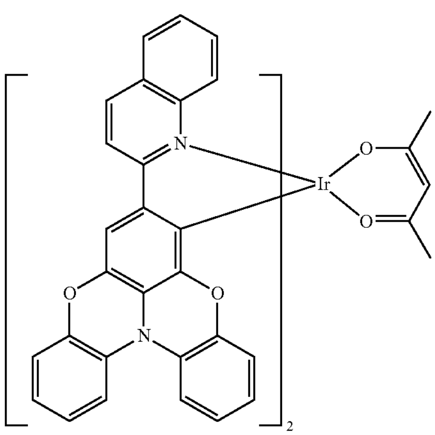
-continued
(279)
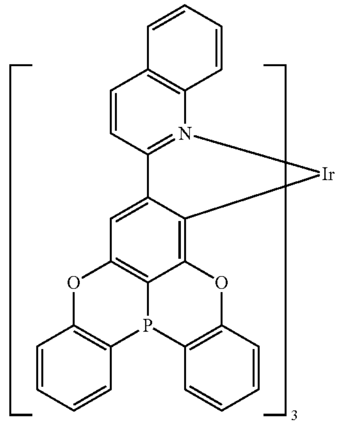
(280)
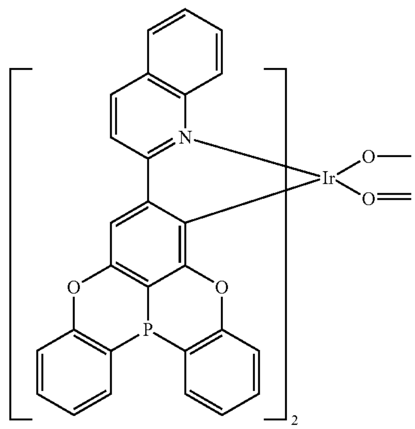
(281)
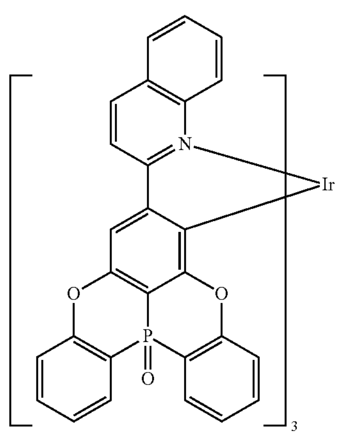

-continued
(282)
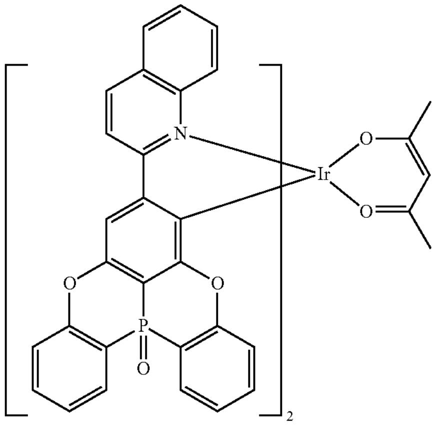
(283)
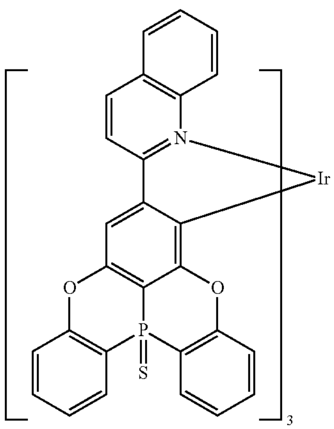
(284)
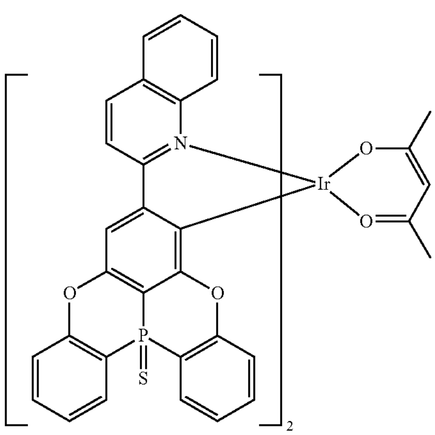
-continued
(285)
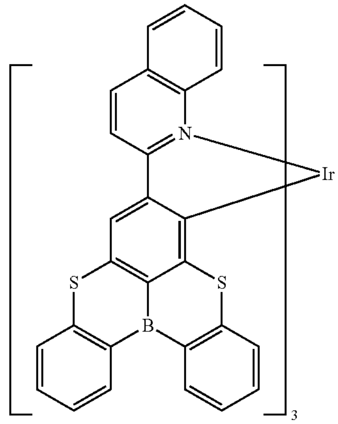
(286)
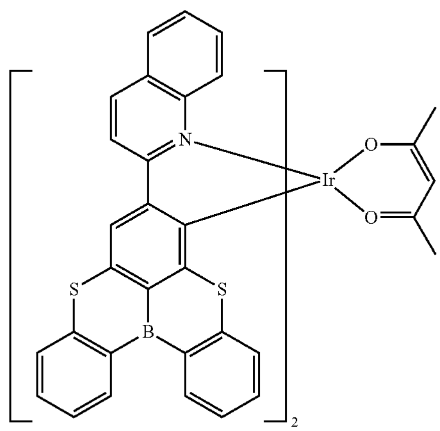
(287)
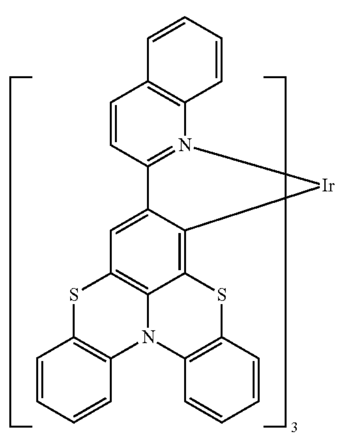

-continued
(288)
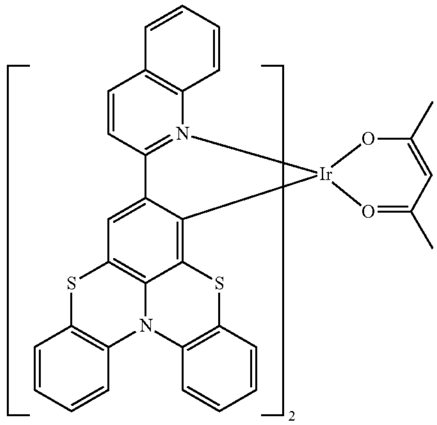
(289)
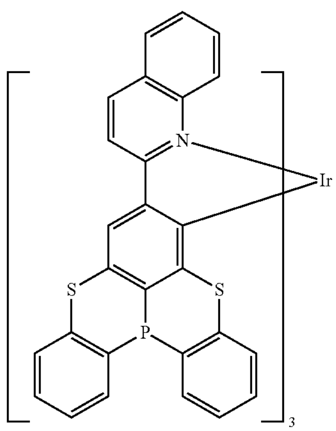
(290)
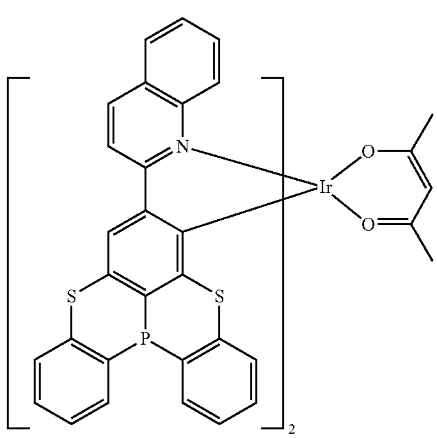
-continued
(291)
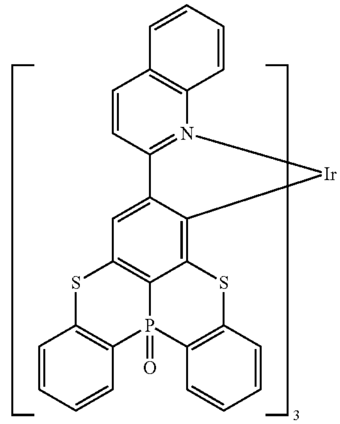
(292)
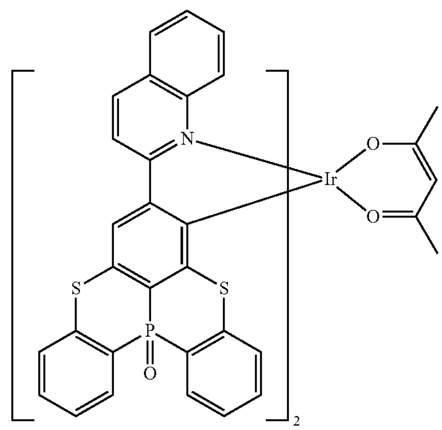
(293)
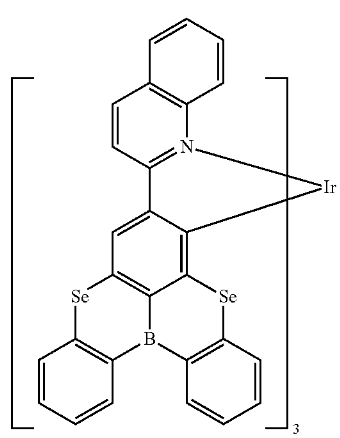

-continued
(294)
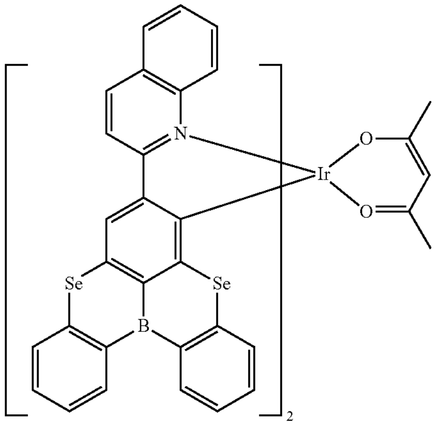
(295)
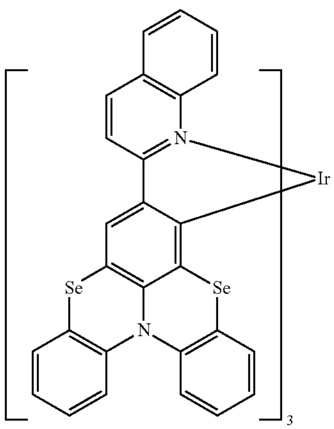
(296)
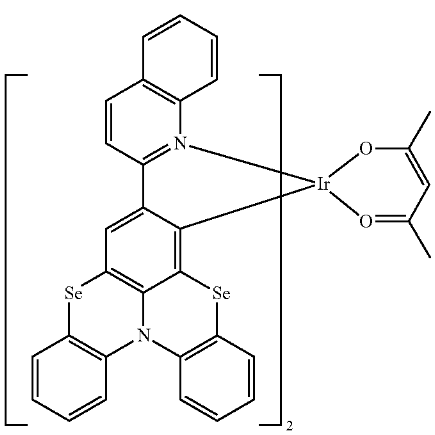
-continued
(297)
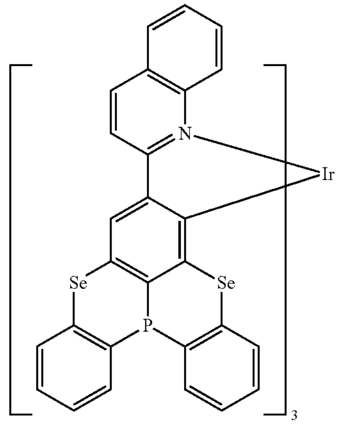
(298)
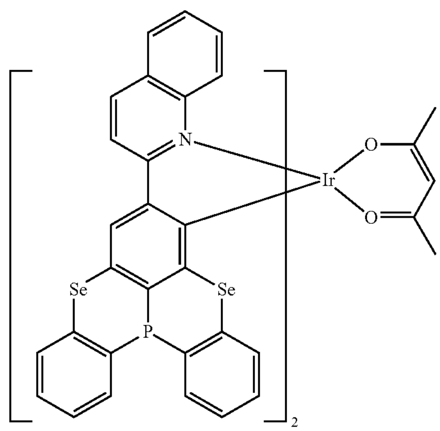
(299)
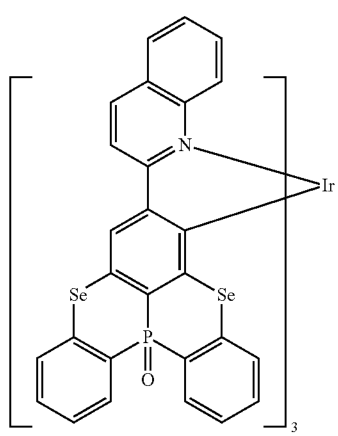

-continued
(300)
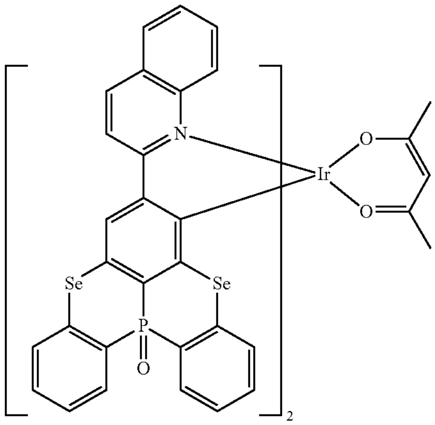
(301)
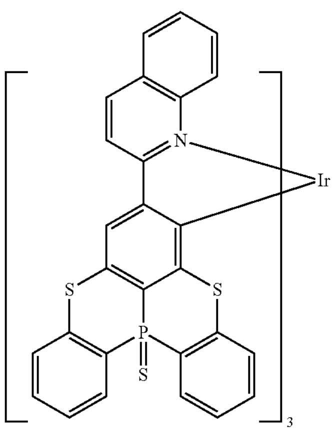
(302)
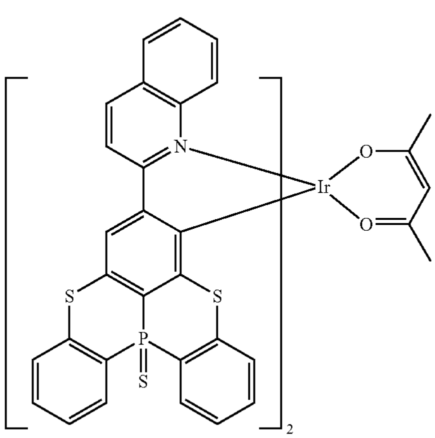
-continued
(303)
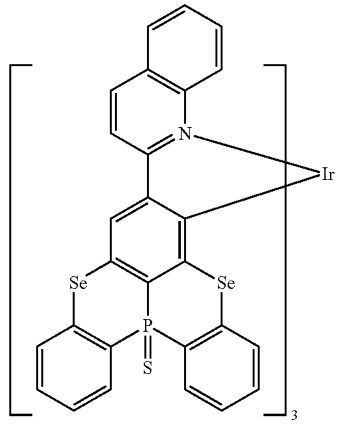
(304)
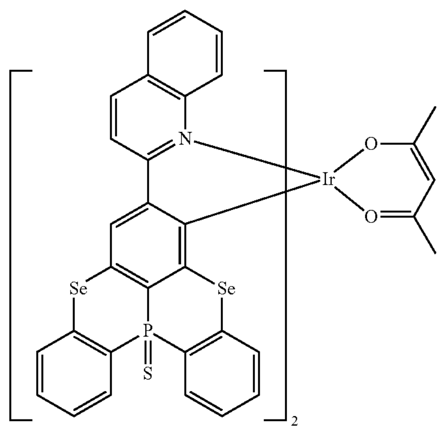
(305)
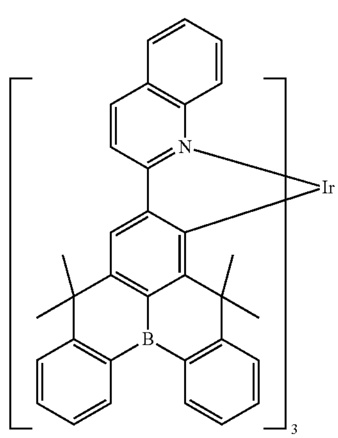

84
-continued
(306)
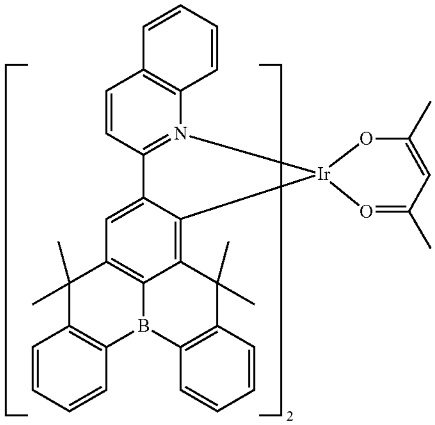
(307)
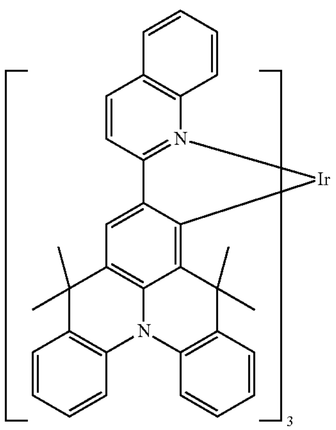
(308)
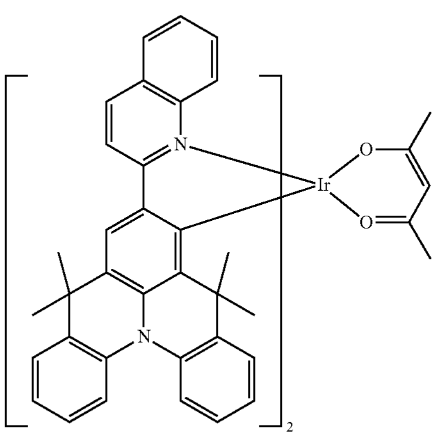
(309)
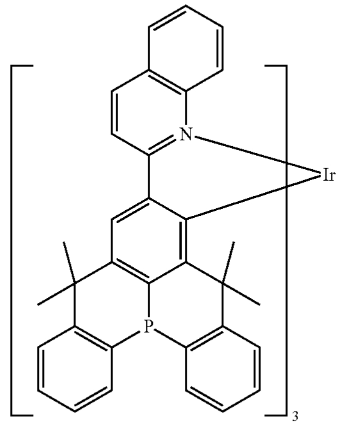
(310)
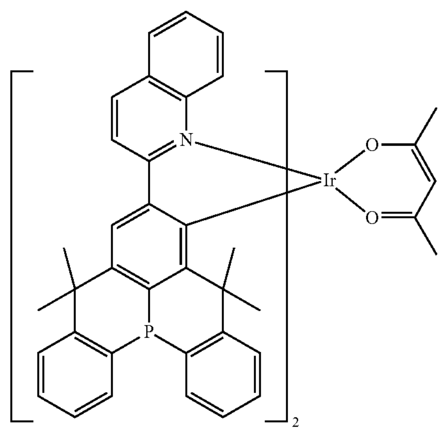
(311)
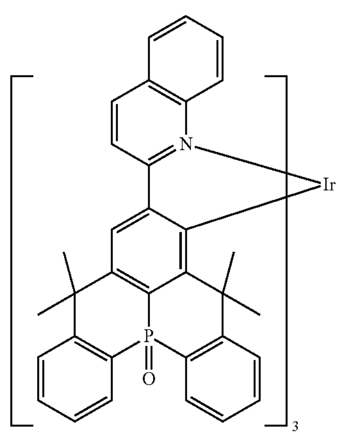

-continued
(312)
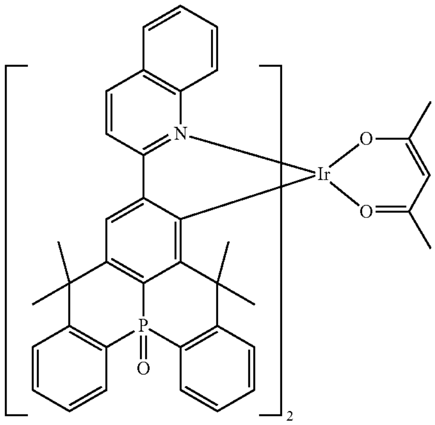
(313)
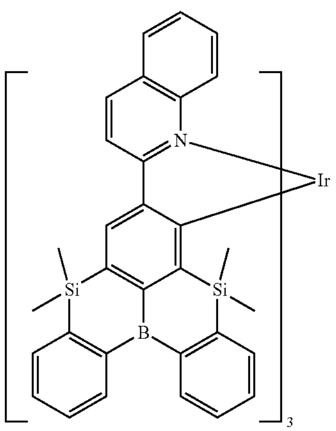
(314)
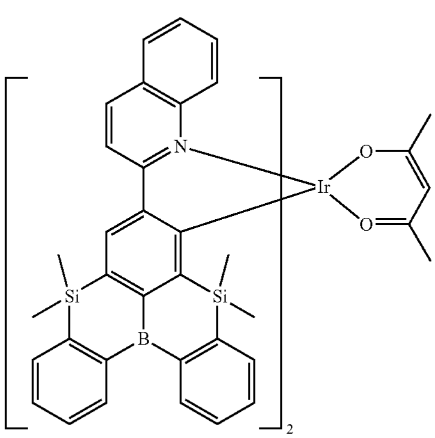
-continued
(315)
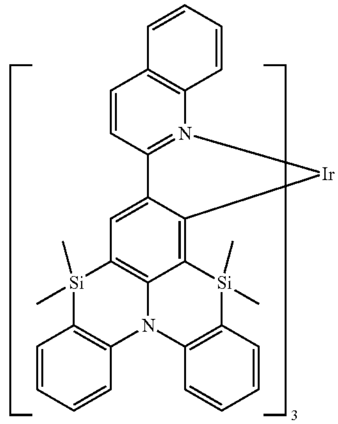
(316)
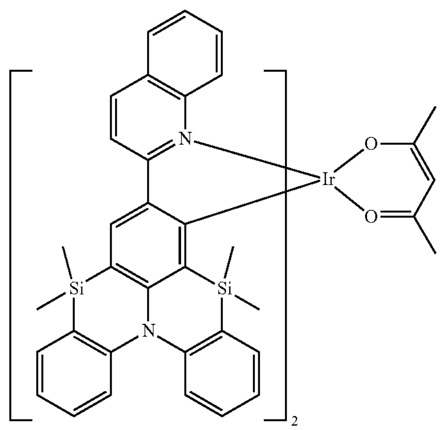
(317)
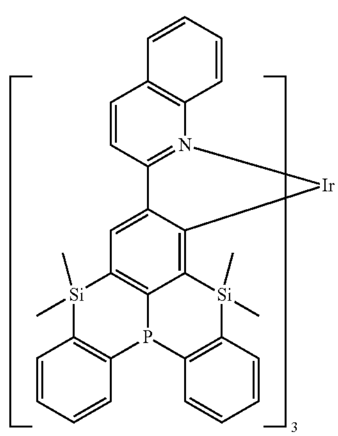

-continued
(318)
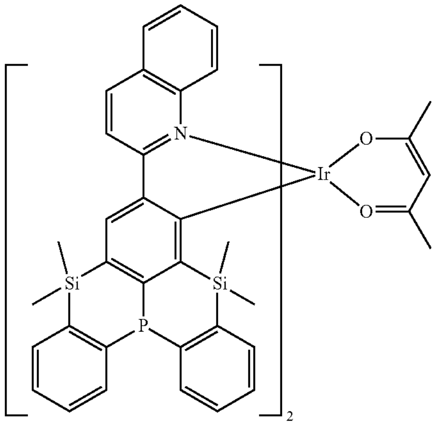
(319)
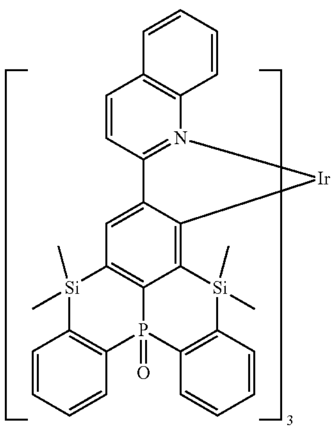
(320)
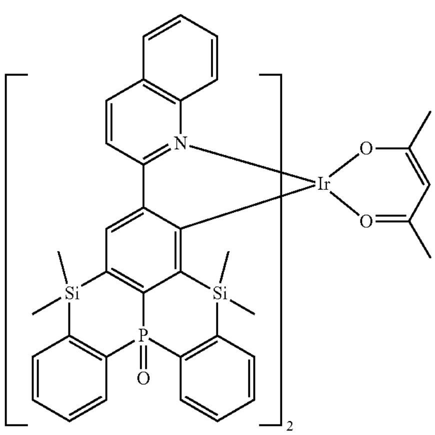
-continued
(321)
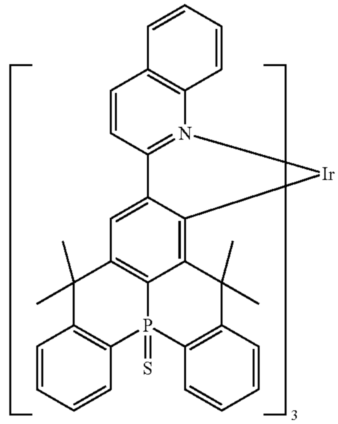
(322)
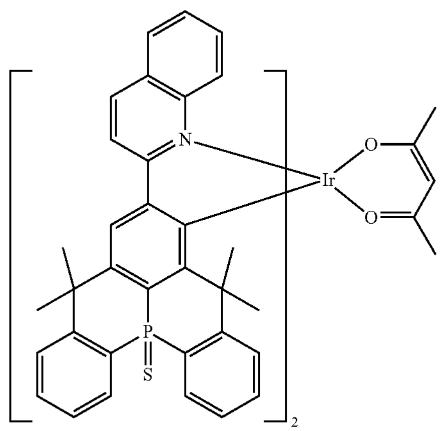
(323)
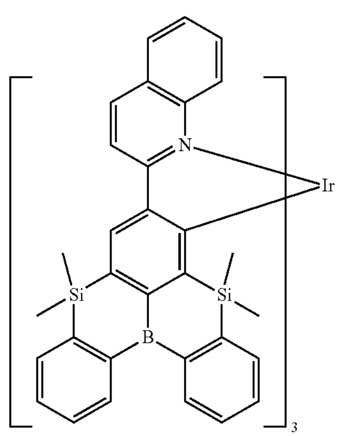

-continued
(324)
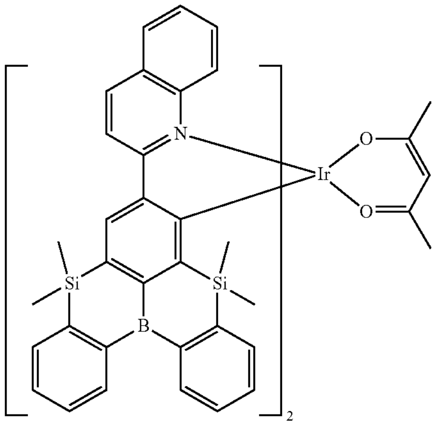
(325)
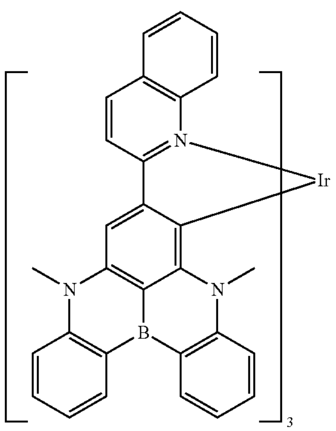
(326)
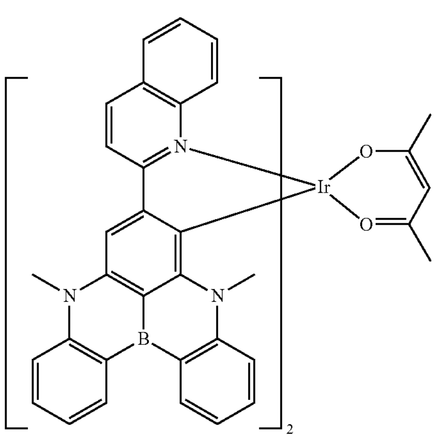
-continued
(327)
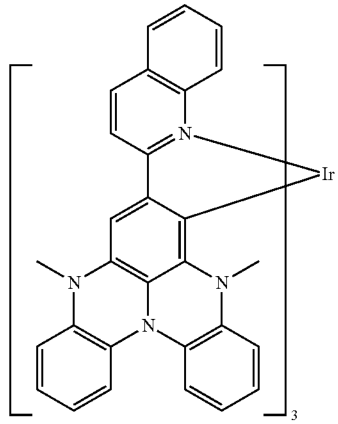
(328)
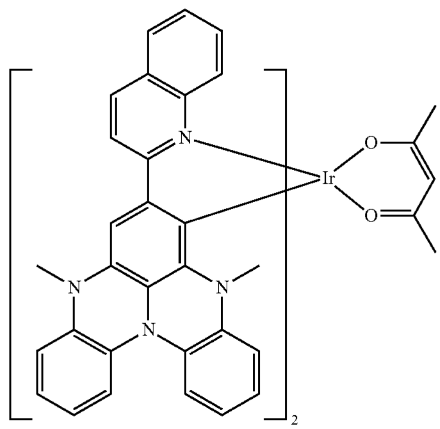
(329)
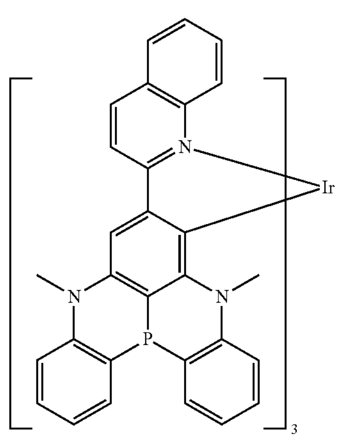

(330)
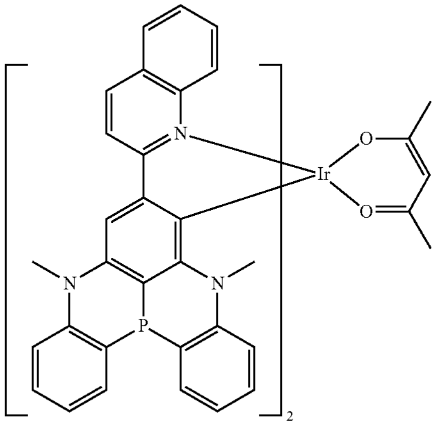
(331)
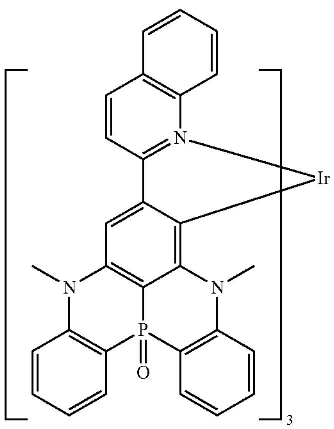
(332)
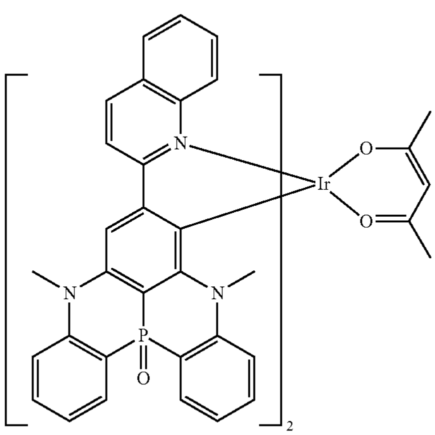
(333)
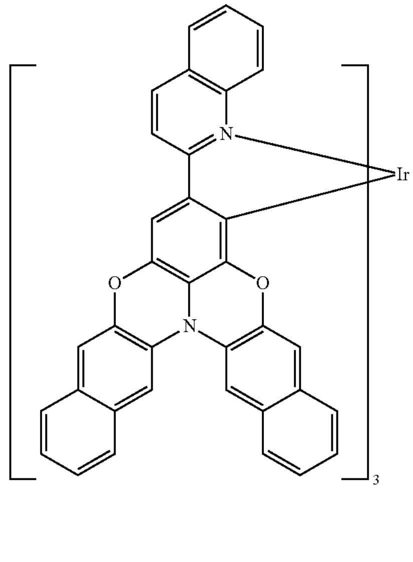
(334)
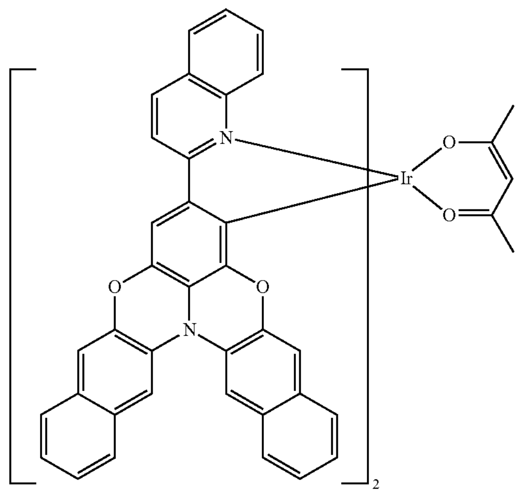
(335)
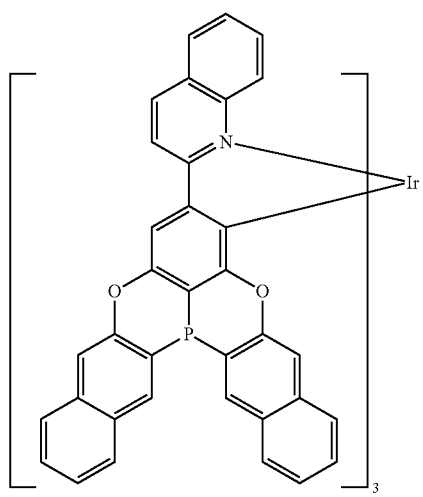

-continued
(336)
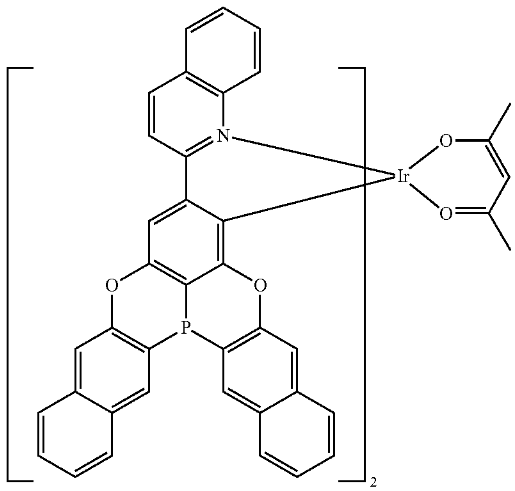
(333)
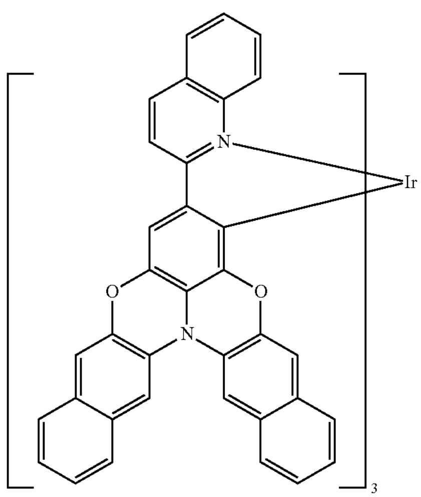
(334)
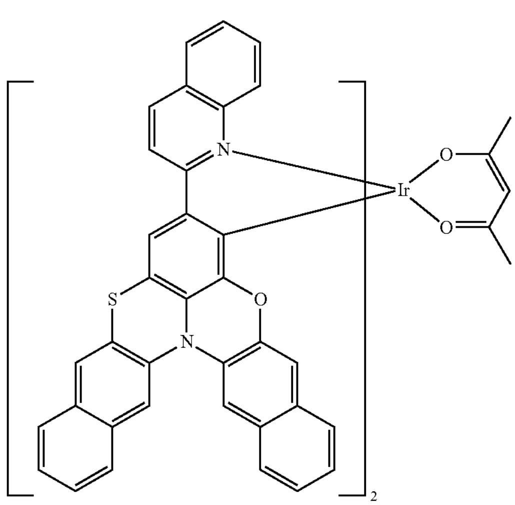
-continued
(335)
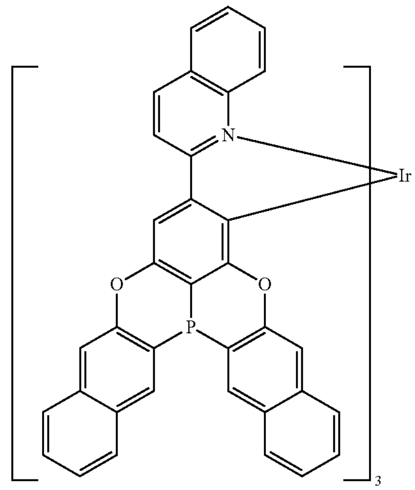
(336)
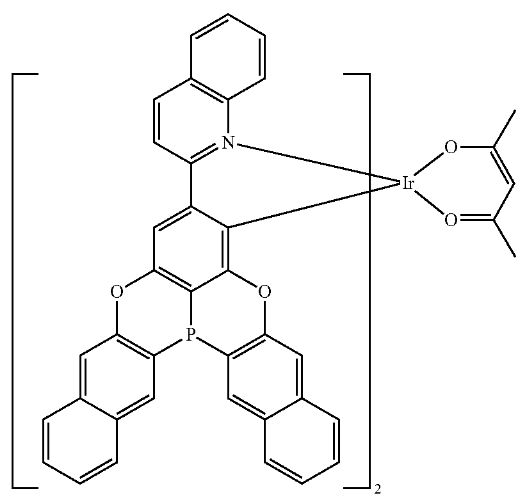
(341)
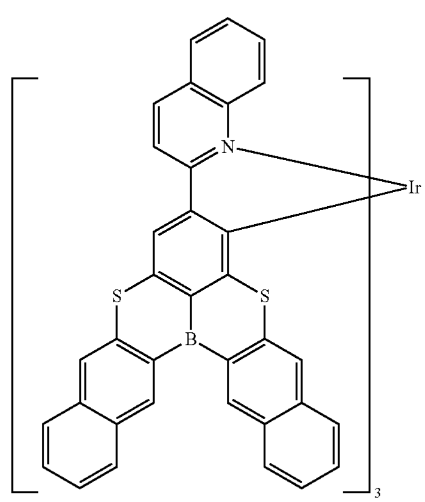

-continued
(342)
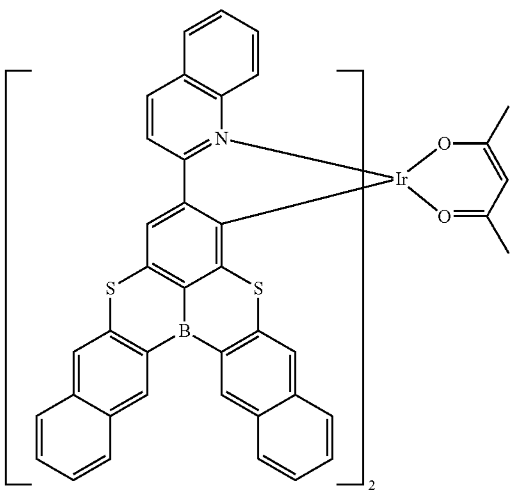
(343)
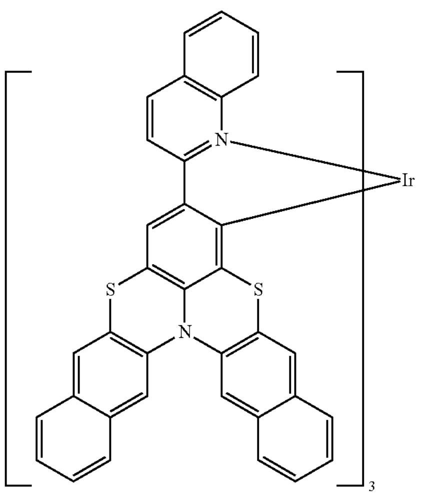
(344)
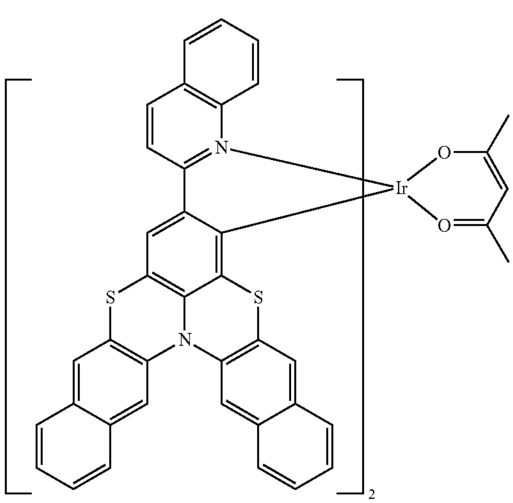
-continued
(345)
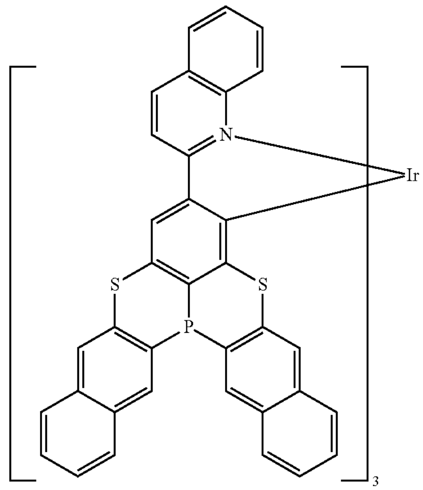
(346)
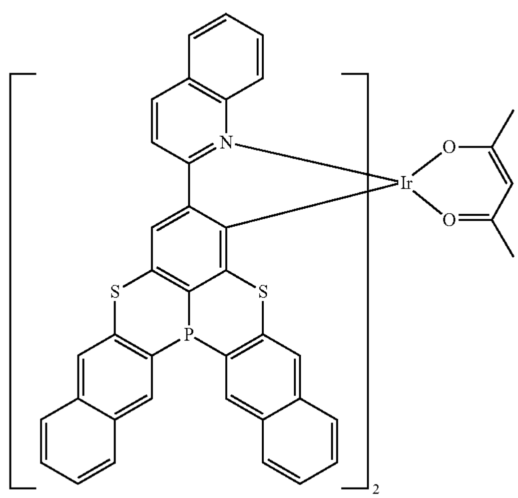
(347)
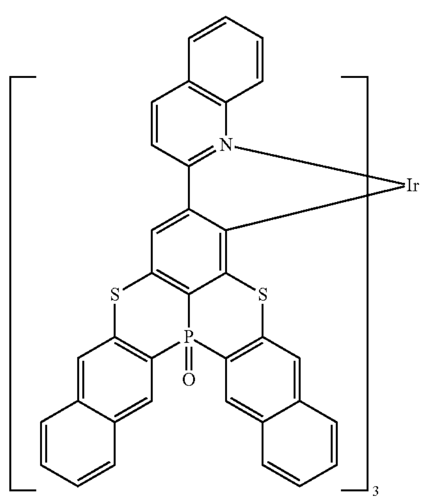

-continued
(348)
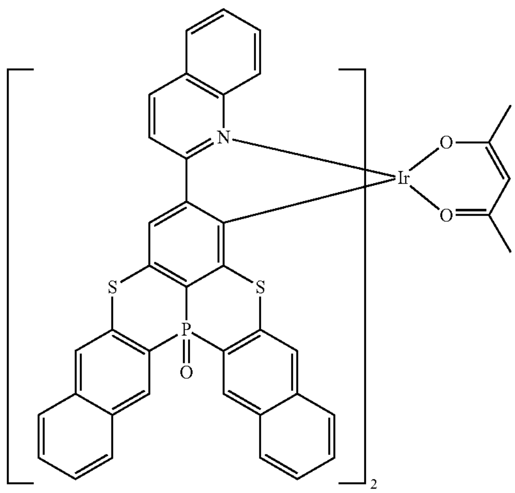
(349)
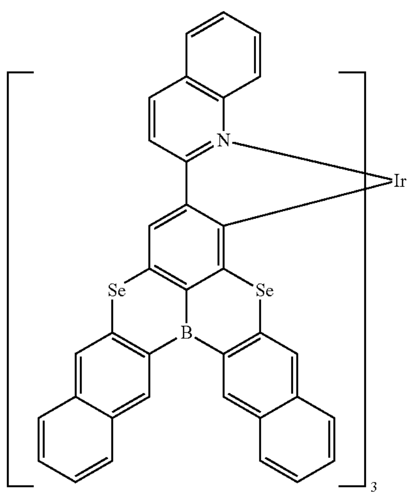
(350)
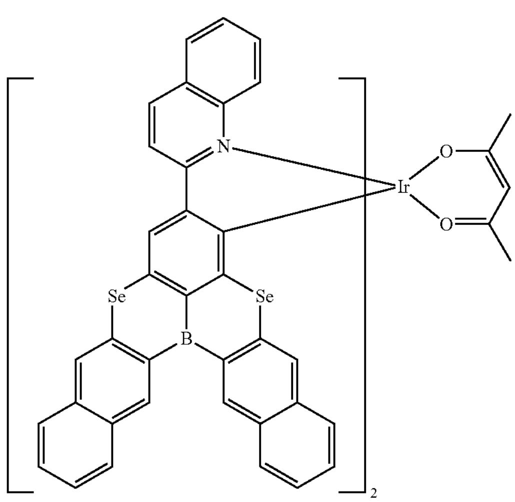
-continued
(351)
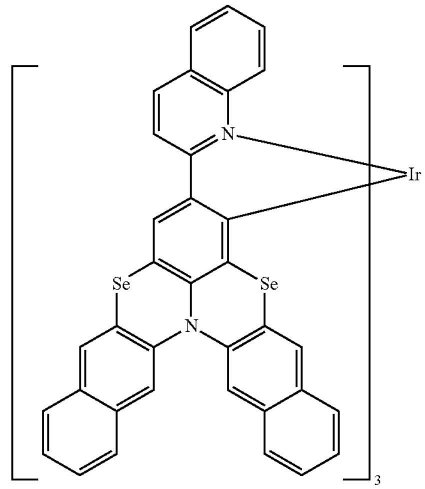
(352)
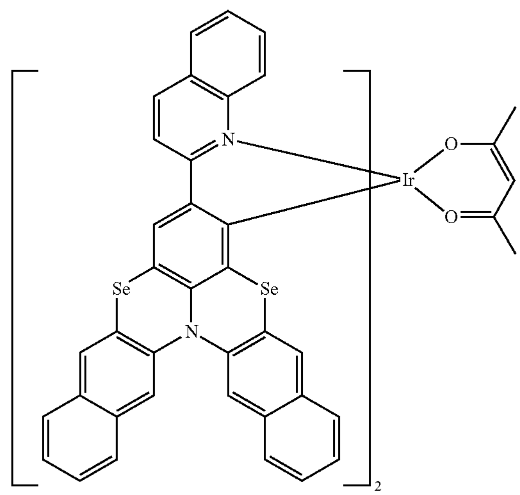
(353)
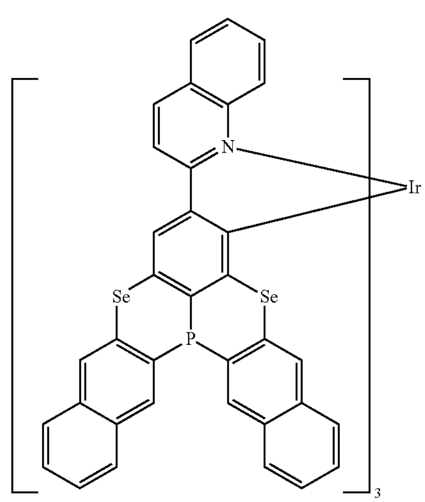

(354)
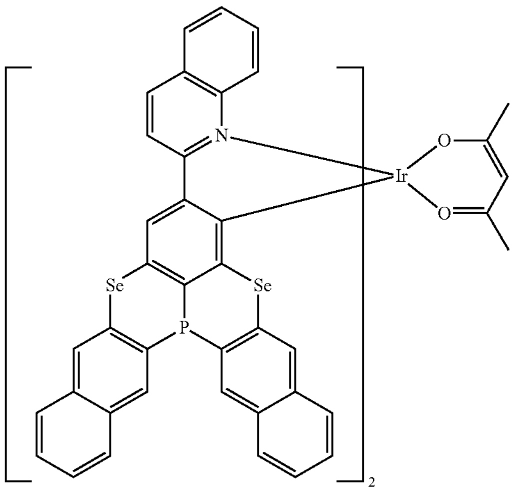
(355)
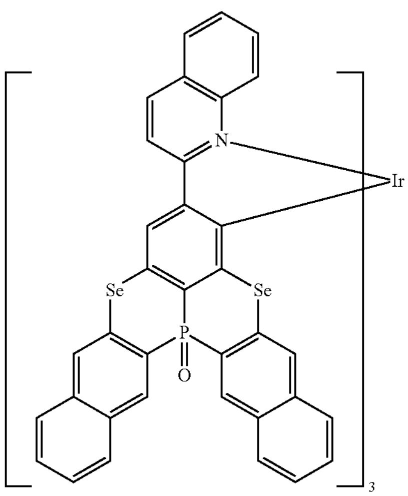
(356)
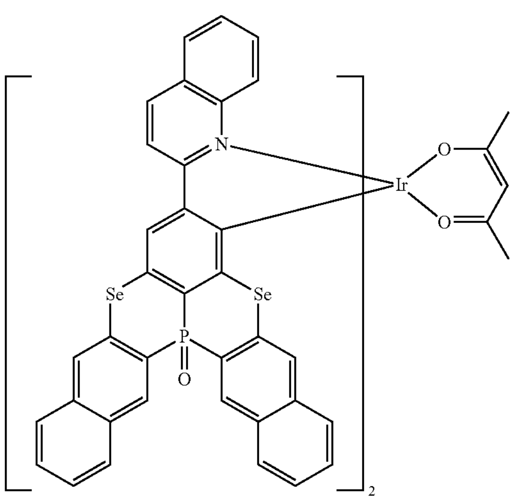
(357)
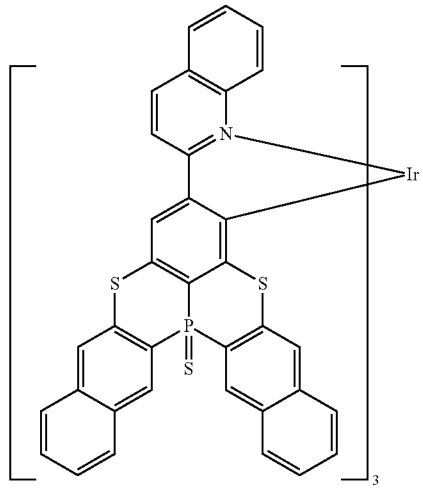
(358)
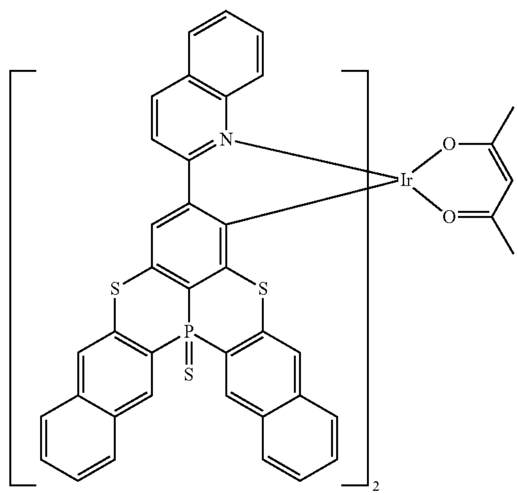
(359)
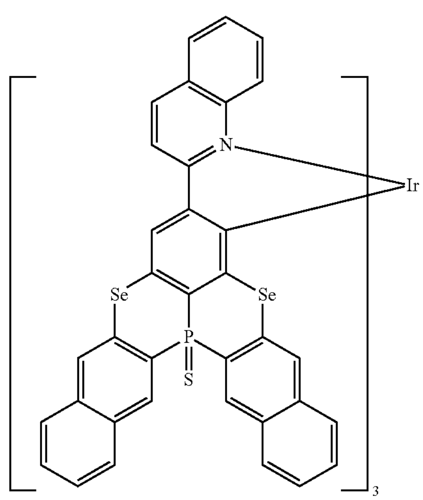

-continued
(360)
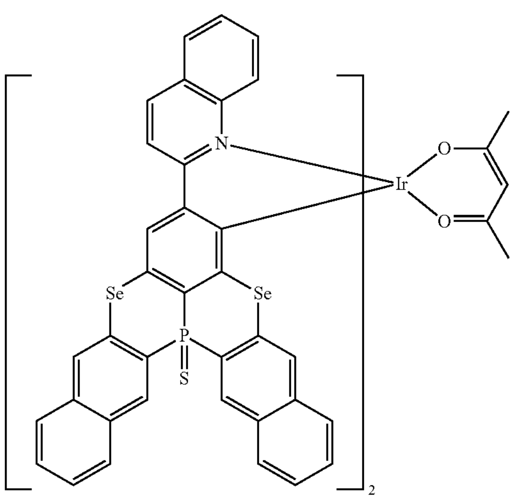
(361)
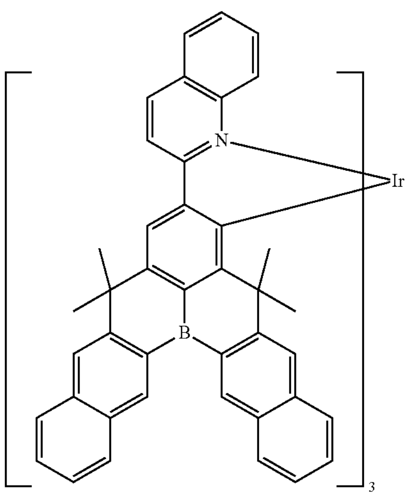
(362)
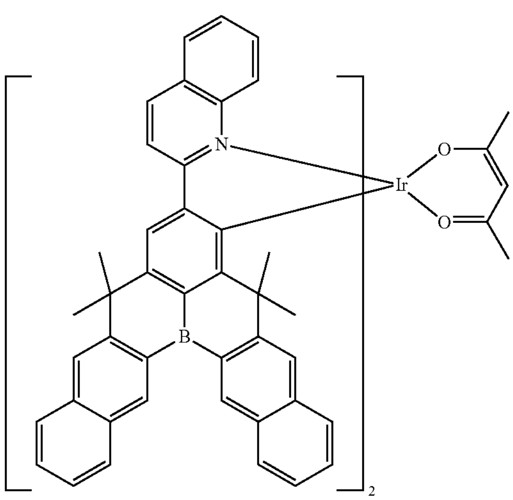
-continued
(363)
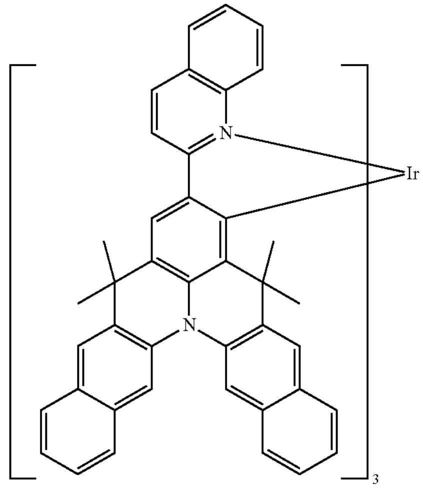
(364)
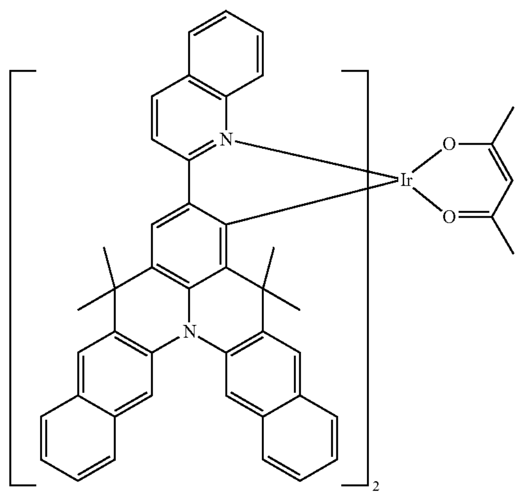
(365)
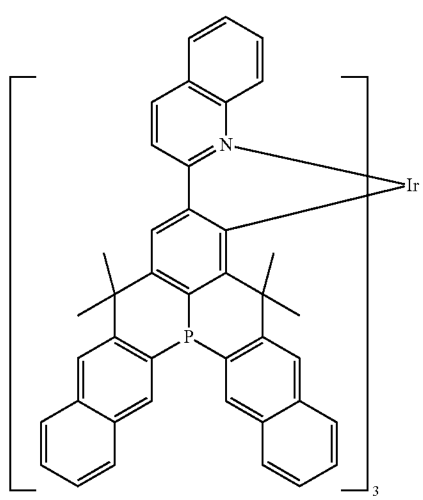

-continued
(366)
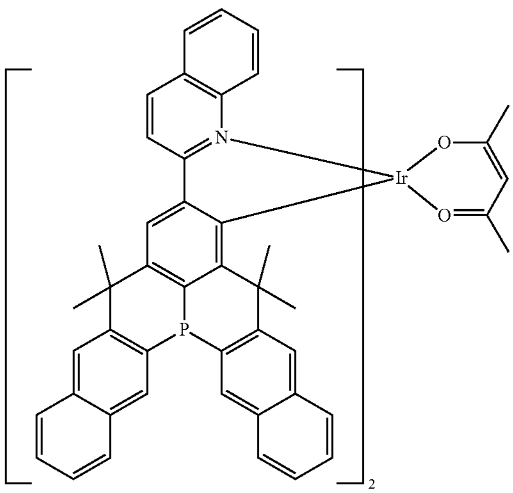
(367)
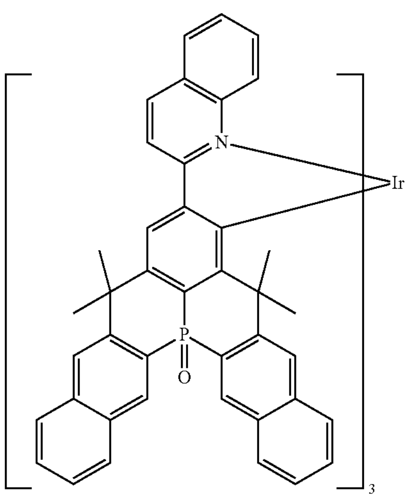
(368)
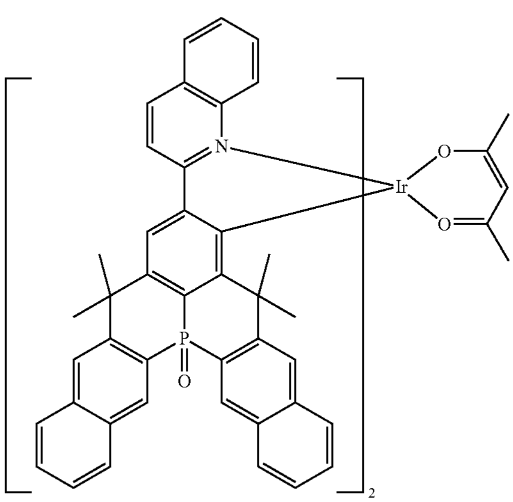
-continued
(369)
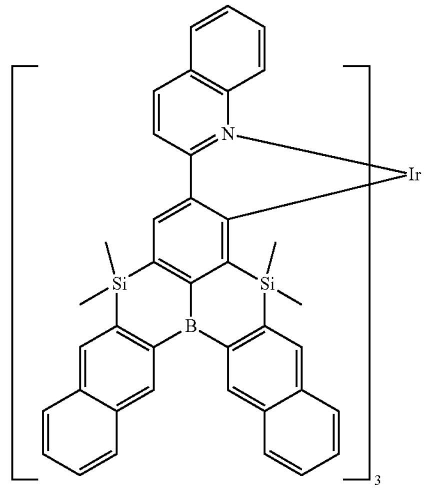
(370)
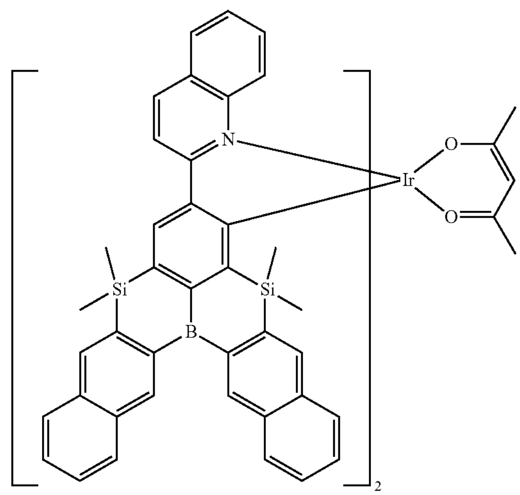
(371)
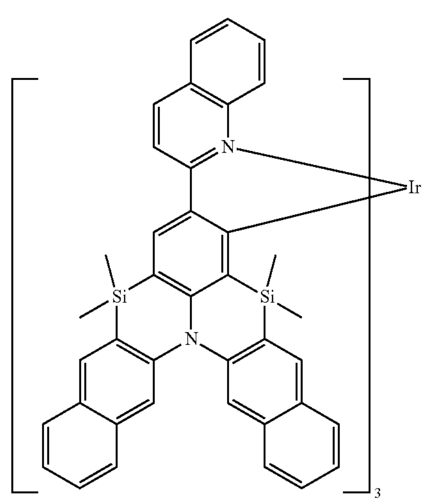

-continued
(372)
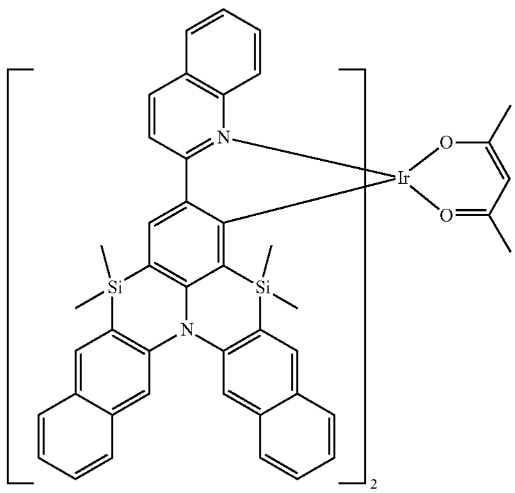
(373)
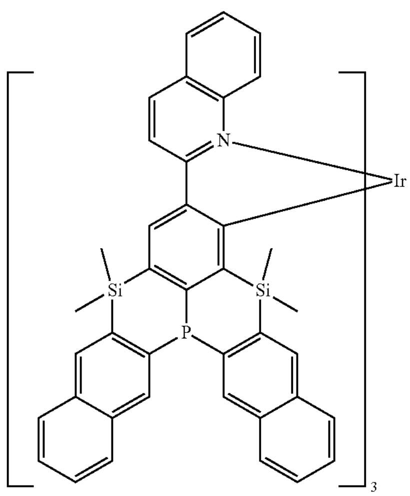
(374)
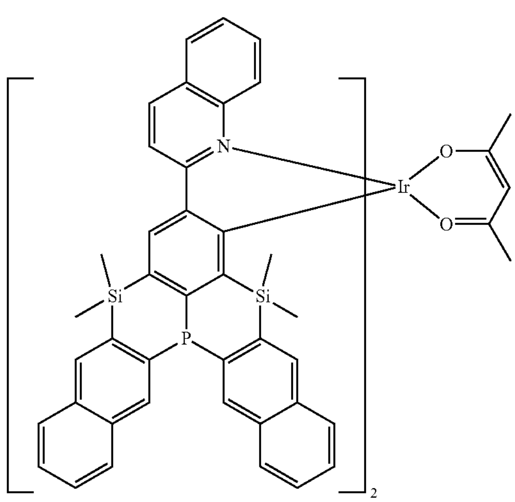
-continued
(375)
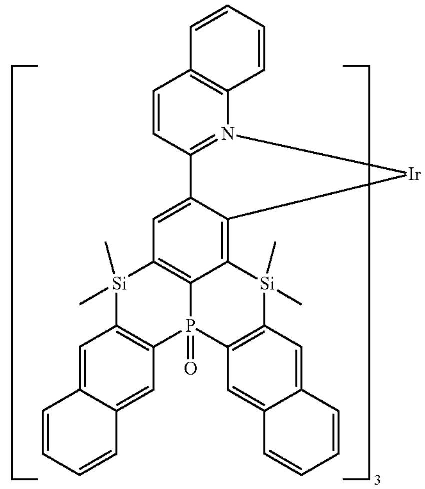
(376)
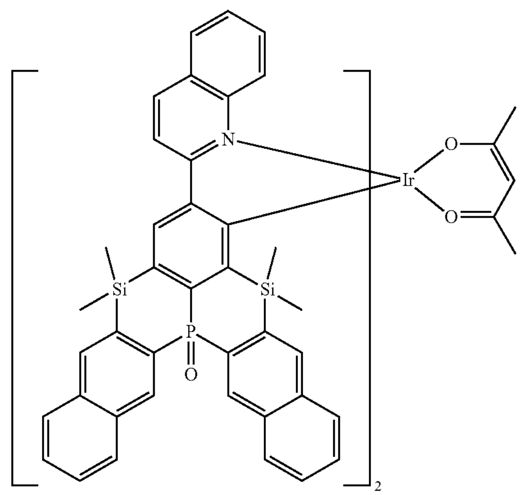
(377)
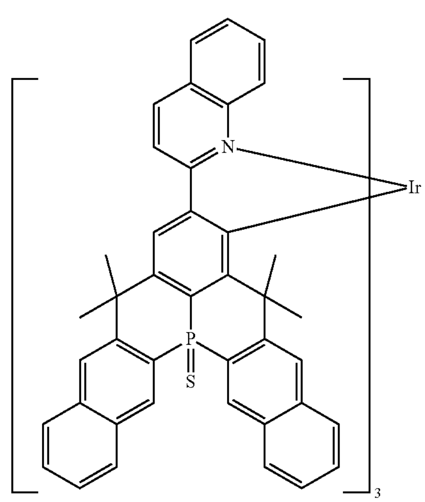

-continued
(378)
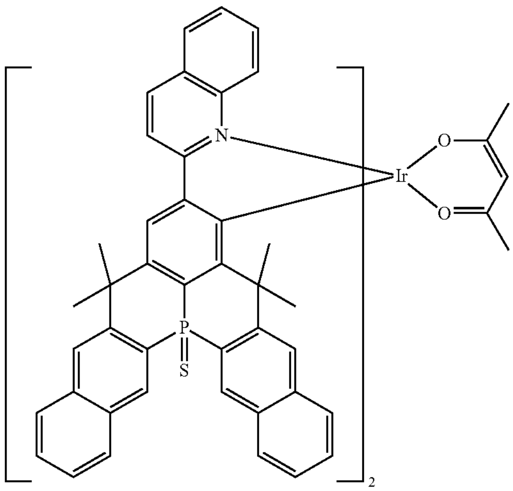
(379)
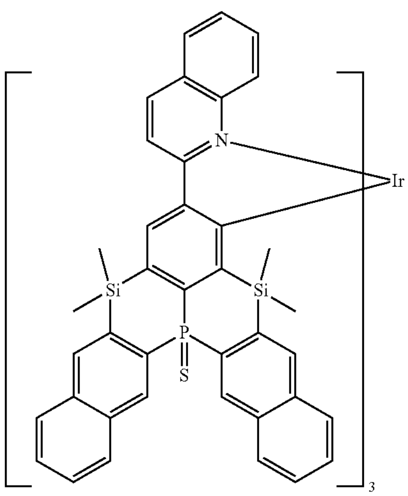
(380)
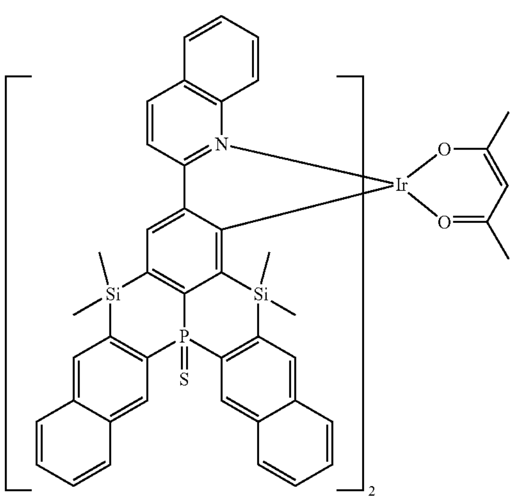
-continued
(381)
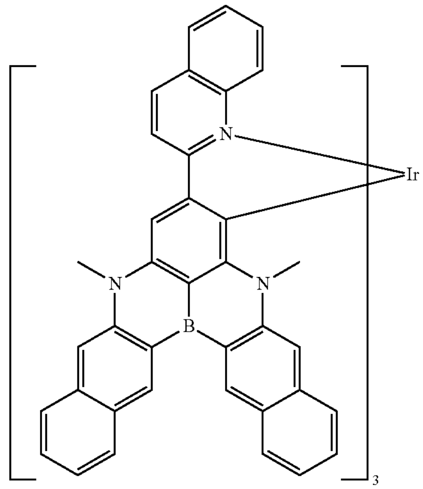
(382)
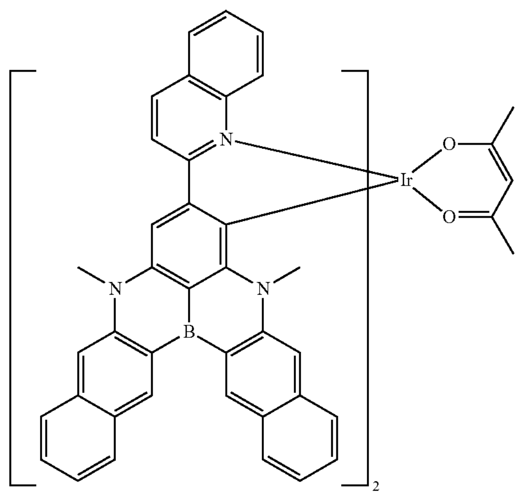
(383)
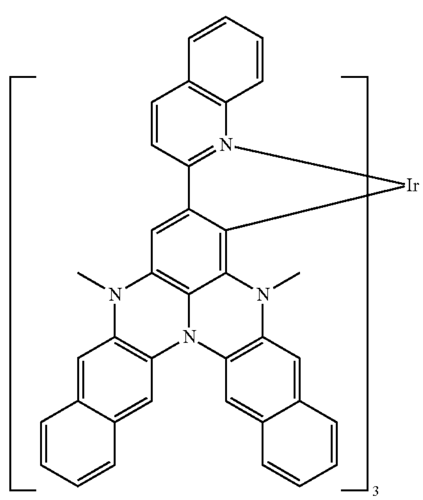

-continued
(384)
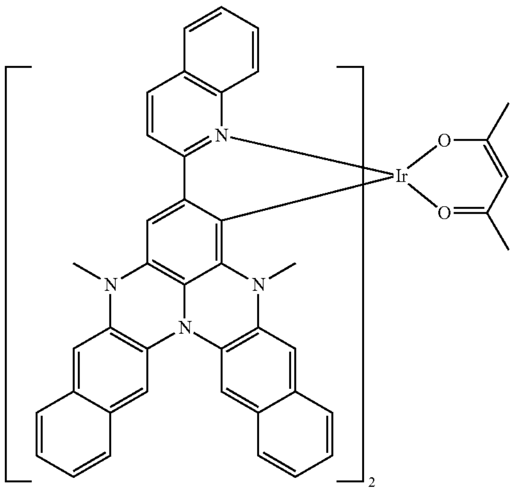
(385)
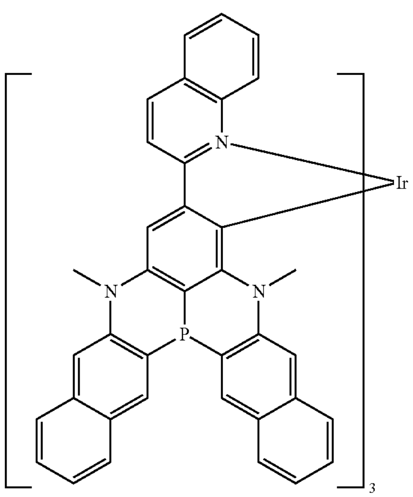
(386)
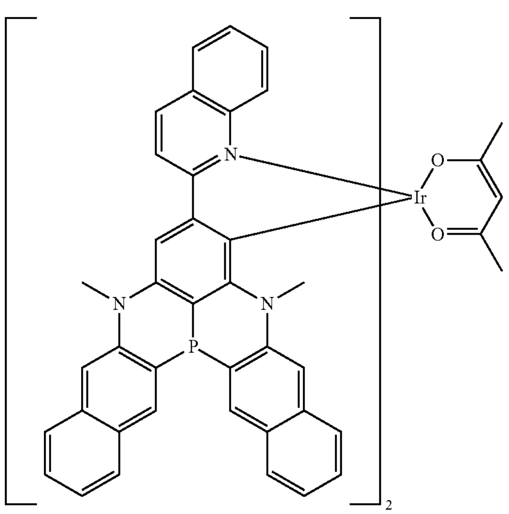
-continued
(387)
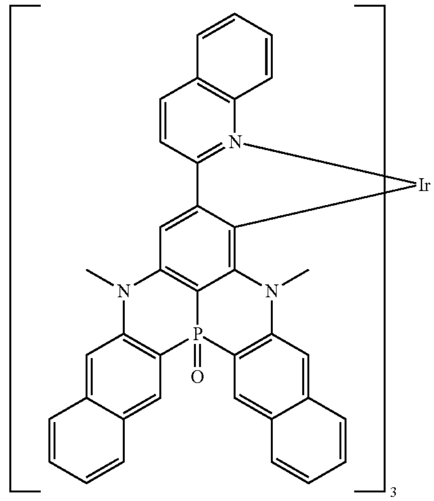
(388)
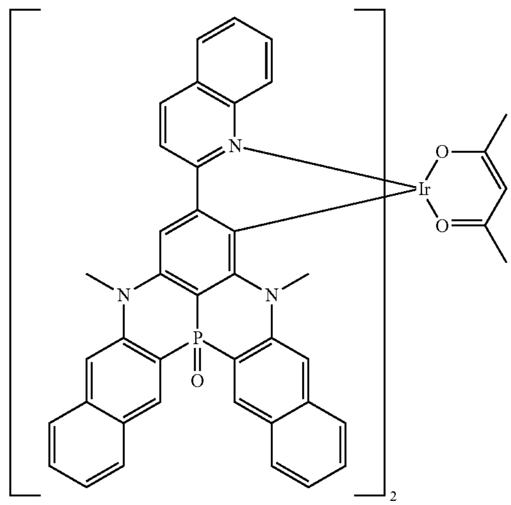
(389)
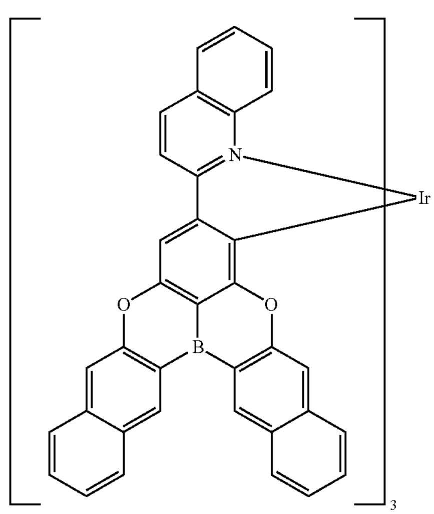

-continued
(390)
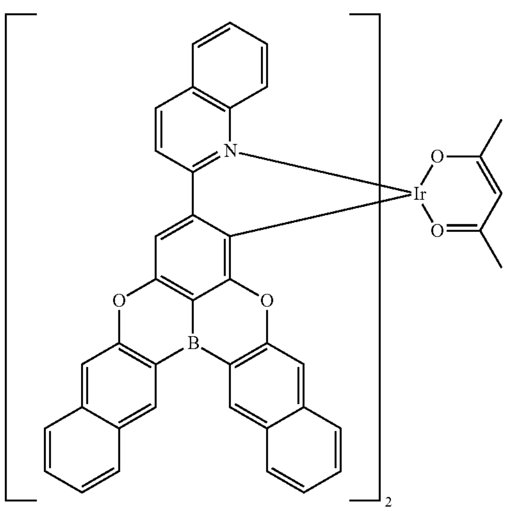
(391)
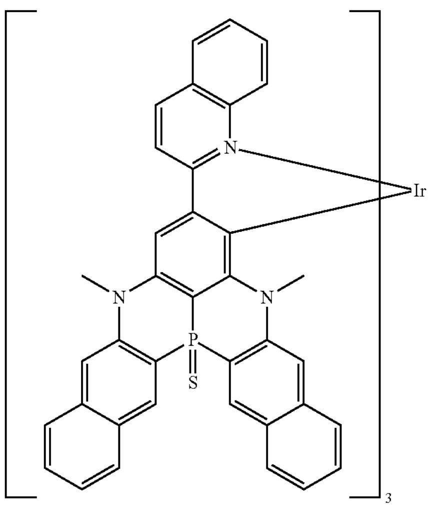
(392)
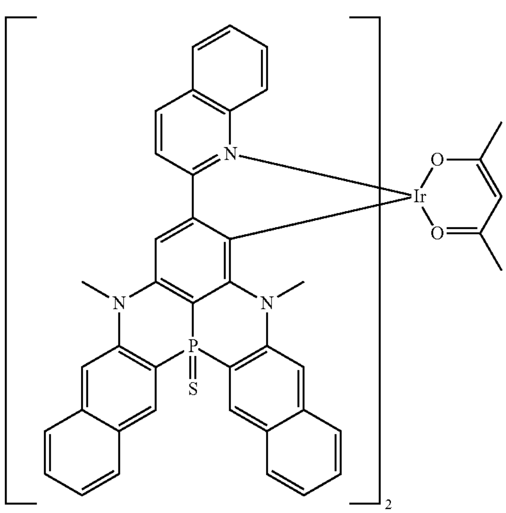
-continued
(393)
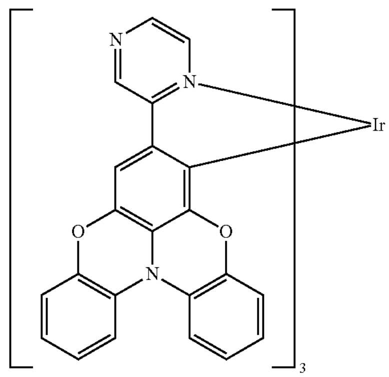
(394)
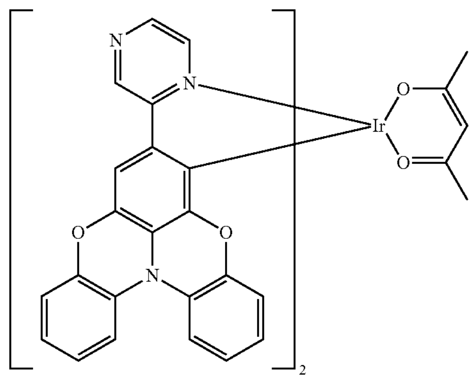
(395)
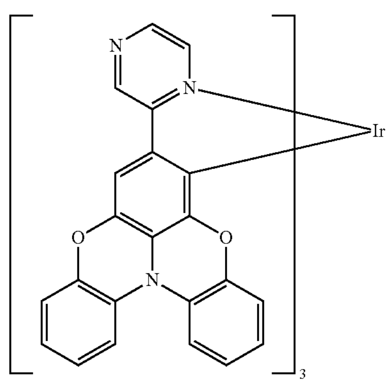
(396)
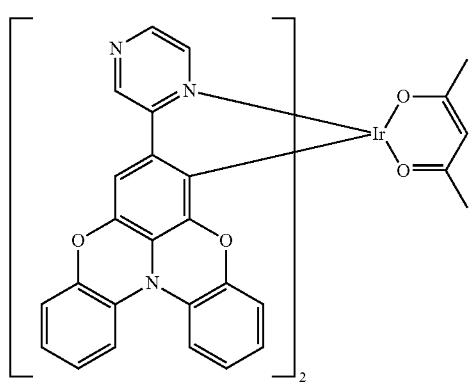

-continued
(397)
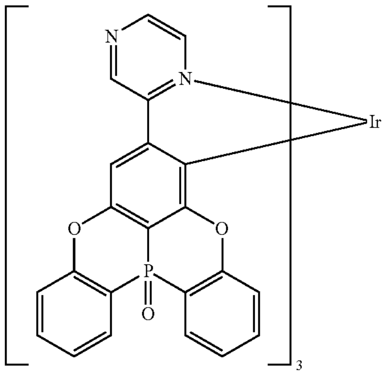
(398)
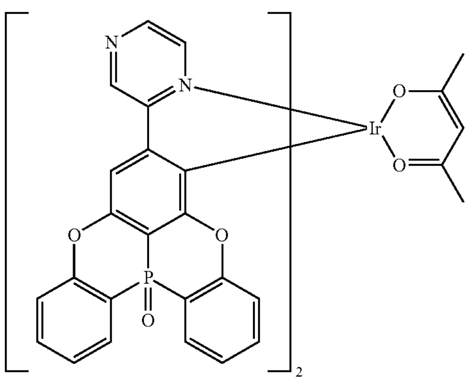
(399)
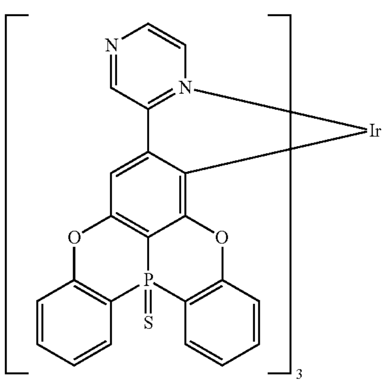
(400)
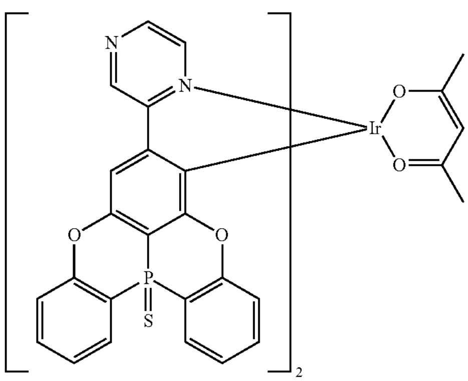
-continued
(401)
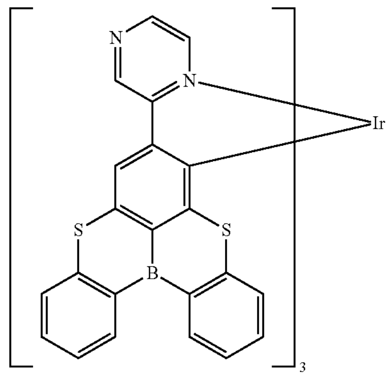
(402)
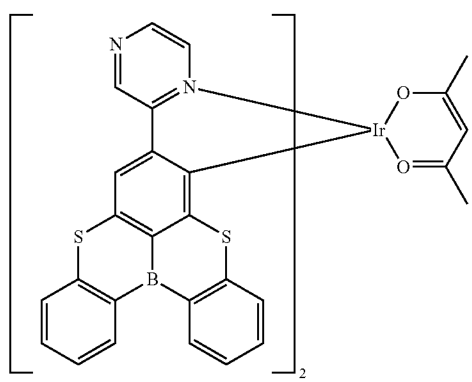
(403)
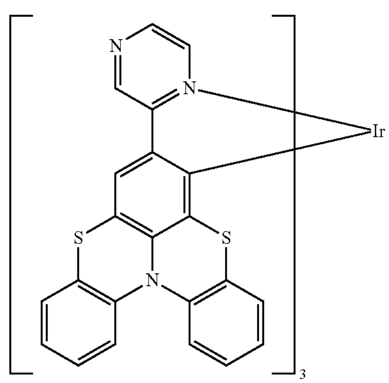
(404)
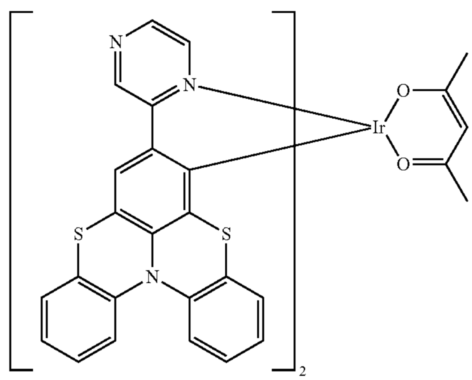

-continued
(405)
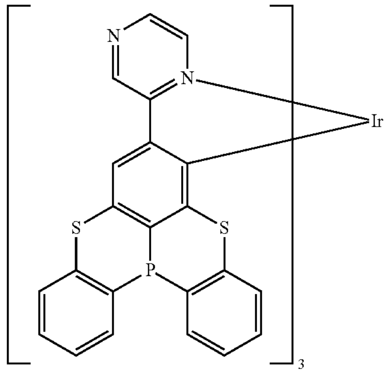
(406)
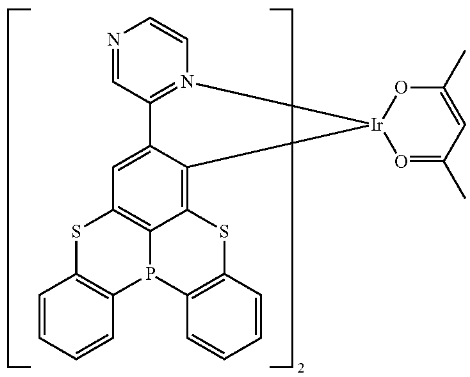
(407)
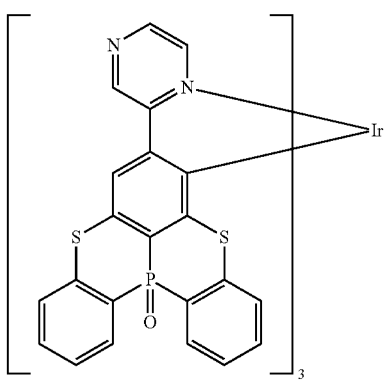
(408)
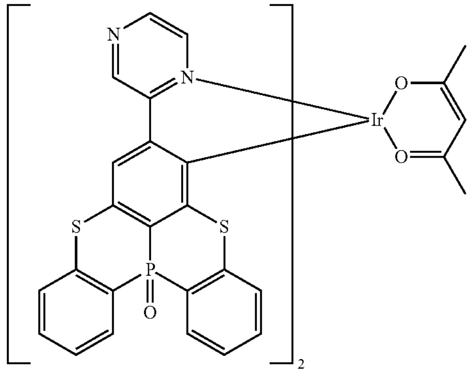
-continued
(409)
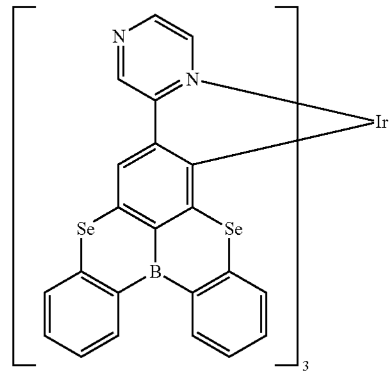
(410)
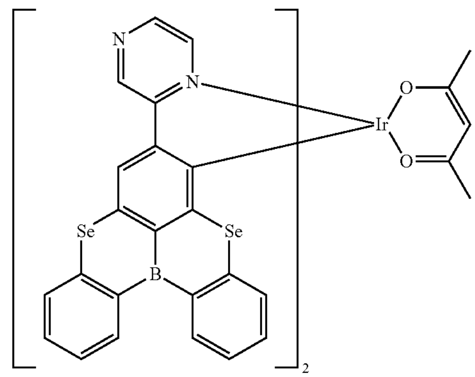
(411)
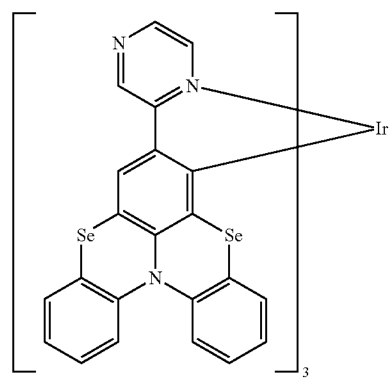
(412)
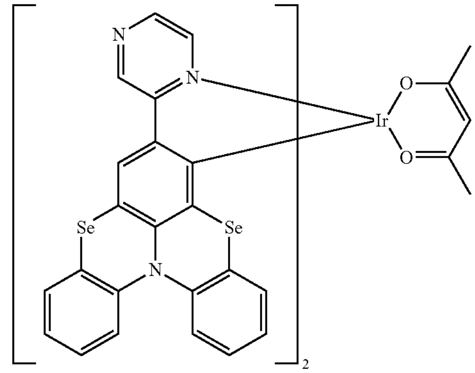

-continued
(413)
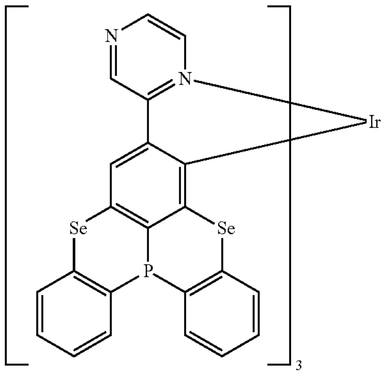
(414)
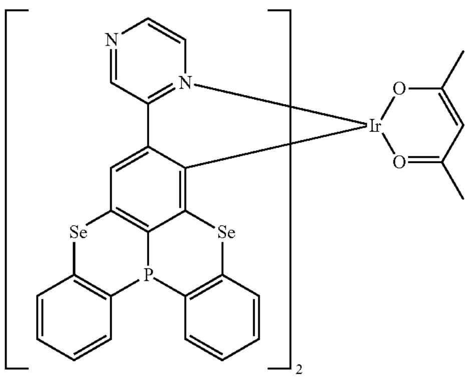
(415)
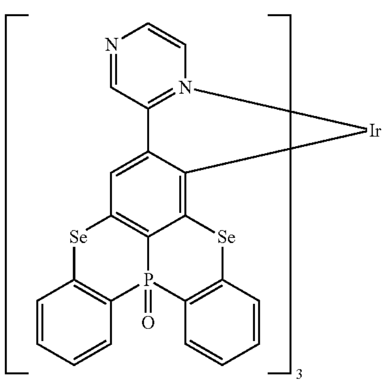
(416)
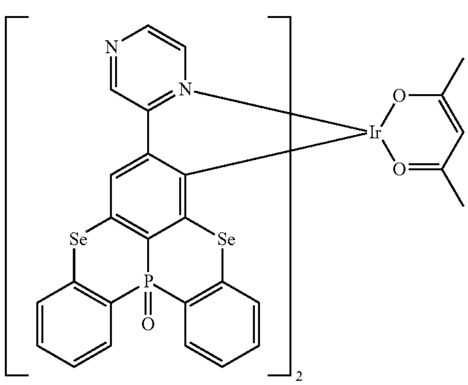
-continued
(417)
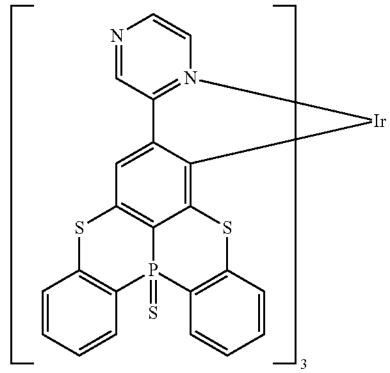
(418)
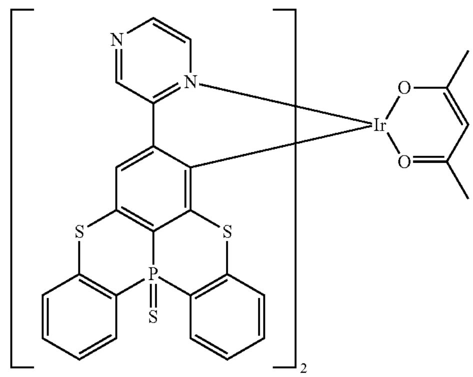
(419)
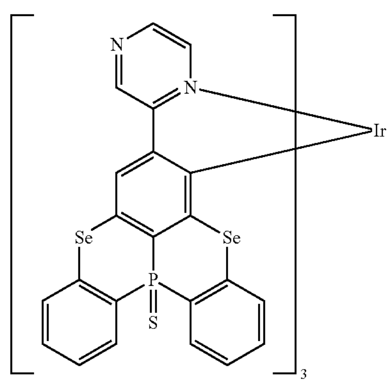
(420)
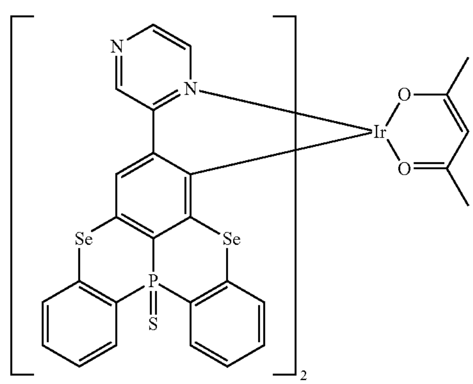

-continued
(421)
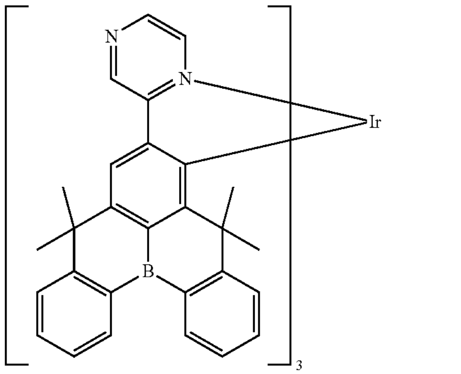
(422)
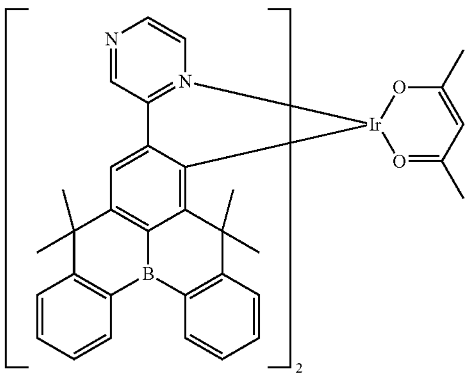
(423)
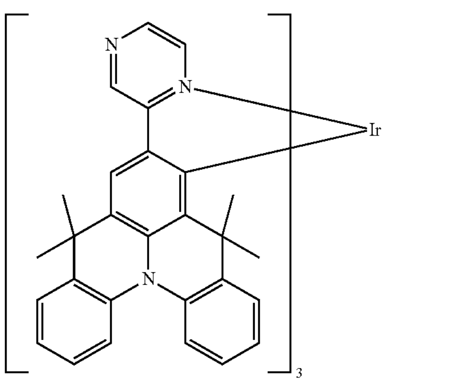
(424)
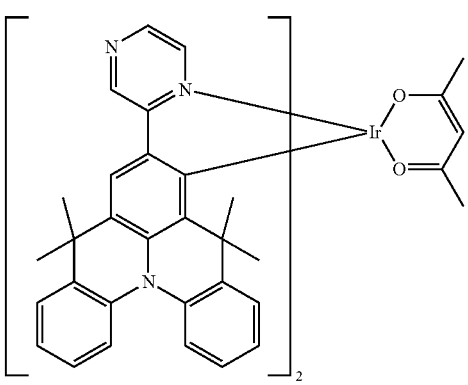
-continued
(425)
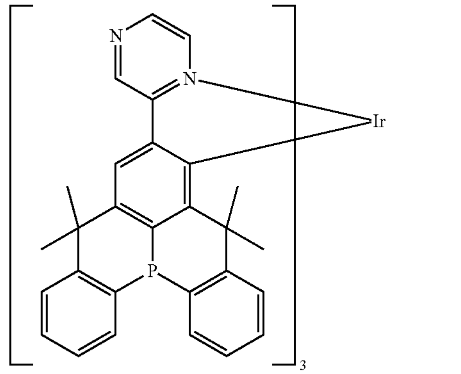
(426)
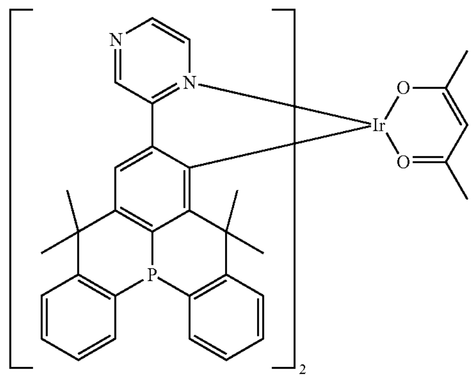
(427)
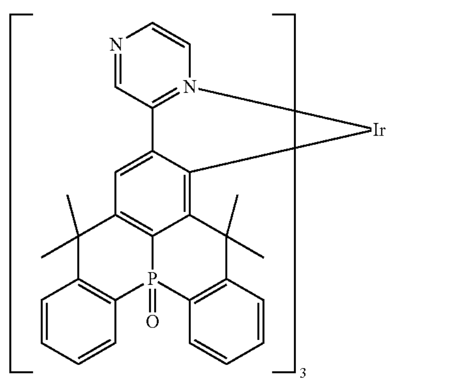
(428)
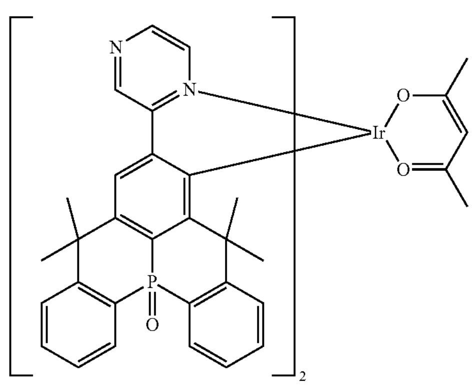

-continued
(429)
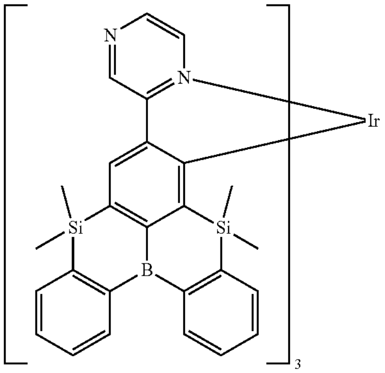
(430)
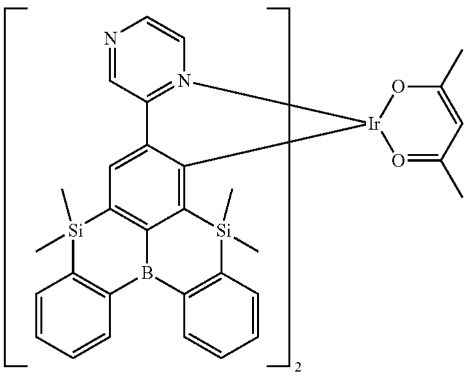
(431)
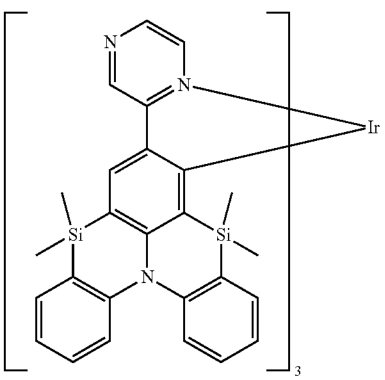
(432)
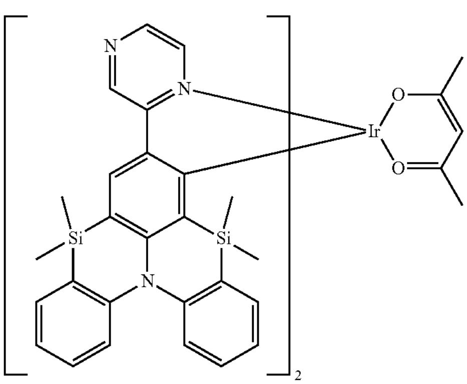
-continued
(433)
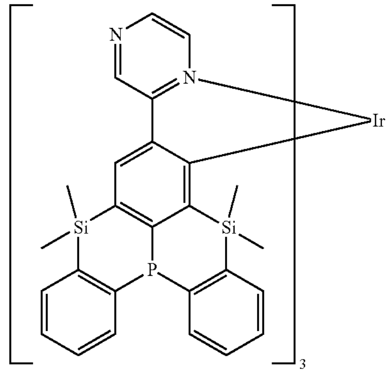
(434)
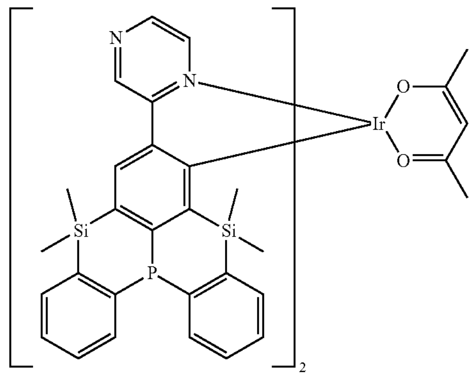
(435)
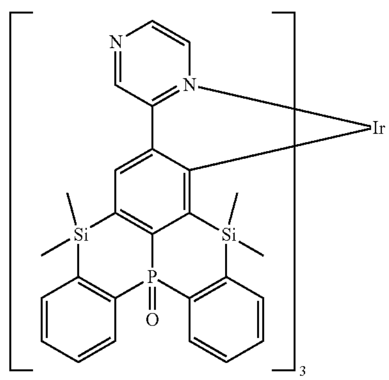
(436)
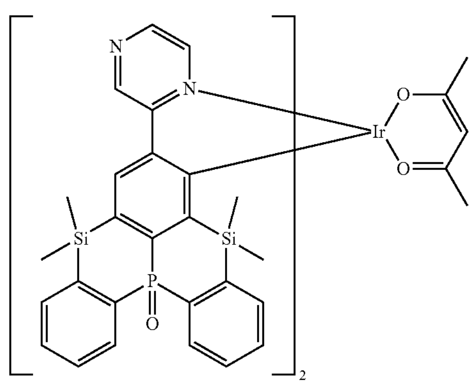

-continued
(437)
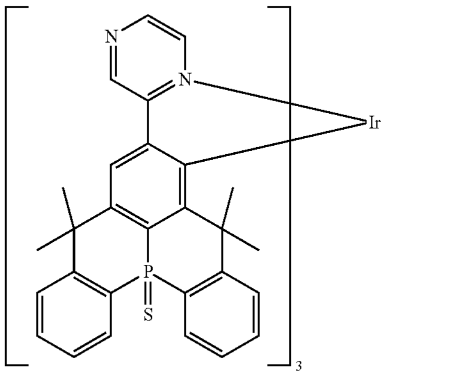
(438)
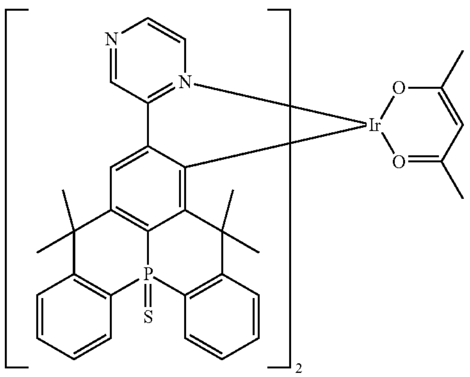
(439)
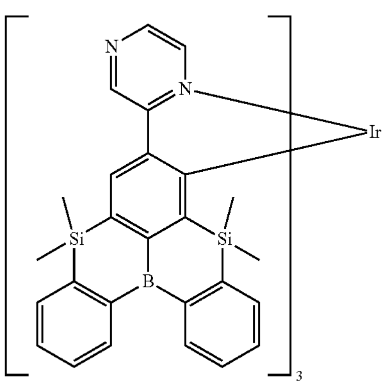
(440)
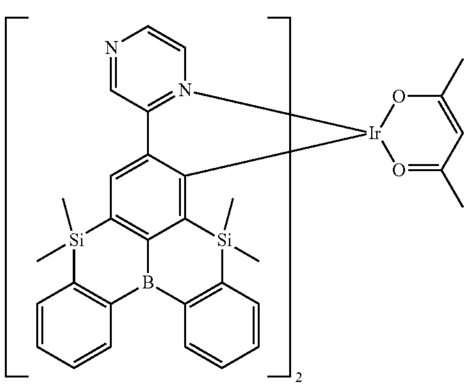
-continued
(441)
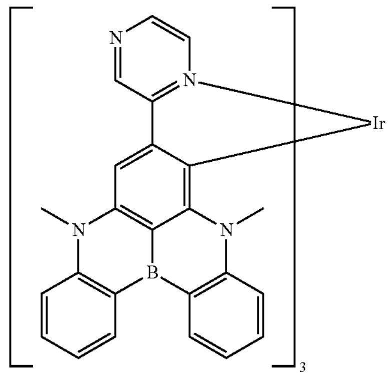
(442)
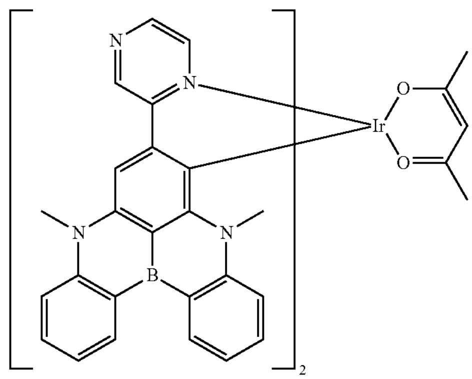
(443)
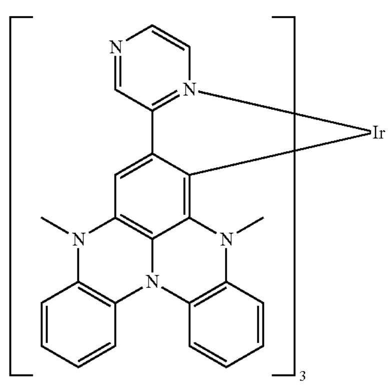
(444)
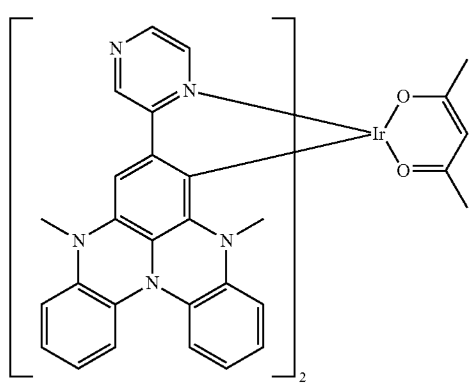

-continued
(445)
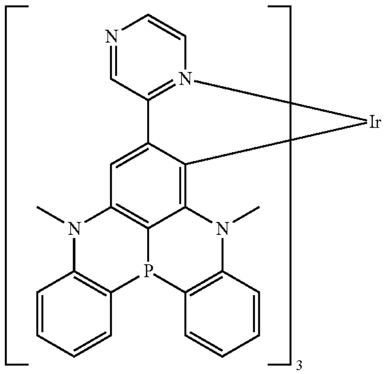
(446)
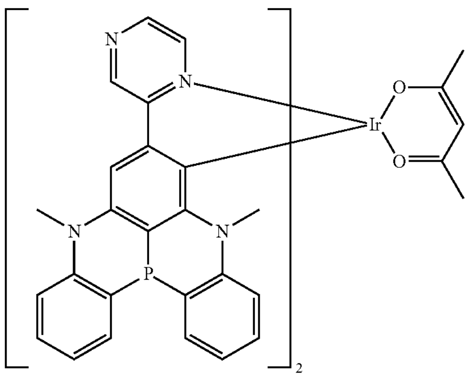
(447)
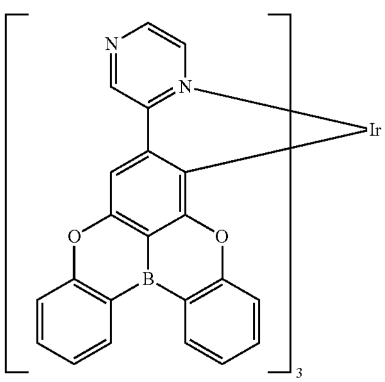
(448)
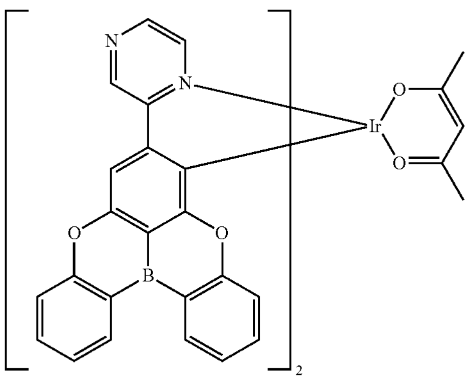
-continued
(449)
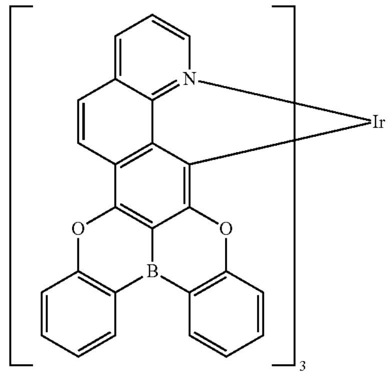
(450)
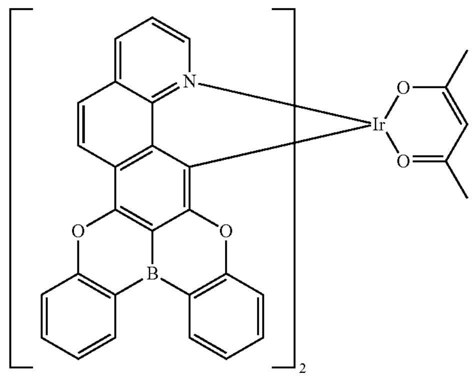
(451)
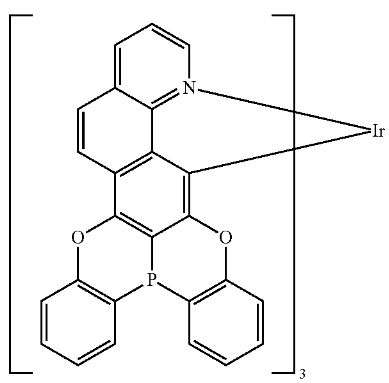
(452)
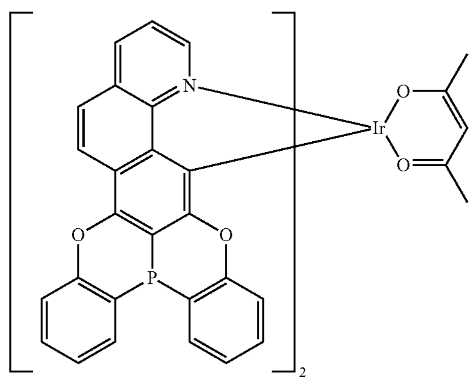

-continued
(453)
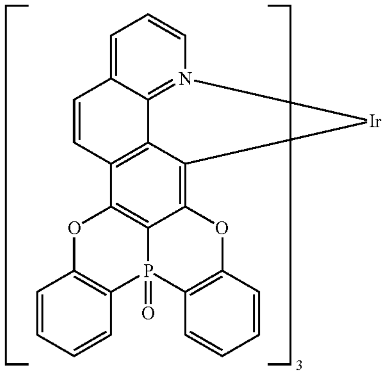
(454)
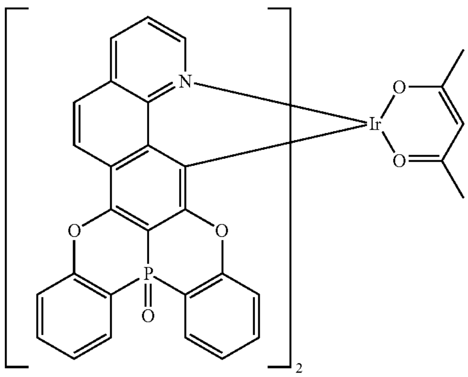
(455)
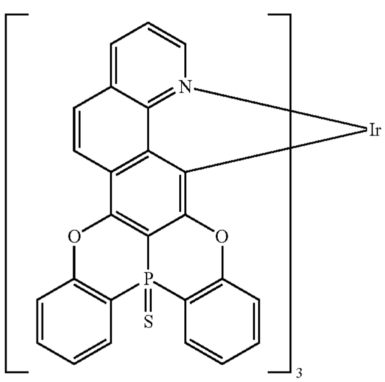
(456)
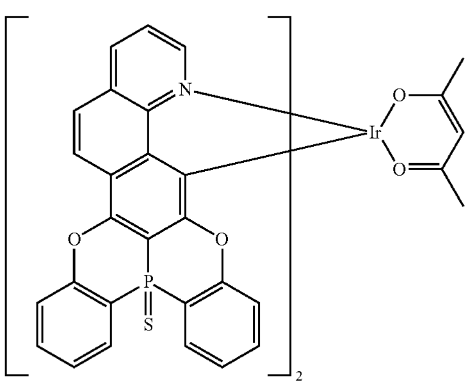
-continued
(457)
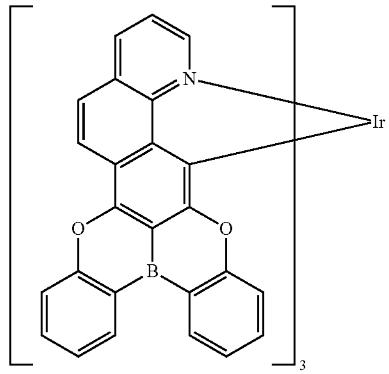
(458)
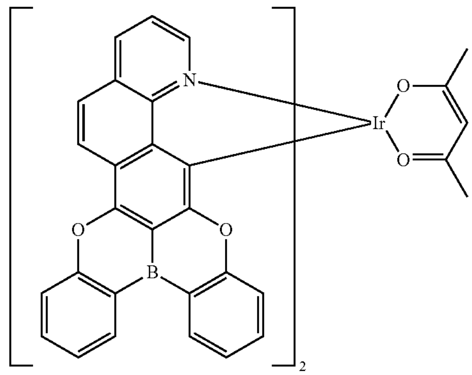
(459)
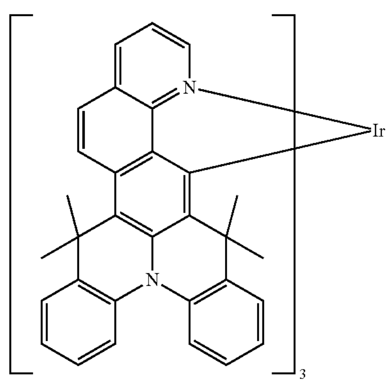
(460)
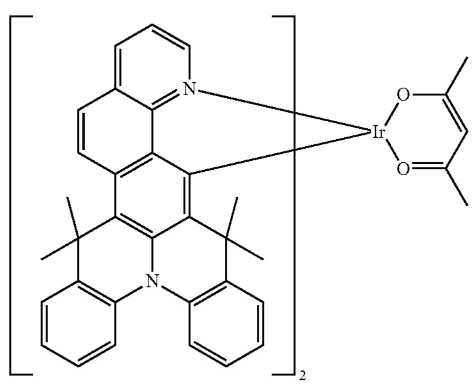

-continued
(461)
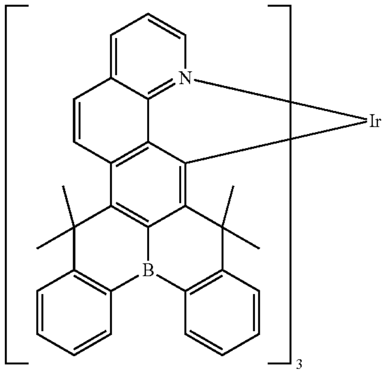
(462)
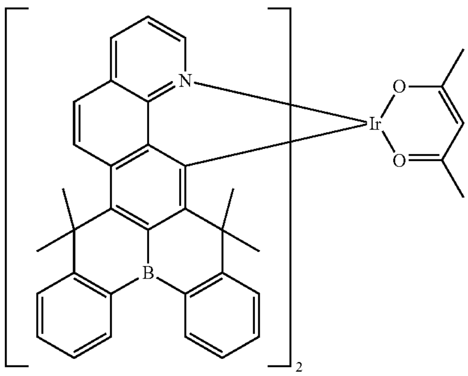
(463)
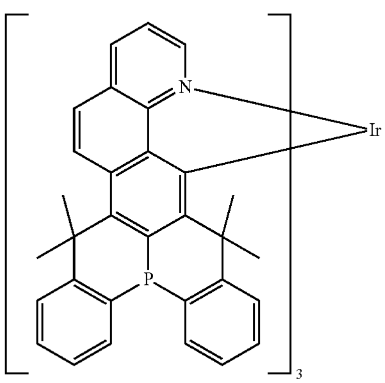
(464)
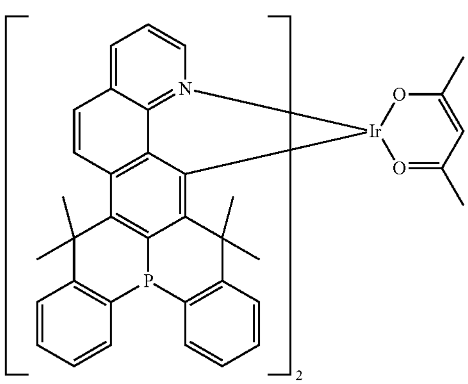
-continued
(465)
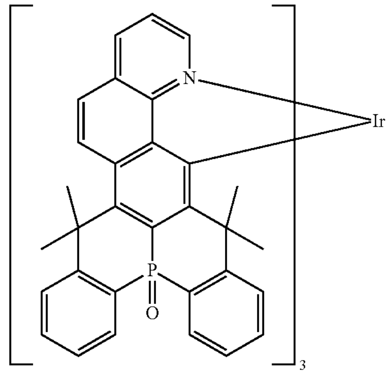
(466)
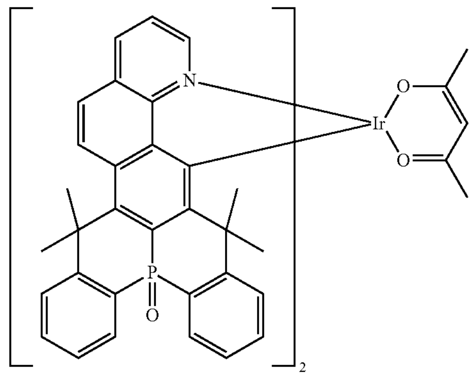
(467)
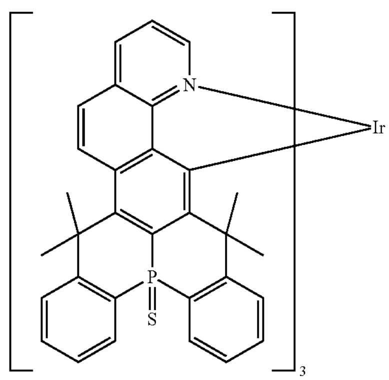
(468)
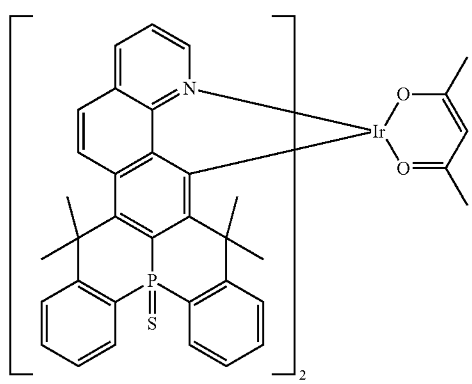
In one embodiment, the organometallic complex according to the present disclosure is a light-emitting material with a light-emitting wavelength between 300 nm and 1000 nm, further, the organometallic complex according to the present disclosure is a light-emitting material with a light-emitting wavelength between 350 nm and 900 nm in another embodiment, further, the organometallic complex according to the present disclosure is a light-emitting material with a light-emitting wavelength between 400 nm and 800 nm in a particular embodiment. The term luminescence/light-emitting herein refers to photoluminescence or electroluminescence.

In some embodiments, the organometallic complex according to the present disclosure has a photoluminescence or electroluminescence efficiency greater than or equal to 30%, further, the organometallic complex according to the present disclosure has a photoluminescence or electroluminescence efficiency greater than or equal to 40% in other embodiments, further, the organometallic complex according to the present disclosure has a photoluminescence or electroluminescence efficiency greater than or equal to 50% in other embodiments, further, the organometallic complex according to the present disclosure has a photoluminescence or electroluminescence efficiency greater than or equal to 60% in other embodiments.

In some embodiments, the organometallic complex according to the present disclosure may also be a non-emitting material.

The present disclosure also relates to a polymer comprising at least one repeating unit which comprises the structural unit represented by the general formula (I).

In one embodiment, the synthesis method of the polymer is selected from the group consisting of SUZUKI-, YAMAMOTO-, STILLE-, NIGESHI-, KUMADA-, HECK-, SONOGASHIRA-, HIYAMA-, FUKUYAMA-, HARTWIG-BUCHWALD- and ULLMAN.

In one embodiment, the polymer according to the present disclosure has a glass transition temperature ($T_g$)≥100° C., further, the polymer according to the present disclosure has a $T_g$≥120° C. in another embodiment, further, the polymer according to the present disclosure has a $T_g$≥140° C. in another embodiment, further, the polymer according to the present disclosure has a $T_g$≥160° C. in another embodiment, further, the polymer according to the present disclosure has a $T_g$≥180° C. in a particular embodiment.

In one embodiment, the polymer according to the present disclosure has a molecular weight distribution (PDI) in the range of 1 to 5, further, the polymer according to the present disclosure has a molecular weight distribution (PDI) in the range of 1 to 4 in another embodiment, further, the polymer according to the present disclosure has a molecular weight distribution (PDI) in the range of 1 to 3 in another embodiment, further, the polymer according to the present disclosure has a molecular weight distribution (PDI) in the range of 1 to 2 in another embodiment, further, the polymer according to the present disclosure has a molecular weight distribution (PDI) in the range of 1 to 1.5 in a particular embodiment.

In one embodiment, the polymer according to the present disclosure has a weight average molecular weight (Mw) in the range of 10,000 to 1,000,000, and further, the polymer according to the present disclosure has a weight average molecular weight (Mw) in the range of 50,000 to 500,000 in another embodiment, further, the polymer according to the present disclosure has a weight average molecular weight (Mw) in the range of 100,000 to 400,000 in another embodiment, further, the polymer according to the present disclosure has a weight average molecular weight (Mw) in the range of 150,000 to 300,000 in another embodiment, further, the polymer according to the present disclosure has a weight average molecular weight (Mw) in the range of 200,000 to 250,000 in a particular embodiment.

The present disclosure also provides a mixture comprising at least one or more organometallic complexes or polymers as described above and at least another organic functional material, wherein the at least another organic functional material may be selected from the group consisting of a hole injection material (HIM), a hole transport material (HTM), an electron transport material (ETM), an electron injection material (EIM), an electron blocking material (EBM), a hole blocking material (HBM), a light-emitting material (emitter), a host material, and an organic dye. Various organic functional materials are described in detail, for example, in WO2010135519A1, US20090134784A1 and WO 2011110277A1, and the entire contents of these three patent documents are hereby incorporated herein by reference.

In some embodiments, the content of the metal organic complex in the mixture according to the present disclosure is 0.01 wt % to 30 wt %, 0.5 wt % to 20 wt % in other embodiments, 2 wt % to 15 wt % in other embodiments, 5 wt % to 15 wt % in other embodiments.

In one embodiment, the mixture according to the present disclosure comprises the organometallic complex or the polymer according to the present disclosure and a triplet matrix material.

In another embodiment, the mixture according to the present disclosure comprises the organometallic complex or the polymer according to the present disclosure, a triplet matrix material and another triplet emitter.

In another embodiment, the mixture according to the present disclosure comprises the organometallic complex or the polymer according to the present disclosure and a thermally activated delayed fluorescent material (TADF).

In another embodiment, the mixture according to the present disclosure comprises the organometallic complex or the polymer according to the present disclosure, a triplet matrix material and a thermally activated delayed fluorescent material (TADF).

The triplet matrix materials, triplet emitters and TADF materials are described in more detail below (but are not limited thereto).

1. Triplet Host Materials

Examples of triplet host material are not particularly limited, and any metal complex or organic compound may be used as a host as long as its triplet energy level is higher than that of an emitter, particularly a triplet emitter or a phosphorescent emitter. Examples of the metal complex that may be used as the triplet host include (but are not limited to) the following general structure:

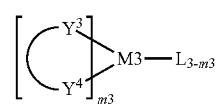

M3 is a metal; ($Y^3$-$Y^4$) is a bidentate ligand, $Y^3$ and $Y^4$ are independently selected from C, N, O, P and S; L is an auxiliary ligand; m3 is an integer from 1 to the maximum coordination number of the metal. In one embodiment, the metal complex that may be used as the triplet host has the following forms:

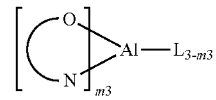

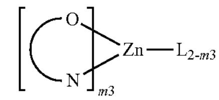

(O—N) is a bidentate ligand, wherein the metal is coordinated with O and N atoms, m3 is an integer from 1 to the maximum coordination number of this metal.

In a certain embodiment, M3 may be selected from Ir and Pt.

Examples of organic compounds that may be used as the triplet host are selected from the group consisting of compounds comprising cyclic aromatic hydrocarbyl, such as benzene, biphenyl, triphenyl benzene, and benzofluorene; compounds comprising aromatic heterocyclic group, such as dibenzothiophene, dibenzofuran, dibenzoselenophen, furan, thiophene, benzofuran, benzothiophene, benzoselenophen, carbazole, dibenzocarbazole, indolocarbazole, pyridine indole, pyrrole dipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, oxazole, dibenzoxazole, benzisoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furopyridine, benzothiophene pyridine, thiophene pyridine, benzoselenophenepyridine and selenophenbenzodipyridine; or groups containing 2 to 10 ring structures, which may be the same or different types of cyclic aromatic hydrocarbyl groups or aromatic heterocyclic groups and are connected to each other directly or through at least one of the following groups, such as oxygen atom, nitrogen atom, sulfur atom, silicon atom, phosphorus atom, boron atom, chain structure unit, and aliphatic ring group. Wherein, each Ar may be further substituted, and the substituent may be selected from the group consisting of hydrogen, deuterium, cyano group, halogen, alkyl, alkoxy, amino, alkenyl, alkynyl, aralkyl, heteroalkyl, aryl and heteroaryl.

In one embodiment, the singlet host material may be selected from compounds containing at least one of the following groups:

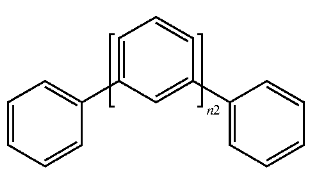

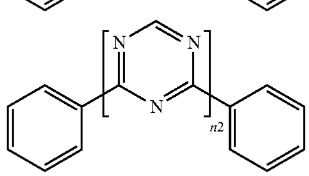

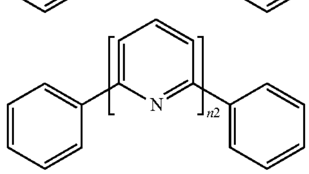

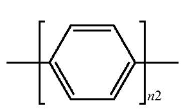

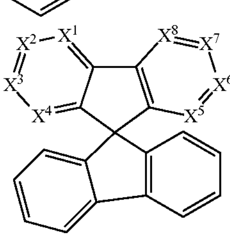

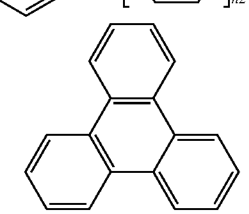

-continued

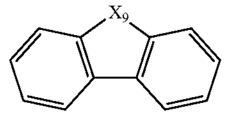

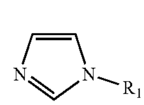

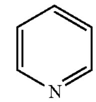

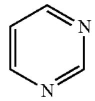

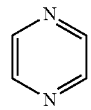

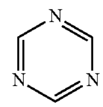

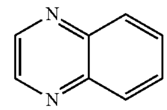

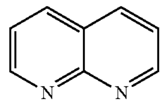

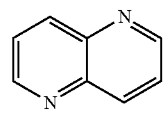

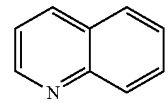

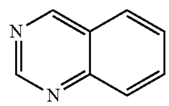

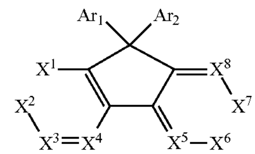

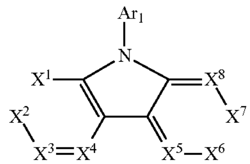

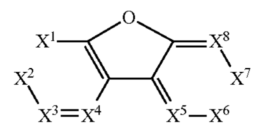

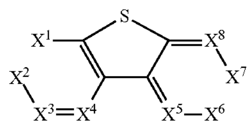

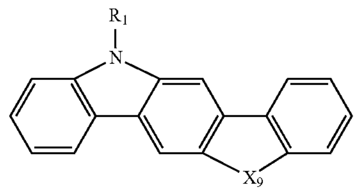

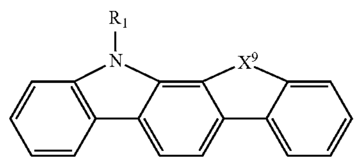

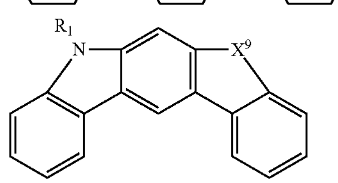

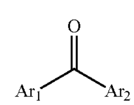

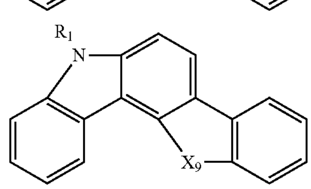

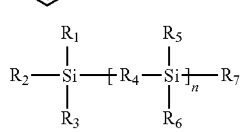

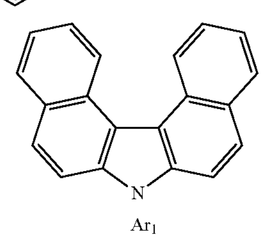

-continued
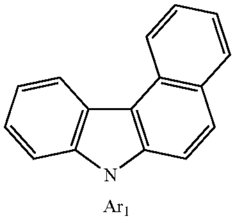
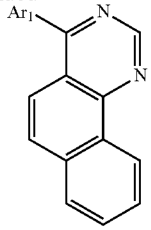
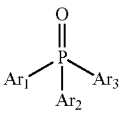
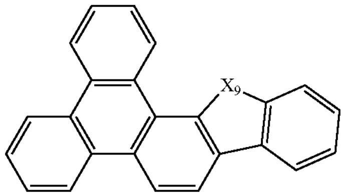
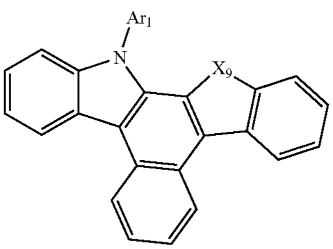
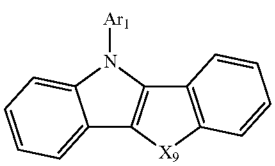
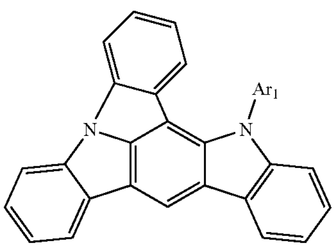
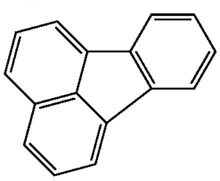
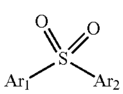
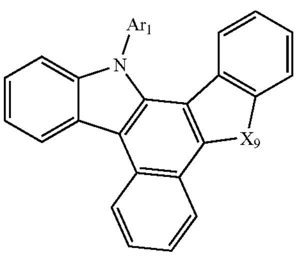
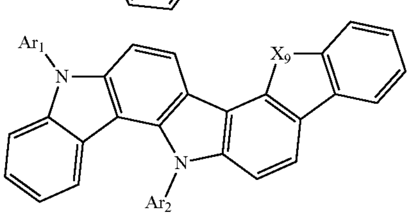
-continued
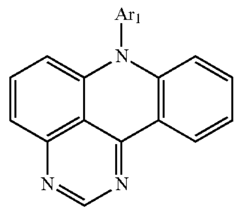
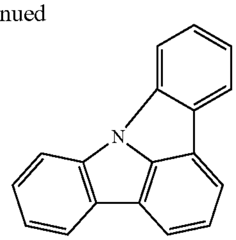
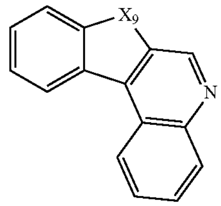
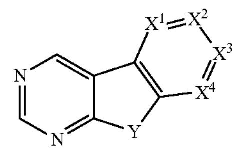
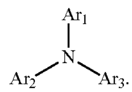
$R_2$-$R_7$ are defined as $R_L$, $X^1$~$X^9$ are $CR_1R_2$ or $NR_1$, Y is selected from $CR_1R_2$, $NR_1$, O and S, n2 is any integer from 1 to 20, each occurrence of $Ar_1$~$Ar_3$ is independently an aromatic group or a heteroaromatic group, $R_1$ and $R^2$ are defined as above.
Suitable examples of the triplet host material are listed below, but are not limited to:
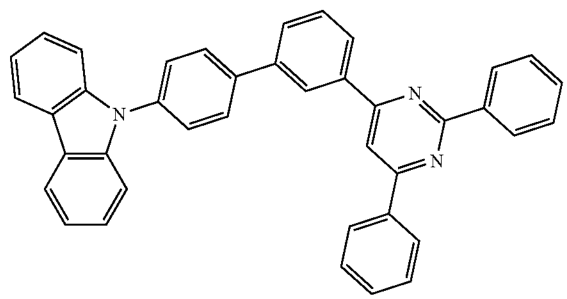
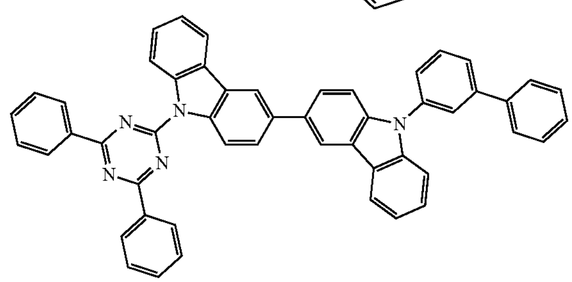
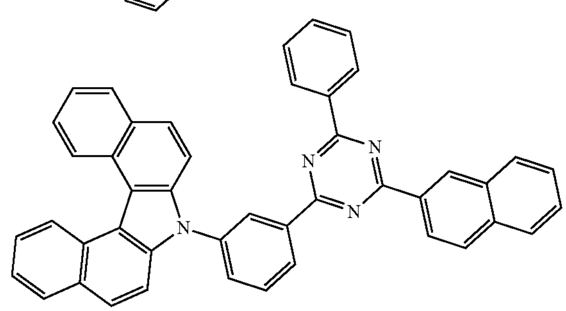

-continued
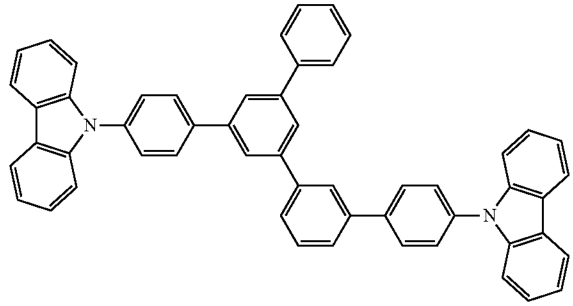
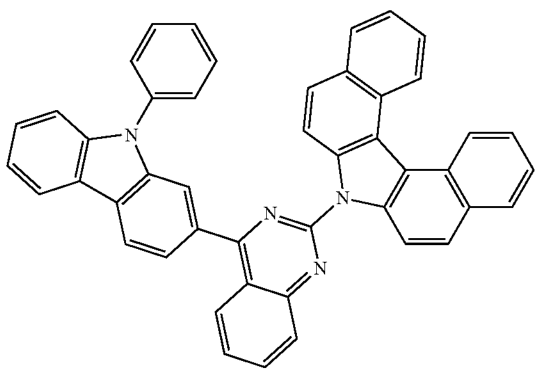
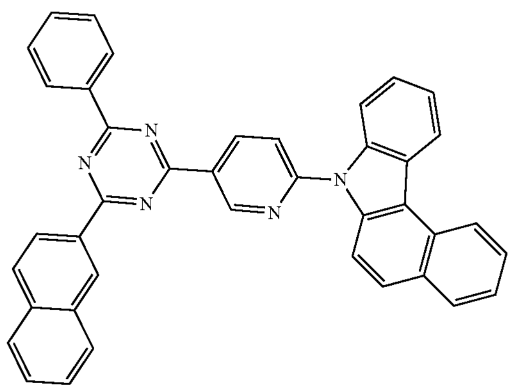
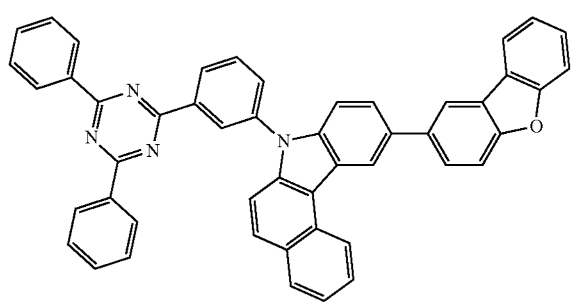
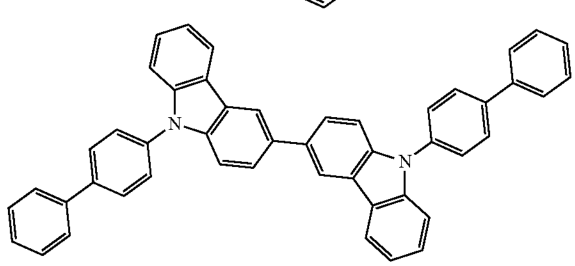
-continued
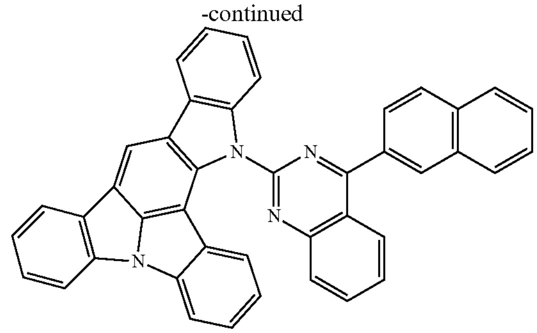
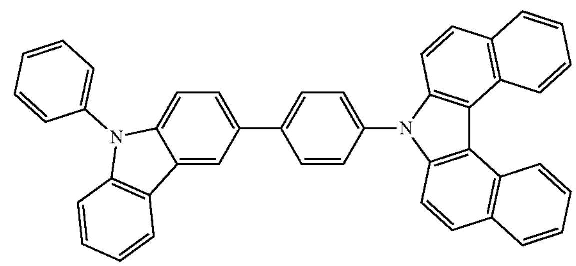
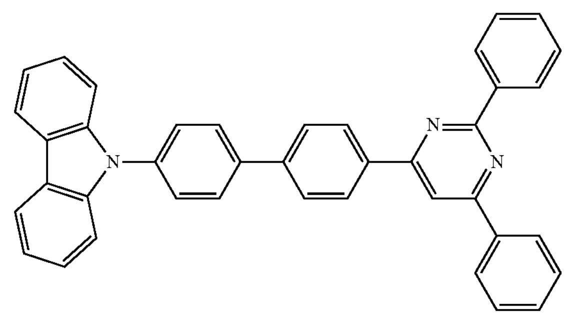
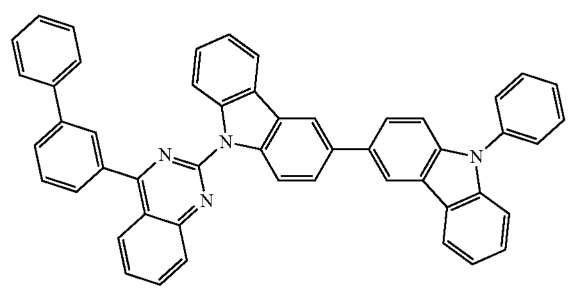
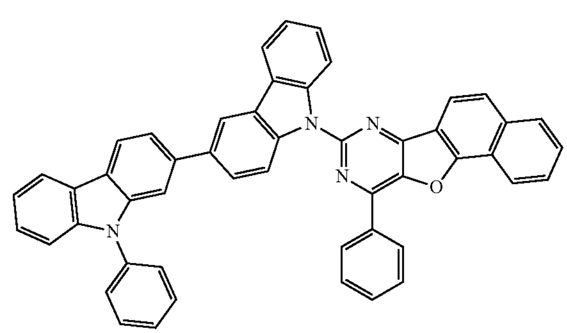

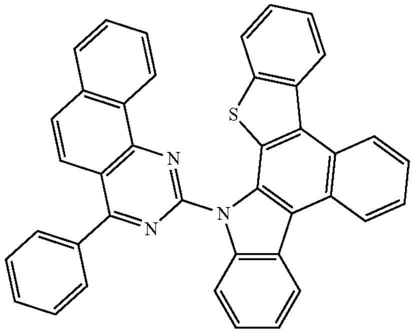
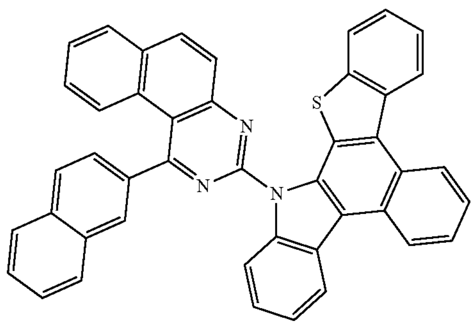
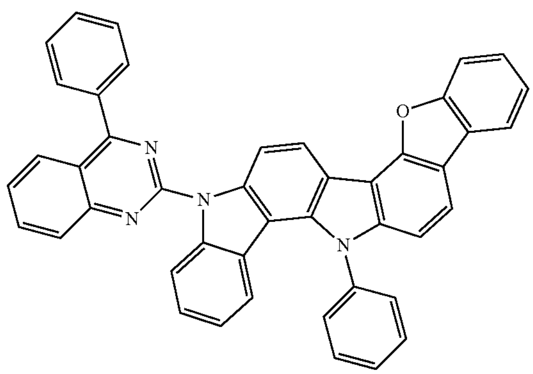
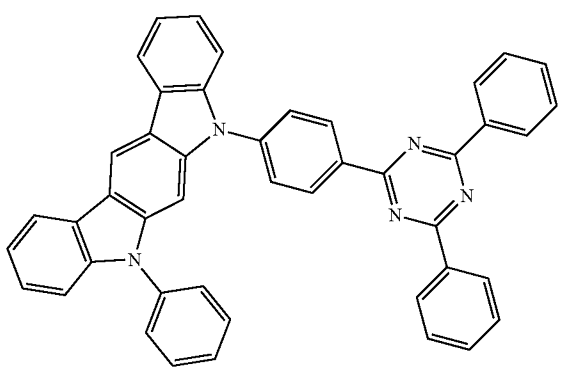
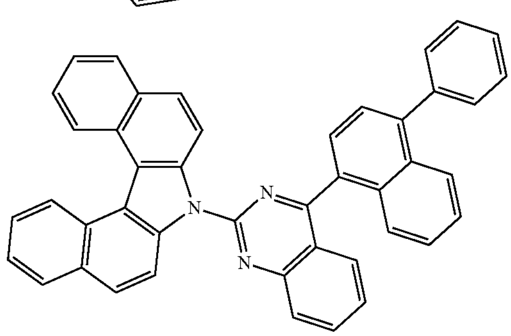
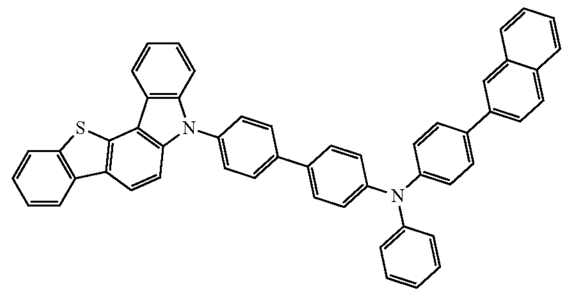
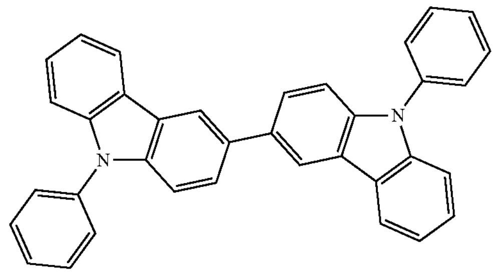
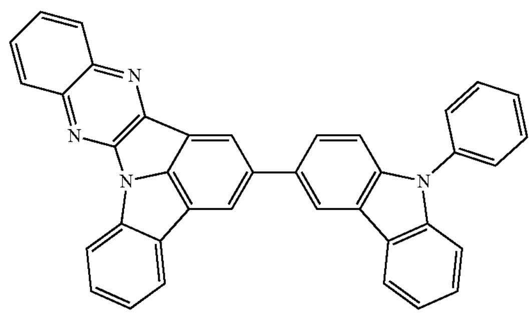
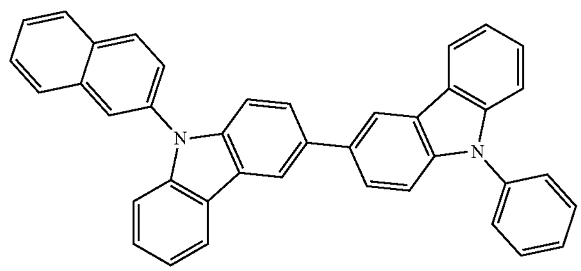
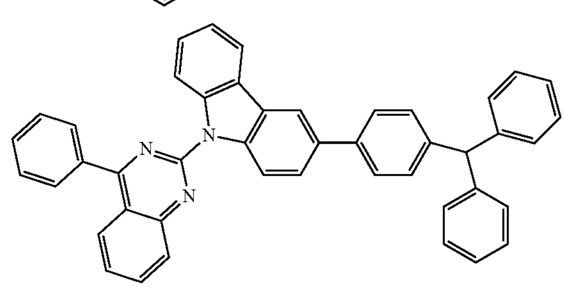

-continued
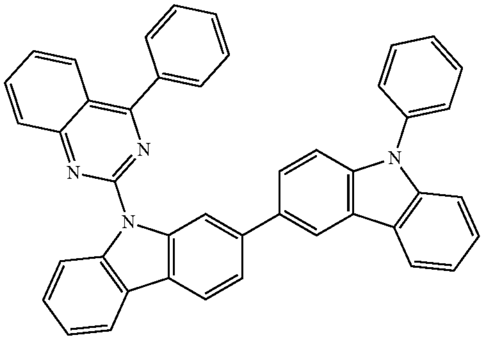
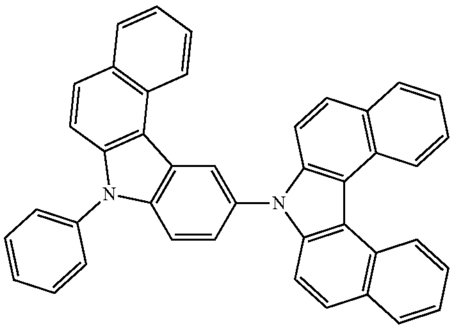
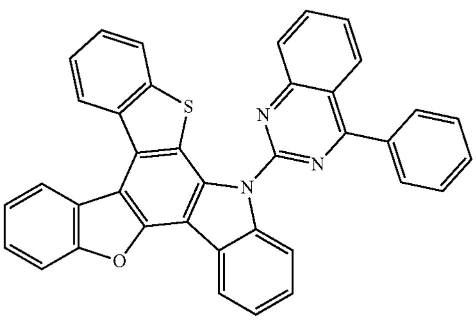
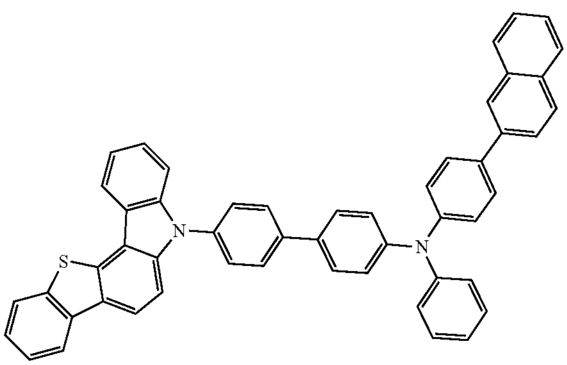
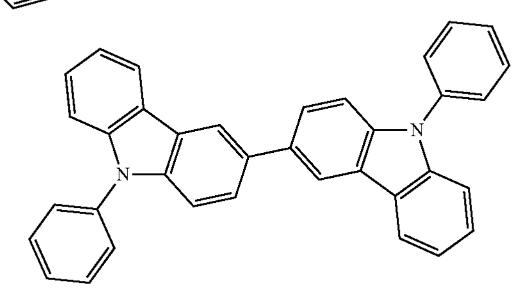
-continued
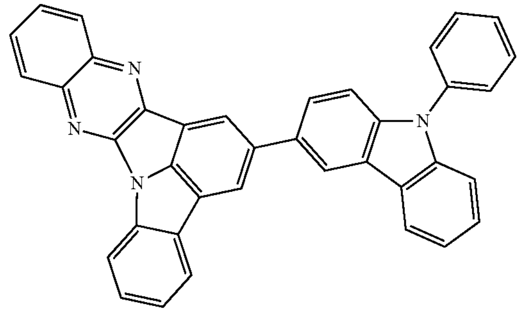
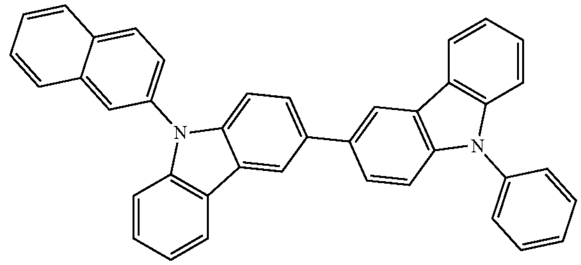
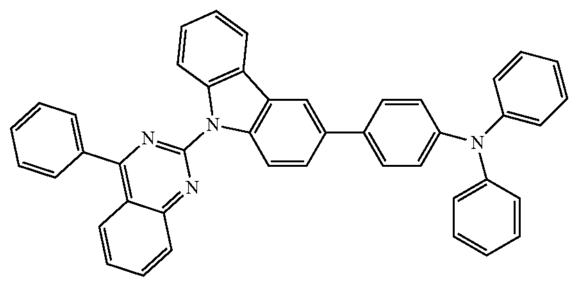
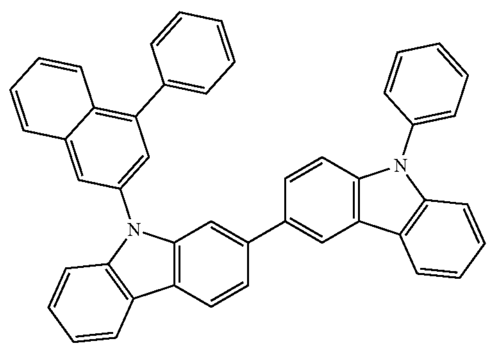
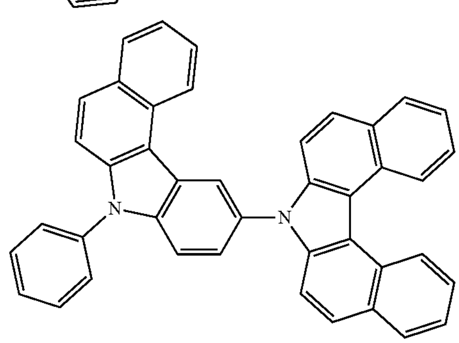

-continued

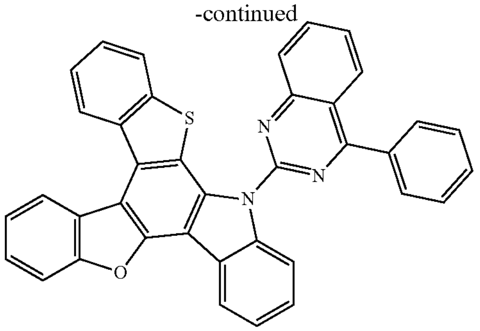

2. Thermally Activated Delayed Fluorescent Materials (TADF)

Traditional organic fluorescent materials can only emit light using 25% singlet exciton formed by electric excitation, and the device has low internal quantum efficiency (up to 25%). Although the intersystem crossing is enhanced due to the strong spin-orbit coupling of the heavy atom center, phosphorescent materials can emit light using the singlet exciton and triplet exciton formed by the electric excitation effectively, to achieve 100% internal quantum efficiency of the device. However, the application of phosphorescent materials in OLEDs is limited by the problems such as high cost, poor material stability and serious roll-down of the device efficiency. Thermally activated delayed fluorescent materials are the third generation of organic light-emitting materials developed after organic fluorescent materials and organic phosphorescent materials. This type of materials generally have a small singlet-triplet energy level difference (ΔEst), and the triplet exciton can emit light through being converted to singlet exciton by anti-intersystem crossing. This can make full use of the singlet exciton and triplet exciton formed under electric excitation. The device can achieve 100% internal quantum efficiency. Meanwhile, the materials are controllable in structure, stable in property, have low cost and no need for precious metals, and have a promising application prospect in the OLED field.

TADF materials need to have a smaller singlet-triplet energy level difference, typically $\Delta Est<0.3$ eV, further $\Delta Est<0.25$ eV, still further $\Delta Est<0.20$ eV, even further $\Delta Est<0.1$ eV. In one embodiment, TADF materials have a relatively small ΔEst, and in another embodiment, TADF materials have a better fluorescence quantum efficiency. Some TADF materials can be found in the following patent documents: CN103483332(A), TW201309696(A), TW201309778(A), TW201343874(A), TW201350558(A), US20120217869(A1), WO2013133359(A1), WO2013154064(A1), Adachi, et. al. Adv. Mater., 21, 2009, 4802, Adachi, et. al. Appl. Phys. Lett., 98, 2011, 083302, Adachi, et. al. Appl. Phys. Lett., 101, 2012, 093306, Adachi, et. al. Chem. Commun., 48, 2012, 11392, Adachi, et. al. Nature Photonics, 6, 2012, 253, Adachi, et. al. Nature, 492, 2012, 234, Adachi, et. al. J. Am. Chem. Soc, 134, 2012, 14706, Adachi, et. al. Angew. Chem. Int. Ed, 51, 2012, 11311, Adachi, et. al. Chem. Commun., 48, 2012, 9580, Adachi, et. al. Chem. Commun., 48, 2013, 10385, Adachi, et. al. Adv. Mater., 25, 2013, 3319, Adachi, et. al. Adv. Mater., 25, 2013, 3707, Adachi, et. al. Chem. Mater., 25, 2013, 3038, Adachi, et. al. Chem. Mater., 25, 2013, 3766, Adachi, et. al. J. Mater. Chem. C., 1, 2013, 4599, Adachi, et. al. J. Phys. Chem. A., 117, 2013, 5607, the contents of the above-listed patents or article documents are hereby incorporated by reference in their entirety.

Some suitable examples of TADF light-emitting materials are listed below:

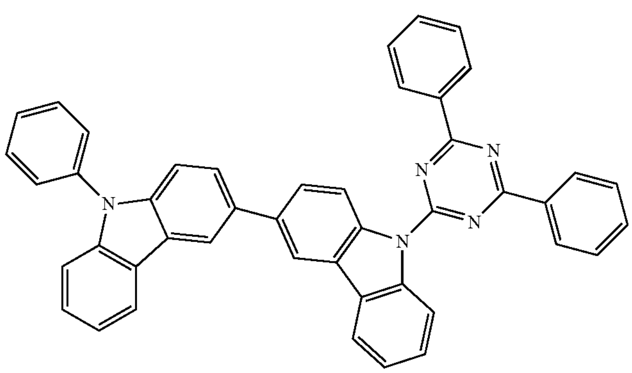

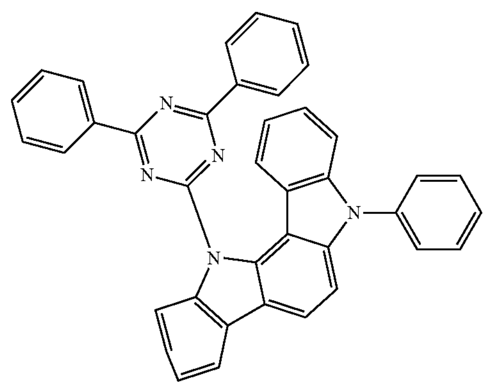

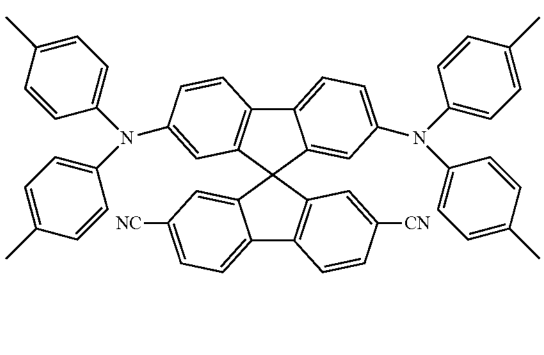

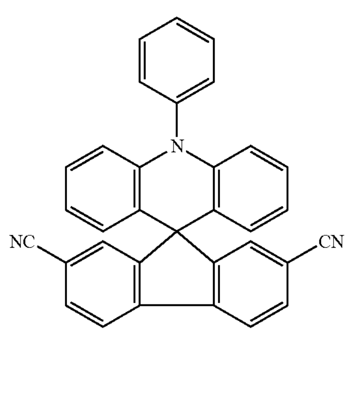

-continued
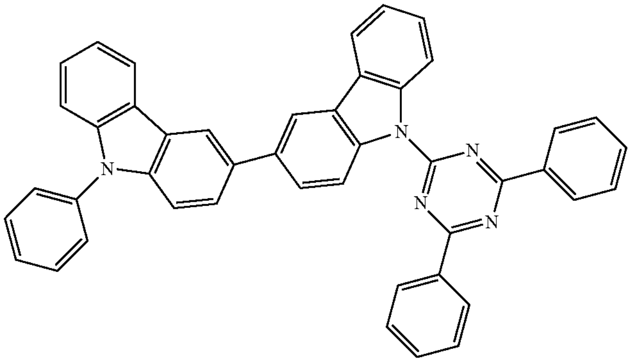
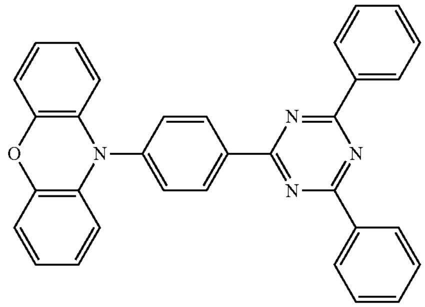
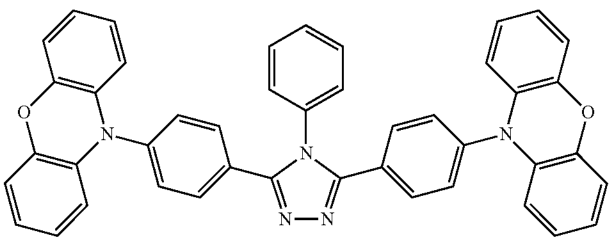
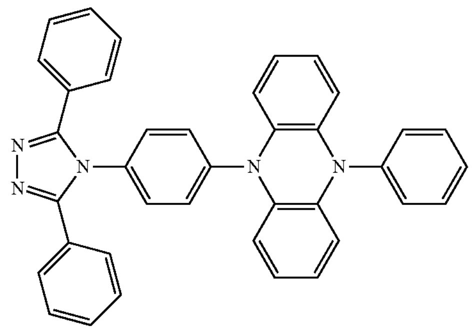
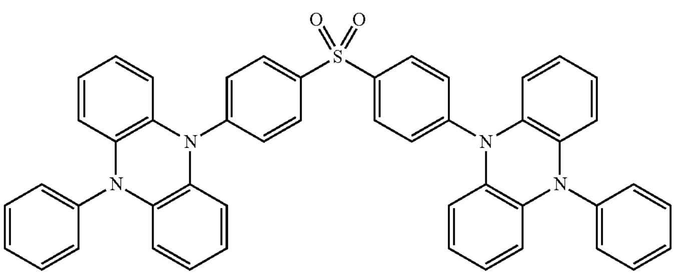
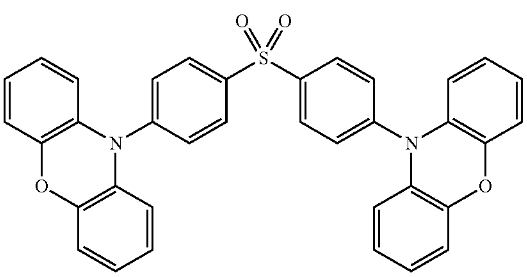
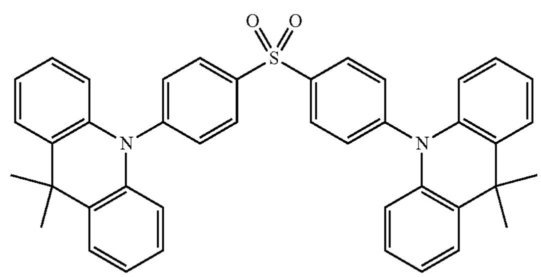
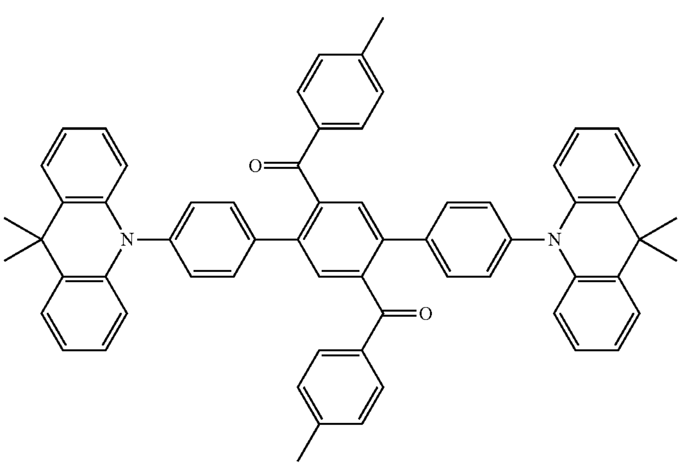
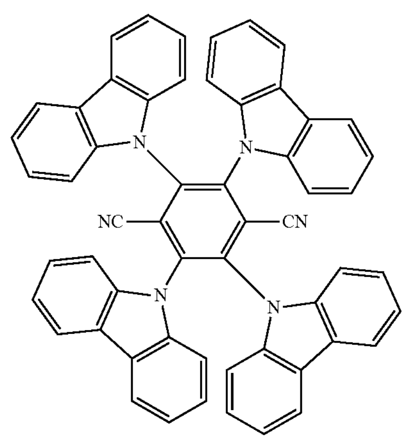

-continued
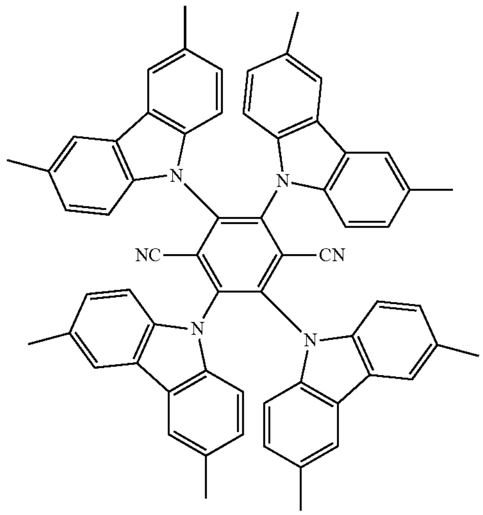
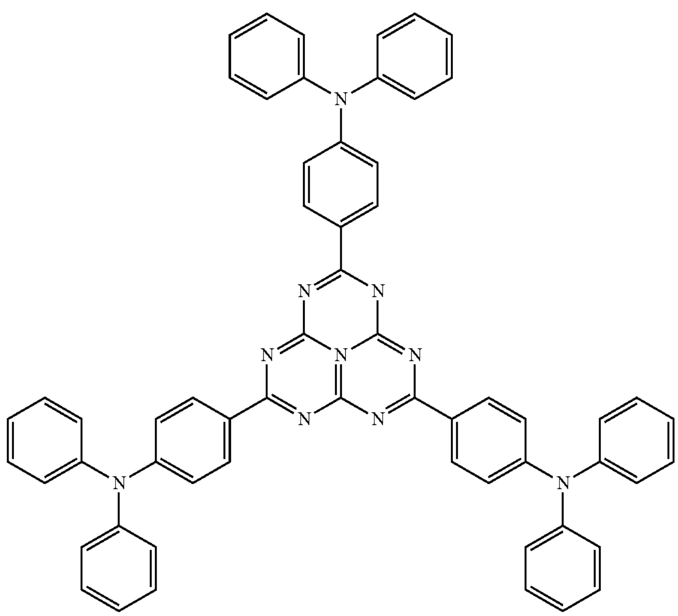
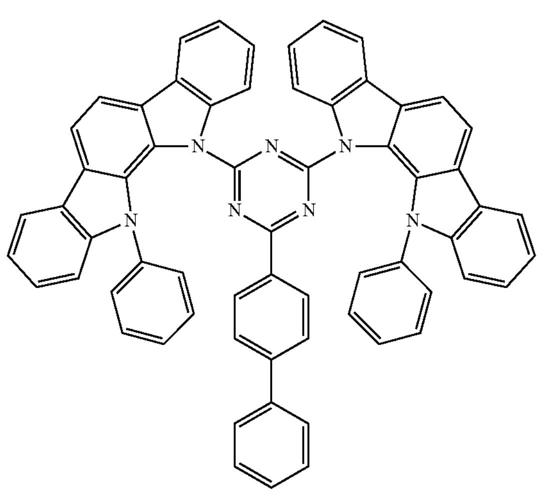
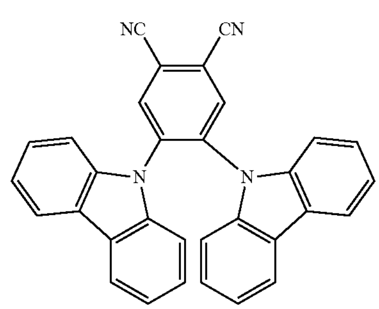

-continued
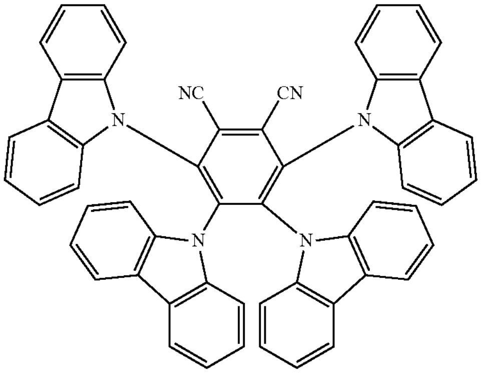
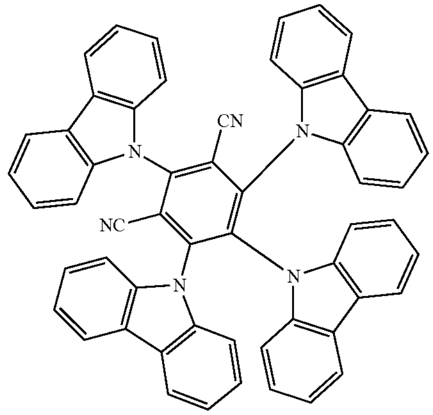
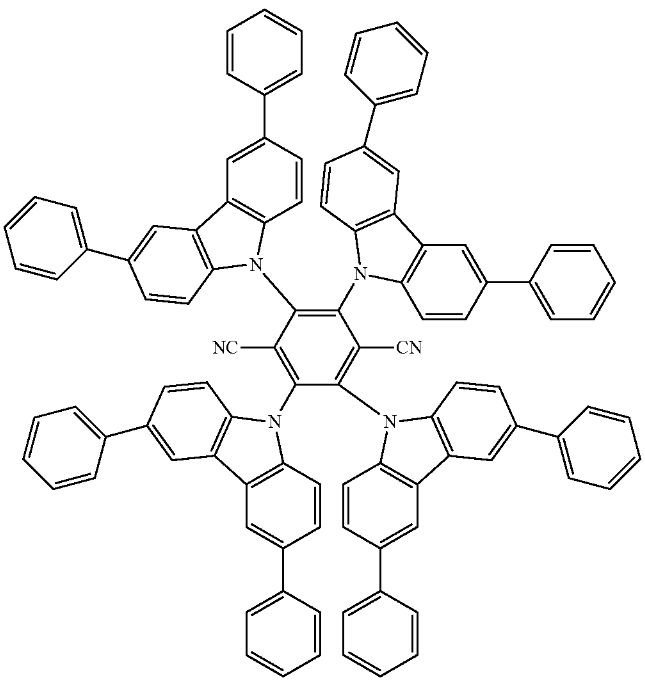
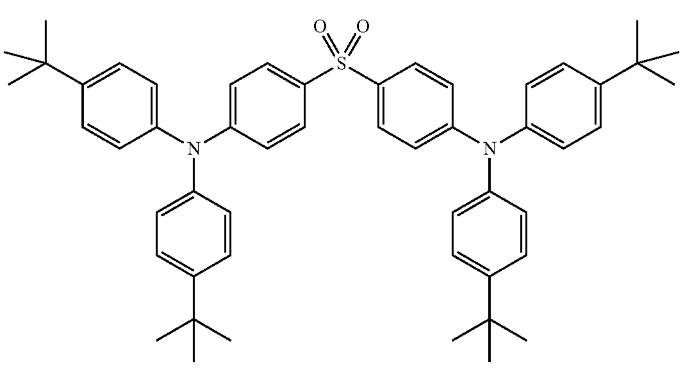
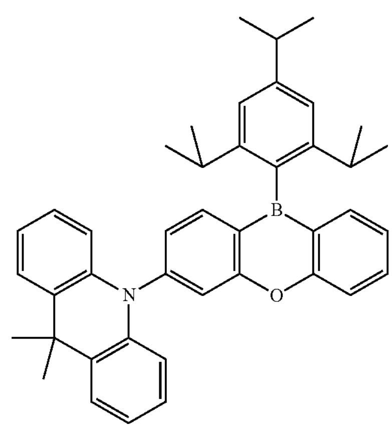

-continued
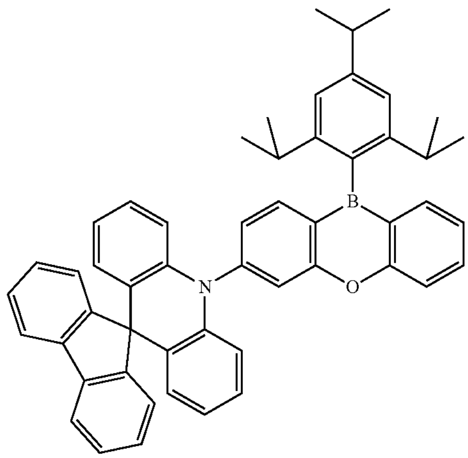
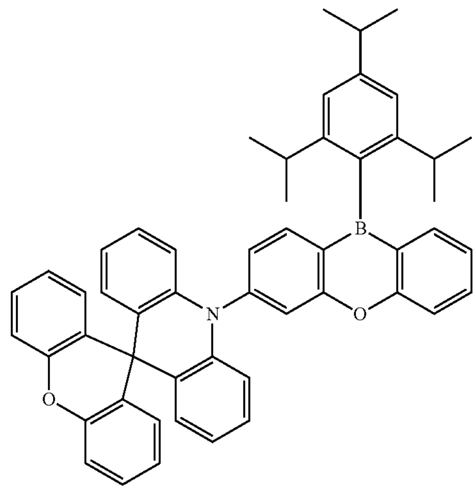
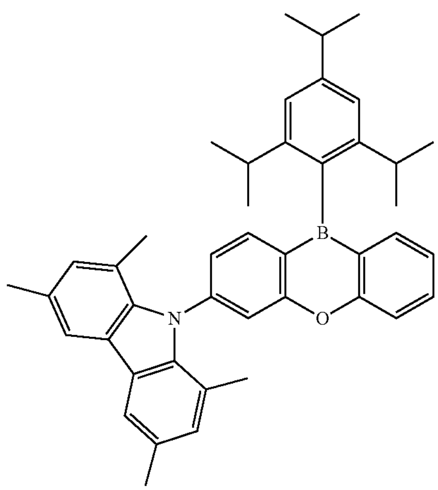
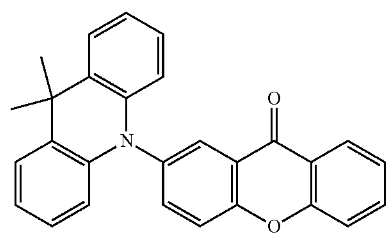
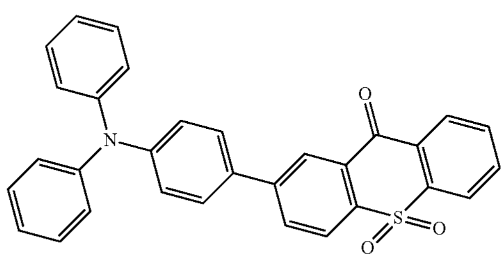
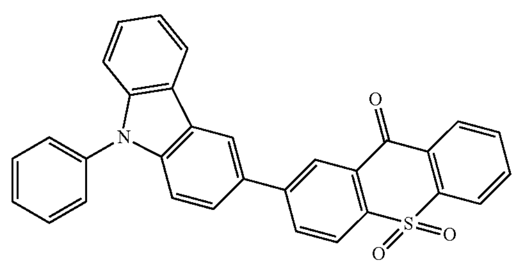
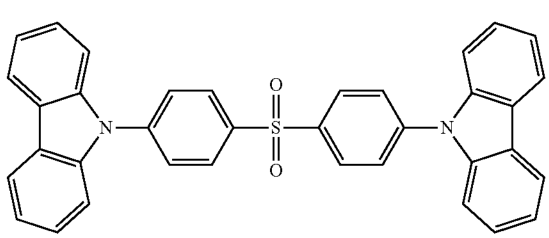
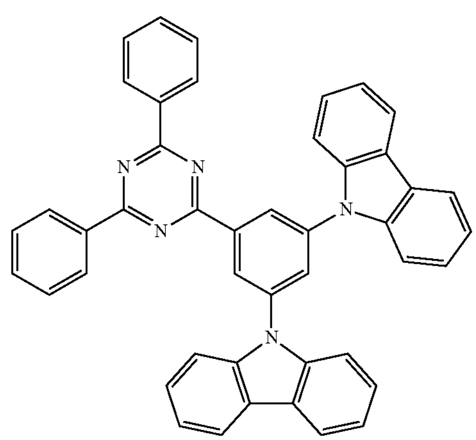

-continued
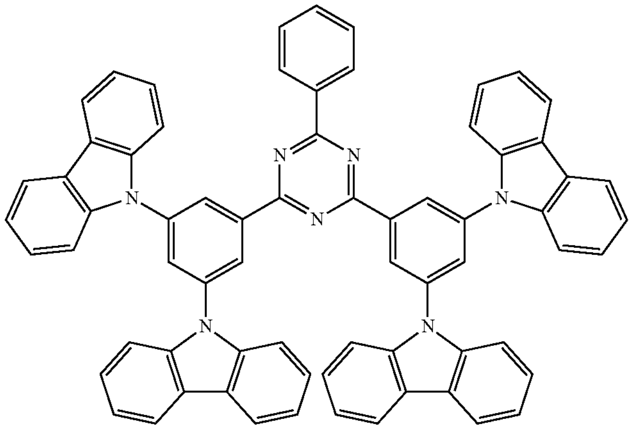
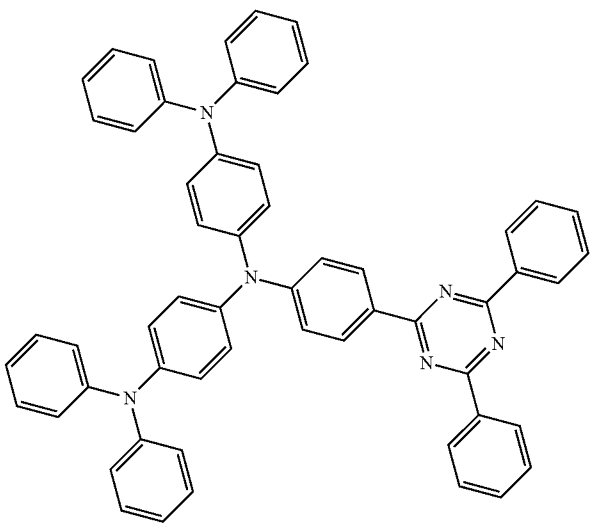
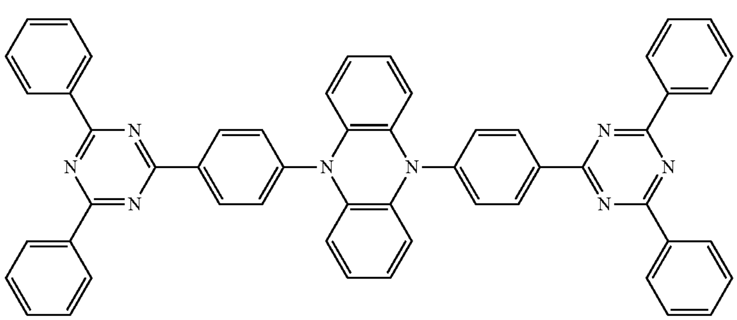
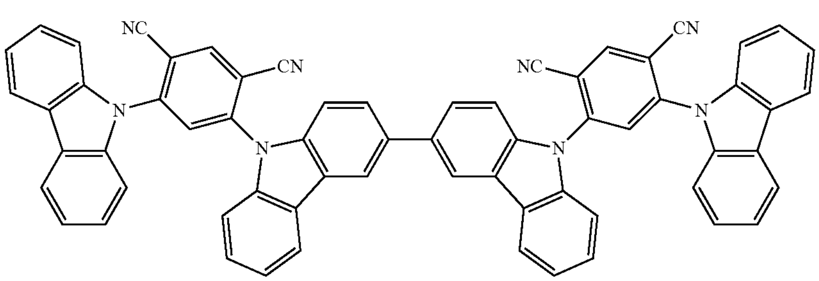

-continued
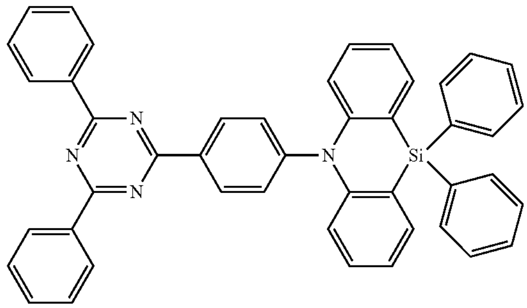
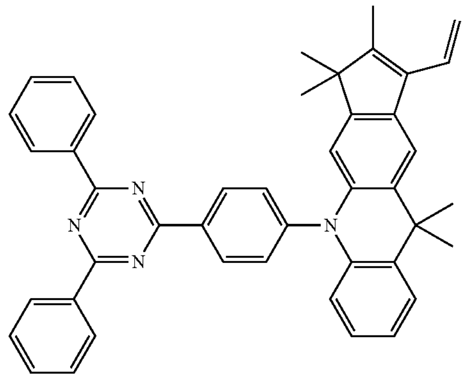
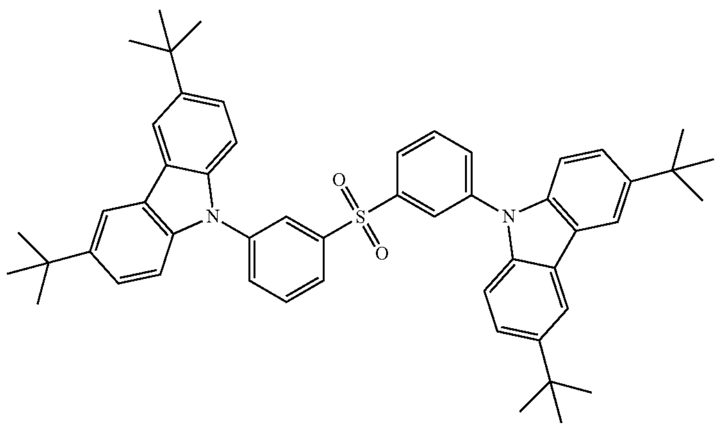
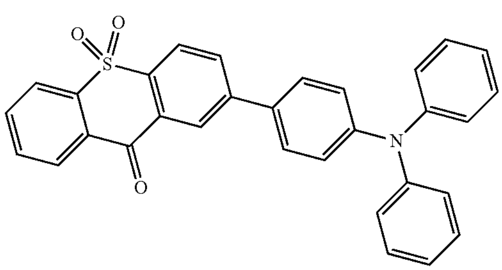
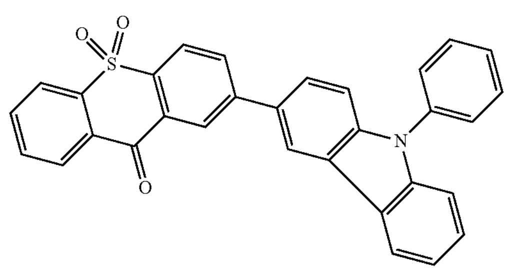
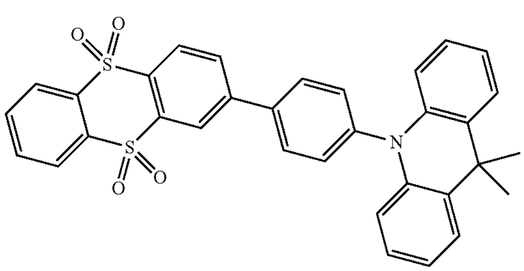
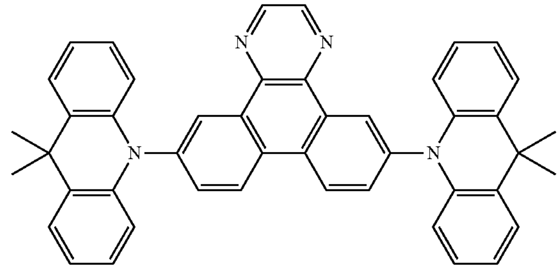
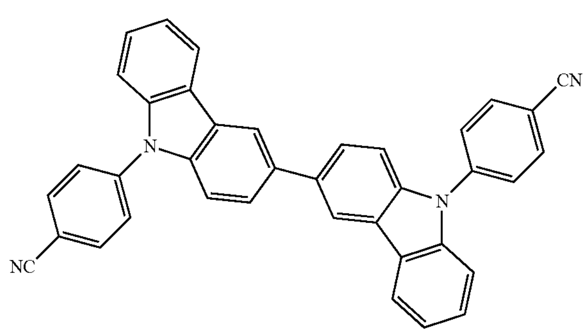

-continued
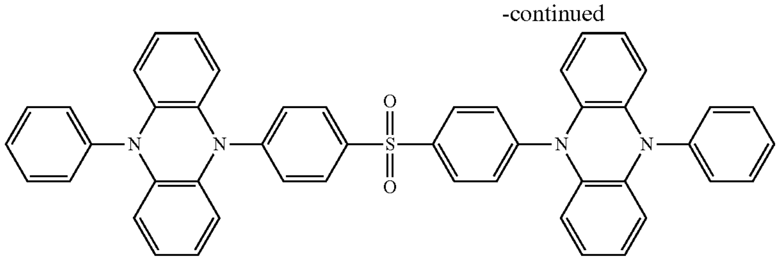
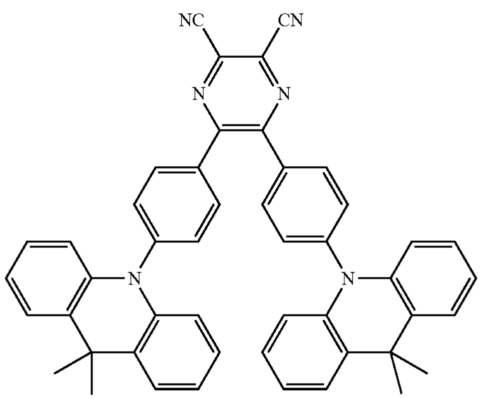
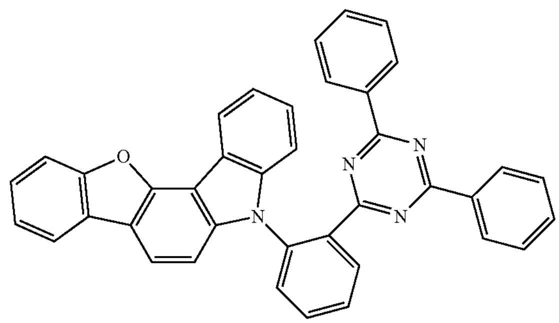
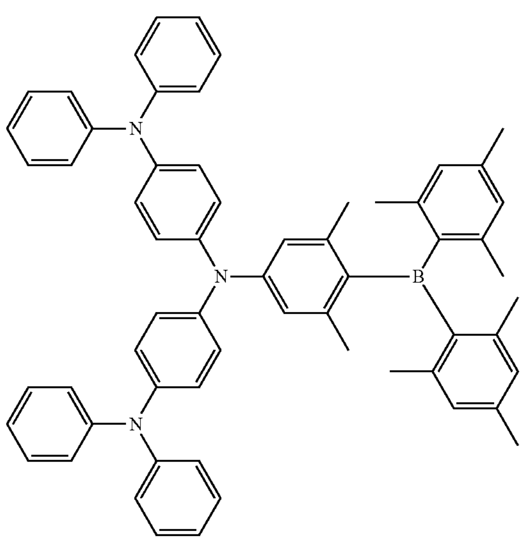
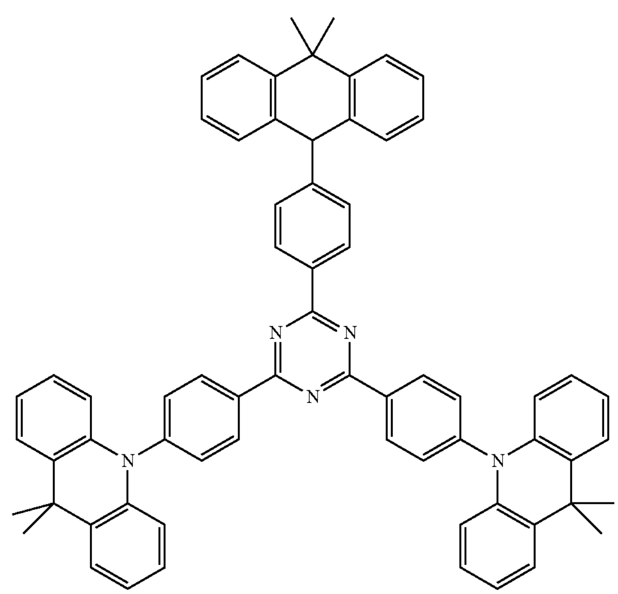

-continued
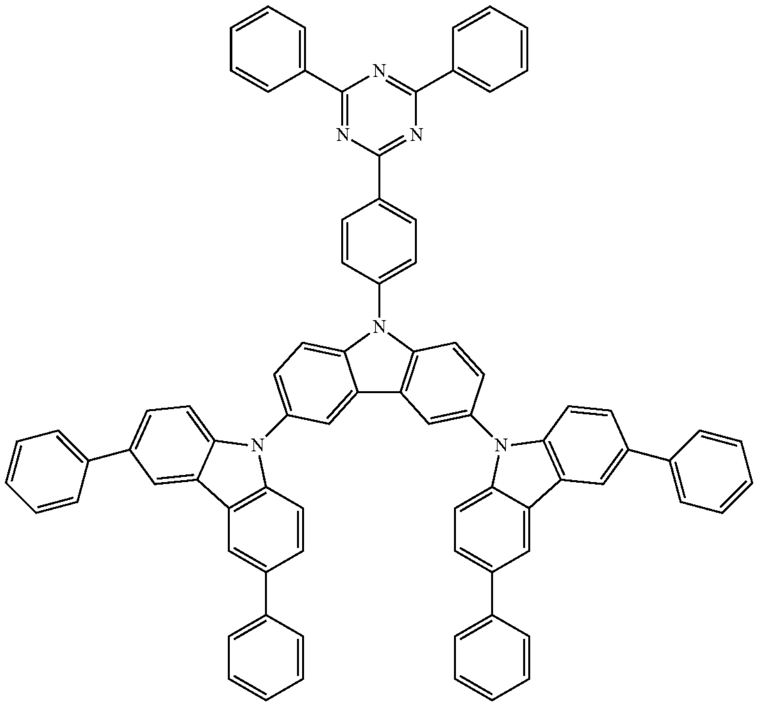
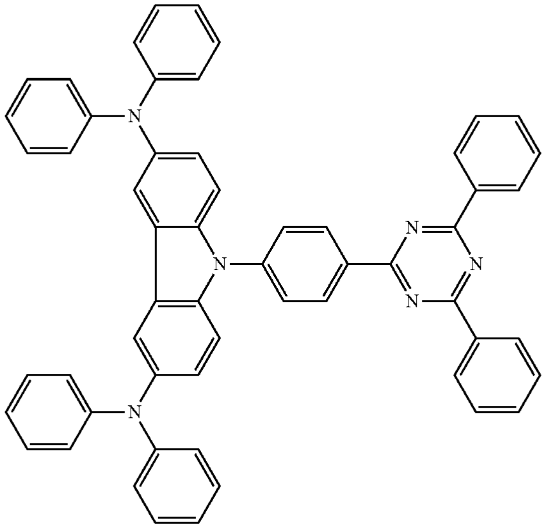
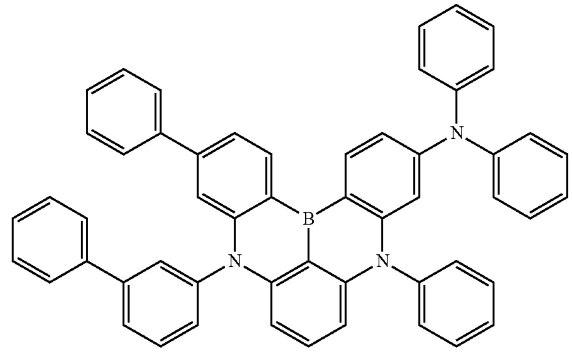

-continued
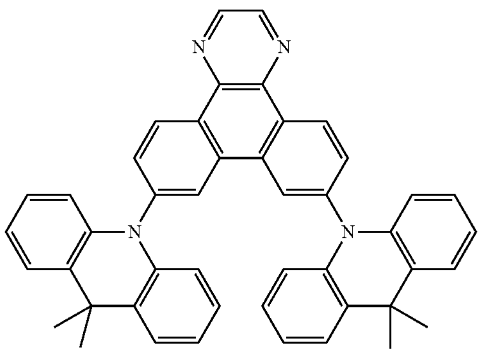
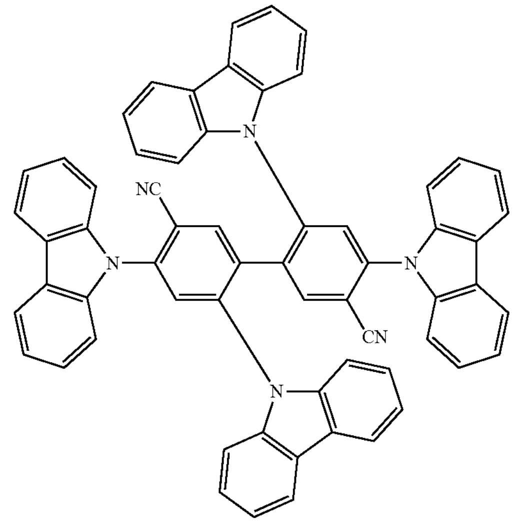
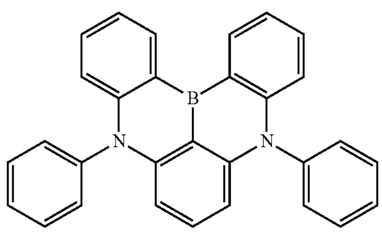
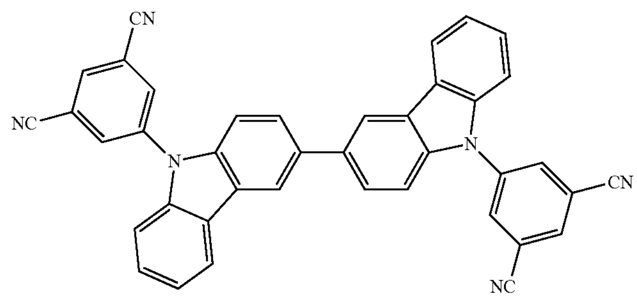
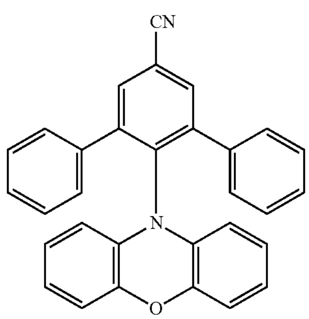
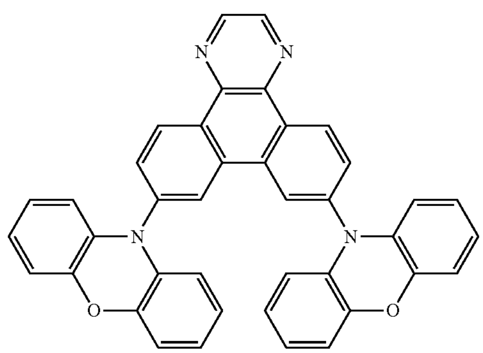
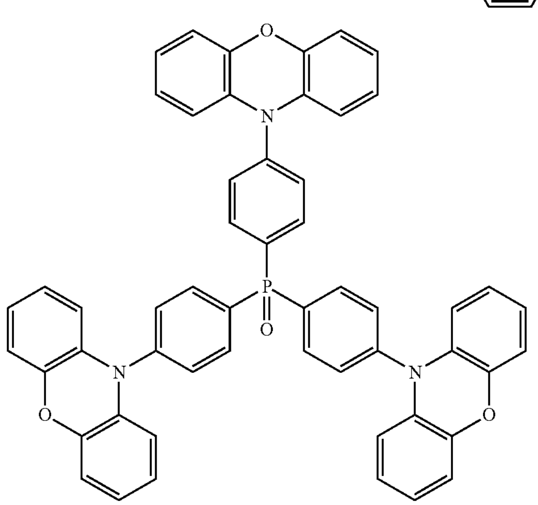

3. Triplet Emitters

Triplet emitters are also called phosphorescent emitters. In one embodiment, triplet emitters are metal complexes with general formula $M'(L')_n$, wherein M' is a metal atom, and each occurrence of L' may be the same or different and is an organic ligand which is bonded or coordinated to the metal atom M' through one or more sites, and n is an integer greater than 1, particularly is 1, 2, 3, 4, 5 or 6.

Optionally, these metal clathrates are connected to a polymer through one or more sites, particularly through organic ligands.

In one embodiment, the metal atom M' is selected from transition metal elements, lanthanide elements or actinide elements. In another embodiment, the metal atom M' is selected from the group consisting of Ir, Pt, Pd, Au, Rh, Ru, Os, Sm, Eu, Gd, Tb, Dy, Re, Cu and Ag. In another embodiment, the metal atom M' is selected from the group consisting of Os, Ir, Ru, Rh, Re, Pd, Au and Pt.

In some embodiments, the triplet emitter comprises chelating ligands, i.e. ligands, which are coordinated with the metal via at least two binding sites. In other embodiments, the triplet emitter comprises two or three same or different bidentate or multidentate ligands. The chelating ligands are beneficial to improve the stability of the metal complexes.

Examples of the organic ligands may be selected from the group consisting of phenylpyridine derivatives, 7,8-benzoquinoline derivatives, 2 (2-thienyl) pyridine derivatives, 2 (1-naphthyl) pyridine derivatives, and 2 phenylquinoline derivatives. All of these organic ligands may be substituted by, for example, fluoromethyl or trifluoromethyl. Auxiliary ligands may be selected from acetylacetone or picric acid.

In one embodiment, the metal complexes that can be used as the triplet emitters have the following form:

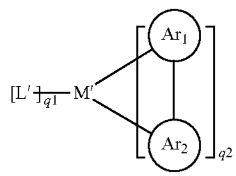

wherein M' is a metal and selected from transition metal elements, lanthanide elements, or actinide elements, particularly from Ir, Pt and Au;

each occurrence of $Ar_1$ may be the same or different and is a cyclic group which contains at least one donor atom, i.e. an atom with a lone pair of electrons, such as nitrogen or phosphorus, through which the cyclic group is coordinated with the metal; each occurrence of $Ar_2$ may be the same or different and is a cyclic group which contains at least one carbon atom, through which the cyclic group is coordinated with the metal; Ar and $Ar_2$ are covalently bonded together and may each carry one or more substituents which may also be bonded together by substituents; each occurrence of L' may be the same or different and is a bidentate chelating auxiliary ligand, particularly a monoanionic bidentate chelating ligand; q1 may be 0, 1, 2 or 3, particularly 2 or 3; q2 may be 0, 1, 2 or 3, particularly 1 or 0.

Some examples of triplet emitter materials and applications thereof can be found in the following patent documents and references: WO 200070655, WO 200141512, WO 200202714, WO 200215645, EP 1191613, EP 1191612, EP 1191614, WO 2005033244, WO 2005019373, US 2005/0258742, WO 2009146770, WO 2010015307, WO 2010031485, WO 2010054731, WO 2010054728, WO 2010086089, WO 2010099852, WO 2010102709, US 20070087219 A1, US 20090061681 A1, US 20010053462 A1, Baldo, Thompson et al. Nature 403, (2000), 750-753, US 20090061681 A1, US 20090061681 A1, Adachi et al. Appl. Phys. Lett. 78 (2001), 1622-1624, J. Kido et al. Appl. Phys. Lett. 65 (1994), 2124, Kido et al. Chem. Lett. 657, 1990, US 2007/0252517 A1, Johnson et al., JACS 105, 1983, 1795, Wrighton, JACS 96, 1974, 998, Ma et al., Synth. Metals 94, 1998, 245, U.S. Pat. Nos. 6,824,895, 7,029,766, 6,835,469, 6,830,828, US 20010053462 A1, WO 2007095118 A1, US 2012004407A1, WO 2012007088A1, WO2012007087A1, WO 2012007086A1, US 2008027220A1, WO 2011157339A1, CN 102282150A, WO 2009118087A1, WO 2013107487A1, WO 2013094620A1, WO 2013174471A1, WO 2014031977A1, WO 2014112450A1, WO 2014007565A1, WO 2014038456A1, WO 2014024131A1, WO 2014008982A1, WO2014023377A1. The entire contents of the above listed patent documents and literatures are hereby incorporated herein by reference.

Some suitable examples of triplet emitters are listed below:

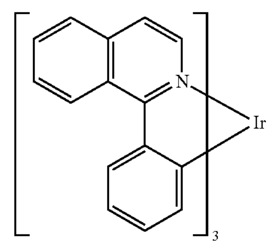

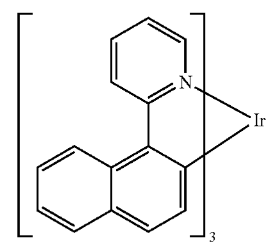

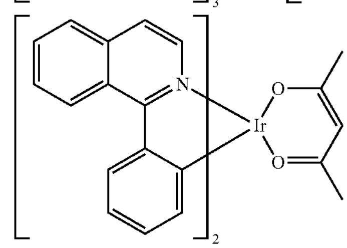

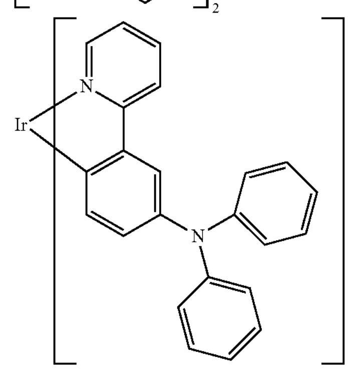

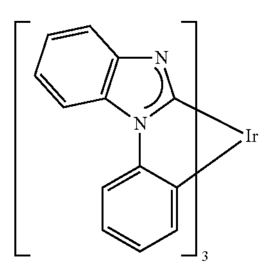

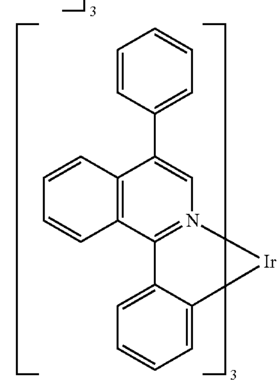

-continued
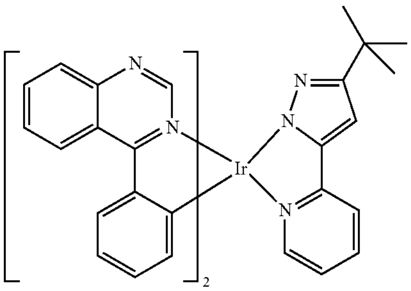
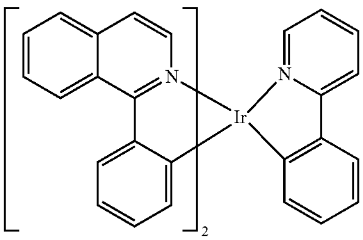
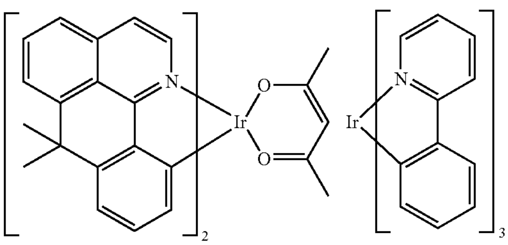
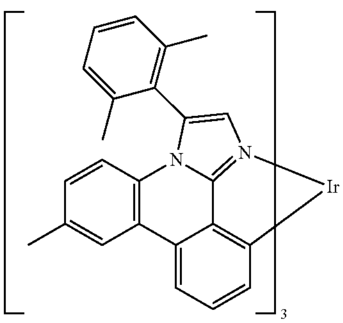
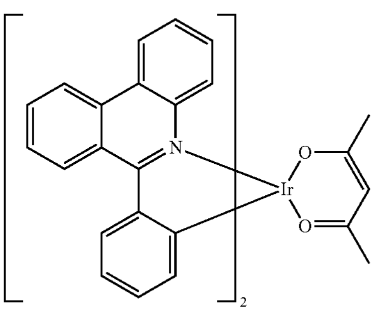
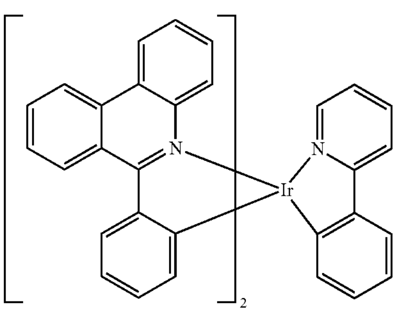
-continued
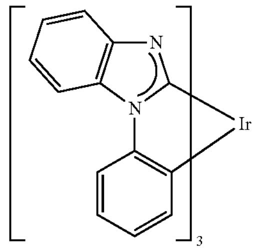
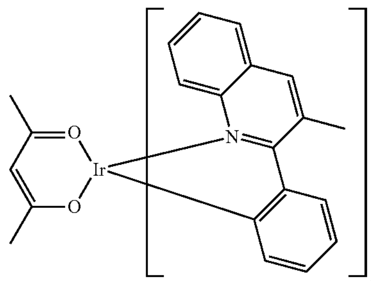
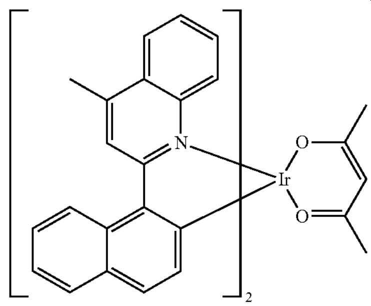
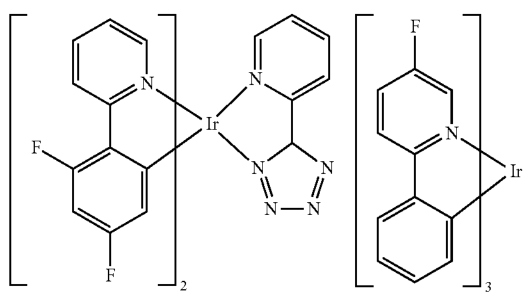
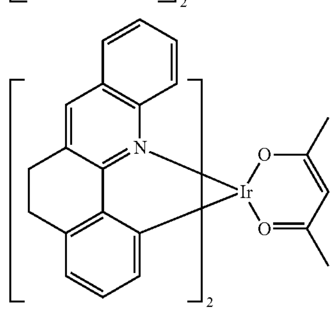
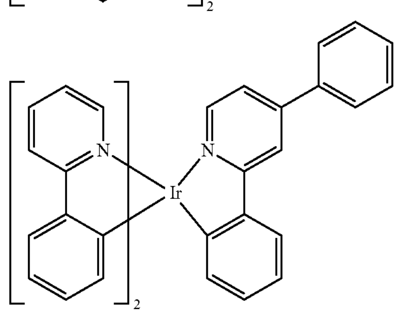

-continued
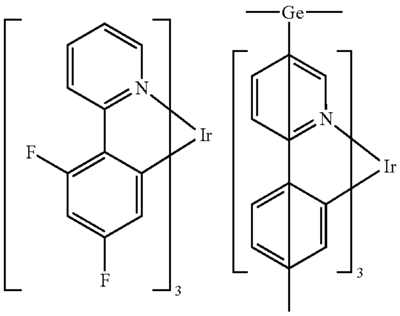
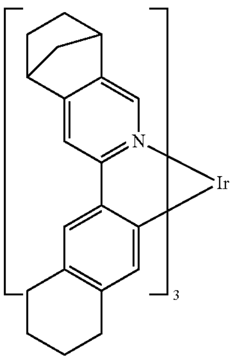
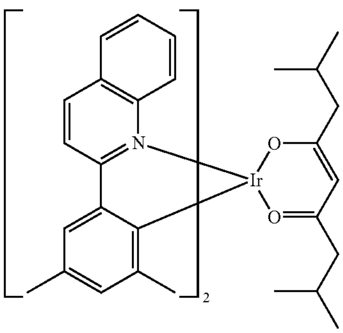
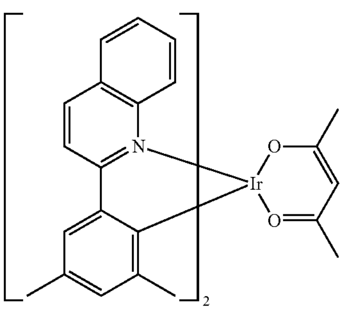
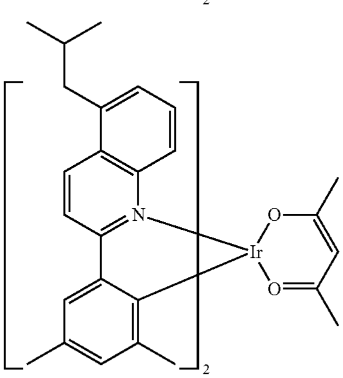
-continued
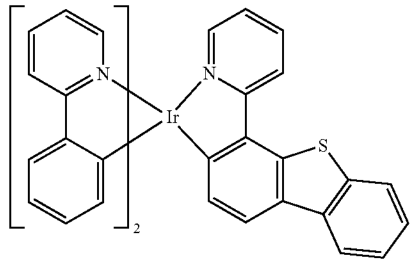
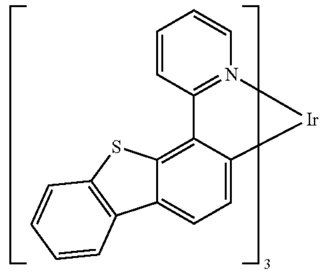
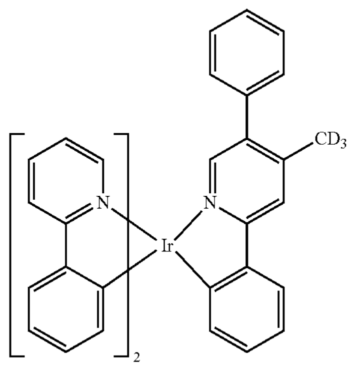
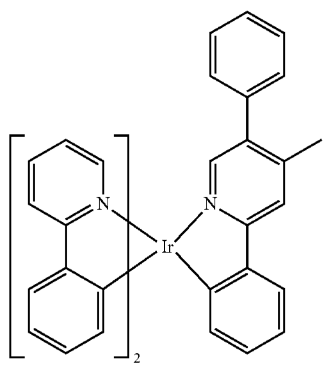
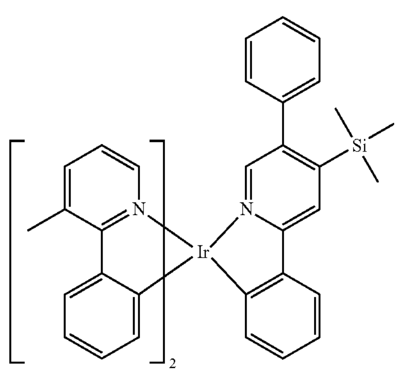

-continued

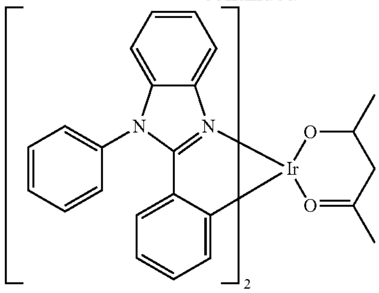

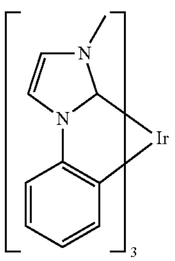

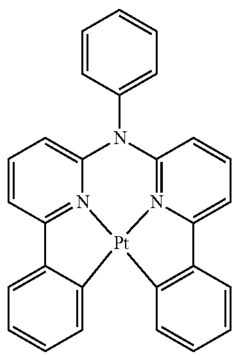

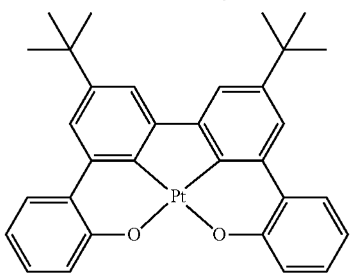

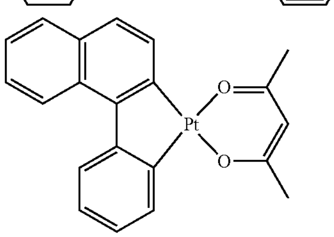

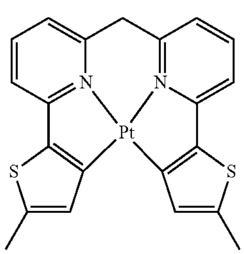

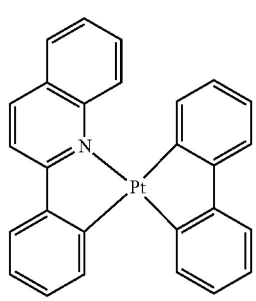

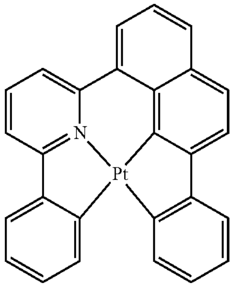

-continued

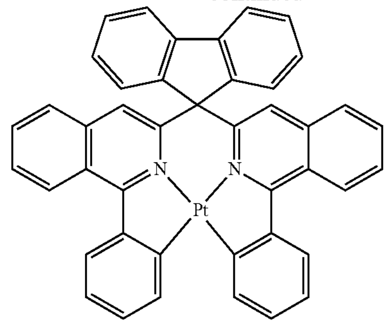

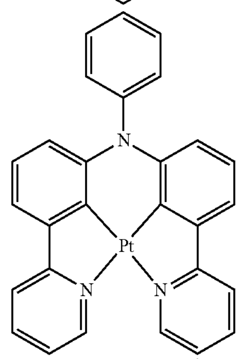

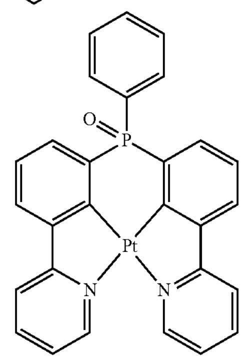

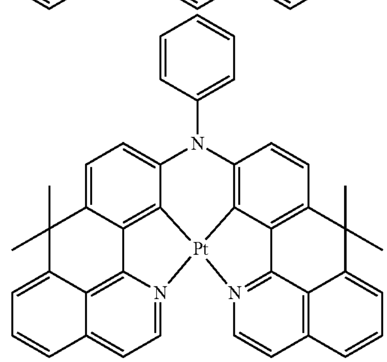

One object of the present disclosure is to provide material solutions for printing OLEDs.

In certain embodiments, the organometallic complex according to the present disclosure has a molecular weight no greater than 1100 g/mol, further, the organometallic complex according to the present disclosure has a molecular weight no greater than 1000 g/mol in other embodiments, further, the organometallic complex according to the present disclosure has a molecular weight no greater than 950 g/mol in other embodiments, further, the organometallic complex according to the present disclosure has a molecular weight no greater than 900 g/mol in other embodiments, further, the organometallic complex according to the present disclosure has a molecular weight no greater than 800 g/mol in other embodiments.

Another object of the present disclosure is to provide a material solution for printing OLEDs.

In certain embodiments, the organometallic complex according to the present disclosure has a molecular weight no less than 700 g/mol, further, the organometallic complex according to the present disclosure has a molecular weight no less than 800 g/mol in other embodiments, further, the organometallic complex according to the present disclosure has a molecular weight no less than 900 g/mol in other embodiments, further, the organometallic complex according to the present disclosure has a molecular weight no less than 1000 g/mol in other embodiments, further, the organometallic complex according to the present disclosure has a molecular weight no less than 1100 g/mol in other embodiments.

In other embodiments, the solubility of the organometallic complex according to the present disclosure in toluene at 25° C. is no less than 2 mg/ml. In other embodiments, the solubility of the organometallic complex according to the present disclosure in toluene at 25° C. is no less than 4 mg/ml. In other embodiments, the solubility of the organometallic complex according to the present disclosure in toluene at 25° C. is no less than 5 mg/ml.

The present disclosure further relates to a formulation or a printing ink comprising at least the organometallic complex, the polymer and the mixture as described above and at least one organic solvent. The at least one organic solvent is selected from the group consisting of aromatic or heteroaromatic compounds, ester, aromatic ketone or aromatic ether, aliphatic ketone or aliphatic ether, alicyclic or alkene compounds, borate or phosphate compounds, or a mixture of two or more solvents.

In one embodiment, according to the formulation of the present disclosure, the at least one organic solvent is selected from aromatic or heteroaromatic based solvents.

Examples of the aromatic or heteroaromatic based solvents suitable for the present disclosure include, but are not limited to: p-diisopropylbenzene, pentyl benzene, tetrahydronaphthalene, cyclohexylbenzene, chloronaphthalene, 1,4-dimethylnaphthalene 3-isopropylbiphenyl, p-methylisopropylbenzene, dipentylbenzene, tripentylbenzene, pentyltoluene, o-diethylbenzene, m-diethylbenzene, p-diethylbenzene, 1,2,3,4-tetramethylbenzene, 1,2,3,5-tetramethylbenzene, 1,2,4,5-tetramethylbenzene, butylbenzene, dodecylbenzene, dihexylbenzene, dibutylbenzene, p-diisopropylbenzene, cyclohexylbenzene, benzylbutylbenzene, dimethylnaphthalene, 3-isopropylbiphenyl, p-methylisopropylbenzene, 1-methylnaphthalene, 1,2,4-trichlorobenzene, 4,4-difluorodiphenylmethane, 1,2-dimethoxy-4-(1-propenyl)benzene, diphenylmethane, 2-phenylpyridine, 3-phenylpyridine, N-methyldiphenylamine, 4-isopropylbiphenyl, α, α-dichlorodiphenylmethane, 4-(3-phenylpropyl)pyridine, benzyl benzoate, 1,1-bis(3,4-dimethylphenyl)ethane, 2-isopropylnaphthalene, quinoline, isoquinoline, methyl 2-furancarboxylate, ethyl 2-furancarboxylate and the like.

Examples of the aromatic ketone based solvents suitable for the present disclosure include, but are not limited to: 1-tetralone, 2-tetralone, 2-(phenylepoxy)tetralone, 6-(methyloxy)tetralone, acetophenone, propiophenone, benzophenone, and derivatives thereof, such as 4-methylacetophenone, 3-methylacetophenone, 2-methylacetophenone, 4-methylpropiophenone, 3-methylpropiophenone, 2-methylpropiophenone, and the like.

Examples of the aromatic ether based solvents suitable for the present disclosure include, but are not limited to: 3-phenoxytoluene, butoxybenzene, p-anisaldehyde dimethyl acetal, tetrahydro-2-phenoxy-2H-pyran, 1,2-dimethoxy-4-(1-propenyl)benzene, 1,4-benzodioxane, 1,3-dipropylbenzene, 2,5-dimethoxytoluene, 4-ethylphenetole, 1,3-dipropoxybenzene, 1,2,4-trimethoxybenzene, 4-(1-propenyl)-1,2-dimethoxybenzene, 1,3-dimethoxybenzene, glycidyl phenyl ether, dibenzyl ether, 4-tert-butylanisole, trans-p-propenyl anisole, 1,2-dimethoxybenzene, 1-methoxynaphthalene, diphenyl ether, 2-phenoxymethyl ether, 2-phenoxytetrahydrofuran, and ethyl-2-naphthyl ether.

In some embodiments, according to the formulation of the present disclosure, the at least one organic solvent may be selected from the group consisting of aliphatic ketones, such as 2-nonanone, 3-nonanone, 5-nonanone, 2-decanone, 2,5-hexanedione, 2,6,8-trimethyl-4-nonanone, fenchone, phorone, isophorone, 6-undecanone, and the like; and aliphatic ethers, such as pentyl ether, hexyl ether, dioctyl ether, ethylene glycol dibutyl ether, diethylene glycol diethyl ether, diethylene glycol butyl methyl ether, diethylene glycol dibutyl ether, triethylene glycol dimethyl ether, triethylene glycol ethyl methyl ether, triethylene glycol butyl methyl ether, tripropylene glycol dimethyl ether, tetraethylene glycol dimethyl ether, and the like.

In other embodiments, according to the formulation of the present disclosure, the at least one organic solvent may be selected from the ester based solvents: alkyl caprylate, alkyl sebacate, alkyl stearate, alkyl benzoate, alkyl phenylacetate, alkyl cinnamate, alkyl oxalate, alkyl maleate, alkyl lactone, alkyl oleate, and the like. In other embodiments, the at least one organic solvent may be selected from the group consisting of octyl octanoate, diethyl sebacate, diallyl phthalate, and isononyl isononanoate.

The solvent may be used alone or used as a mixture of two or more organic solvents.

In some embodiments, the formulation according to the present disclosure comprises at least the organometallic complex, the polymer and the mixture as described above and at least one organic solvent, and may further comprise another organic solvent. Examples of the another organic solvent include, but are not limited to, methanol, ethanol, 2-methoxyethanol, dichloromethane, trichloromethane, chlorobenzene, o-dichlorobenzene, tetrahydrofuran, anisole, morpholine, toluene, o-xylene, m-xylene, p-xylene, 1,4-dioxane, acetone, methyl ethyl ketone, 1,2-dichloroethane, 3-phenoxy toluene, 1,1,1-trichloroethane, 1,1,2,2-tetrachloroethane, ethyl acetate, butyl acetate, dimethylformamide, dimethylacetamide, dimethyl sulfoxide, tetrahydronaphthalene, decalin, indene, and/or mixtures thereof.

In some embodiments, the solvents particularly suitable for the present disclosure are solvents with Hansen solubility parameters in the following range:

$\delta_d$ (dispersion force) is in the range of 17.0~23.2 $MPa^{1/2}$, especially in the range of 18.5~21.0 $MPa^{1/2}$;

$\delta_p$ (polarity force) is in the range of 0.2~12.5 $MPa^{1/2}$, especially in the range of 2.0~6.0 $MPa^{1/2}$;

$\delta_h$ (hydrogen bonding force) is in the range of 0.9~14.2 $MPa^{1/2}$, especially in the range of 2.0~6.0 $MPa^{1/2}$.

According to the formulation of the present disclosure, the boiling point parameter must be taken into account when selecting the organic solvent. In one embodiment of the present disclosure, the boiling point of the organic solvent is no less than 150° C., no less than 180° C. in another embodiment, no less than 200° C. in another embodiment, no less than 250° C. in another embodiment, no less than 275° C. or no less than 300° C. in another embodiment. Boiling points in these ranges are beneficial for preventing the clogging of the nozzle of the inkjet printing head. The organic solvent can be evaporated from the solvent system to form a film comprising the functional material.

In one embodiment, the formulation according to the present disclosure is a solution.

In another embodiment, the formulation according to the present disclosure is a suspension.

The formulation in one embodiment of the present disclosure may include 0.01 wt % to 20 wt % of the organometallic complex or the polymer or the mixture according to the present disclosure. In another embodiment, the formulation may include 0.1 wt % to 15 wt % of the organometallic complex or the polymer or the mixture according to the present disclosure. In another embodiment, the formulation may include 0.2 wt % to 10 wt % of the organometallic complex or the polymer or the mixture according to the present disclosure. In another embodiment, the formulation may include 0.25 wt % to 5 wt % of the organometallic complex or the polymer or the mixture according to the present disclosure.

The present disclosure further relates to the use of the formulation as a coating or printing ink in the preparation of organic electronic devices, particularly by the printing or coating method.

The appropriate printing technology or coating technology includes, but is not limited to, inkjet printing, nozzle printing, typography, screen printing, dip coating, spin coating, blade coating, roller printing, twist roller printing, lithography, flexography, rotary printing, spray coating, brush coating or transfer printing, slot die coating, and the like, Specially gravure printing, nozzle printing and inkjet printing. The solution or the suspension may further comprise one or more components, such as surfactant compound, lubricant, wetting agent, dispersant, hydrophobic agent, binder, and the like, to adjust the viscosity and the film forming property and to improve the adhesion property. For more information about printing technologies and relevant requirements thereof on related solutions, such as solvents, concentration, and viscosity, etc., see Handbook of Print Media: Technologies and Production Methods, ISBN 3-540-67326-1, edited by Helmut Kipphan.

The present disclosure further provides an application of the organometallic complex, the polymer, the mixture or the formulation as described above in organic electronic devices. The organic electronic devices may be selected from, but are not limited to, organic light-emitting diode (OLED), organic photovoltaic cell (OPV), organic light-emitting electrochemical cell (OLEEC), organic field effect transistor (OFET), organic light-emitting field effect transistor, organic laser, organic spintronic device, organic sensor, and organic plasmon emitting diode, and the like, specially OLED. In an embodiment of the present disclosure, the organometallic complex or the polymer is particularly used in the light-emitting layer of the OLED device.

The present disclosure further relates to an organic electronic device comprising at least the organometallic complex, the polymer, the mixture or the formulation as described above. Generally, the organic electronic device includes at least one cathode, one anode, and one functional layer located between the cathode and the anode, wherein the functional layer comprises at least the organic mixture as described above. The organic electronic devices may be selected from, but are not limited to, organic light-emitting diode (OLED), organic photovoltaic cell (OPV), organic light-emitting electrochemical cell (OLEEC), organic field effect transistor (OFET), organic light-emitting field effect transistor, organic laser, organic spintronic device, organic sensor, and organic plasmon emitting diode, and the like, specially organic electroluminescent device, such as OLED, OLEEC and organic light-emitting field effect transistor.

In certain embodiments, the light-emitting layer of the electroluminescent device comprises the organometallic complex, the polymer, the mixture or the formulation as described above, or comprises the organometallic complex, the polymer, the mixture or the formulation and a phosphorescent emitter, or comprises the organometallic complex, the polymer, the mixture or the formulation and a host material, or comprises the organometallic complex, the polymer, the mixture or the formulation, a phosphorescent emitter and a host material.

In the above light-emitting device, particularly in the OLED, a substrate, an anode, at least one light-emitting layer and a cathode are included.

The substrate may be opaque or transparent. A transparent substrate may be used to fabricate a transparent light-emitting device. For example, see Bulovic et al. Nature 1996, 380, p 29 and Gu et al. Appl. Phys. Lett. 1996, 68, p 2606. The substrate may be rigid or elastic. The substrate may be plastic, metal, semiconductor wafer or glass. Particularly, the substrate has a smooth surface. The substrate without surface defect is a particular desirable choice. In one embodiment, the substrate is flexible and may be selected from a polymer thin film or plastic which has a glass transition temperature $T_g$ greater than 150° C., greater than 200° C. in another embodiment, greater than 250° C. in another embodiment, greater than 300° C. in another embodiment. Suitable examples of the flexible substrate include polyethylene terephthalate (PET) and polyethylene 2,6-naphthalate (PEN).

The anode may include a conductive metal, a metallic oxide, or a conductive polymer. The anode can inject holes easily into the hole injection layer (HIL), or the hole transport layer (HTL), or the light-emitting layer. In one embodiment, the absolute value of the difference between the work function of the anode and the HOMO energy level or the valence band energy level of the emitter in the light-emitting layer or of the p-type semiconductor material as the HIL or HTL or the electron blocking layer (EBL) is less than 0.5 eV, further less than 0.3 eV, still further less than 0.2 eV. Examples of the anode material include, but are not limited to, Al, Cu, Au, Ag, Mg, Fe, Co, Ni, Mn, Pd, Pt, ITO, aluminum-doped zinc oxide (AZO), and the like. Other suitable anode materials are known and may be easily selected by one of ordinary skilled in the art. The anode material may be deposited with any suitable technology, such as the suitable physical vapor deposition method which includes radio frequency magnetron sputtering, vacuum thermal evaporation, e-beam, and the like. In some embodiments, the anode is patterned and structured. Patterned ITO conductive substrates are commercially available and can be used to prepare the device according to the present disclosure.

The cathode may include a conductive metal or metal oxide. The cathode can inject electrons easily into the EIL or ETL, or directly into the light-emitting layer. In one embodiment, the absolute value of the difference between the work function of the cathode and the LUMO energy level or the valence band energy level of the emitter in the light-emitting layer or of the n type semiconductor material as the electron injection layer (EIL) or the electron transport layer (ETL) or the hole blocking layer (HBL) is less than 0.5 eV, further less than 0.3 eV, still further less than 0.2 eV. In principle, all materials that can be used as cathodes for OLED may be used as the cathode materials for the devices of the present disclosure. Examples of the cathode material include, but are not limited to, Al, Au, Ag, Ca, Ba, Mg, LiF/Al, MgAg alloy, $BaF_2$/Al, Cu, Fe, Co, Ni, Mn, Pd, Pt, ITO, and the like. The cathode material may be deposited with any suitable technology, such as the suitable physical vapor deposition method which includes radio frequency magnetron sputtering, vacuum thermal evaporation, electron beam, and the like.

OLED may also comprise other functional layers such as hole injection layer (HIL), hole transport layer (HTL), electron blocking layer (EBL), electron injection layer (EIL), electron transport layer (ETL), and hole blocking layer (HBL). Materials suitable for use in these functional layers are described in detail above and in WO2010135519A1, US20090134784A1 and WO2011110277A1, the entire contents of which are hereby incorporated herein by reference.

The light-emitting wavelength of the light-emitting device according to the present disclosure is between 300 nm and 1000 nm. In one embodiment, the light-emitting wavelength of the light-emitting device according to the present disclosure is between 350 nm and 900 nm. In another embodiment, the light-emitting wavelength of the light-emitting device according to the present disclosure is between 400 nm and 800 nm.

The present disclosure also relates to the application of the electroluminescent device according to the present disclosure in various electronic equipment, which includes, but are not limited to, display equipment, lighting equipment, light source, and sensor, and the like.

The present disclosure will be described below with reference to the preferred embodiments, but the present disclosure is not limited to the following embodiments. It should be understood that the appended claims summarized the scope of the present disclosure. Those skilled in the art should realize that certain changes to the embodiments of the present disclosure that are made under the guidance of the concept of the present disclosure will be covered by the spirit and scope of the claims of the present disclosure.

1. Synthesis of Compounds

Ir-1

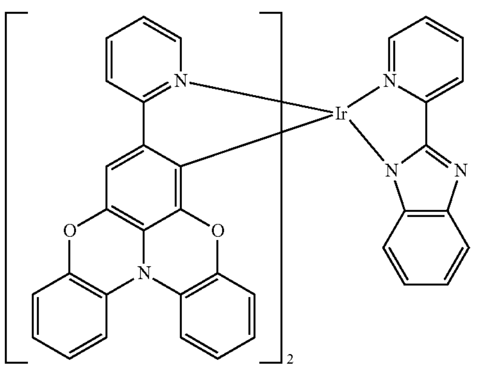

Ir-2

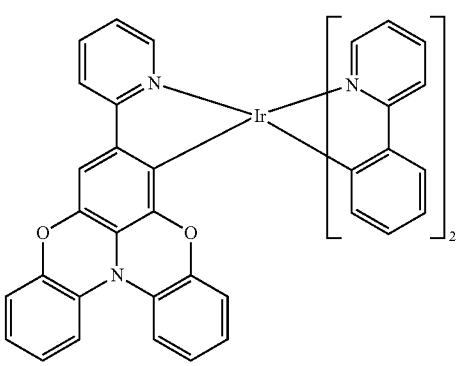

-continued

Ir-3

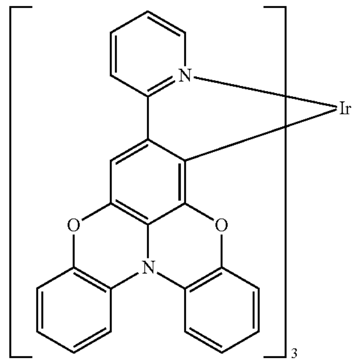

Ir-4

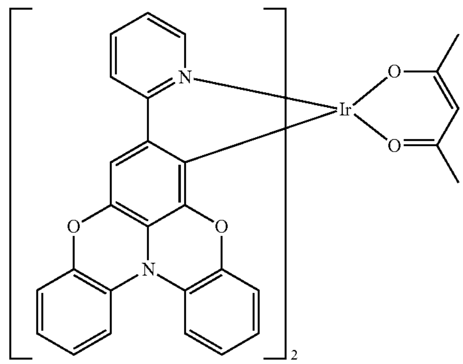

Ir-5

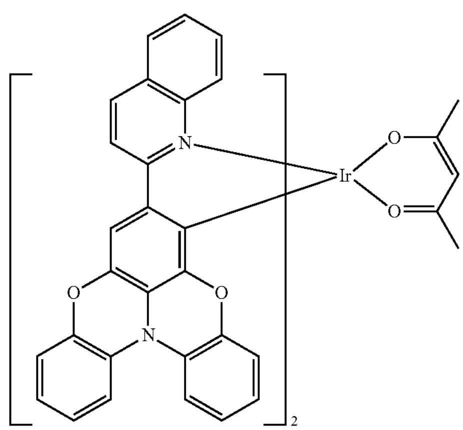

Ir-6

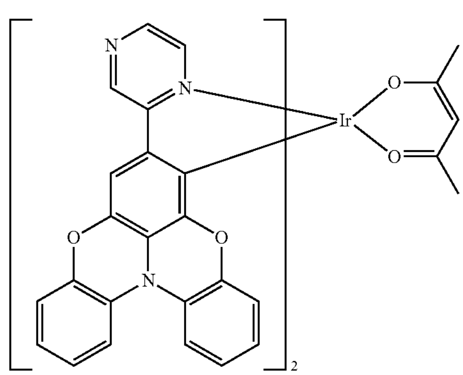

-continued
Ir-7
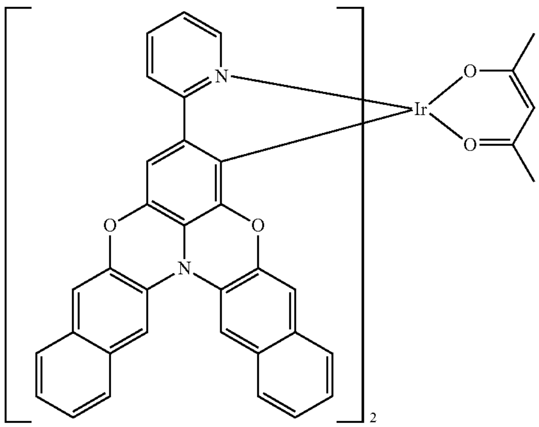
Ir-8
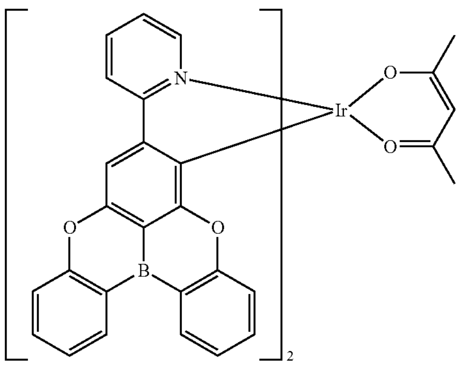
Ir-9
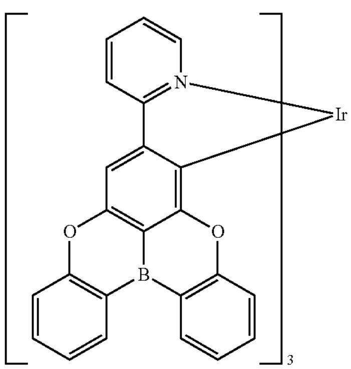
Ir-10
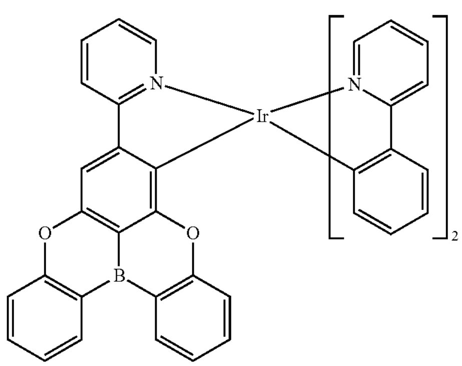
Synthesis Route of Ligand L-1/L-2/L-3
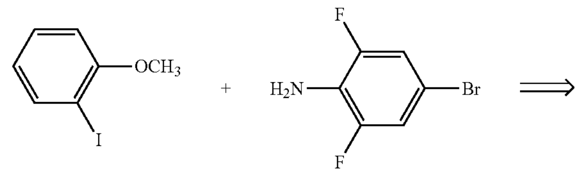
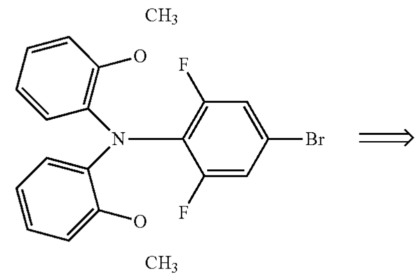
1-a
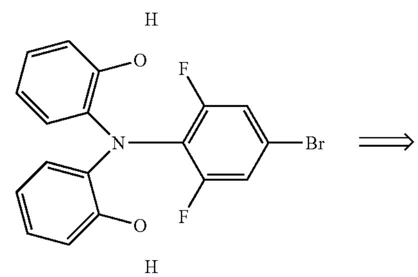
1-b
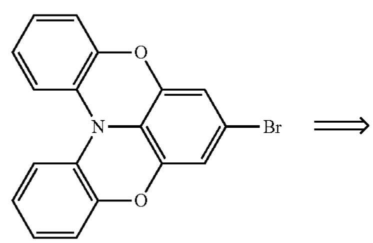
1-c
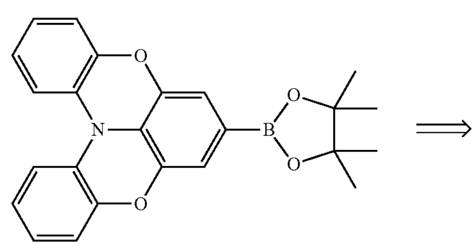
1-d
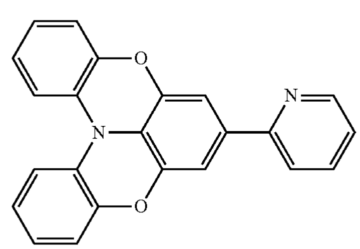
or
L-1

-continued

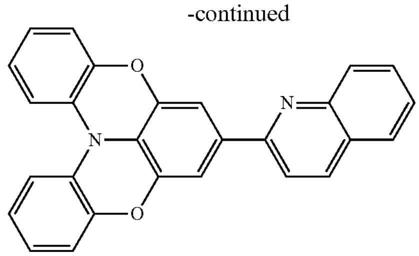

or

L-2

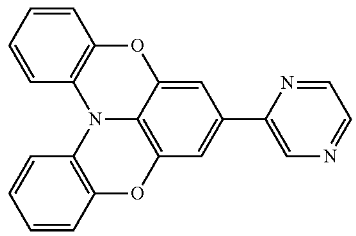

L-3

Synthesis of Compound 1-a 2-iodoanisole (1.98 g, 8.46 mmol), 2,6-difluoro-4-bromoaniline (0.774 g, 3.72 mmol), potassium carbonate (2.15 g, 15.6 mmol), and copper powder (0.782 g, 12.3 mmol) were placed into a dry two-neck flask, 10 mL of dry o-dichlorobenzene were then added, and the solution was reacted under stirring at 180° C. for 96 hours, then cooled to room temperature. The reaction solution was filtered with suction, and the filter cake was washed with dichloromethane to collect filtrate. The filtrate was extracted by adding water and dichloromethane, concentrated to remove dichloromethane, and then distilled under reduced pressure to remove o-dichlorobenzene. Then a large amount of dichloromethane were added and the filtrate was mixed with silica gel (three times), the organic phase was concentrated, then a large amount of petroleum ether were added to precipitate 1.25 g of white solid (1-a), with a yield of 80%.

Synthesis of Compound 1-b

Compound 1-a (2.09 g, 5 mmol) was placed into a dry schlenck, which was then vacuumed and filled with nitrogen for three cycles, and 100 mL of dry dichloromethane was added under nitrogen flow. The mixture was stirred at −78° C. for 20 minutes, and then boron tribromide (1 mL, 10.6 mmol) was added. The solution was heated slowly to room temperature, and reacted under stirring for 3 hours. Then water was added slowly, and the reaction solution was extracted with dichloromethane, dried, and concentrated to obtain 1.56 g of white solid (1-b), with a yield of 80%.

Synthesis of Compound 1-c

Compound 1-b (2.02 g, 5 mmol) and potassium carbonate (2.07 g, 5 mmol) were placed into a dry two-neck flask, which was then vacuumed and filled with nitrogen for three cycles, then 60 mL of dry DMF was added under nitrogen flow. The solution was reacted under stirring at 100° C. for 12 hours, and then cooled to room temperature. Then a large amount of solids were precipitated after water was added. The reaction solution was filtered with suction, and the filter cake was dried to obtain 1.4 g of white solid (1-c), with a yield of 80%.

Synthesis of Compound 1-d

Compound 1-c (0.35 g, 1 mmol), bis(pinacolato)diboron (0.38 g, 1.5 mmol), Pd (dppf)$_2$Cl$_2$ (0.022 g, 0.03 mmol), and potassium acetate (1 g, 10 mmol) were placed into a dry two-neck flask, which was then vacuumed and filled with nitrogen for three cycles, and then 15 mL of dry dioxane was added under nitrogen flow. The solution was refluxed and reacted at 110° C. for 24 hours, concentrated to remove dioxane, extracted with the addition of water and dichloromethane, concentrated, then purified by column chromatography with volume ratio of dichloromethane:petroleum ether=1:4 to obtain 0.27 g of light green solid (1-d), with a yield of 70%.

Synthesis of Compound L-1

Compound 1-d (0.48 g, 1.2 mmol), 2-bromopyridine (0.16 g, 1 mmol), tetra-(triphenylphosphine)-palladium (0.0115 g, 0.01 mmol), and potassium carbonate (0.55 g, 4 mmol) were placed into a dry two-neck flask, which was then vacuumed and filled with nitrogen for three cycles, and then a mixed solution of 2 mL water and 4 mL dioxane was added under nitrogen flow. The solution was reacted under stirring at 100° C. for 24 hours, cooled to room temperature, spin-dried to remove dioxane, and extracted with the addition of water and dichloromethane. The organic phase was concentrated, and then purified by column chromatography with volume ratio of dichloromethane:petroleum ether=2:1 to obtain 0.245 g of light yellow solid (L-1), with a yield of 70%.

Synthesis of Compound L-2

Compound 1-d (0.48 g, 1.2 mmol), 2-bromoquinoline (0.21 g, 1 mmol), tetra-(triphenylphosphine)-palladium (0.0115 g, 0.01 mmol), and potassium carbonate (0.55 g, 4 mmol) were placed into a dry two-neck flask, which was then vacuumed and filled with nitrogen for three cycles, then a mixed solution of 2 mL water and 4 mL dioxane was added under nitrogen flow. The solution was reacted under stirring at 100° C. for 24 hours, cooled to room temperature, spin-dried to remove dioxane, and extracted with the addition of water and dichloromethane. The organic phase was concentrated, and then purified by column chromatography with volume ratio of dichloromethane:petroleum ether=2:1 to obtain 0.22 g of light yellow solid (L-2), with a yield of 60%.

Synthesis of Compound L-3

Compound 1-d (0.48 g, 1.2 mmol), 2-bromopyrazine (0.21 g, 1 mmol), tetra-(triphenylphosphine)-palladium (0.0115 g, 0.01 mmol), and potassium carbonate (0.55 g, 4 mmol) were placed into a dry two-neck flask, which was then vacuumed and filled with nitrogen for three cycles, then a mixed solution of 2 mL water and 4 mL dioxane was added under nitrogen flow. The solution was reacted under stirring at 100° C. for 24 hours, cooled to room temperature, spin-dried to remove dioxane, and extracted with the addition of water and dichloromethane. The organic phase was concentrated, and then purified by column chromatography with volume ratio of dichloromethane:petroleum ether=2:1 to obtain 0.28 g of light yellow solid (L-3), with a yield of 65%.

Example 1: Synthesis of Compound Ir-1

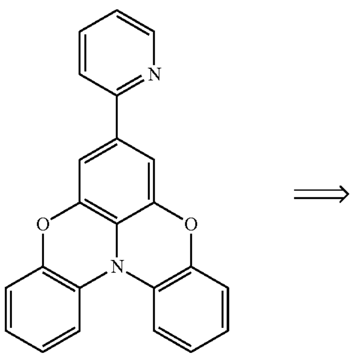

L-1

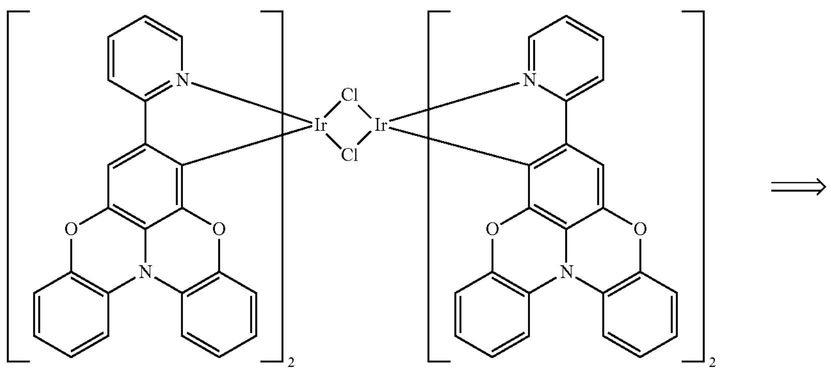

Ir-Cl-1

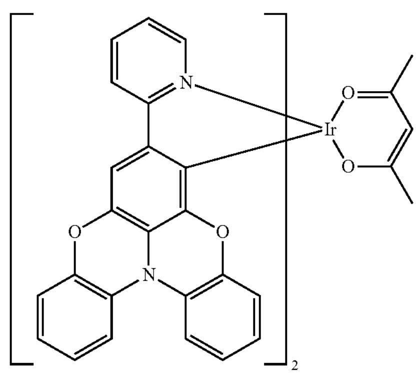

Ir-1

Synthesis of Iridium Chloride Bridge Ir—Cl-1 Compound L-1 (0.85 g, 2.43 mmol) and iridium trichloride (0.348 g, 1 mmol) were placed into a dry two-neck flask, which was then vacuumed and filled with nitrogen for three cycles, then a mixed solution of 18 mL ethylene glycol monoethyl ether and 6 mL water was added under nitrogen flow. The mixture was reacted under stirring at 110° C. for 24 hours, and then cooled to room temperature, then solids were precipitated after water was added. The reaction solution was filtered with suction, and the filter cake was dried to obtain 0.55 g of red brown solid (Ir—Cl-1), with a yield of 60%.

Synthesis of Complex Ir-1:

Compound Ir—Cl-1 (0.185 g, 0.1 mmol), acetylacetone (0.076 mL, 0.74 mmol), and sodium carbonate (0.05 g, 0.47 mmol) were placed into a dry two-neck flask, which was then vacuumed and filled with nitrogen for three cycles, and then 10 mL of ethylene glycol monoethyl ether was added under nitrogen flow. The solution was reacted under stirring at room temperature for 24 hours, distilled under reduced pressure to remove ethylene glycol monoethyl ether, and extracted with the addition of water and dichloromethane. The organic phase was concentrated, and then purified by column chromatography with volume ratio of ethyl acetate: petroleum ether=1:3 to obtain 0.059 g of yellow solid (Ir-1), with a yield of 30%.

Example 2: Synthesis of Compound Ir-2

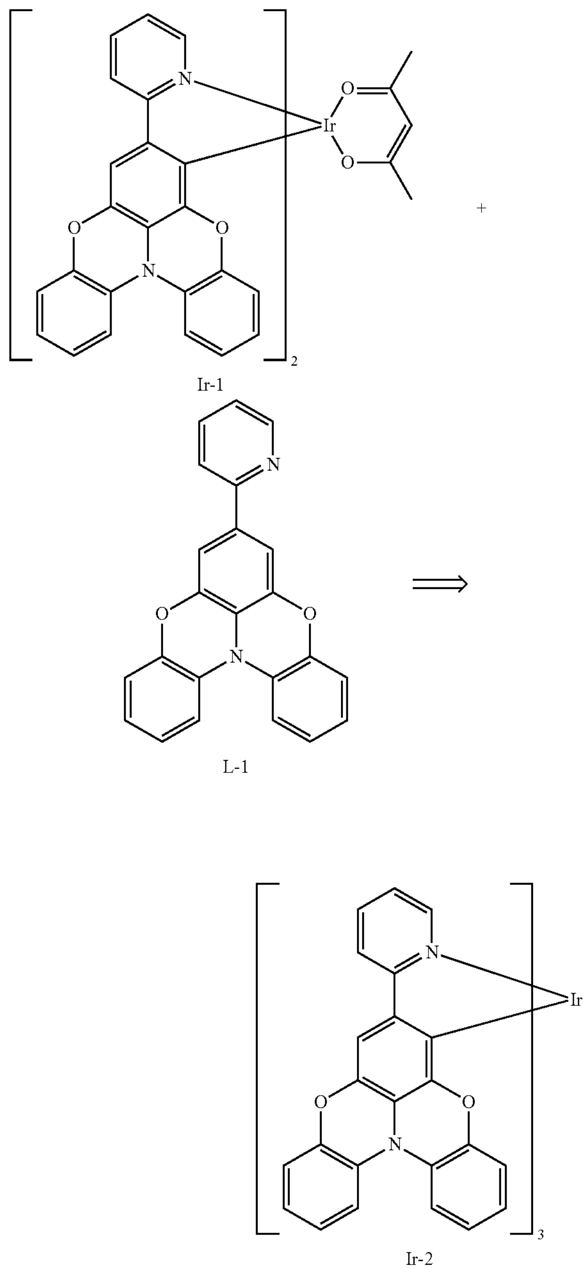

Compound Ir-1 (0.099 g, 0.1 mmol) and compound L-1 (0.035 g, 0.1 mmol) were placed into a dry two-neck flask, which was then vacuumed and filled with nitrogen for three cycles, and then 10 mL of glycerol was added under nitrogen flow. The solution was reacted under stirring at 170° C. for 24 hours, cooled to room temperature, and extracted with dichloromethane after a plenty of water and a little hydrochloric acid were added. The organic phase was concentrated, and then purified by column chromatography with volume ratio of ethyl acetate:petroleum ether=1:5 to obtain 0.059 g of yellow solid (Ir-2), with a yield of 30%.

Example 3: Synthesis of Compound Ir-3

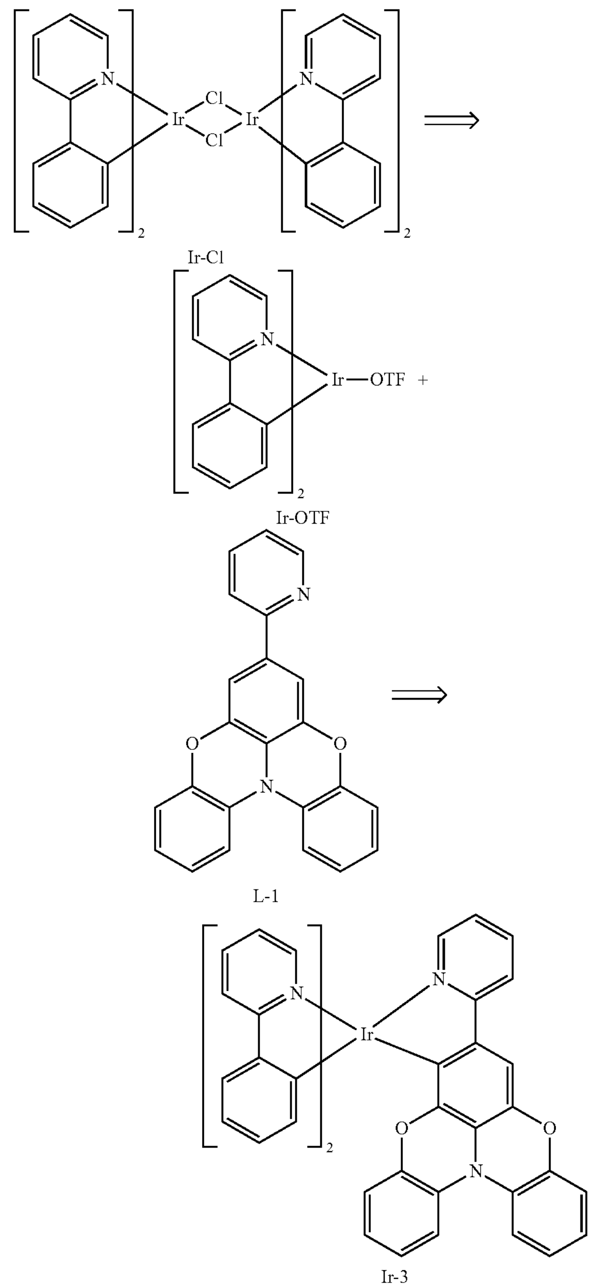

Synthesis of an Intermediate of Iridium Complex Ir-OTF

Compound Ir—Cl (2 g, 1.87 mmol) was placed into a dry single neck flask, then a mixed solution of 200 mL dichloromethane and 10 mL methanol was added to dissolve Compound Ir—Cl, and then silver triflate (1 g, 3.92 mmol) was added. The solution was reacted under stirring at room temperature for 8 hours, filtered with suction, and the filtrate was spin-dried to obtain a yellow solid with a yield of 90%.

Synthesis of Complex Ir-3:

Compound Ir—OTF (0.26 g, 0.4 mmol) and compound L-1 (0.4 g, 1.16 mmol) were placed into a dry two-neck flask, which was then vacuumed and filled with nitrogen for three cycles, and then 30 mL of ethanol was added. The solution was refluxed and reacted under stirring for 24 hours, cooled to room temperature, filtered with suction, and the filter cake was dried to obtain a yellow crude product. Then the yellow crude product was purified by column chromatography with volume ratio of dichloromethane:petroleum ether=1:1 to obtain a pure product with a yield of 70%.

Example 4: Synthesis of Compound Ir-4

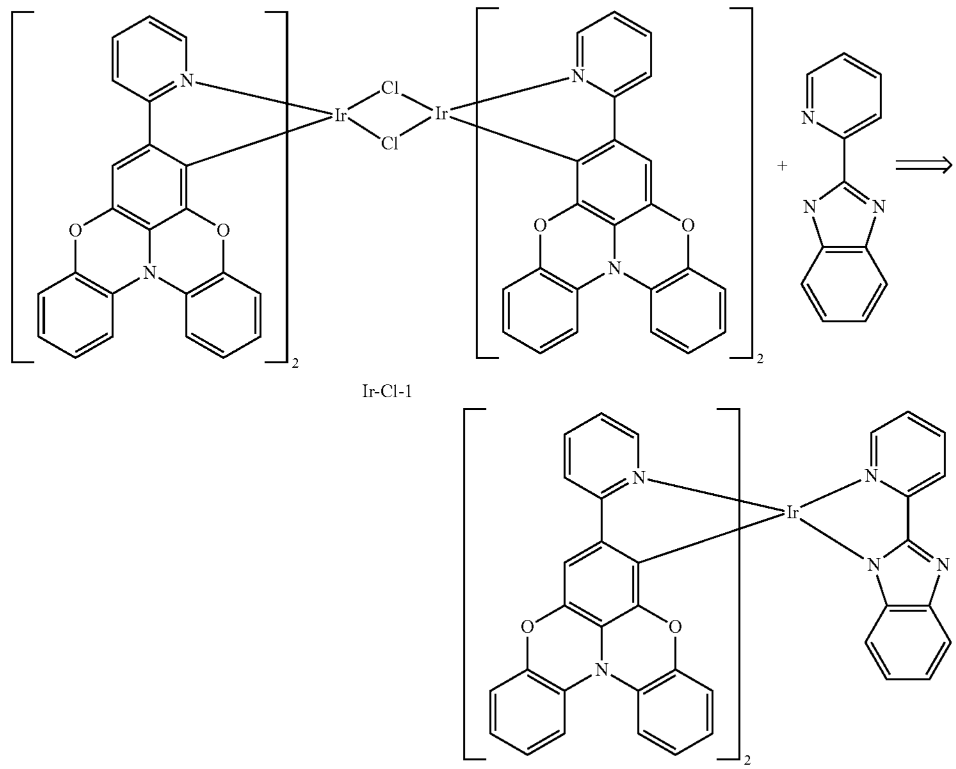

Ir-Cl-1

Ir-4

Compound Ir—Cl-1 (0.185 g, 0.1 mmol), 2-pyridylbenzimidazole (0.039 g, 0.2 mmol), and potassium carbonate (0.028 g, 0.2 mmol) were placed into a dry two-neck flask, which was then vacuumed and filled with nitrogen for three cycles, and then a mixed solution of 10 mL dichloromethane and 10 mL methanol was added under nitrogen flow. The solution was reacted under stirring at room temperature for 24 hours, concentrated, and then purified by column chromatography with volume ratio of methanol:dichloromethane=1:10 to obtain a yellow solid (Ir-4), with a yield of 30%.

Example 5: Synthesis of Compound Ir-5

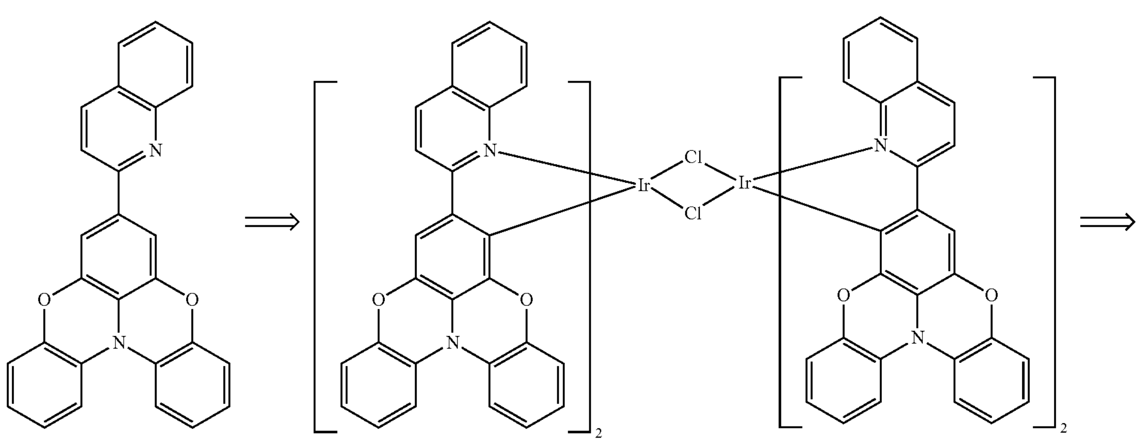

L-2

Ir-Cl-2

-continued

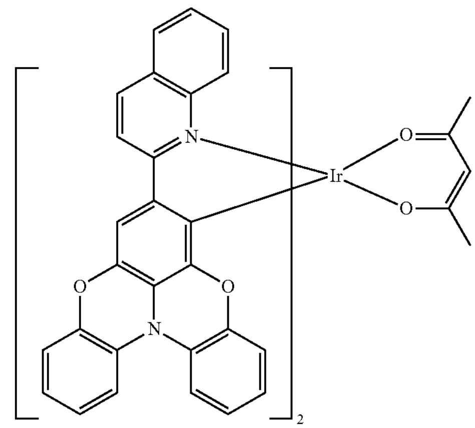

Ir-5

Synthesis of Iridium Chloride Bridge Ir—Cl-2

Compound L-2 (0.97 g, 2.43 mmol) and iridium trichloride (0.348 g, 1 mmol) were placed into a dry two-neck flask, which was then vacuumed and filled with nitrogen for three cycles, and then a mixed solution of 18 mL ethylene glycol monoethyl ether and 6 mL water was added under nitrogen flow. The mixture was reacted under stirring at 110° C. for 24 hours, and then cooled to room temperature. Then solids were precipitated after water was added. The reaction solution was filtered with suction, and the filter cake was dried to obtain 0.71 g of red brown solid (Ir—Cl-2), with a yield of 60%.

Synthesis of Complex Ir-5:

Compound Ir—Cl-2 (0.225 g, 0.1 mmol), acetylacetone (0.076 mL, 0.74 mmol), and sodium carbonate (0.05 g, 0.47 mmol) were placed into a dry two-neck flask, which was then vacuumed and filled with nitrogen for three cycles, and then 10 mL ethylene glycol monoethyl ether was added under nitrogen flow. The solution was reacted under stirring at room temperature for 24 hours, distilled under reduced pressure to remove ethylene glycol monoethyl ether, and extracted with the addition of water and dichloromethane. The organic phase was concentrated, and then purified by column chromatography with volume ratio of ethyl acetate: petroleum ether=1:3 to obtain 0.053 g of yellow solid (Ir-5), with a yield of 20%.

Example 6: Synthesis of Compound Ir-6

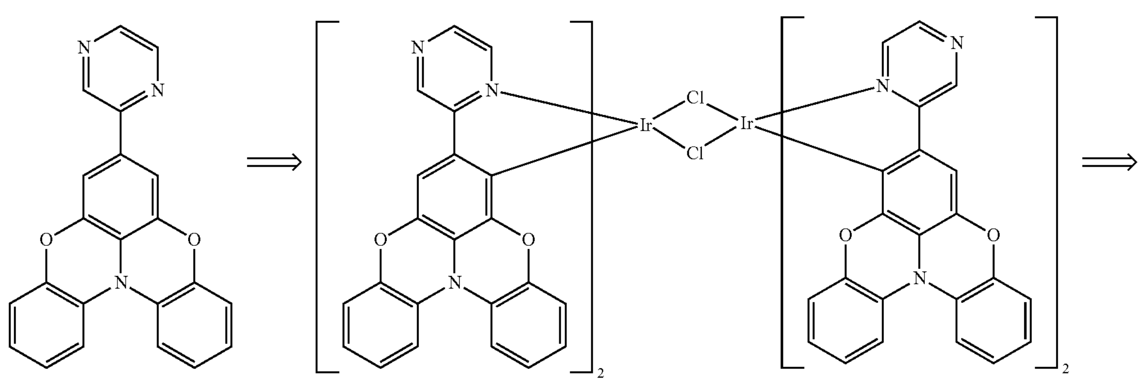

L-3

Ir-Cl-3

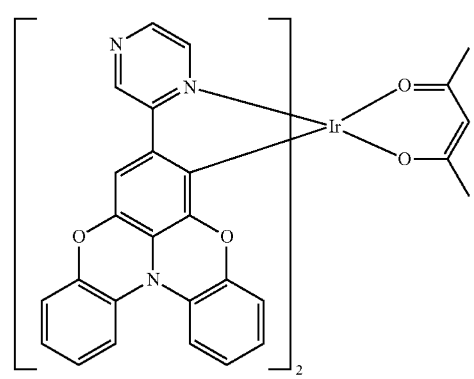

Ir-6

Synthesis of Iridium Chloride Bridge Ir—Cl-3

Compound L-3 (0.85 g, 2.43 mmol) and iridium trichloride (0.348 g, 1 mmol) were placed into a dry two-neck flask, which was then vacuumed and filled with nitrogen for three cycles, and then a mixed solution of 18 mL ethylene glycol monoethyl ether and 6 mL water was added under nitrogen flow. The mixture was reacted under stirring at 110° C. for 24 hours, and then cooled to room temperature. Then solids were precipitated after water was added. The reaction solution was filtered with suction, and the filter cake was dried to obtain 0.55 g of red brown solid (Ir—Cl-3), with a yield of 60%.

Synthesis of Complex Ir-6:

Compound Ir—Cl-3 (0.185 g, 0.1 mmol), acetylacetone (0.076 mL, 0.74 mmol), and sodium carbonate (0.05 g, 0.47 mmol) were placed into a dry two-neck flask, which was then vacuumed and filled with nitrogen for three cycles, and then 10 mL of ethylene glycol monoethyl ether was added under nitrogen flow. The solution was reacted under stirring at room temperature for 24 hours, cooled to room temperature, distilled under reduced pressure to remove ethylene glycol monoethyl ether, and extracted with the addition of water and dichloromethane. The organic phase was concentrated, and then purified by column chromatography with volume ratio of ethyl acetate:petroleum ether=1:3 to obtain 0.059 g of yellow solid (Ir-6), with a yield of 30%.

Synthesis Route of Ligand L-4

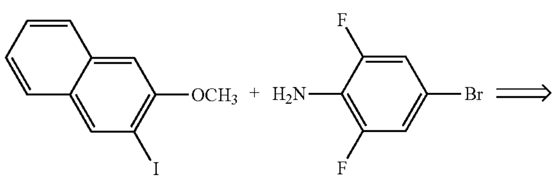

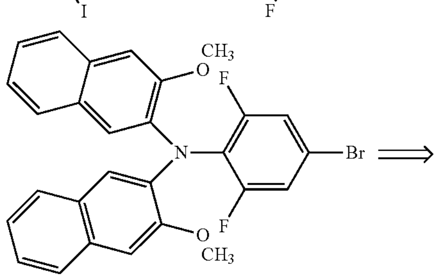

2-a

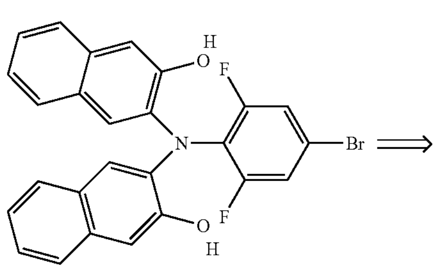

2-b

-continued

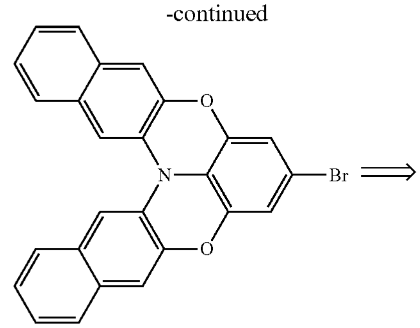

2-c

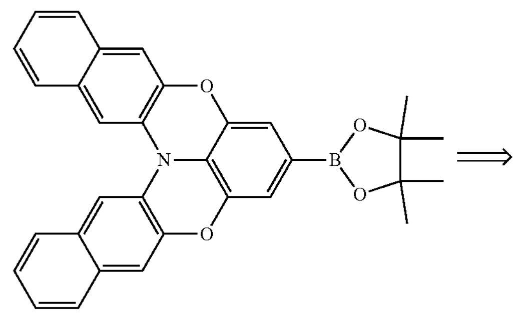

2-d

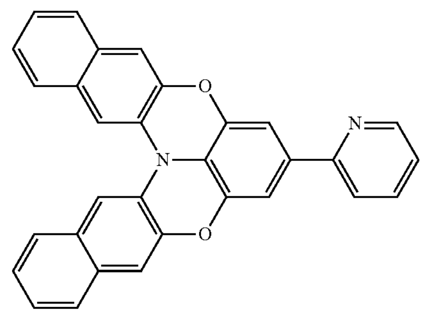

L-4

Synthesis of Compound 2-a 2-iodo-3-naphthyl methyl ether (2.39 g, 8.46 mmol), 2,6-difluoro-4-bromoaniline (0.774 g, 3.72 mmol), potassium carbonate (2.15 g, 15.6 mmol), and copper powder (0.782 g, 12.3 mmol) were placed into a dry two-neck flask, 10 mL dry o-dichlorobenzene were then added. The solution was reacted under stirring at 180° C. for 96 hours, then cooled to room temperature. The reaction solution was filtered with suction, and the filter cake was washed with dichloromethane to collect filtrate. The filtrate was extracted by adding water and dichloromethane, concentrated to remove dichloromethane, and then distilled under reduced pressure to remove o-dichlorobenzene. Then a large amount of dichloromethane were added and the filtrate was mixed with silica gel (three times), the organic phase was concentrated, then a large amount of petroleum ether were added to precipitate 1.54 g of white solid (2-a), with a yield of 80%.

Synthesis of Compound 2-b

Compound 2-a (2.60 g, 5 mmol) was placed into a dry schlenck, and the schlenck was vacuumed and filled with nitrogen for three cycles, then 100 mL of dry dichloromethane was added under nitrogen flow. The mixture was stirred at −78° C. for 20 minutes, and then boron tribromide (1 mL, 10.6 mmol) was added. The solution was heated slowly to room temperature, and reacted under stirring for 3 hours. Then water was added slowly, and the reaction solution was extracted with dichloromethane, dried, and concentrated to obtain 1.96 g of white solid (2-b), with a yield of 80%.

Synthesis of Compound 2-c

Compound 2-b (2.45 g, 5 mmol) and potassium carbonate (2.07 g, 5 mmol) were placed into a dry two-neck flask, which was then vacuumed and filled with nitrogen for three cycles, and then 60 mL of dry DMF was added under nitrogen flow. The mixture was reacted under stirring at 100° C. for 12 hours, and then cooled to room temperature. Then a large amount of solids were precipitated after water was added. The reaction solution was filtered with suction, and the filter cake was dried to obtain 1.8 g of white solid (2-c), with a yield of 80%.

Synthesis of Compound 2-d

Compound 2-c (0.45 g, 1 mmol), bis(pinacolato)diboron (0.38 g, 1.5 mmol), Pd $(dppf)_2C12$ (0.022 g, 0.03 mmol), and potassium acetate (1 g, 10 mmol) were placed into a dry two-neck flask, which was then vacuumed and filled with nitrogen for three cycles, and then 15 mL of dry dioxane was added under nitrogen flow. The solution was refluxed and reacted at 110° C. for 24 hours, concentrated to remove dioxane, extracted with the addition of water and dichloromethane, concentrated, then purified by column chromatography with volume ratio of dichloromethane:petroleum ether=1:4 to obtain 0.35 g of light green solid (2-d), with a yield of 70%.

Synthesis of Compound L-4

Compound 2-d (0.59 g, 1.2 mmol), 2-bromopyridine (0.16 g, 1 mmol), tetra-(triphenylphosphine)-palladium (0.0115 g, 0.01 mmol), and potassium carbonate (0.55 g, 4 mmol) were placed into a dry two-neck flask, which was then vacuumed and filled with nitrogen for three cycles, and then a mixed solution of 2 mL water and 4 mL dioxane was added under nitrogen flow. The solution was reacted under stirring at 100° C. for 24 hours, cooled to room temperature, spin-dried to remove dioxane, and extracted with the addition of water and dichloromethane. The organic phase was concentrated, and then purified by column chromatography with volume ratio of dichloromethane:petroleum ether=2:1 to obtain 0.38 g of light yellow solid (L-4), with a yield of 70%.

Example 7: Synthesis of Compound Ir-7

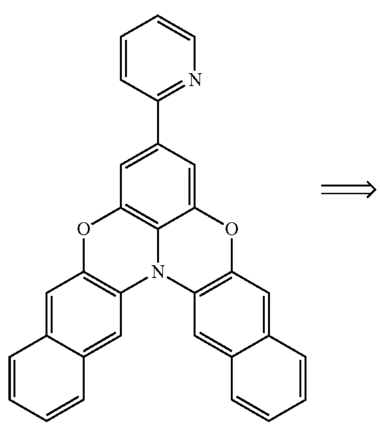

L-4

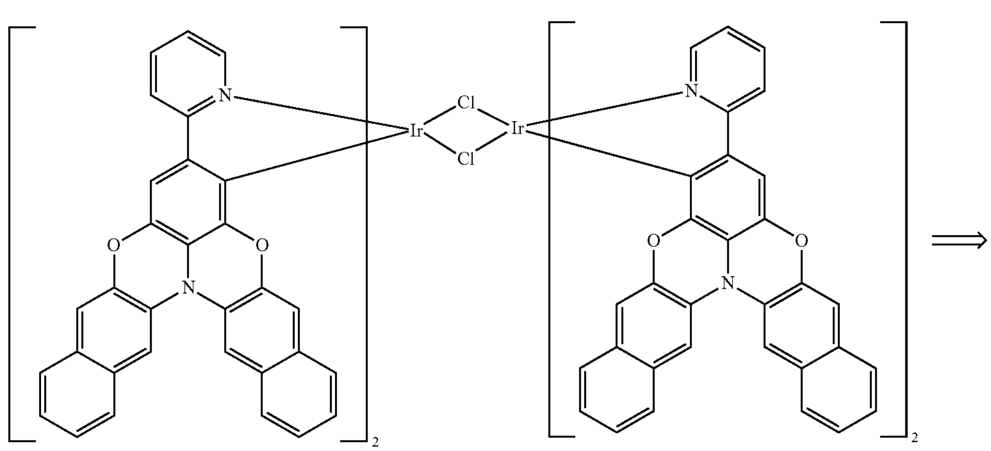

Ir-Cl-4

-continued

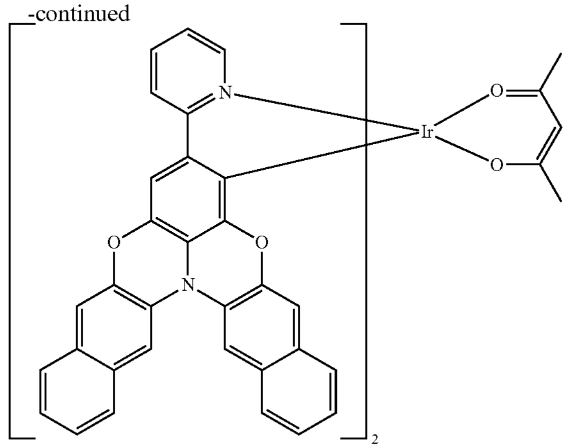

Ir-7

Synthesis of Iridium Chloride Bridge Ir—Cl-4

Compound L-4 (1.09 g, 2.43 mmol) and iridium trichloride (0.348 g, 1 mmol) were placed into a dry two-neck flask, which was then vacuumed and filled with nitrogen for three cycles, and then a mixed solution of 18 mL ethylene glycol monoethyl ether and 6 mL water was added under nitrogen flow. The solution was reacted under stirring at 110° C. for 24 hours, and then cooled to room temperature. Then solids were precipitated after water was added. The reaction solution was filtered with suction, and the filter cake was dried to obtain 1.35 g of red brown solid (Ir—Cl-4), with a yield of 60%.

Synthesis of Complex Ir-7:

Compound Ir—Cl-4 (0.22 g, 0.1 mmol), acetylacetone (0.076 mL, 0.74 mmol), and sodium carbonate (0.05 g, 0.47 mmol) were placed into a dry two-neck flask, which was then vacuumed and filled with nitrogen for three cycles, and then 10 mL of ethylene glycol monoethyl ether was added under nitrogen flow. The solution was reacted under stirring at room temperature for 24 hours, distilled under reduced pressure to remove ethylene glycol monoethyl ether, and extracted with the addition of water and dichloromethane. The organic phase was concentrated, and then purified by column chromatography with volume ratio of ethyl acetate: petroleum ether=1:3 to obtain 0.035 g of yellow solid (Ir-7), with a yield of 30%.

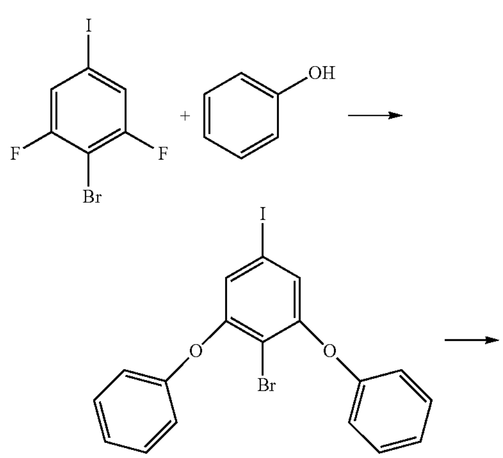

3-a

-continued

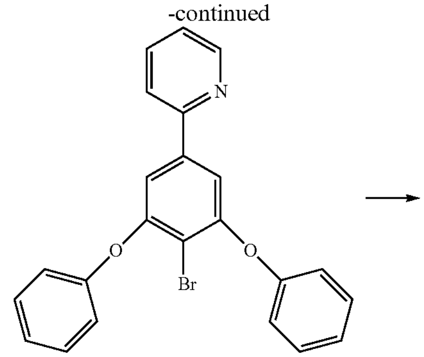

3-b

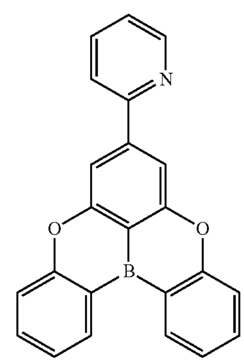

L-5

Synthesis of Compound 3-a 2-bromo-1,3-difluoro-5-iodobenzene (0.319 g, 1 mmol), phenol (0.376 g, 4 mmol), and $K_2CO_3$ (0.552 g, 4 mmol) were placed into a dry two-neck flask (100 ml), which was then vacuumed and filled with nitrogen for three cycles, and then N-methylpyrrolidone solvent (10 ml) was added under nitrogen flow. The solution was gradually heated to 135° C. and stirred for 24 hours, then cooled to room temperature, and solids were precipitated after adding a large amount of water. The solution was filtered with suction and the filter cake was dried to obtain a light pink solid, which was then recrystallized with petroleum ether and dichloromethane to obtain 420 mg of white solid product (3-a), with a yield of 90%.

Synthesis of Compound 3-b 2-bromo-1,3-diphenyl ether-5-iodobenzene (Compound 3-a) (0.94 g, 2 mmol) was placed into a dry two-neck flask (100 ml), which was then vacuumed and filled with nitrogen for three cycles, and then $Pd(PPh_3)$ 4 (0.23 g, 0.2 mmol), dry toluene (50 ml) and 2-tri-n-butylstannylpyridine (0.64 ml, 0.74 g, 2 mmol) were added under nitrogen flow. The solution was heated to 120° C. under nitrogen flow, and stirred for 24 hours. After cooling to room temperature, the solution was distilled under reduced pressure to remove toluene, then extracted with the addition of dichloromethane and water.

The organic phase was concentrated, and then purified by column chromatography with $CH_2Cl_2$:PE=1:1 to obtain 600 mg of light yellow solid with a yield of 71%.

Synthesis of Compound L-5

2-bromo-1,3-diphenyl ether-5-pyridine (Compound 3-b) (0.209 g, 0.5 mmol) was placed into a dry Schlenck flask, and dry m-xylene (5 ml) was added under $N_2$ flow, which was then vacuumed and filled with nitrogen for three cycles. The mixture was cooled to −40° C. and stirred for 10 minutes, and n-BuLi (0.65 mmol, 0.26 ml (2.5 M)) was slowly added dropwise under nitrogen flow, stirred at −40° C. for 1 hours, then gradually heated to room temperature and reacted under stirring for 1 hour. The mixture was then cooled to −40° C., and $BBr_3$ (0.65 mmol, 0.061 ml) was added dropwise. After the reaction at −40° C. for 30 minutes, the mixture was transferred to room temperature and stirred for 1 hour. After cooling to 0° C. for 10 minutes in an ice bath, N, N-diisopropylethylamine (1.03 mmol, 0.175 ml) was added dropwise. After the reaction at 0° C. for 10 minutes, the mixture was gradually heated to 120° C. and stirred for 12 hours. After cooling to room temperature, the reaction solution was quenched by the addition of a deionized aqueous solution of sodium acetate, and then extracted by the addition of deionized water and dichloromethane. The organic phase was concentrated, and m-xylene was removed under reduced pressure. Solids were precipitated after the addition of petroleum ether, and then filtered with suction and dried to obtain 160 mg of yellow solid, with a yield of 90%.

Example 8: Synthesis of Compound Ir-8

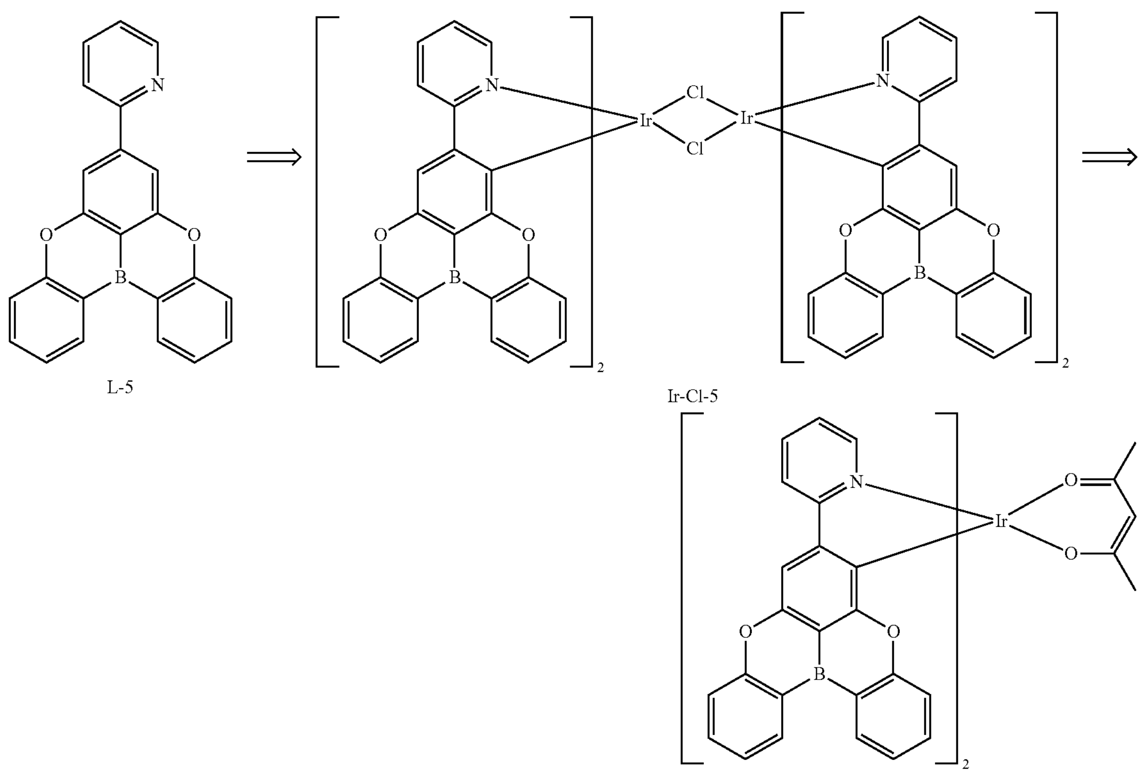

L-5

Ir-Cl-5

Ir-8

Synthesis of Iridium Chloride Bridge Ir—Cl-5

Compound L-5 (0.85 g, 2.43 mmol) and iridium trichloride (0.348 g, 1 mmol) were placed into a dry two-neck flask, which was then vacuumed and filled with nitrogen for three cycles, and then a mixed solution of 18 mL ethylene glycol monoethyl ether and 6 mL water was added under nitrogen flow. The mixture was reacted under stirring at 110° C. for 24 hours, and then cooled to room temperature. Then solids were precipitated after water was added. The reaction solution was filtered with suction, and the filter cake was dried to obtain 0.55 g of red brown solid (Ir—Cl-5), with a yield of 60%.

Synthesis of Complex Ir-8:

Compound Ir—Cl-5 (0.185 g, 0.1 mmol), acetylacetone (0.076 mL, 0.74 mmol), and sodium carbonate (0.05 g, 0.47 mmol) were placed into a dry two-neck flask, which was then vacuumed and filled with nitrogen for three cycles, and then 10 mL of ethylene glycol monoethyl ether was added under nitrogen flow. The solution was reacted under stirring at room temperature for 24 hours, cooled to room temperature, distilled under reduced pressure to remove ethylene glycol monoethyl ether, and extracted with the addition of water and dichloromethane. The organic phase was concentrated, and then purified by column chromatography with volume ratio of ethyl acetate:petroleum ether=1:3 to obtain 0.059 g of yellow solid (Ir-8), with a yield of 30%.

Example 9: Synthesis of Compound Ir-9

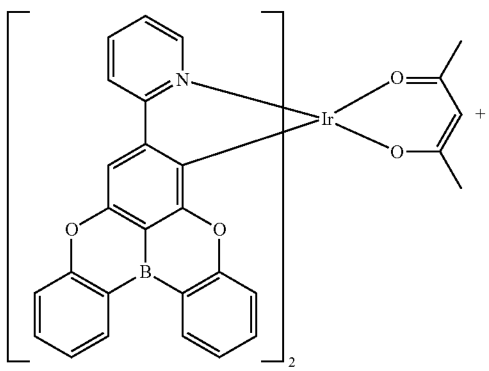

Ir-8

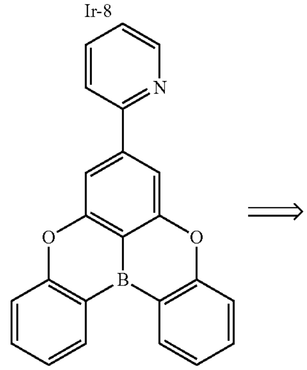

L-5

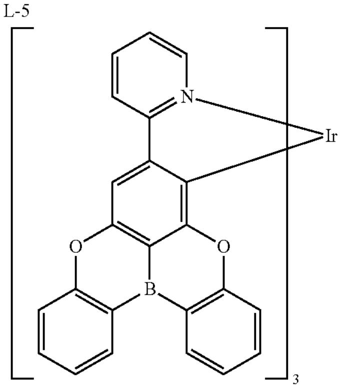

Ir-9

Compound Ir-8 (0.099 g, 0.1 mmol) and compound L-5 (0.035 g, 0.1 mmol) were placed into a dry two-neck flask, which was then vacuumed and filled with nitrogen for three cycles, and then 10 mL glycerol was added under nitrogen flow. The solution was reacted under stirring at 170° C. for 24 hours, cooled to room temperature, and extracted with dichloromethane after a plenty of water and a little hydrochloric acid were added. The organic phase was concentrated, and then purified by column chromatography with volume ratio of ethyl acetate:petroleum ether=1:5 to obtain 0.059 g of yellow solid (Ir-9), with a yield of 30%.

Example 10: Synthesis of Compound Ir-10

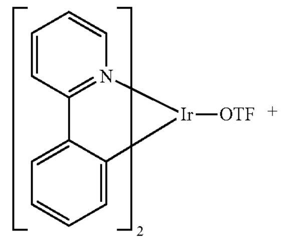

Ir-OTF

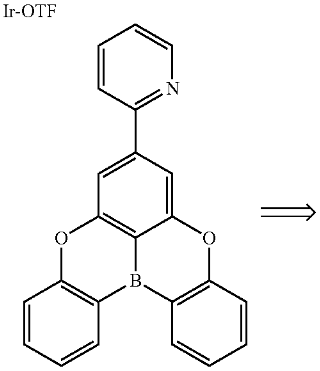

L-5

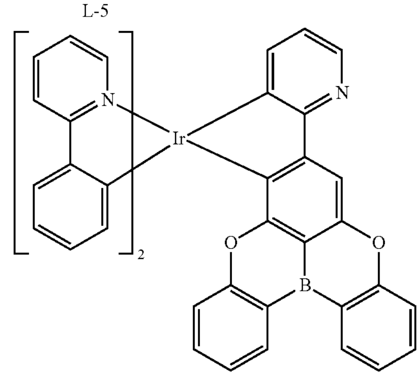

Ir-10

Synthesis of Complex Ir-10:

Compound Ir-OTF (0.26 g, 0.4 mmol) and compound L-5 (0.4 g, 1.16 mmol) were placed into a dry two-neck flask, which was then vacuumed and filled with nitrogen for three cycles, and then 30 mL of ethanol was added. The solution was refluxed and reacted under stirring for 24 hours, cooled to room temperature, filtered with suction, and the filter cake was dried to obtain a yellow crude product. Then the yellow crude product was purified by column chromatography with volume ratio of dichloromethane:petroleum ether=1:1 to obtain a pure product with a yield of 70%.

2. Energy Level Structure of Compounds

The energy levels of the metal organic complexes Ir-1-Ir-10 can be obtained by quantum calculations, such as using TD-DFT (Time Dependent-Density Functional Theory) by Gaussian03W (Gaussian Inc.), and the specific simulation methods can be found in WO2011141110. Firstly, the molecular geometry is optimized by semi-empirical method "Ground State/Semi-empirical/Default Spin/LanL2 MB" (Charge 0/Spin Singlet), and then the energy structure of organic molecules is calculated by TD-DFT (time-density functional theory) "TD-SCF/DFT/Default Spin/B3PW91" and the basis set "6-31G (d)" (Charge 0/Spin Singlet). The HOMO and LUMO energy levels are calculated according to the following calibration formulas, S1 and T1 are used directly.

$$HOMO(eV)=((HOMO(G)\times 27.212)-0.9899)/1.1206$$

$$LUMO(eV)=((LUMO(G)\times 27.212)-2.0041)/1.385$$

wherein, HOMO(G) and LUMO(G) in the unit of eV are the direct calculation results of Gaussian 09W. The results are shown in Table 1, where ΔHOMO=HOMO−(HOMO−1).

TABLE 1

| Materials | HOMO [eV] | HOMO − 1 [eV] | LUMO [eV] | LUMO + 1 [eV] | T1 [eV] | S1 [eV] |
|---|---|---|---|---|---|---|
| Ir-1 | −5.00 | −5.05 | −2.45 | −2.40 | 2.32 | 2.69 |
| Ir-2 | −4.92 | −4.95 | −2.46 | −2.44 | 2.28 | 2.65 |
| Ir-3 | −4.96 | −5.23 | −2.44 | −2.34 | 2.36 | 2.71 |
| Ir-4 | −5.13 | −5.22 | −2.58 | −2.55 | 2.35 | 2.65 |
| Ir-5 | −5.05 | −5.12 | −2.48 | −2.43 | 2.21 | 2.68 |
| Ir-6 | −5.21 | −5.25 | −2.48 | −2.42 | 2.18 | 2.67 |
| Ir-7 | −5.29 | −5.33 | −2.49 | −2.45 | 2.17 | 2.66 |
| Ir-8 | −5.41 | −5.37 | −2.46 | −2.42 | 1.95 | 2.43 |
| Ir-9 | −5.42 | −5.38 | −2.45 | −2.41 | 2.01 | 2.47 |
| Ir-10 | −5.35 | −5.31 | −2.44 | −2.39 | 2.08 | 2.51 |

3. Preparation Method of OLED Devices

The preparation process of the OLED devices using the above-mentioned organometallic complex is described in detail through specific examples. The structure of the OLED devices is: ITO/NPD (60 nm)/15% dopant (for example, Ir-1~Ir4): mCP (45 nm)/TPBi (35 nm)/LiF (1 nm)/Al (150 nm)/cathode a. Cleaning of conductive glass substrate: when it was used for the first time, the conductive glass substrate may be cleaned with various solvents such as chloroform, ketone and isopropanol, and then ultraviolet ozone treatment and plasma treatment were performed;

b. HIL (60 nm), EML (25 nm) and ETL (65 nm) were formed by thermal evaporation in high vacuum ($1\times10^{-6}$ mbar);

c. Cathode: LiF/Al (1 nm/150 nm) was formed by thermal evaporation in high vacuum ($1\times10^{-6}$ mbar);

d. Encapsulating: the device was encapsulated with UV-curable resin in a chlorine glove box.

OLED1: EML material is 15% Ir-1: mCP (45 nm); 15% Ir-1 represents 15% wt of Ir-1 in EML material.

OLED2: EML material is 15% Ir-2: mCP (45 nm); 15% Ir-2 represents 15% wt of Ir-2 in EML material.

OLED3: EML material is 15% Ir-3: mCP (45 nm); 15% Ir-3 represents 15% wt of Ir-3 in EML material.

OLED4: EML material is 15% Ir-4: mCP (45 nm); 15% Ir-4 represents 15% wt of Ir-4 in EML material.

The current-voltage-luminance (JVL) characteristics of each OLED device are characterized by characterization equipment and important parameters such as efficiency and external quantum efficiency are recorded.

As detected, the maximum external quantum efficiencies of OLEDx (corresponding to organometallic complex Ir-x) have reached more than 10%.

Further optimization, such as optimization of device structure, optimization of the combination of HTM, ETM and host material can further improve the properties of the device, especially efficiency, driving voltage and lifetime.

It should be understood that, the application of the present disclosure is not limited to the above-described examples, and those skilled in the art can make modifications and changes in accordance with the above description, all of which are within the scope of the appended claims.

The invention claimed is:

1. An organometallic complex of the general formula (I):

(I)

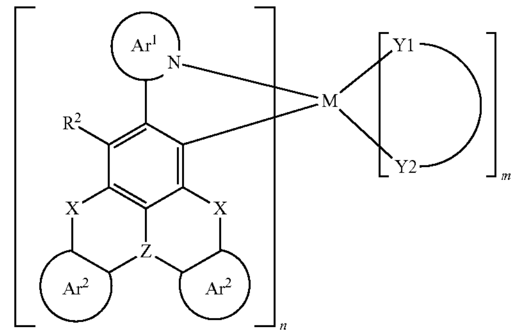

wherein each occurrence of $Ar^1$ is the same or different and is a heteroaromatic group containing at least one N; each occurrence of $Ar^2$ is the same or different and is an aromatic group or a heteroaromatic group; $Ar^1$ and $Ar^2$ are substituted by one or more $R^1$;

X is selected from the group consisting of O, S, Se, $NR^1$, $C(R^1)_2$ and $Si(R^1)_2$;

Z is selected from the group consisting of B, N, P, P═O and P═S;

each occurrence of $R^1$ and $R^2$ is the same or different and is selected from the group consisting of H, deuterium, a linear alkyl containing 1 to 20 carbon atoms, a linear alkoxy containing 1 to 20 carbon atoms, a linear thioalkoxy group containing 1 to 20 carbon atoms, a branched or cyclic alkyl containing 3 to 20 carbon atoms, a branched or cyclic alkoxy containing 3 to 20 carbon atoms, a branched or cyclic thioalkoxy group containing 3 to 20 carbon atoms, a branched or cyclic silyl group containing 3 to 20 carbon atoms, a substituted keto group containing 1 to 20 carbon atoms, an alkoxycarbonyl group containing 2 to 20 carbon atoms, an aryloxycarbonyl group containing 7 to 20 carbon atoms, a cyano group, a carbamoyl group, a haloformyl group, a formyl group, an isocyano group, an isocyanate group, a thiocyanate group or isothiocyanate group, a hydroxyl group, a nitro group, $CF_3$ group, Cl, Br, F, a crosslinkable group, a substituted or unsubstituted aromatic or heteroaromatic ring containing 5 to 40 ring atoms, and an aryloxy or heteroaryloxy group containing 5 to 40 ring atoms;

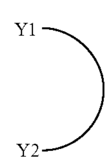

is a bidentate ligand;

M is a transition metal element; m is an integer from 0 to 2, and n is an integer from 1 to 3.

2. The organometallic complex according to claim 1, wherein X is O or S, and Z is B or N.

3. The organometallic complex according to claim 1, wherein the metal element M is selected from any one of the transition metals consisting of chromium, molybdenum, tungsten, ruthenium, rhodium, nickel, silver, copper, zinc, palladium, gold, osmium, rhenium, iridium and platinum.

4. The organometallic complex according to claim 3, wherein the metal element M is iridium or platinum.

5. The organometallic complex according to claim 1, wherein each of $Ar^1$ on multiple occurrences is independently selected from any one of the general formulas C1 to C3:

C1

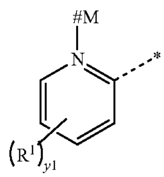

C2

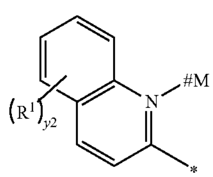

C3

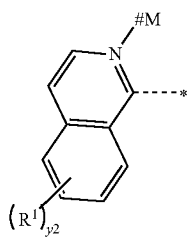

wherein

#M represents a site attached to the transition metal M,

* represents a site attached to the carbon atom of the benzene ring in the general formula (I), y1 represents an integer from 0 to 4, y2 represents an integer from 0 to 6, and the dotted line represents a connection in the form of a single bond.

6. The organometallic complex according to claim 1, wherein each of $Ar^2$ on multiple occurrences is independently selected from the group consisting of benzene, biphenyl, naphthalene, anthracene, phenanthrene, benzophenanthrene, pyrene, pyridine, pyrimidine, triazine, fluorene, dibenzothiophene, silafluorene, carbazole, thiophene, furan, thiazole, triphenylamine, triphenylphosphine oxide, tetraphenyl silicane, spirofluorene, and spirosilabifluorene.

7. The organometallic complex according to claim 1, wherein each of $Ar^2$ on multiple occurrences is the same and is substituted or unsubstituted benzene or naphthalene.

8. The organometallic complex according to claim 1, wherein

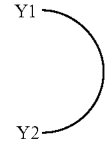

is a mono-anionic ligand, each of which on multiple occurrences is independently selected from any one of the following general formulas L1 to L15:

L1

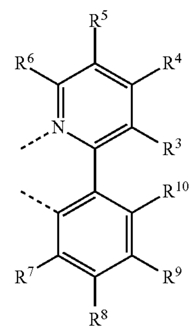

L2

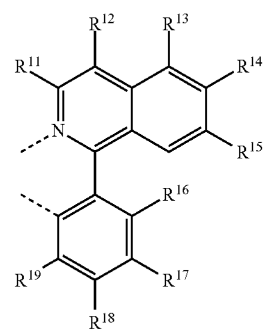

L3

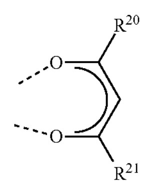

L4

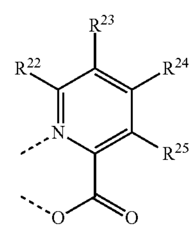

L5

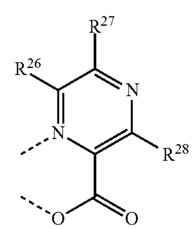

-continued

L6

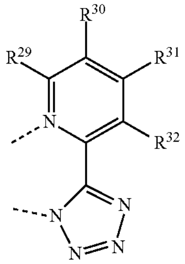

L7

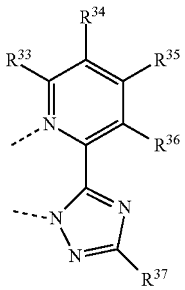

L8

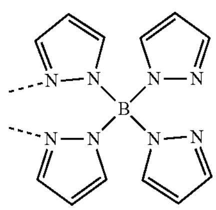

L9

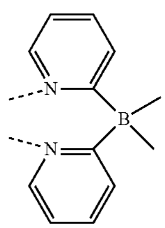

L10

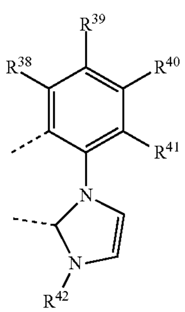

L11

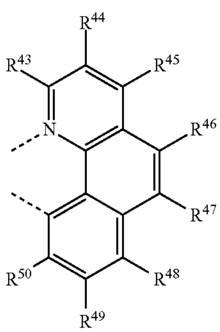

-continued

L12

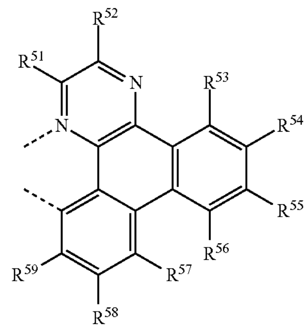

L13

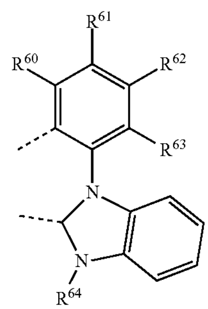

L14

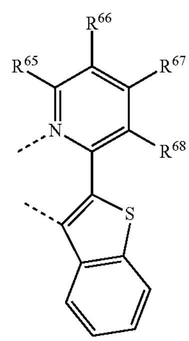

L15

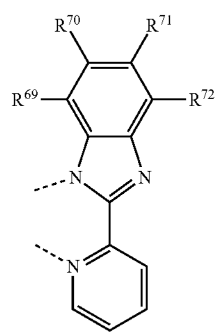

wherein $R^3$ to $R^{72}$ are selected from any one of the group consisting of —H, —F, —Cl, —Br, —I, -D, —CN, —$NO_2$, —$CF_3$, $B(OR^2)_2$, $Si(R^2)_3$, linear alkane, alkane ether, alkane sulfide containing 1 to 10 carbon atoms, branched alkane, cycloalkane, and aryl containing 6 to 10 carbon atoms, wherein the dotted line represents the bond directly connected to the metal element M.

9. The organometallic complex according to claim 1, wherein the organometallic complex is selected from the compounds represented by the following general formulas:

-continued
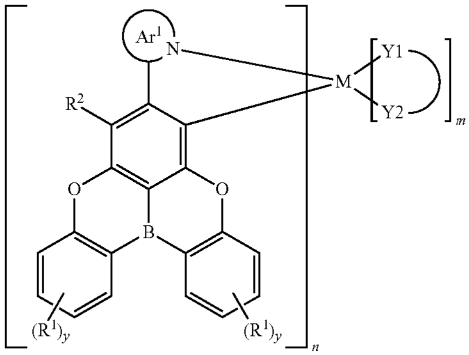
(I-1)
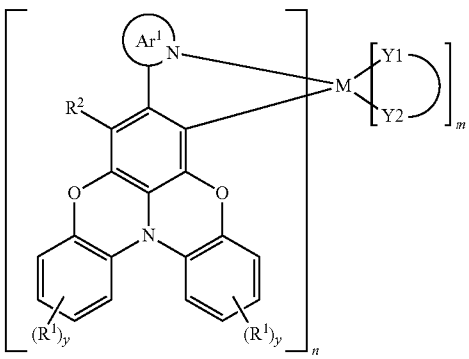
(I-2)
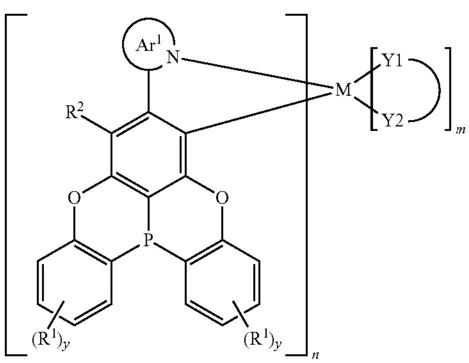
(I-3)
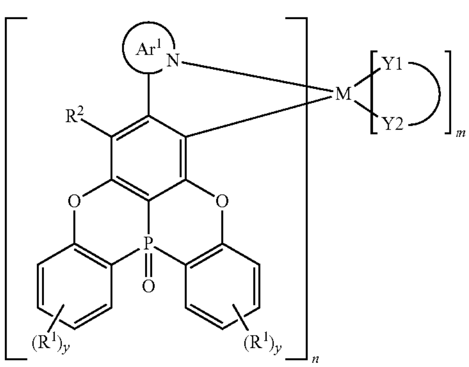
(I-4)
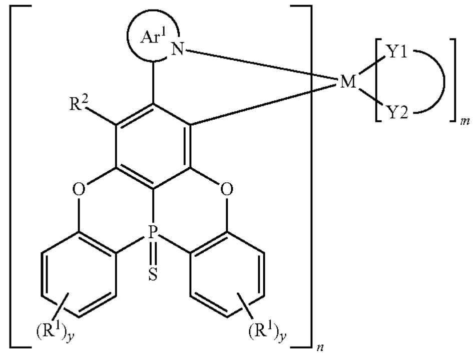
(I-5)
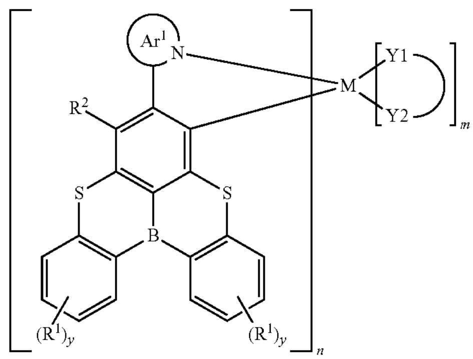
(I-6)
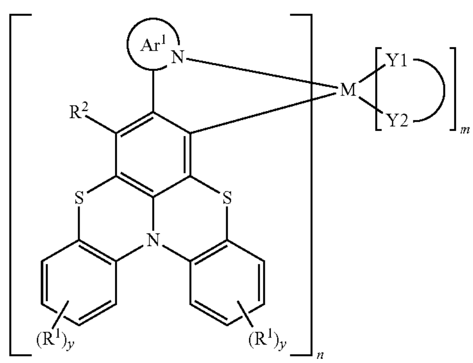
(I-7)
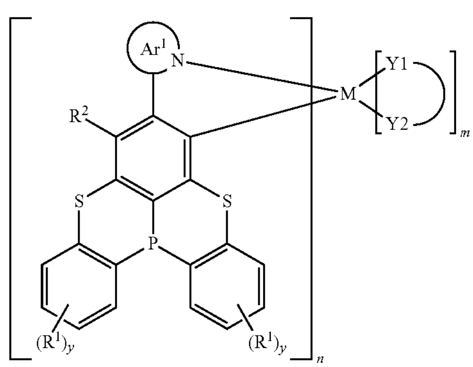
(I-8)

-continued
(I-9)
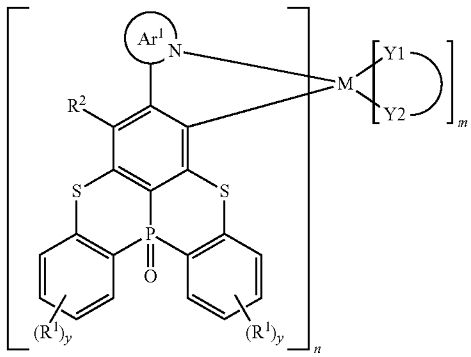
(I-10)
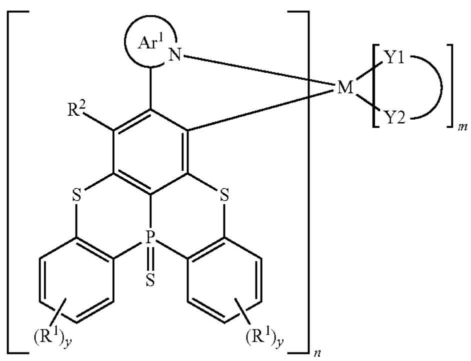
(I-11)
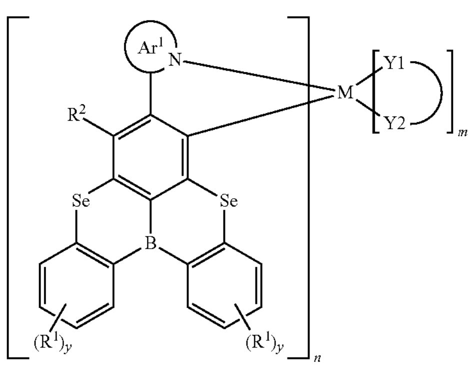
(I-12)
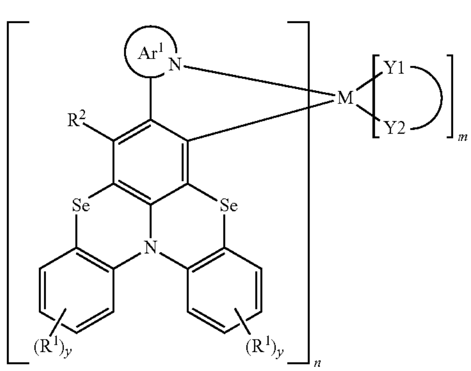
-continued
(I-13)
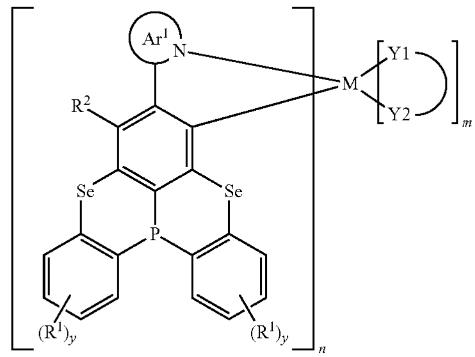
(I-14)
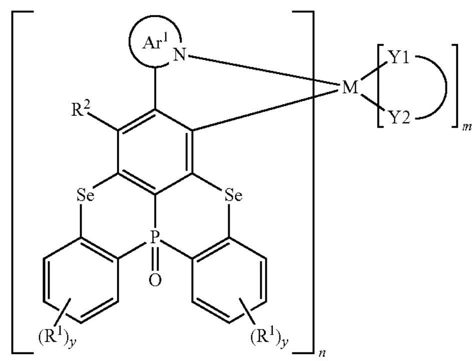
(I-15)
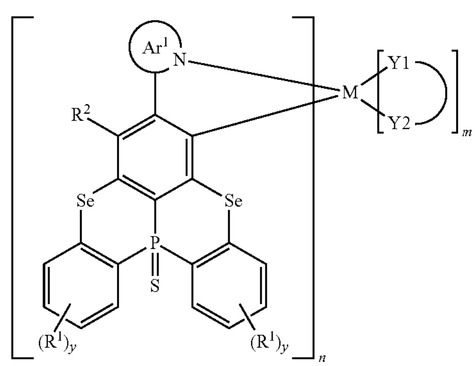
(I-16)
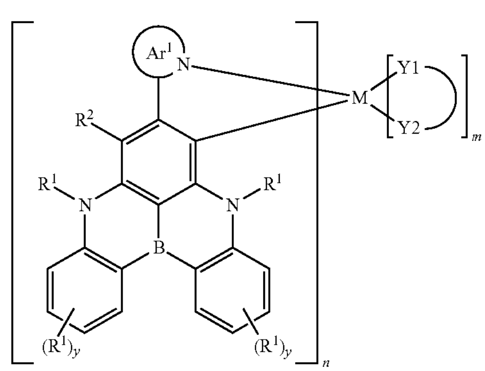

-continued
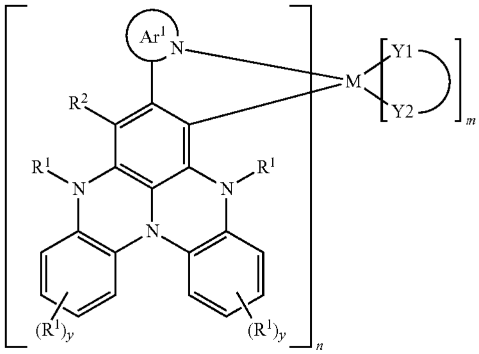
(I-17)
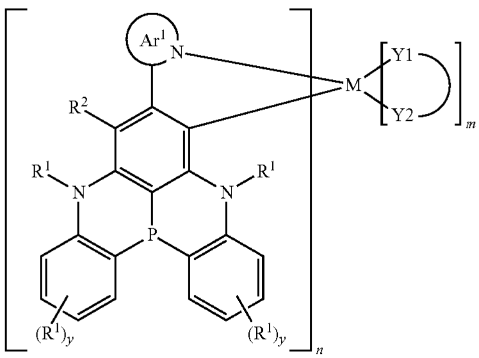
(I-18)
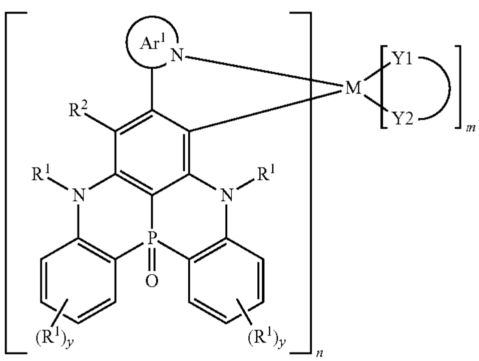
(I-19)
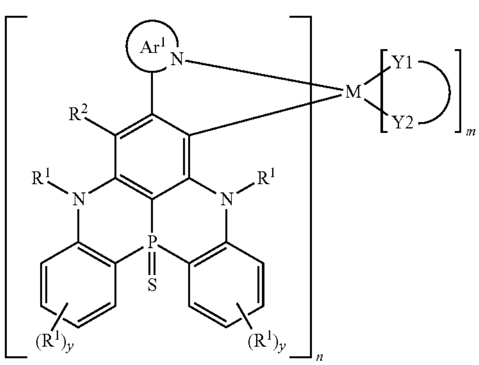
(I-20)
-continued
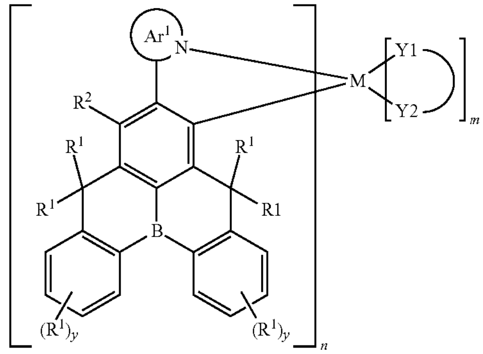
(I-21)
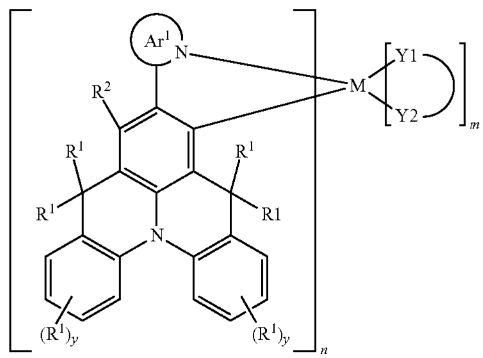
(I-22)
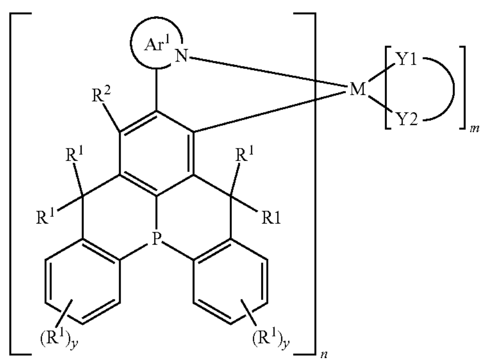
(I-23)
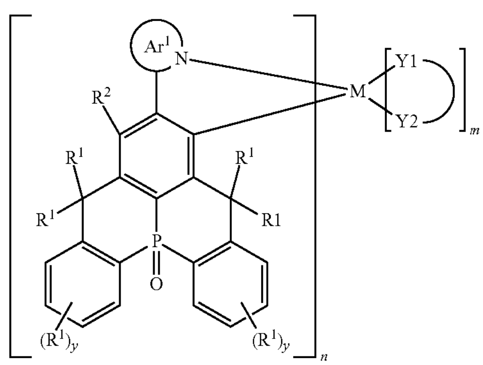
(I-24)

(I-25)
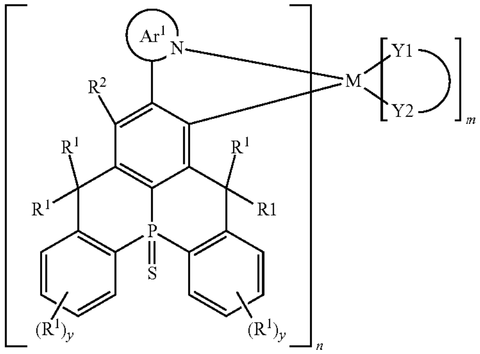
(I-26)
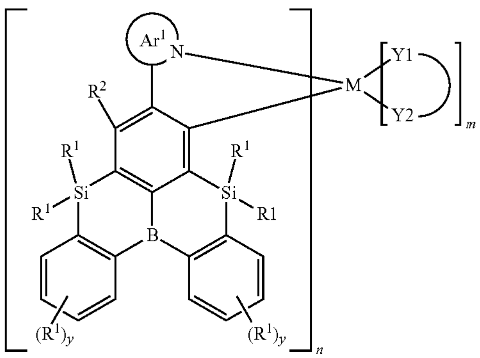
(I-27)
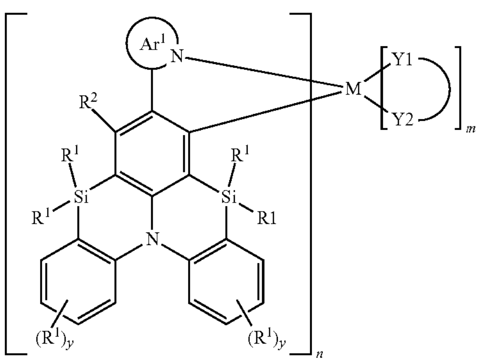
(I-28)
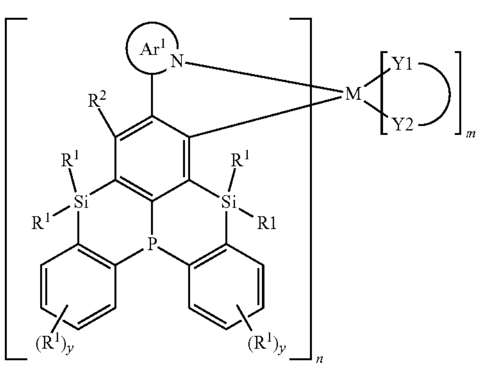
(I-29)
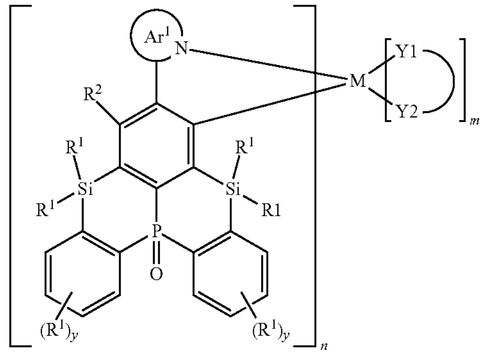
(I-30)
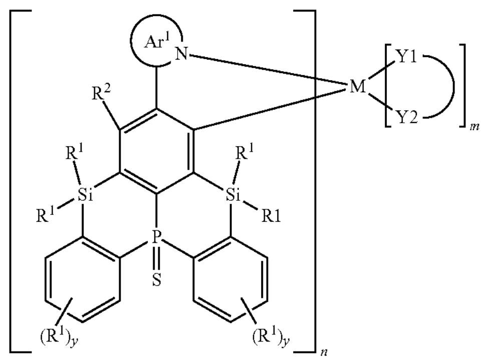
(I-31)
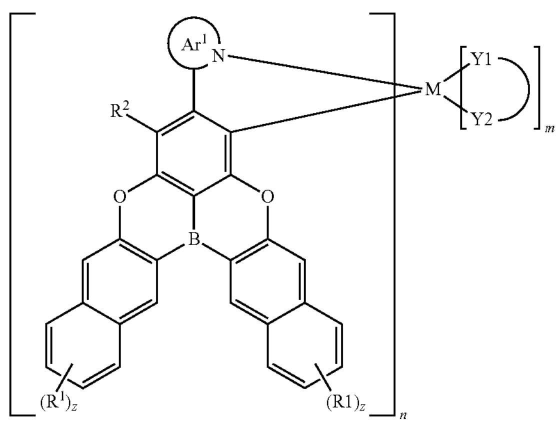
(I-32)
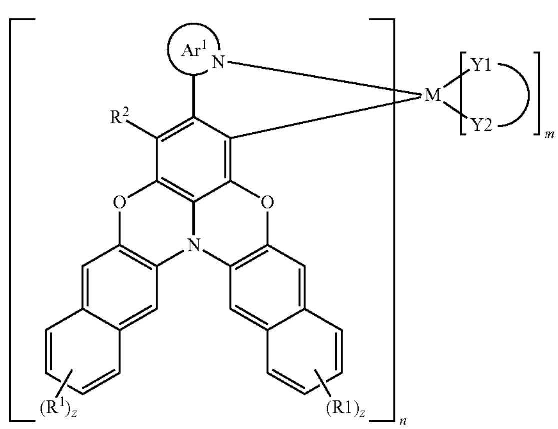

-continued
(I-33)
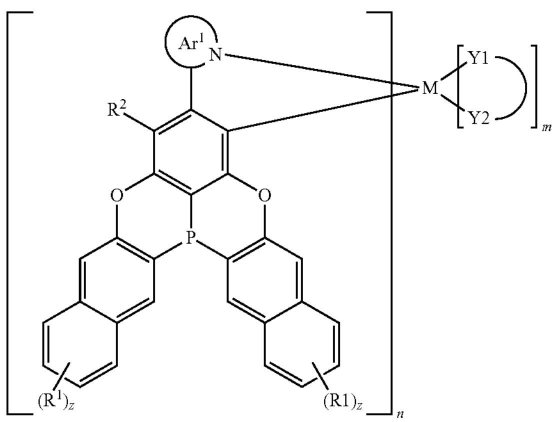
(I-34)
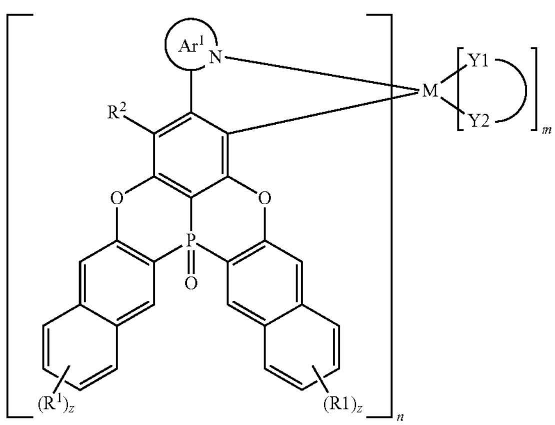
(I-35)
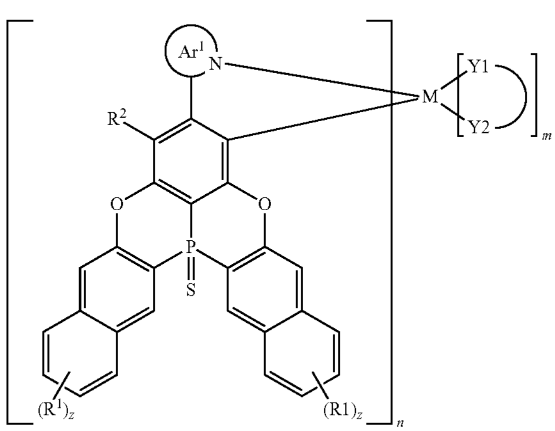
-continued
(I-36)
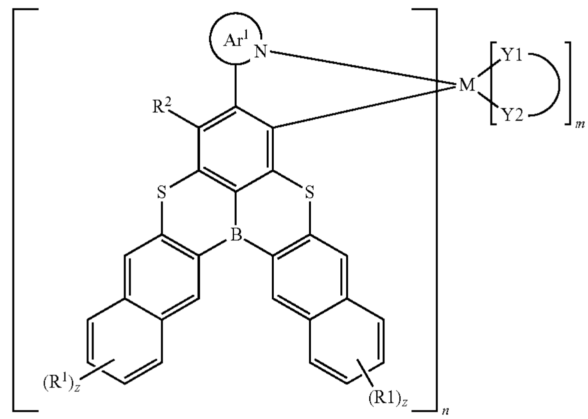
(I-37)
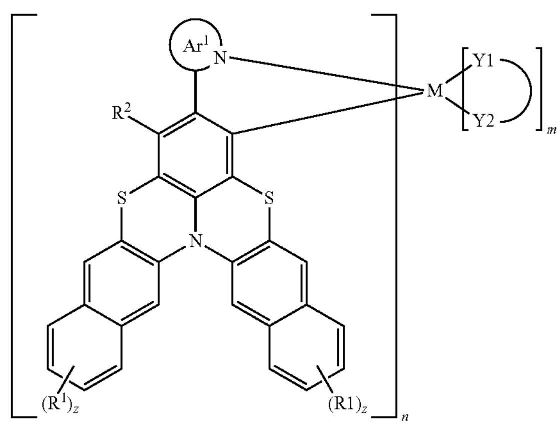
(I-38)
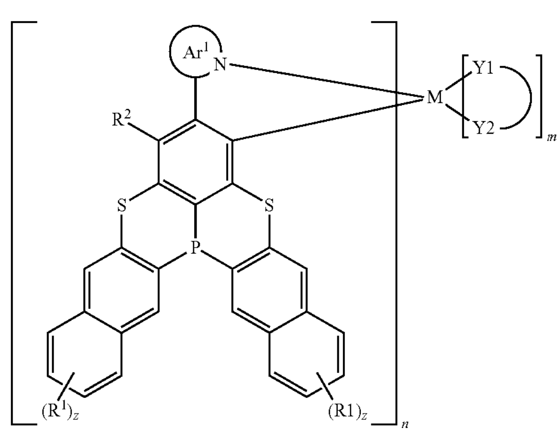

-continued
(I-39)
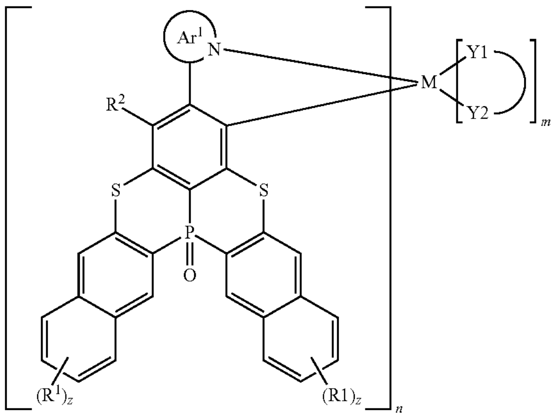
(I-40)
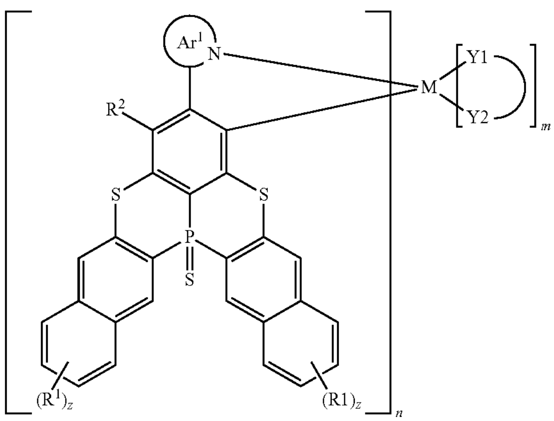
(I-41)
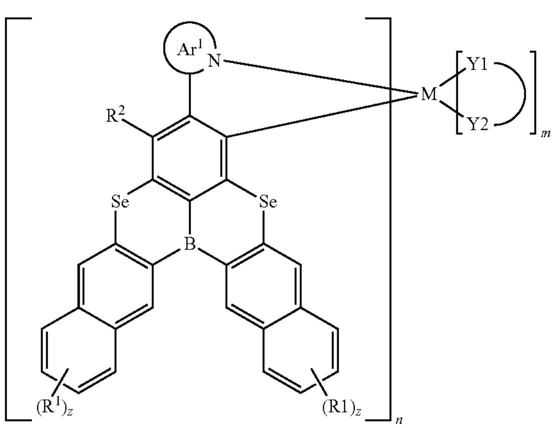
-continued
(I-42)
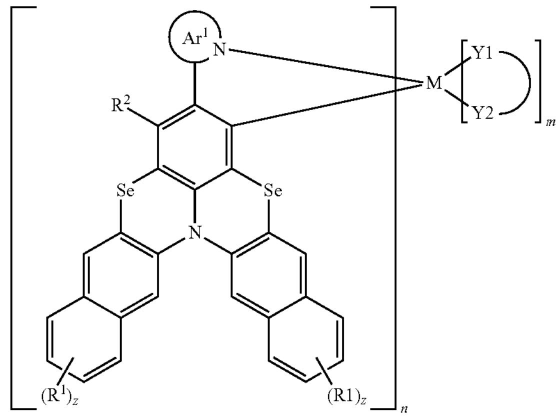
(I-43)
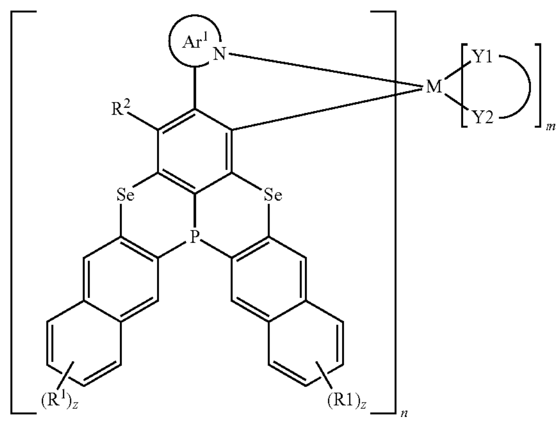
(I-44)
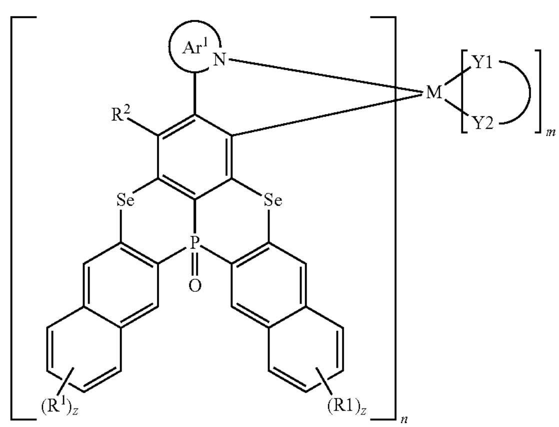

-continued
(I-45)
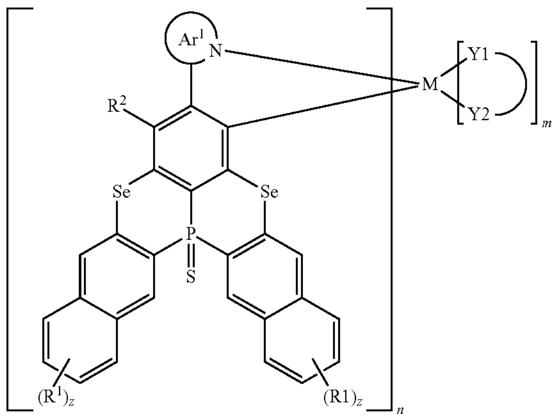
(I-46)
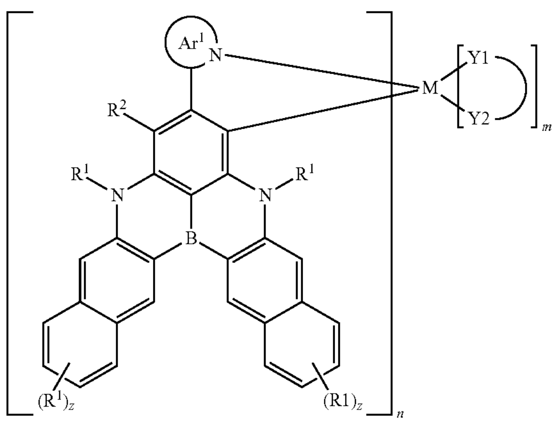
(I-47)
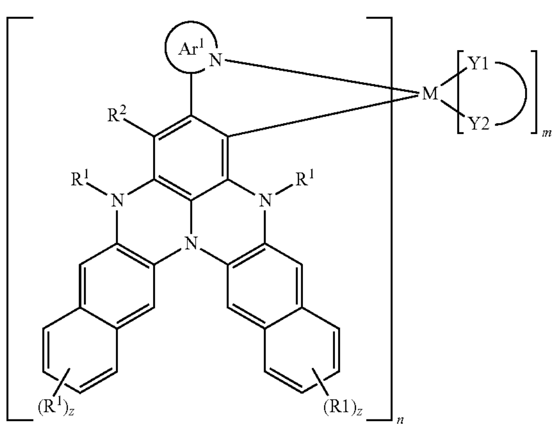
-continued
(I-48)
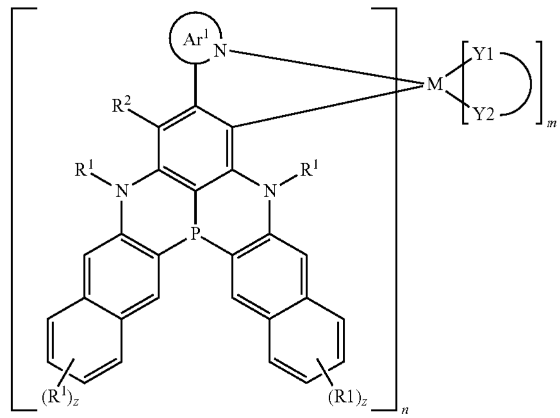
(I-49)
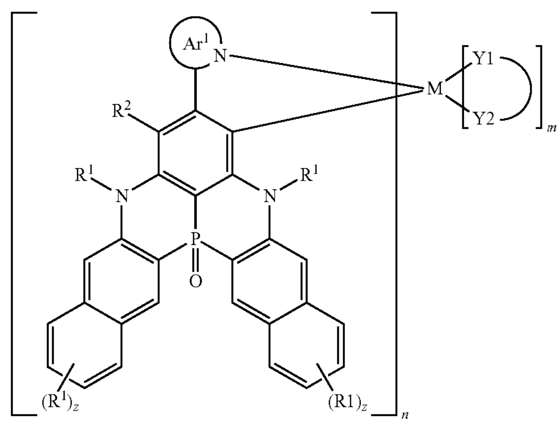
(I-50)
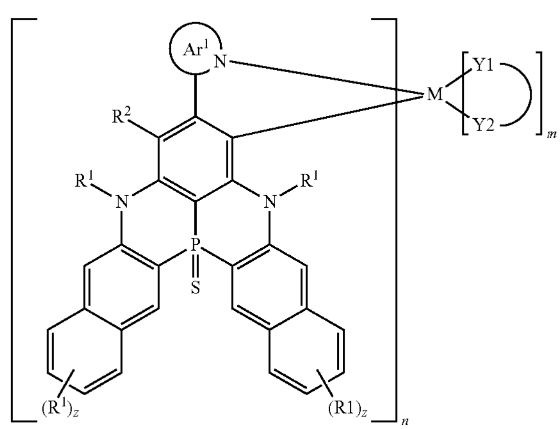

(I-51)
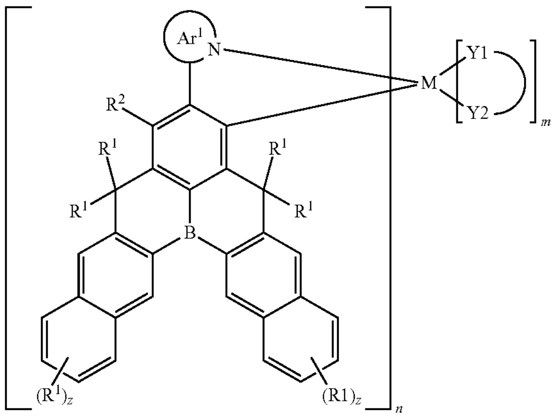
(I-52)
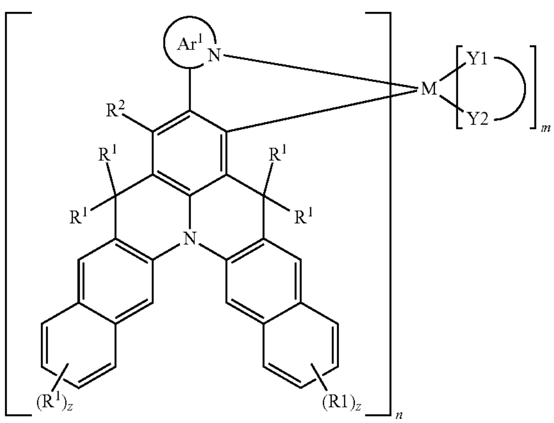
(I-53)
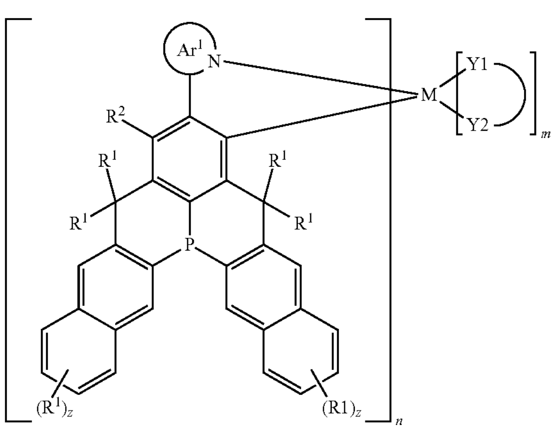
(I-54)
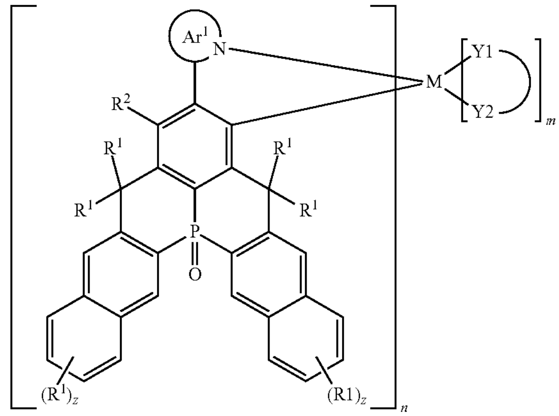
(I-55)
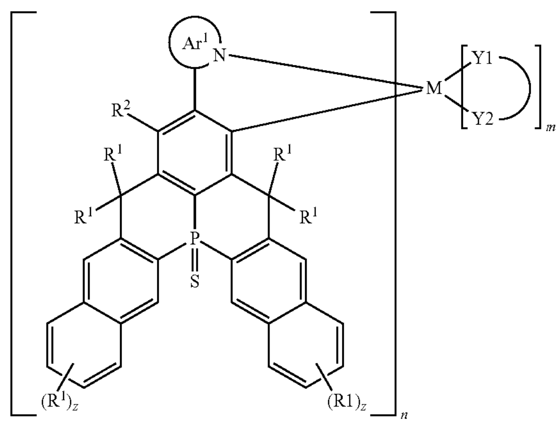
(I-56)
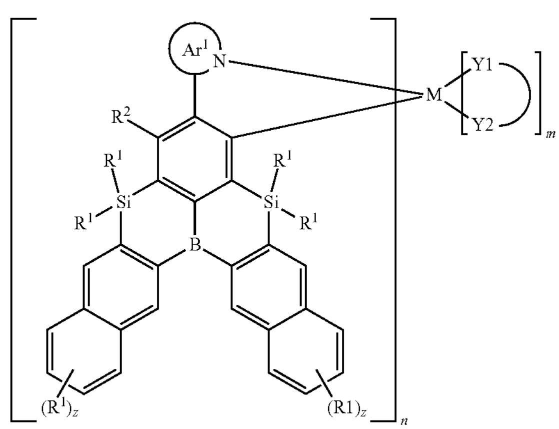

-continued (I-57)

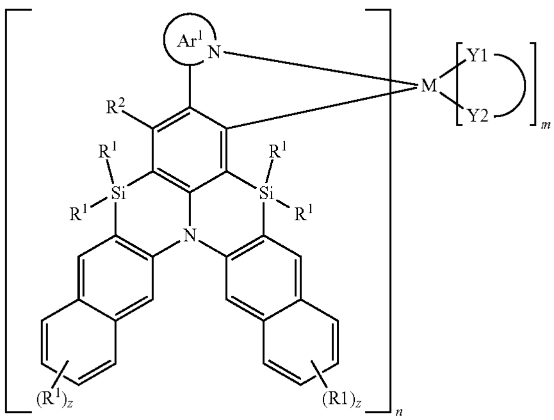

(I-58)

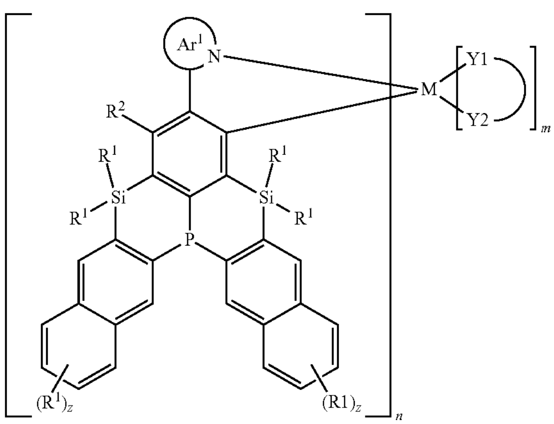

(I-59)

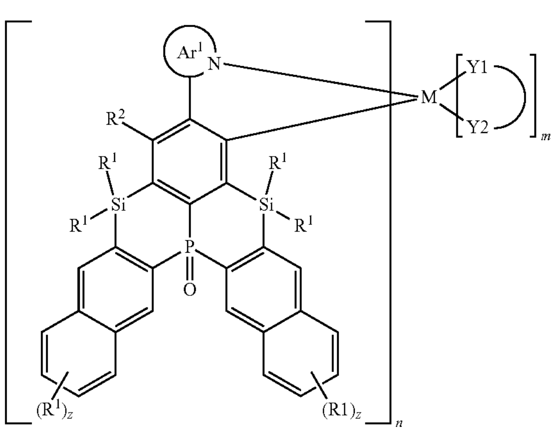

-continued (I-60)

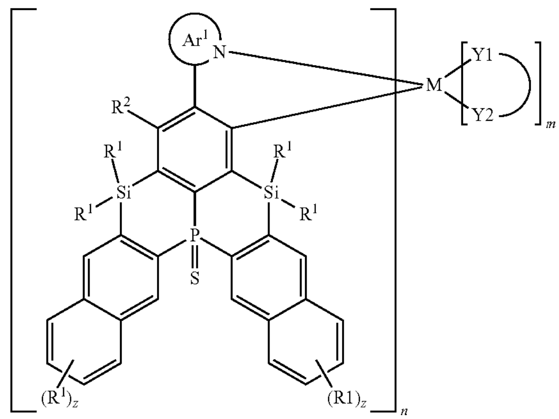

wherein y represents an integer from 0 to 4, and z represents an integer from 0 to 6.

10. A mixture comprising at least the organometallic complex of claim 1 and at least another organic functional material which is selected from the group consisting of hole injection material, hole transport material, electron transport material, electron injection material, electron blocking material, hole blocking material, light-emitting material, host material, and organic dye.

11. An organic electronic device comprising at least the organometallic complex of claim 1.

12. The organic electronic device according to claim 11, comprising a light-emitting layer which comprises at least the organometallic complex of claim 1.

13. The organometallic complex according to claim 1, wherein X is O, and Z is N or B.

14. The organometallic complex according to claim 1, wherein each of $Ar^2$ on multiple occurrences is benzene.

15. The organometallic complex according to claim 1, wherein the organometallic complex is selected from the compounds represented by the following general formulas:

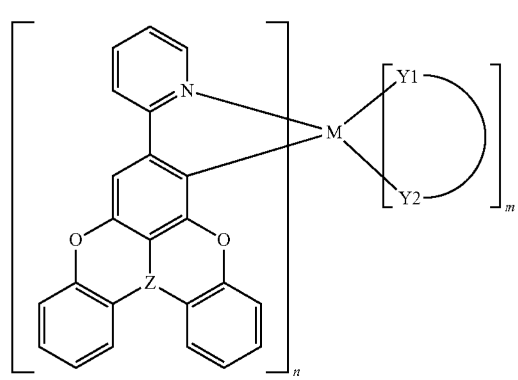

-continued
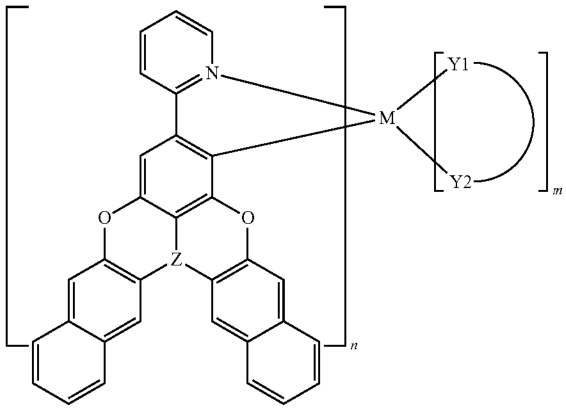
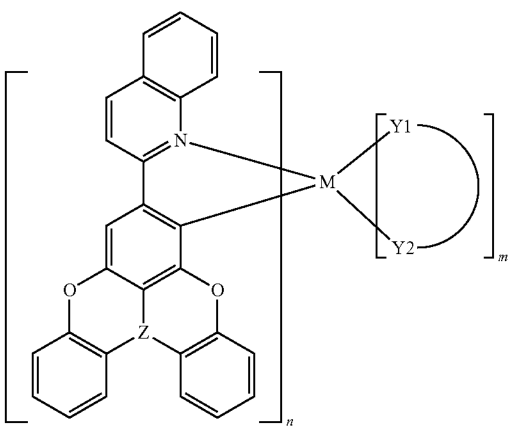
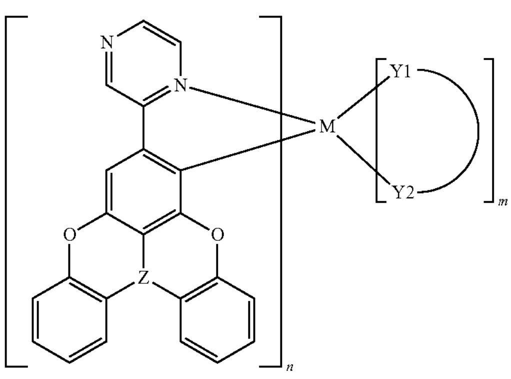
wherein, Z is B or N.
16. The organometallic complex according to claim 1, wherein the organometallic complex is selected from the compounds represented by the following structures:
Ir-1
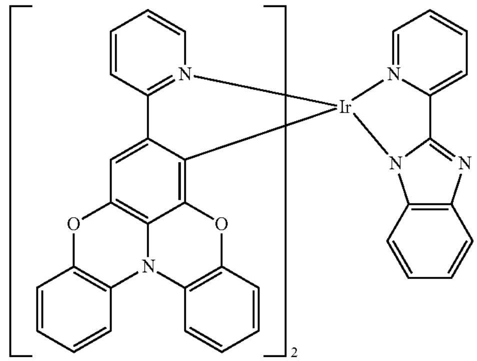
Ir-2
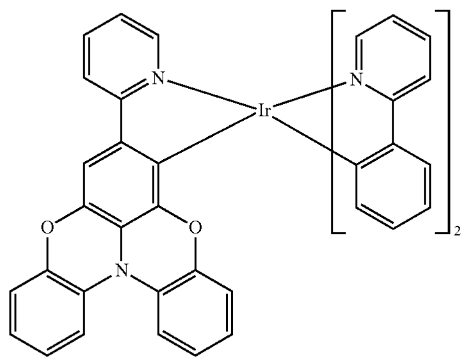
Ir-3
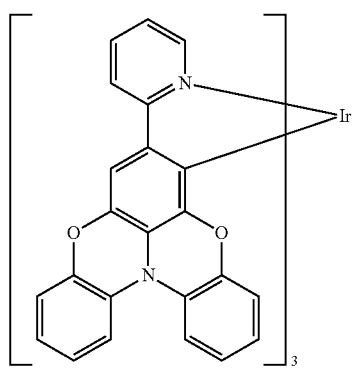
Ir-4
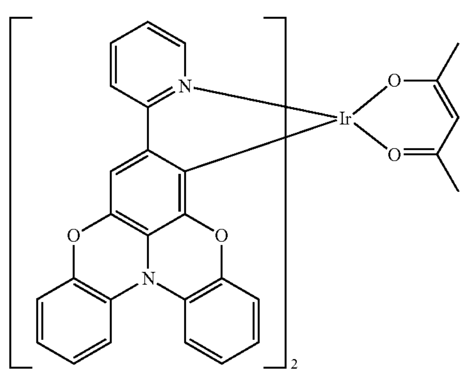

-continued
Ir-5
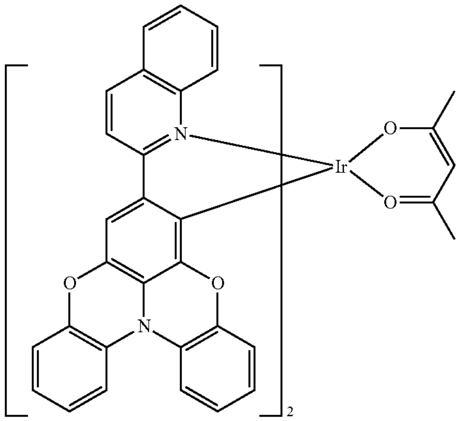
Ir-6
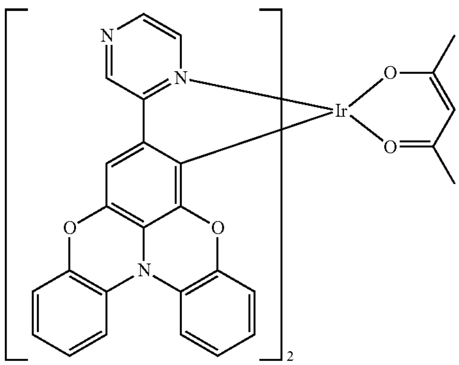
Ir-7
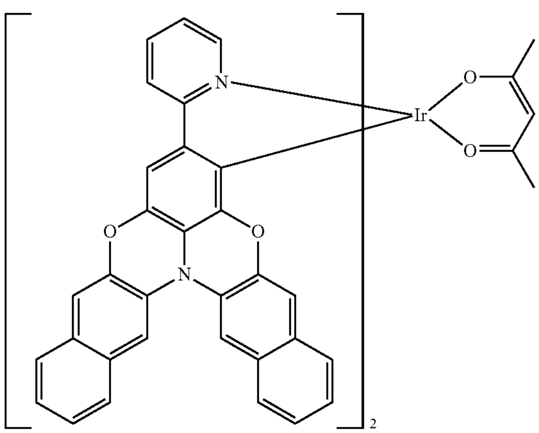
-continued
Ir-8
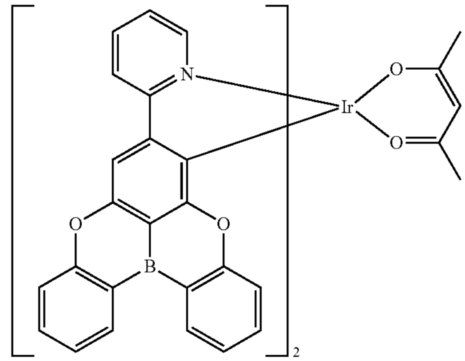
Ir-9
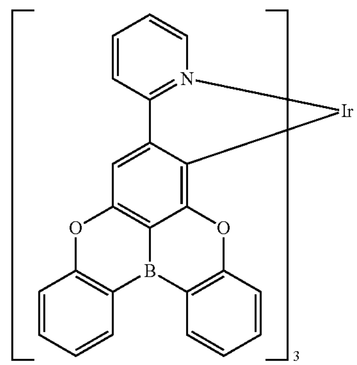
Ir-10
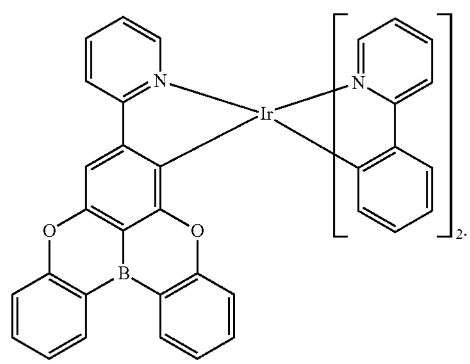
* * * * *